US012615784B2

(12) United States Patent
Or-Bach et al.

(10) Patent No.: US 12,615,784 B2
(45) Date of Patent: Apr. 28, 2026

(54) 3D SEMICONDUCTOR MEMORY DEVICE AND STRUCTURE

(71) Applicant: Monolithic 3D Inc., Klamath Falls, OR (US)

(72) Inventors: Zvi Or-Bach, Haifa (IL); Jin-Woo Han, San Jose, CA (US)

(73) Assignee: Monolithic 3D Inc., Allen, TX (US)

( * ) Notice: Subject to any disclaimer, the term of this patent is extended or adjusted under 35 U.S.C. 154(b) by 0 days.

(21) Appl. No.: 18/385,383

(22) Filed: Oct. 31, 2023

(65) Prior Publication Data

US 2024/0090241 A1 Mar. 14, 2024

Related U.S. Application Data

(63) Continuation-in-part of application No. 17/367,385, filed on Jul. 4, 2021, now Pat. No. 11,937,422, which
(Continued)

(51) Int. Cl.
*H10B 80/00* (2026.01)
*H10W 90/00* (2026.01)
*H10W 80/00* (2026.01)

(52) U.S. Cl.
CPC ............ *H10B 80/00* (2023.02); *H10W 90/00* (2026.01); *H10W 80/211* (2026.01);
(Continued)

(58) Field of Classification Search
None
See application file for complete search history.

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Sarah K Salerno
(74) *Attorney, Agent, or Firm* — PowerPatent Patent PC; Bao Tran

(57) ABSTRACT
A 3D semiconductor device, the device including: a first level including first single crystal transistors; a second level including second transistors; memory periphery circuits; and memory cells, where the first level is overlaid by the second level, where the first level includes a transferred layer and a bonded layer, where the second level is bonded to the first level, where the bonded second level includes oxide to oxide bonds, where the bonded second level includes metal to metal bonds, where the first level includes a preponderance of the memory periphery circuits, where the second level includes a preponderance of the memory cells, where the preponderance of the memory periphery circuits are connected to the preponderance of the memory cells using a portion of the metal to metal bonds, and where the memory periphery circuits include at least one Look up Table ("LUT") circuit.

8 Claims, 148 Drawing Sheets

Primary gate line 2110
Supporting gate line right 2120
Supporting gate line left 2130
Right side
Bit3
Bit7 Bit4
Bit5 Bit8
Bit1 Bit6
Bit2
Left side

Related U.S. Application Data is a continuation-in-part of application No. 16/786,060, filed on Feb. 10, 2020, now Pat. No. 11,114,427, which is a continuation-in-part of application No. 16/377,238, filed on Apr. 7, 2019, now Pat. No. 10,622,365, which is a continuation-in-part of application No. 15/911,071, filed on Mar. 2, 2018, now Pat. No. 10,297,599, which is a continuation-in-part of application No. 15/344,562, filed on Nov. 6, 2016, now Pat. No. 9,953,994.

(60) Provisional application No. 62/297,857, filed on Feb. 20, 2016, provisional application No. 62/269,950, filed on Dec. 19, 2015, provisional application No. 62/258,433, filed on Nov. 21, 2015, provisional application No. 62/252,448, filed on Nov. 7, 2015.

(52) U.S. Cl.
CPC ........ *H10W 80/312* (2026.01); *H10W 80/327* (2026.01); *H10W 90/792* (2026.01)

(56) References Cited

U.S. PATENT DOCUMENTS

| | | | |
|---|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayash |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |

(56) References Cited

U.S. PATENT DOCUMENTS

| | | |
|---|---|---|
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B2 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |

(56) References Cited

U.S. PATENT DOCUMENTS

| | | | |
|---|---|---|---|
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,264,065 B2 | 9/2012 | Su et al. |
| 8,266,560 B2 | 9/2012 | McIlrath |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,525,342 B2 | 9/2013 | Chandrasekaran |
| 8,546,956 B2 | 10/2013 | Nguyen |
| 8,566,762 B2 | 10/2013 | Morimoto et al. |

(56) References Cited

U.S. PATENT DOCUMENTS

| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 3/2006 | Chang et al. |
| 2006/0049449 A1 | 3/2006 | Lino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |

(56) References Cited

U.S. PATENT DOCUMENTS

| | | |
|---|---|---|
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |

(56) References Cited

U.S. PATENT DOCUMENTS

| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | Graw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |

(56)　　References Cited

U.S. PATENT DOCUMENTS

| | | |
|---|---|---|
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0269044 A1* | 9/2014 | Bedeschi ........... G11C 13/0004 |
| | | 365/163 |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2015/0348905 A1* | 12/2015 | Tsai .................... H01L 21/4846 |
| | | 257/774 |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker et al. |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner et al. |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol. No., pp. 14-15, Jun. 12-14, 2007.
Lue, H.-T., et al., "A Highly Scalable 8-Layer 3D Vertical-Gate (VG) TFT Nand Flash Using Junction-Free Buried Channel BE-SONOS Device," Symposium on VLSI Technology, 2010, pp. 131-132.
Kim, W., et al., "Multi-layered Vertical Gate NAND Flash overcoming stacking limit for terabit density storage", Symposium on VLSI Technology Digest of Technical Papers, 2009, pp. 188-189.
Dicioccio, L., et al., "Direct bonding for wafer level 3D integration", ICICDT 2010, pp. 110-113.
Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate- All-Around or Independent Gates (@Flash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D Ic Structures", proceedings VLSI Multi Level Interconnect Conference 2004, pp. 73-74.
Rajendran, B., "Sequential 3D Ic Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D Cmos Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

(56) References Cited

OTHER PUBLICATIONS

Dong, C. et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M. et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S. et al., "CELONCEL: Effective Design Technique for 3-D Monolithic Integration targeting High Performance Integrated Circuits", *Asia pacific DAC 2011*, paper 4A-4.

Choudhury, D., "3D Integration Technologies for Emerging Microsystems", IEEE Proceedings of the IMS 2010, pp. 1-4.

Lee, Y.-J., et al., "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

Park, J.-H., et al., "N-Channel Germanium MOSFET Fabricated Below 360 . by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Radu, I., et al., "Recent Developments of Cu—Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.

Souri, S. J., "Interconnect Performance in 3-Dimensional Integrated Circuits", PHD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D Ic Design on Repeater Usage", Proceedings of International VLSI/ULSI Multi-level Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From The Future Si Technology Perspective: Challenges and Opportunities", IEDM 2010, pp. 1.1.1-1.1.9.

Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

(56)     References Cited

OTHER PUBLICATIONS

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Sadaka, M., et al., "Building Blocks for wafer level 3D integration", www.electroiq.com, Aug. 18, 2010, last accessed Aug. 18, 2010.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional Ics, Having Four Stacked Active Device Layers," IEDM 1989, paper 34.6, pp. 837-840.

Gaillardon, P-E., et al., "Can We Go Towards True 3-D Architectures?," DAC 2011, paper 58, pp. 282-283.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunties in 3D CMOS Sequential Integration," 2011 IEEE International Electron Devices Meeting, paper 7.3, Dec. 2011, pp. 151-154.

Yun, C. H., et al., "Transfer of patterned ion-cut silicon layers", Applied Physics Letters, vol. 73, No. 19, Nov. 1998, pp. 2772-2774.

Ishihara, R., et al., "Monolithic 3D-ICs with single grain Si thin film transistors," Solid-State Electronics 71 (2012) pp. 80-87.

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, J., et al., "A Stacked Memory Device on Logic 3D Technology for Ultra-high-density Data Storage," Nanotechnology, vol. 22, 254006 (2011).

Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, (Aug. 2010) pp. 304-319.

Bernstein, K., et al., "Interconnects in the Third Dimension: Design Challenges for 3DICs," Design Automation Conference, 2007, DAC'07, 44th ACM/IEEE, vol. No., pp. 562-567, Jun. 4-8, 2007.

Kuroda, T., "ThruChip Interface for Heterogeneous Chip Stacking," ElectroChemicalSociety Transactions, 50 (14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

Qiang, J-Q, "3-D Hyperintegration and Packaging Technologies for Micro-Nano Systems," Proceedings of the IEEE, 97.1 (2009) pp. 18-30.

Lee, B.H., et al., "A Novel Pattern Transfer Process for Bonded SOI Giga-bit DRAMs," Proceedings 1996 IEEE International SOI Conference, Oct. 1996, pp. 114-115.

Wu, B., et al., "Extreme ultraviolet lithography and three dimensional circuits," Applied Physics Reviews, 1, 011104 (2014).

Delhougne, R., et al., "First Demonstration of Monocrystalline Silicon Macaroni Channel for 3-D NAND Memory Devices" IEEE VLSI Tech Digest, 2018, pp. 203-204.

Kim, J., et al.; "A stacked memory device on logic 3D technology for ultra-high-density data storage"; Nanotechnology 22 (2011) 254006 (7pp).

Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to -49.

Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to 405.

Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697 to 700.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

(56)　　　　　References Cited

OTHER PUBLICATIONS

Kim, J.Y., et al., "The excellent scalability of the RCAT (recess-channel-array-transistor) technology for sub-70nm DRAM feature size and beyond," 2005 IEEE Vlsi-Tsa International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development , vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et.al., "Nickel vs. Cobalt Silicide integration for sub-50nm Cmos", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to -2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, 13-15, Dec. 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Vengurlekar, A., et al., "Mechanism of Dopant Activation Enhancement in Shallow Junctions by Hydrogen", Proceedings of the Materials Research Society, vol. 864, Spring 2005, E9.28.1-6.

Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.

Guo, X. et al., "Cascade single-chip phosphor-free white light emitting diodes," Applied Physics Letters, 2008, pp. 013507-1-013507-3, vol. 92.

Takafuji, Y. et al., "Integration of Single Crystal Si TFTs and Circuits on a Large Glass Substrate," IEEE International Electron Devices Meeting (IEDM), Dec. 7-9, 2009, pp. 1-4.

Wierer, J.J. et al., "High-power AlGalnN flip-chip light-emitting diodes," Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al., "Autonomous Refresh of Floating Body Cell (FBC)", International Electron Device Meeting, 2008, pp. 801-804.

Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.

Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.

Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.

Chen, W., et al., "InP Layer Transfer with Masked Implantation," Electrochemical and Solid-State Letters, Issue 12, No. 4, Apr. 2009, H149-150.

Feng, J., et al., "Integration of Germanium-on-Insulator and Silicon MOSFETs on a Silicon Substrate," IEEE Electron Device Letters, vol. 27, No. 11, Nov. 2006, pp. 911-913.

(56) References Cited

OTHER PUBLICATIONS

Zhang, S., et al., "Stacked CMOS Technology on SOI Substrate," IEEE Electron Device Letters, vol. 25, No. 9, Sep. 2004, pp. 661-663.

Brebner, G., "Tooling up for Reconfigurable System Design," IEE Colloquium on Reconfigurable Systems, 1999, Ref. No. 1999/061, pp. 2/1-2/4.

Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.

Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.

Valsamakis, E.A., "Generator for a Custom Statistical Bipolar Transistor Model," IEEE Journal of Solid-State Circuits, Apr. 1985, pp. 586-589, vol. SC-20, No. 2.

Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.

Gosele, U., et al., "Semiconductor Wafer Bonding," Annual Review of Materials Science, Aug. 1998, pp. 215-241, vol. 28.

Spangler, L.J et al., "A Technology for High Performance Single-Crystal Silicon-on-Insulator Transistors," IEEE Electron Device Letters, Apr. 1987, pp. 137-139, vol. 8, No. 4.

Larrieu, G., et al., "Low Temperature Implementation of Dopant-Segregated Band-edger Metallic S/D junctions in Thin-Body SOI p-MOSFETs", Proceedings IEDM, 2007, pp. 147-150.

Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

Khater, M.H., et al., "High-k/Metal-Gate Fully Depleted Soi Cmos With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings DATE, pp. 1338-1343.

Mclaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.

Sellathamby, C.V., et al., "Non-contact wafer probe using wireless probe cards", (2005) Proceedings—International Test Conference, 2005, pp. 447-452.

Jung, S.-M., et al., "Soft Error Immune 0.46pm2 SRAM Cell with MIM Node Capacitor by 65nm CMOS Technology for Ultra High Speed Sram", IEDM 2003, pp. 289-292.

Brillouet, M., "Emerging Technologies on Silicon", IEDM 2004, pp. 17-24.

(56) References Cited

OTHER PUBLICATIONS

Meindl, J. D., "Beyond Moore's Law: The Interconnect Era", IEEE Computing in Science & Engineering, Jan./Feb. 2003, pp. 20-24.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS MANTECH Conference, May 14-17, 2007 Austin, Texas, pp. 33-36.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation Of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on Soi", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen- implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, A., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

(56) References Cited

OTHER PUBLICATIONS

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process": A New SOI wafer fabrication method, Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol. No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

* cited by examiner

200

208
WL direction

206
BL direction

204
N+ region

202
P region

204
N+ region

202
P region

202
P
region

204
N+
region

200

202
P
region

204
N+ region

212
N+ protection
regions

200

BL direction WL direction

241

212 N+ protection regions

204  N+ region

202  P region

WL direction

BL direction

204  N+ region

215

215

222

212    N+ region

204

222

WL direction

BL direction

212

204

221

222

225

224
O/N/O

BL direction

WL direction 212
204
222
225
224
O/N/O 226
227
225
BL direction
WL direction

Remove implantation mask

302
N+
protection
layer

N+ region

P region

WL direction

BL direction

Deposit first ONO and first gate
Deposit hard mask
Pattern hardmask

Pattern first gate, first ONO, and exposed P-Si regions a remaining hard mask region a remaining top gate region a remaining P region Form second ONO and second gate
CMP the second ONO and second gate

GLtop,m
506

N+
S/D

GLleft side,m
509

GLright side,m
508

N+
S/D

P
Channel

Bit1
Bit2
Bit3
Bit4
Bit5
Bit6

| Operation | S/D$_n$ | S/D$_{n+1}$ | Other S/D | GL$_{top,m}$ | GL$_{left side,m}$ | GL$_{right side,m}$ | Other GLs |
|---|---|---|---|---|---|---|---|
| Write bit 1 | 0 V | 4.0 V | Floating | 8 V | 0 V | 0 V | 0 V |
| Write bit 2 | 4.0 V | 0 V | Floating | 8 V | 0 V | 0 V | 0 V |
| Erase bit 1 | 0 V | 4.0 V | Floating | -8 V | 0 V | 0 V | 0 V |
| Erase bit 2 | 4.0 V | 0 V | Floating | - 8 V | 0 V | 0 V | 0 V |
| Read on top channel (S/D$_n$ and S/D$_{n+1}$ swapping) | 1.0 → 0 V | 0 → 1.0 V | Floating | 4 V | 0 V | 0 V | 0 V |
| Write bit 3 | 0 V | 4.0 V | Floating | 0 V | 8 V | 0 V | 0 V |
| Write bit 4 | 4.0 V | 0 V | Floating | 0 V | 8 V | 0 V | 0 V |
| Erase bit 3 | 0 V | 4.0 V | Floating | 0 V | -8 V | 0 V | 0 V |
| Erase bit 4 | 4.0 V | 0 V | Floating | 0 V | - 8 V | 0 V | 0 V |
| Read on left side channel (S/D$_n$ and S/D$_{n+1}$ swapping) | 1.0 → 0 V | 0 → 1.0 V | Floating | 0 V | 4 V | 0 V | 0 V |
| Write bit 5 | 0 V | 4.0 V | Floating | 0 V | 0 V | 8 V | 0 V |
| Write bit 6 | 4.0 V | 0 V | Floating | 0 V | 0 V | 8 V | 0 V |
| Erase bit 5 | 0 V | 4.0 V | Floating | 0 V | 0 V | -8 V | 0 V |
| Erase bit 6 | 4.0 V | 0 V | Floating | 0 V | 0 V | - 8 V | 0 V |
| Read on right side channel (S/D$_n$ and S/D$_{n+1}$ swapping) | 1.0 → 0 V | 0 → 1.0 V | Floating | 0 V | 0 V | 4 V | 0 V |

Fig. 6

| Operation | $S/D_n$ | $S/D_{n+1}$ | Other S/D | $GL_{top,m}$ | $GL_{left\ side,m}$ | $GL_{right\ side,m}$ | Other GLs |
|---|---|---|---|---|---|---|---|
| Write bit 1 | 0 V | 4.0 V | Floating | 8 V | -4 V | 0 V | 0 V |
| Write bit 2 | 4.0 V | 0 V | Floating | 8 V | -4 V | 0 V | 0 V |
| Erase bit 1 | 0 V | 4.0 V | Floating | -8 V | -4 V | 0 V | 0 V |
| Erase bit 2 | 4.0 V | 0 V | Floating | -8 V | -4 V | 0 V | 0 V |
| Read on top channel ($S/D_n$ and $S/D_{n+1}$ swapping) | $1.0 \to 0$ V | $0 \to 1.0$ V | Floating | 4 V | -4 V | 0 V | 0 V |
| Write bit 3 | 0 V | 4.0 V | Floating | 8 V | 0 V | -4 V | 0 V |
| Write bit 4 | 4.0 V | 0 V | Floating | 8 V | 0 V | -4 V | 0 V |
| Erase bit 3 | 0 V | 4.0 V | Floating | -8 V | 0 V | -4 V | 0 V |
| Erase bit 4 | 4.0 V | 0 V | Floating | -8 V | 0 V | -4 V | 0 V |
| Read on left side channel ($S/D_n$ and $S/D_{n+1}$ swapping) | $1.0 \to 0$ V | $0 \to 1.0$ V | Floating | 4 V | 0 V | -4 V | 0 V |

Fig. 8

| Operation | S/D$_n$ | S/D$_{n+1}$ | Other S/D | GL$_{top,m}$ | GL$_{left side,m}$ | GL$_{right side,m}$ | Other GLs |
|---|---|---|---|---|---|---|---|
| Write bit 1 | 0 V | 4.0 V | Floating | 8 V | -4 V | 0 V | 0 V |
| Write bit 2 | 4.0 V | 0 V | Floating | 8 V | -4 V | 0 V | 0 V |
| Erase bit 1 | 0 V | 4.0 V | Floating | -8 V | -4 V | 0 V | 0 V |
| Erase bit 2 | 4.0 V | 0 V | Floating | -8 V | -4 V | 0 V | 0 V |
| Read on top channel (S/D$_n$ and S/D$_{n+1}$ swapping) | 1.0 → 0 V | 0 → 1.0 V | Floating | 4 V | -4 V | 0 V | 0 V |
| Write bit 3 | 0 V | 4.0 V | Floating | 8 V | 0 V | -4 V | 0 V |
| Write bit 4 | 4.0 V | 0 V | Floating | 8 V | 0 V | -4 V | 0 V |
| Erase bit 3 | 0 V | 4.0 V | Floating | -8 V | 0 V | -4 V | 0 V |
| Erase bit 4 | 4.0 V | 0 V | Floating | -8 V | 0 V | -4 V | 0 V |
| Read on left side channel (S/D$_n$ and S/D$_{n+1}$ swapping) | 1.0 → 0 V | 0 → 1.0 V | Floating | 4 V | 0 V | -4 V | 0 V |
| Write bit 5 | 0 V | 4.0 V | Floating | 8 V | -4 V | -4 V | 0 V |
| Write bit 6 | 4.0 V | 0 V | Floating | 8 V | -4 V | -4 V | 0 V |
| Erase bit 5 | 0 V | 4.0 V | Floating | -8 V | -4 V | -4 V | 0 V |
| Erase bit 6 | 4.0 V | 0 V | Floating | -8 V | -4 V | -4 V | 0 V |
| Read on left side channel (S/D$_n$ and S/D$_{n+1}$ swapping) | 1.0 → 0 V | 0 → 1.0 V | Floating | 4 V | -4 V | -4 V | 0 V |

Fig. 10

18 bit cell

1150

1120 Buried oxide

1110 Bottom gate

1100 Substrate

Fig. 11

18 bit cell

| Operation | $S/D_n$ | $S/D_{n+1}$ | Other S/D | $GL_{riht\,side,m}$ | Bottom Gate | $GL_{top,m}$ | Other GLs |
|---|---|---|---|---|---|---|---|
| Write bit 1r | 0 V | 4.0 V | Floating | 8 V | 4 V | 0 V | 0 V |
| Write bit 2r | 4.0 V | 0 V | Floating | 8 V | 4 V | 0 V | 0 V |
| Erase bit 1r | 0 V | 4.0 V | Floating | -8 V | -4 V | 0 V | 0 V |
| Erase bit 2r | 4.0 V | 0 V | Floating | - 8 V | -4 V | 0 V | 0 V |
| Read on top channel ($S/D_n$ and $S/D_{n+1}$ swapping) | 1.0 → 0 V | 0 → 1.0 V | Floating | 4 V | 4 V | 0 V | 0 V |
| Write bit 3r | 0 V | 4.0 V | Floating | 8 V | 0 V | 4 V | 0 V |
| Write bit 4r | 4.0 V | 0 V | Floating | 8 V | 0 V | 4 V | 0 V |
| Erase bit 3r | 0 V | 4.0 V | Floating | -8 V | 0 V | -4 V | 0 V |
| Erase bit 4r | 4.0 V | 0 V | Floating | - 8 V | 0 V | -4 V | 0 V |
| Read on left side channel ($S/D_n$ and $S/D_{n+1}$ swapping) | 1.0 → 0 V | 0 → 1.0 V | Floating | 4 V | 0 V | 4 V | 0 V |
| Write bit 5r | 0 V | 4.0 V | Floating | 8 V | -4 V | -4 V | 0 V |
| Write bit 6r | 4.0 V | 0 V | Floating | 8 V | -4 V | -4 V | 0 V |
| Erase bit 5r | 0 V | 4.0 V | Floating | -8 V | 4 V | 4 V | 0 V |
| Erase bit 6r | 4.0 V | 0 V | Floating | - 8 V | 4 V | 4 V | 0 V |
| Read on left side channel ($S/D_n$ and $S/D_{n+1}$ swapping) | 1.0 → 0 V | 0 → 1.0 V | Floating | 4 V | -4 V | -4 V | 0 V |

Fig. 13A

| Operation | S/D$_n$ | S/D$_{n+1}$ | Other S/D | GL$_{left\ side,m}$ | Bottom Gate | GL$_{top,m}$ | Other GLs |
|---|---|---|---|---|---|---|---|
| Write bit 1| | 0 V | 4.0 V | Floating | 8 V | -4 V | 0 V | 0 V |
| Write bit 2| | 4.0 V | 0 V | Floating | 8 V | -4 V | 0 V | 0 V |
| Erase bit 1| | 0 V | 4.0 V | Floating | -8 V | -4 V | 0 V | 0 V |
| Erase bit 2| | 4.0 V | 0 V | Floating | - 8 V | -4 V | 0 V | 0 V |
| Read on top channel (S/D$_n$ and S/D$_{n+1}$ swapping) | 1.0 → 0 V | 0 → 1.0 V | Floating | 4 V | -4 V | 0 V | 0 V |
| Write bit 3| | 0 V | 4.0 V | Floating | 8 V | 0 V | -4 V | 0 V |
| Write bit 4| | 4.0 V | 0 V | Floating | 8 V | 0 V | -4 V | 0 V |
| Erase bit 3| | 0 V | 4.0 V | Floating | -8 V | 0 V | -4 V | 0 V |
| Erase bit 4| | 4.0 V | 0 V | Floating | - 8 V | 0 V | -4 V | 0 V |
| Read on left side channel (S/D$_n$ and S/D$_{n+1}$ swapping) | 1.0 → 0 V | 0 → 1.0 V | Floating | 4 V | 0 V | -4 V | 0 V |
| Write bit 5| | 0 V | 4.0 V | Floating | 8 V | -4 V | -4 V | 0 V |
| Write bit 6| | 4.0 V | 0 V | Floating | 8 V | -4 V | -4 V | 0 V |
| Erase bit 5| | 0 V | 4.0 V | Floating | -8 V | -4 V | -4 V | 0 V |
| Erase bit 6| | 4.0 V | 0 V | Floating | - 8 V | -4 V | -4 V | 0 V |
| Read on left side channel (S/D$_n$ and S/D$_{n+1}$ swapping) | 1.0 → 0 V | 0 → 1.0 V | Floating | 4 V | -4 V | -4 V | 0 V |

Fig. 13B

| Crt | Pr0 | Pr1 | Pr2 | Pr3 | Pr4 | Pr5 | Pr6 | Pr7 | Crb |
|-----|-----|-----|-----|-----|-----|-----|-----|-----|-----|
| Pt7 | | | | | | | | | Pb 7 |
| Pt6 | | | | | | | | | Pb 6 |
| Pt5 | | | | | | | | | Pb 5 |
| Pt4 | | | | | | | | | Pb 4 |
| Pt3 | | | | | | | | | Pb 3 |
| Pt2 | | | | | | | | | Pb 2 |
| Pt1 | | | | | | | | | Pb 1 |
| Pt0 | | | | | | | | | Pb 0 |
| Clt | Pl0 | Pl1 | Pl2 | Pl3 | Pl4 | Pl5 | Pl6 | Pl7 | Clb |

Bonding oxide

Handing substrate removal from donor wafer
Crack layer removal and cleaning

2038
Target

Fig. 20E

Backside O/N/O and gate stack

2042

2040

| Operation | S/D$_n$ | S/D$_{n+1}$ | Other S/D | C-Gate | L-Gate | R-Gate | Other GLs |
|---|---|---|---|---|---|---|---|
| Write bit 1 | 0 V | 4.0 V | Floating | 8 V | -4 V | 0 V | 0 V |
| Write bit 2 | 4.0 V | 0 V | Floating | 8 V | -4 V | 0 V | 0 V |
| Erase bit 1 | 0 V | 4.0 V | Floating | -8 V | 4 V | 0 V | 0 V |
| Erase bit 2 | 4.0 V | 0 V | Floating | - 8 V | 4 V | 0 V | 0 V |
| Read on n+1 channel (S/D$_{n+1}$ and S/D$_n$ swapping) | 1.0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | - 8 V | 0 V | -4 V | 0 V |
| Read on n+1 channel (S/D$_{n+1}$ and S/D$_n$ swapping) | 1.0 → 0 V | 0 → 1.0 V | Floating | 4 V | 0 V | 4 V | 0 V |
| Write bit 5 | 0 V | 4.0 V | Floating | 8 V | 2 V | -4 V | 0 V |
| Write bit 6 | 4.0 V | 0 V | Floating | 8 V | 2 V | -4 V | 0 V |
| Erase bit 5 | 0 V | 4.0 V | Floating | -8 V | -2 V | 4 V | 0 V |
| Erase bit 6 | 4.0 V | 0 V | Floating | - 8 V | -2 V | 4 V | 0 V |
| Read on n+1 channel (S/D$_{n+1}$ and S/D$_n$ swapping) | 1.0 → 0 V | 0 → 1.0 V | Floating | 4 V | -2 V | -4 V | 0 V |
| Write bit 7 | 0 V | 4.0 V | Floating | 8 V | -4 V | 2 V | 0 V |
| Write bit 8 | 4.0 V | 0 V | Floating | 8 V | -4 V | 2 V | 0 V |
| Erase bit 7 | 0 V | 4.0 V | Floating | -8 V | 4 V | -2 V | 0 V |
| Erase bit 8 | 4.0 V | 0 V | Floating | - 8 V | 4 V | -2 V | 0 V |
| Read on n+1 channel (S/D$_{n+1}$ and S/D$_n$ swapping) | 1.0 → 0 V | 0 → 1.0 V | Floating | 4 V | -4 V | -2 V | 0 V |

✕ — S/D cut

● — S/D programmed to Ground

☐ — Chanel is programmed to always "on"

▨ — Chanel is programmed to always "off"

⬭ — Chanel is programmed to either 'off' or "on"

▬ — Wire across

⬛ — Gate contact of crossing wire

1) Charge trap/control oxide/Tunnel oxide

1) Deposit channel material such as p-type polysilicon
2) Pattern to form NAND string

1) Source/Drain formation

P region Etch Mask
1) Deposit hard mask
2) Pattern hard mask

Fig. 39A

1)  Etch P-region in between

Etch mask

Fin shaped channel

Patterned region

WL direction

BL direction

1) Tunnel oxide/Charge trap/control oxide
2) Polysilicon deposition for sidewall channel
3) CMP polysilicon
4) Etch back Planarized polysilicon on fin sidewall

O/N/O

3900

1) Deposit hard mask and CMP

WL direction

BL direction

3910

1) Hard mask removal

1) Tunnel oxide/Charge trap/control oxide
2) Polysilicon deposition for top channel
3) CMP polysilicon
4) Etch back 1) Deposit hard mask and CMP 1) Selectively remove the hard mask atop side gate 1) Charge trap/control oxide/Tunnel oxide Deposit channel material such as p-type polysilicon 1) Deposit and pattern implantation mask
2) N+ implant to form source/drain region

1) Remove implant mask
2) Etch back polysilicon layer

1) Form S/D interconnect

Fig. 39M

1) Deposit and pattern implantation mask
2) N+ implant to form source/drain region Built on porous (ELTRAN-like) wafer

4102

4100

Flip bonding to target wafer

4100

4102

4124

4126

4110

Lift off, removal of porous layer, cleaning

4124

4126

4110

Backside ONO poly

4127

Backside poly patterning

4130

Unit Programmable Inter Layer Via

S/D of vertical ILV FET to be connected to the upper tier

4306

Out-of-plane

In-plane

4304

S/D of horizontal FET

4312

Gate shared by
horizontal and vertical FETs

S/D of vertical ILV FET to be connected to the lower tier

4308

4310

Charge trap layer to program ILV

4300

S/D of horizontal FET
4302

ILV programming operation

Control voltage can be fed from upper or lower tier depending on design.

To make normally-on device

To make normally-off device

Floating or 0V

+10 V

4/0V

0/4V

-10 V

Floating or 0V

Current flow

Floating or 0V

+10 V

4/0V

0/4V

+10 V

Floating or 0V

No current flow

Dynamic ILV operation

Connected to upper tier

No current flow

3 V

0V

−3 V

Connected to lower tier

Connected to upper tier

Current flow

3 V

0V

3 V

0V

Connected to lower tier 0V should be applied to S/D in horizontal FET in order to prevent any sneaky current flow through shared S/D connected in-plane.

Selectively form S/D region of ILV FET by epitaxial growth, confined within a sidewall of Gate stack and the etch mask of S/D of horizontal FET.

4702

Deposit and planarize bonding oxide layer

Fig. 47B

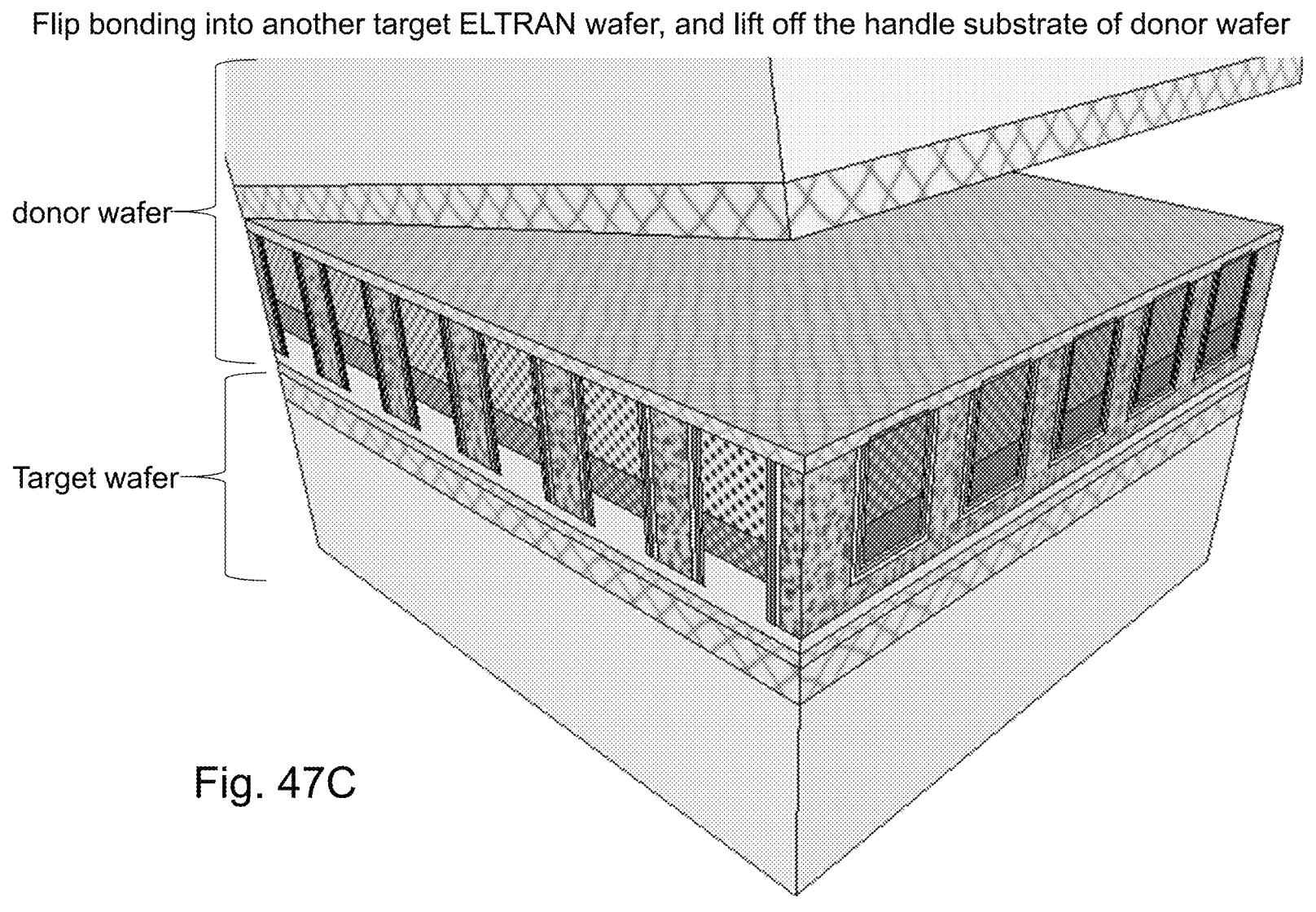

Flip bonding into another target ELTRAN wafer, and lift off the handle substrate of donor wafer donor wafer Target wafer

Fig. 47C

Cleaning and deposit interlayer dielectric

Fig. 47D

Etch hole to expose bottom channel of vertical ILV FET

Fig. 47E

Deposit or epitaxially grow S/D region of vertical ILV FET

STI

4908

4906

4904

4902

Substrate, 5305

Starting Substrate can be bulk, SOI, ELTRAN wafer, etc.

5301

5302 Isolation region

5300
Active region

Active pattern, mesh shaped

5301

Hard mask 5316

Y-gate 5314

5312

Charge trap stack

5300

Active region

5311

5311

5311

Configuration gate patterned along the y-direction, crossing on the isolation region 5324
X-gate P regions
5330

5302

5302

5314
Y-gate

N+ regions
5332

VPGA 3-input LUT.

Fig. 60

Active dummy pattern, mesh shaped for STI process

1) Etch into substrate (could be silicon), followed by STI process

6304 X-Hard Mask for STI formation

6302

Y-Hard Mask for STI formation

6301

After X-Hardmask removal

6312  Y-Hard Mask for STI formation

6318
Channel

6316
Isolation

6301

Self-Aligned Y-O/N/O Gate stack

6312 Y-Hard Mask

6323
Y-O/N/O Gate Stack

6301

Configuration gate patterned along the y-direction, crossing on the isolation region Y-Hard Mask Removal Hard mask 6332

Interconnect 6333
Configuration gate

6334
Charge trap stack

6336
Active region

3D SEMICONDUCTOR MEMORY DEVICE AND STRUCTURE

BACKGROUND OF THE INVENTION

1. Field of the Invention

This application relates to the general field of Integrated Circuit (IC) devices and fabrication methods, and more particularly to NOR architecture non volatile Memory Circuit (NOR-Memory) devices and fabrication methods.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. Memory technology has enjoyed this trend, but now the gains of scaling have slowed and almost stopped. Hence, increases in memory capacity and performance have virtually stalled. There is a need to provide continuing increases in memory capacity and performance.

One way to tackle this is to increase the number of bits per memory cell, effectively increasing the capacity without increasing production cost.

As well, integration of logic and memory needs to be improved, as current methods suffer a high energy cost and large time latency during memory fetches. Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. Patent Application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332 (WO 2019/060798), PCT/US2021/44110, and PCT/US22/44165. The entire contents of all of the foregoing patents, publications, PCTs, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, 10,943,934, 10,998,374, 11,063,071, and 11,133, 344. The entire contents of all of the foregoing patents are incorporated herein by reference.

In a land mark papers at VLSI 2007 and IEDM 2007, Toshiba presented techniques to construct 3D memories which they called BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, these are incorporated herein by reference; we presented multiple 3D memory structures generally constructed by successive layer transfers using ion cut techniques. In this work we are presenting multiple methods and structures to construct 3D memory with monocrystalline channels constructed by alternative methods to ion cut and successive layer transfers. This structure provides the benefit of multiple layers being processed by one lithography step with many of the benefits of a monocrystalline channel, and provides overall lower construction costs.

In addition the entire contents of U.S. patent applications Ser. Nos. 16/786,060, 16/377,238, 15/911,071, 15/344,562, 62/297,857, 62/269,950, 62/258,433, 62/252,448, 62/208, 812, 62/215,112, 62/221,618, 62/246,054, 62/266,610, 62/271,251, 62/276,953 and 62/286,362 are incorporated herein by reference.

SUMMARY

In one aspect, a 3D semiconductor device, the device including: a first level including first single crystal transistors; and a second level including second single crystal transistors, where the first level is overlaid by the second level, where the first level includes a transferred layer and a bonded layer, where the second level is bonded to the first level, where the bonded second level includes oxide to oxide bonds, where the bonded second level includes metal to metal bonds, where the first level includes memory periphery circuits, where the second level includes a plurality of memory cells, and where the first level includes at least one Look up Table ("LUT") circuit.

In another aspect, a 3D semiconductor device, the device including: a first level including first single crystal transistors; and a second level including second single crystal transistors, where the first level is overlaid by the second level, where the first level includes a transferred layer and a bonded layer, where the second level is bonded to the first level, where the bonded second level includes oxide to oxide bonds, where the bonded second level includes metal to metal bonds, where the first level includes memory periphery circuits, where the second level includes a plurality of memory cells, and where the second level includes at least one half latch.

In another aspect, a 3D semiconductor device, the device including: a first level including first single crystal transistors; and a second level including second single crystal transistors, where the first level is overlaid by the second level, where the first level includes a transferred layer and a bonded layer, where the second level is bonded to the first level, where the bonded second level includes oxide to oxide bonds, where the bonded second level includes metal to metal bonds, where the first level includes memory periphery circuits, where the second level includes a plurality of memory cells, and where the first level includes a digital-to-analog converter circuit.

BRIEF DESCRIPTION OF THE DRAWINGS

Various embodiments of the invention will be understood and appreciated more fully from the following detailed description, taken in conjunction with the drawings in which:

FIGS. 3A-3D are example illustrations of an alternative processing and formation of 2D HD-NOR array structures;

FIG. 6 is a table of exemplary write, erase or read conditions for the memory cell of FIGS. 5A and 5B;

FIG. 8 is a table of exemplary write, erase or read conditions for the memory cell of FIG. 7;

FIG. 10 is a table of exemplary write, erase or read conditions for the memory cell of FIG. 9;

FIG. 11 is an example illustration of a memory structure with a bottom gate;

FIGS. 13A and 13B are tables of exemplary write, erase or read conditions for the memory cell of FIG. 12;

FIG. 15 is an example illustration of an exemplary architecture of a HD-NOR array;

FIGS. 20A-20G are example illustrations of the formation of HD-NOR structures;

FIG. 22 is an example illustration of operating conditions for the cell of FIG. 21;

FIGS. 38A-38D are example illustrations of additional NAND memory added to a HD-NOR structure;

FIGS. 47A-47F are example illustrations of formation of an HD NOR cell programmable via;

FIG. 60 is an example illustration of a table for the programming of the two NAND rows of FIG. 59 to support LUT-2 functionality;

DETAILED DESCRIPTION

Figure 1A:
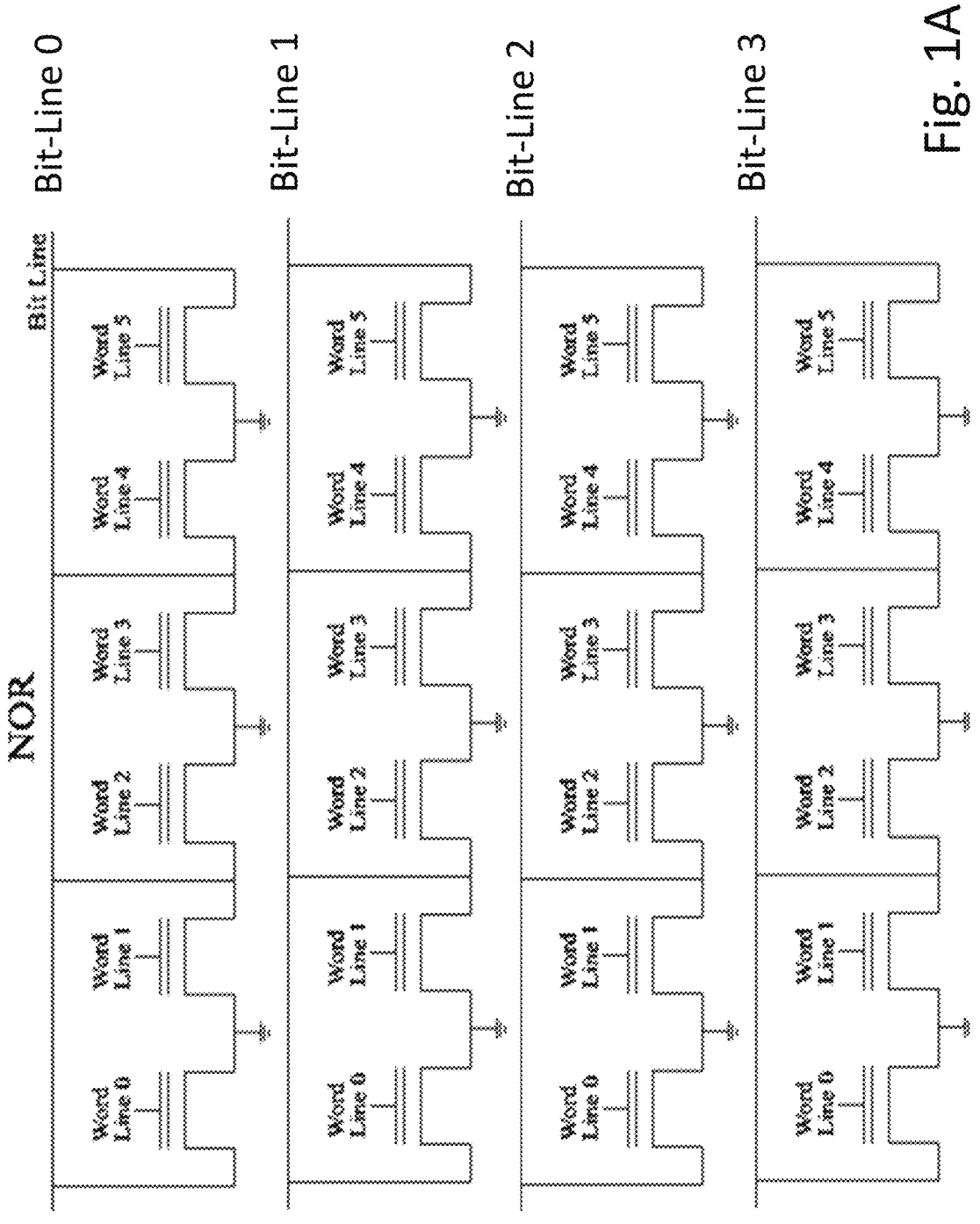
FIGS. 1A-1B are example schematics of prior art NOR and NAND non-volatile (NV) memory.

An embodiment or embodiments of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Memory cells could be constructed with conventional N type or P type transistors where the channel doping may be of opposite type with respect to the source drain doping or the memory cell could utilize a junction-less transistor construction where the gate could fully deplete the channel when in the off-state. For some architectures, the junction-less transistor is attractive as it may take less processing steps (or provide other device advantages such a low leakage off-state) to form the memory array without the need to form a change in doping along the transistor.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

This application incorporates by reference herein the previous related U.S. patent application Ser. No. 14/874,366, 62/252,448, 62/258,433 and 62/269,950 by the same inventors.

Figure 1B:
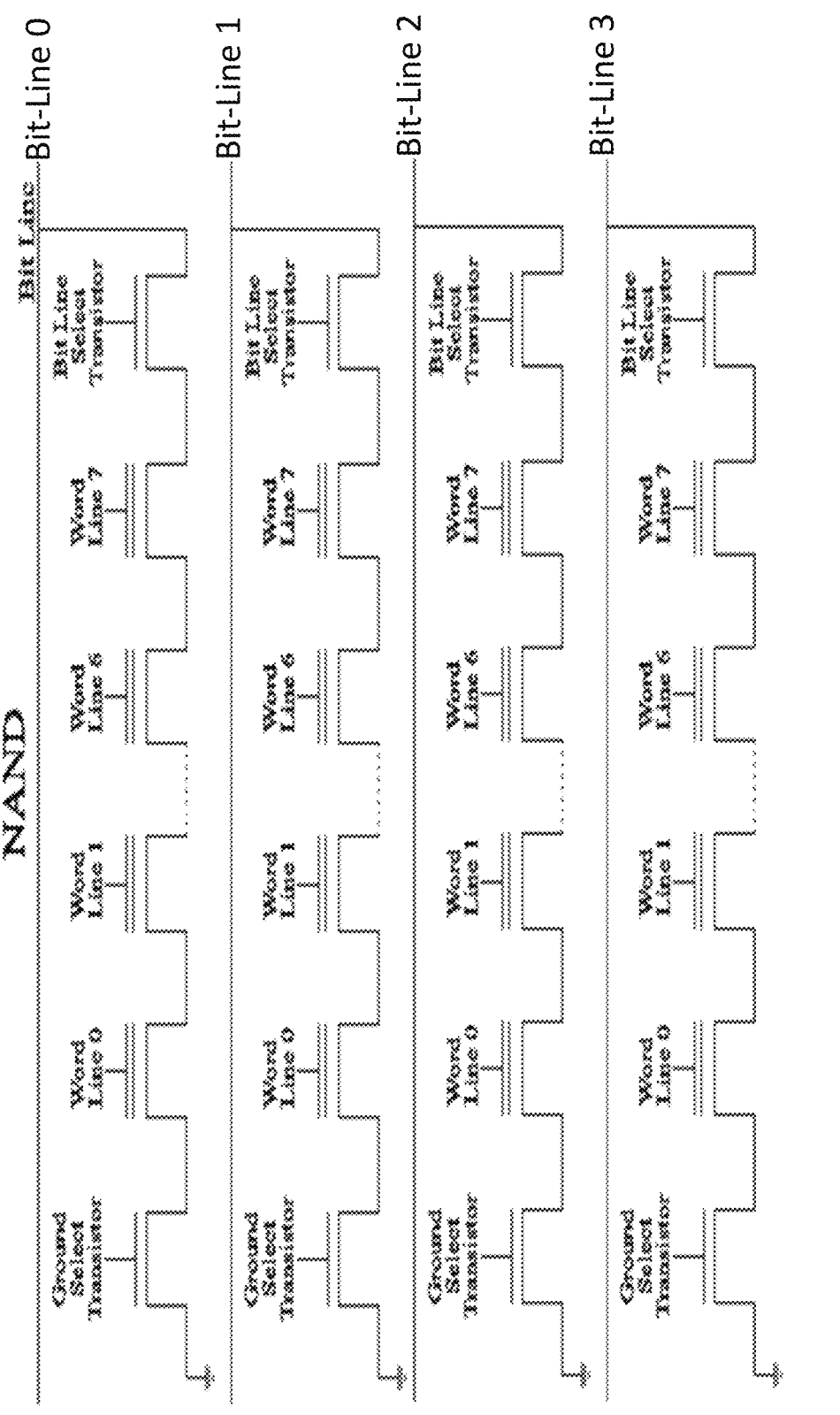

Memory architectures include at least two important types—NAND and NOR. FIG. 1A is a schematic illustration of prior art NOR architecture. FIG. 1B is a schematic illustration of prior art NAND architecture. As illustrated in NOR architecture the memory control lines, bit-lines and word-lines, provide direct access to each memory cell and accordingly quick access. The drawback is the extra area for the contact for each cell resulting in an overall larger area per bit for such architecture.

In contrast the NAND architecture illustrated in FIG. 1B connects memory cells in a daisy chain with source or drain (S/D) contact only at the two ends of the chain. To control a specific cell within the chain all the gates of the other cells in the chain would need to be set to an 'on' state so the signal provided at the chain edge reaches the specific cell within the chain to read or write. NAND architectures require a smaller area per cell than NOR, but would require more time to access an individual cell.

Currently the market has made a clear choice, choosing reducing bit cost even if it results in a much longer memory access.

Figure 1D:
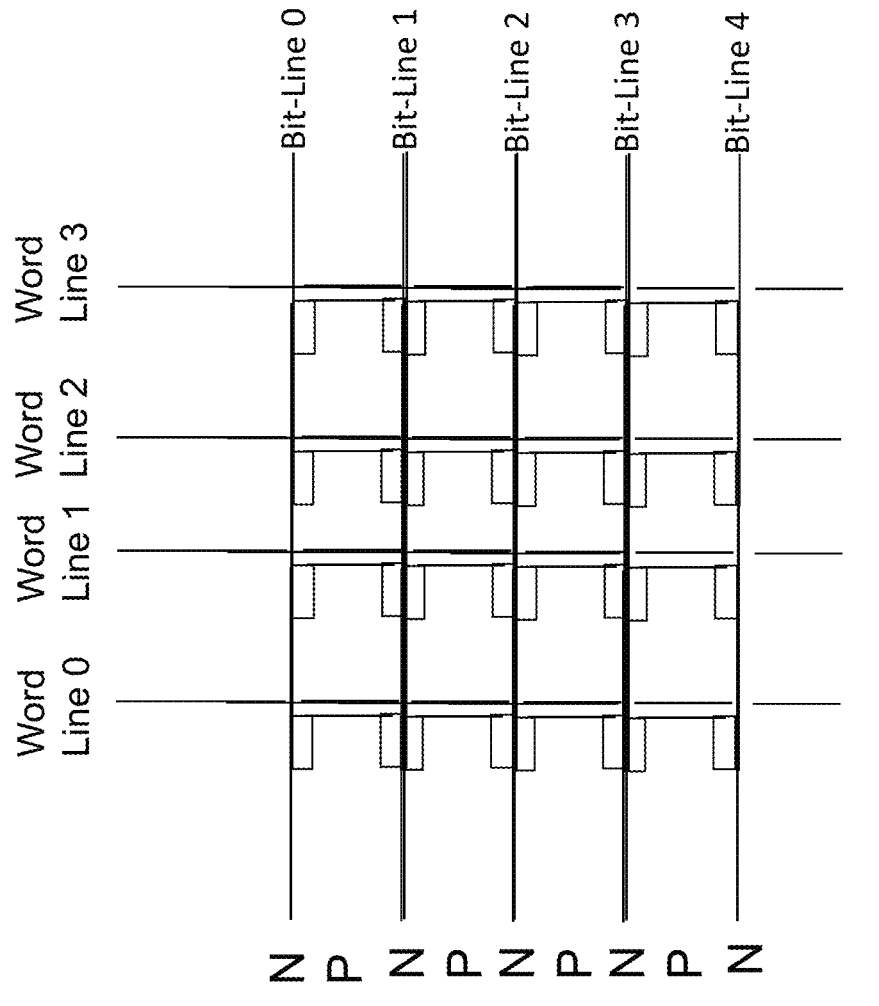
FIGS. 1C and 1D are example schematics of a new HD-NOR non-volatile (NV) memory bit cell and exemplary small array.
Figure 1C:
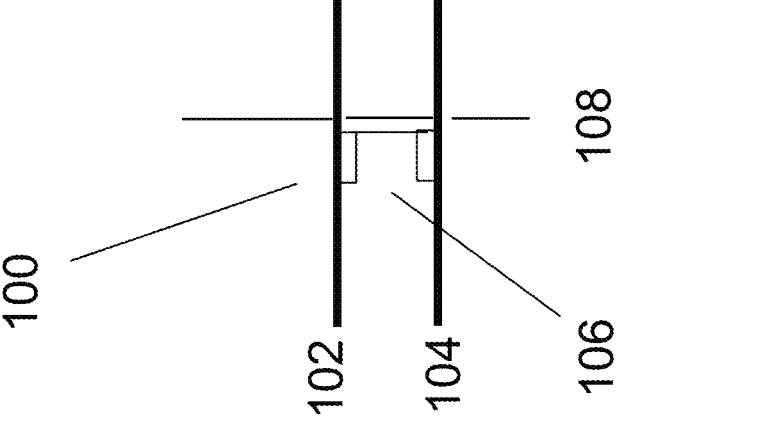

As illustrated in FIG. 1C, a schematic of a bit cell 100 of a new NOR architecture which provides both high speed access and high density—HD-NOR—is shown. The new NOR architecture and bit cell 100 leverage a new class of 3D transistor which maybe formed on many substrates, for example, bulk or SOI wafers. The bit-lines or source lines, first bit/source line 102 and second bit/source line 104, may be formed from N+ silicon strips, which may also act as the individual cell source or drain (S/D). The bit line or source lines are versatile; for example, when one line first bit/source line 102 acts as bit line, another line second bit/source line 104 becomes a source line. Also, the bit line and source line swapping may be used to implement mirror bit operation. In between first bit/source line 102 and second bit/source line 104 may be disposed p type channel 106. Gate 108, which could be made with doped polysilicon for example, going in the vertical direction (substantially orthogonal to bit lines) may function as the word-lines. FIG. 1D illustrates an exemplary small memory array constructed from such a bit-cell.

The architecture referred to by naming as HD-NOR and illustrated herein in reference to FIG. 1C to 3D and in similar illustrations herein is also similar to a structure called in the art AND nonvolatile memory architecture as presented in a patent such as U.S. Pat. No. 7,414,889, and as 1T MONOS as in a paper by Hidenori Mitani et al titled "A 90 nm Embedded 1T-MONOS Flash Macro for Automotive Applications . . ." presented at ISSCC 2016, both incorporated herein by reference.

FIG. 2A to FIG. 2J will be used to illustrate exemplary fabrication steps for processing and forming an HD-NOR array.

Figure 2A:
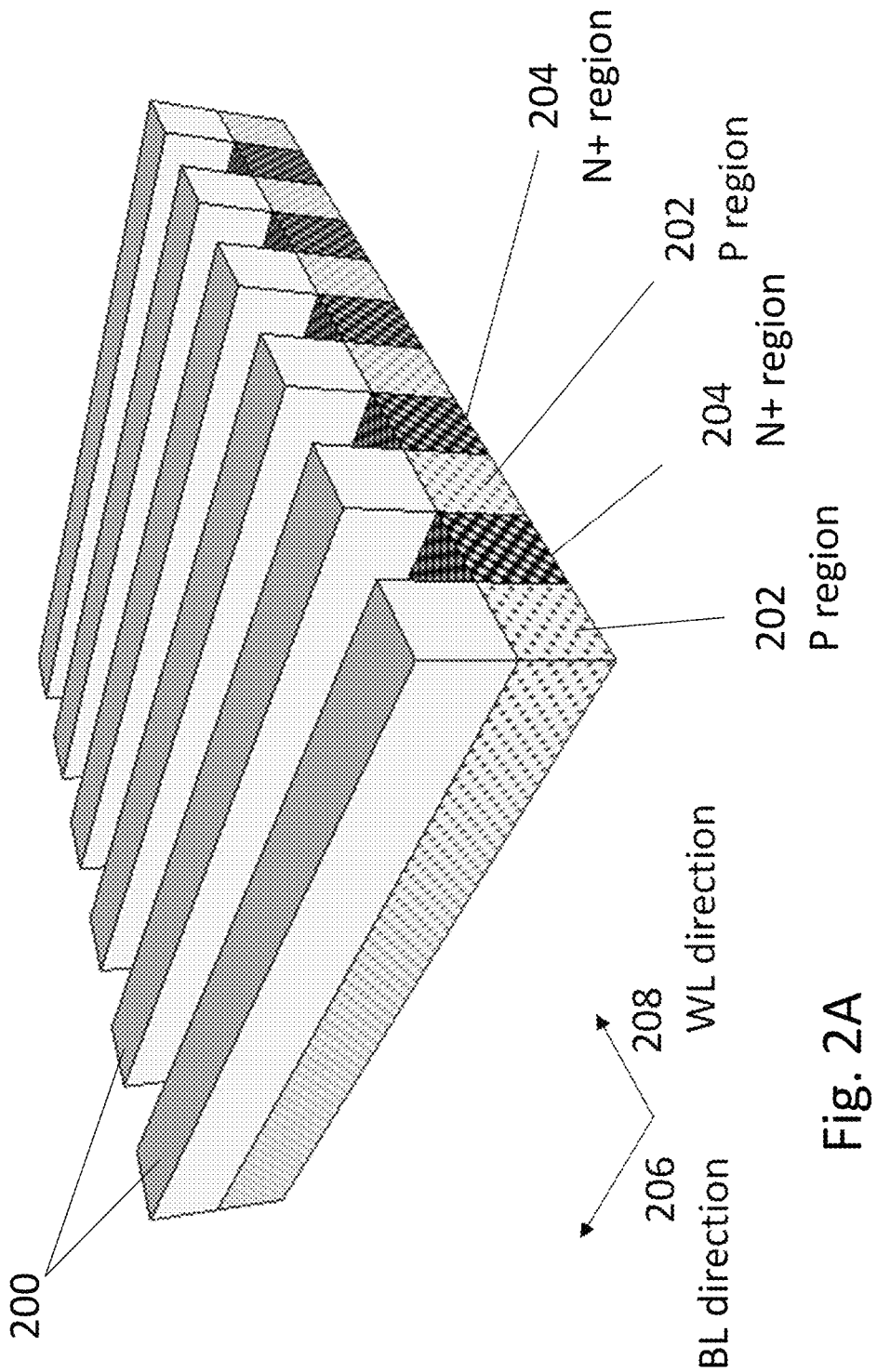
FIGS. 2A-2K are example illustrations of processing and forming 2D HD-NOR array structures.

FIG. 2A illustrates a structure of a small portion of an exemplary HD-NOR in a fabrication process. The base silicon may be, for example, a P-doped bulk or an SOI substrate. The base silicon may be patterned with strips of implant masking regions 200 such as silicon oxide to keep the strips under it as P regions 202 (nominally the original P concentration of the base silicon, but may be modified as known in the art via, for example, ion implantation) while the non implant-mask strips in between the strips of implant masking regions 200 may be ion-implanted to form N+ regions 204. Other doping methods, for example, gas phase or solid phase diffusion may be used. These N+ strips of N+ regions 204 may serve as the bit line(s) in one direction, BL direction 206, and also as the future bit cell's source or drain (S/D). The word-lines will be formed later going in an orthogonal direction to BL direction 206, such as WL direction 208. The bulk of the substrate is not shown to simply the drawing.

Figures 2B, 2C:
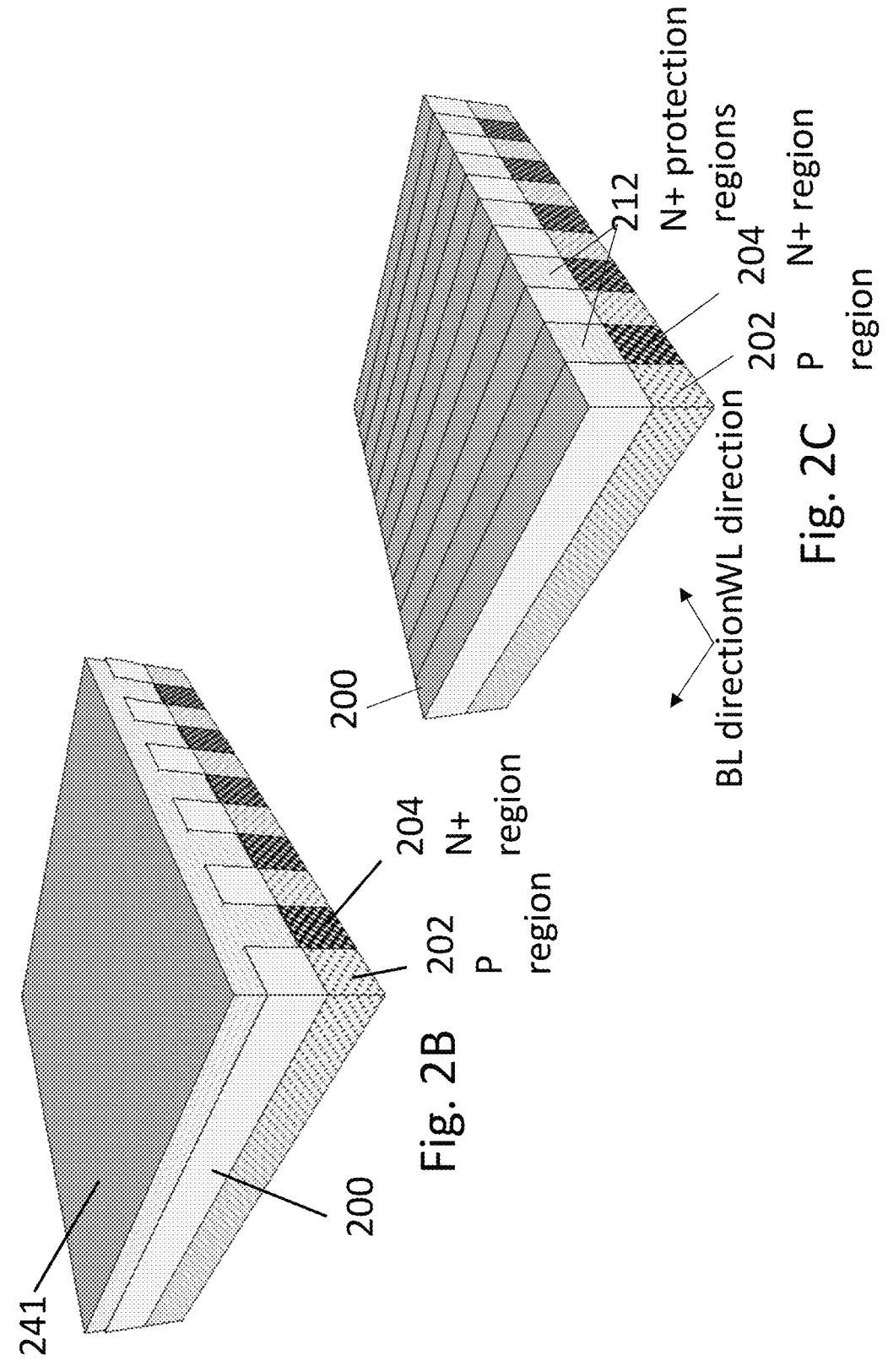

FIG. 2B illustrates the structure after covering the structure of FIG. 2A with a hard mask material 241 such as silicon nitride, which may be accomplished by a deposition. The hard mask material 241 may have sufficient etching selectivity in respect to the hard mask material 200.

FIG. 2C illustrates the structure after the hard mask material 241 had been polished down using, for example, Chemical Mechanical Polishing (CMP), or alternative process, to expose the implant masking strips 200 leaving the resultant hard mask material N+ protection regions 212 protecting the N+ regions 204. This results in self alignment of the N+ protection regions 212 to N+ regions 204.

Figures 2D, 2E:
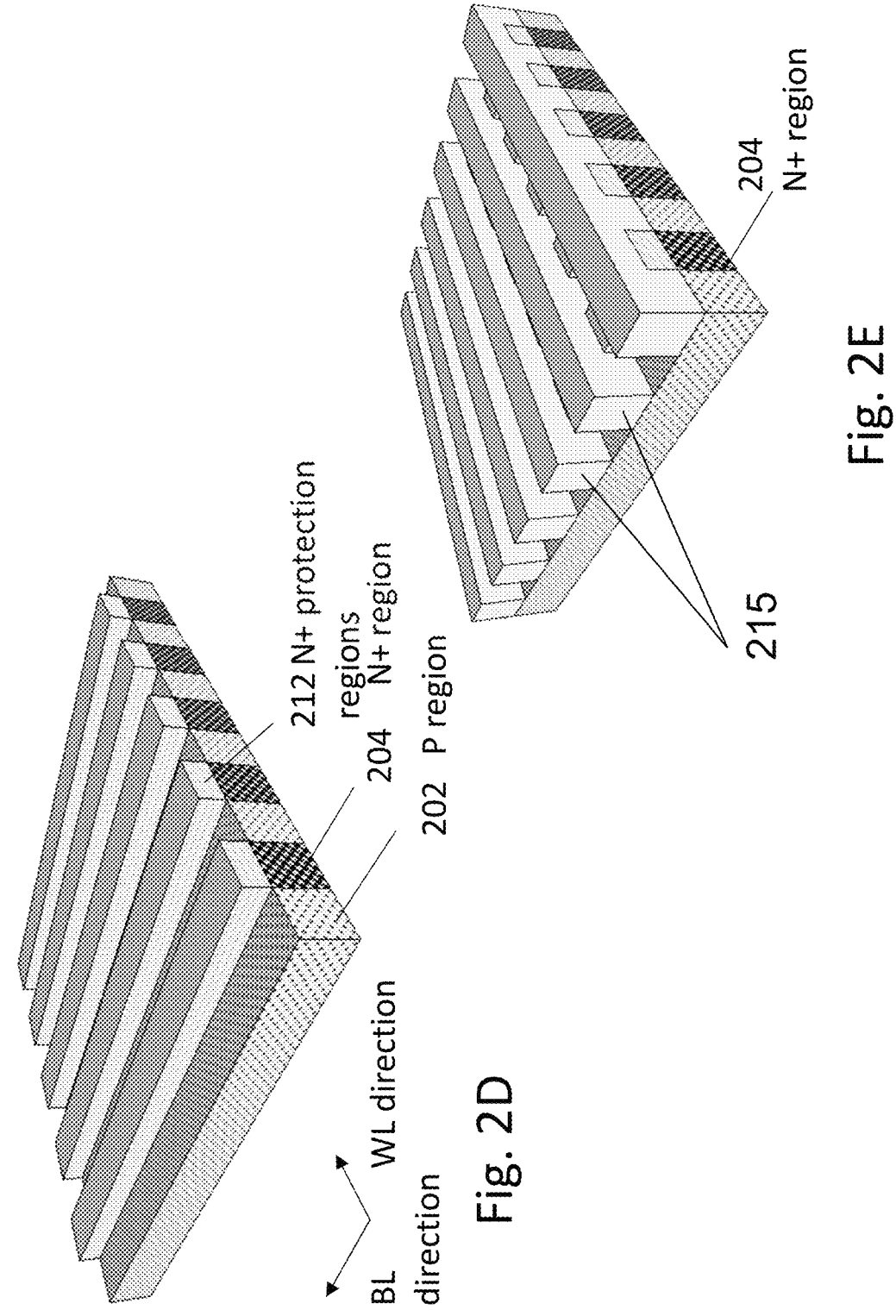

FIG. 2D illustrates the structure after selectively removing the implant protection masking regions 200, leaving the P regions 202 exposed while the N+ regions 204 are still protected by N+ protection regions 212.

FIG. 2E illustrates the structure after deposition of an etch protection layer and patterning it to form orthogonal strips etch mask regions 215 such as silicon dioxide in the word-line direction.

Figure 2F:
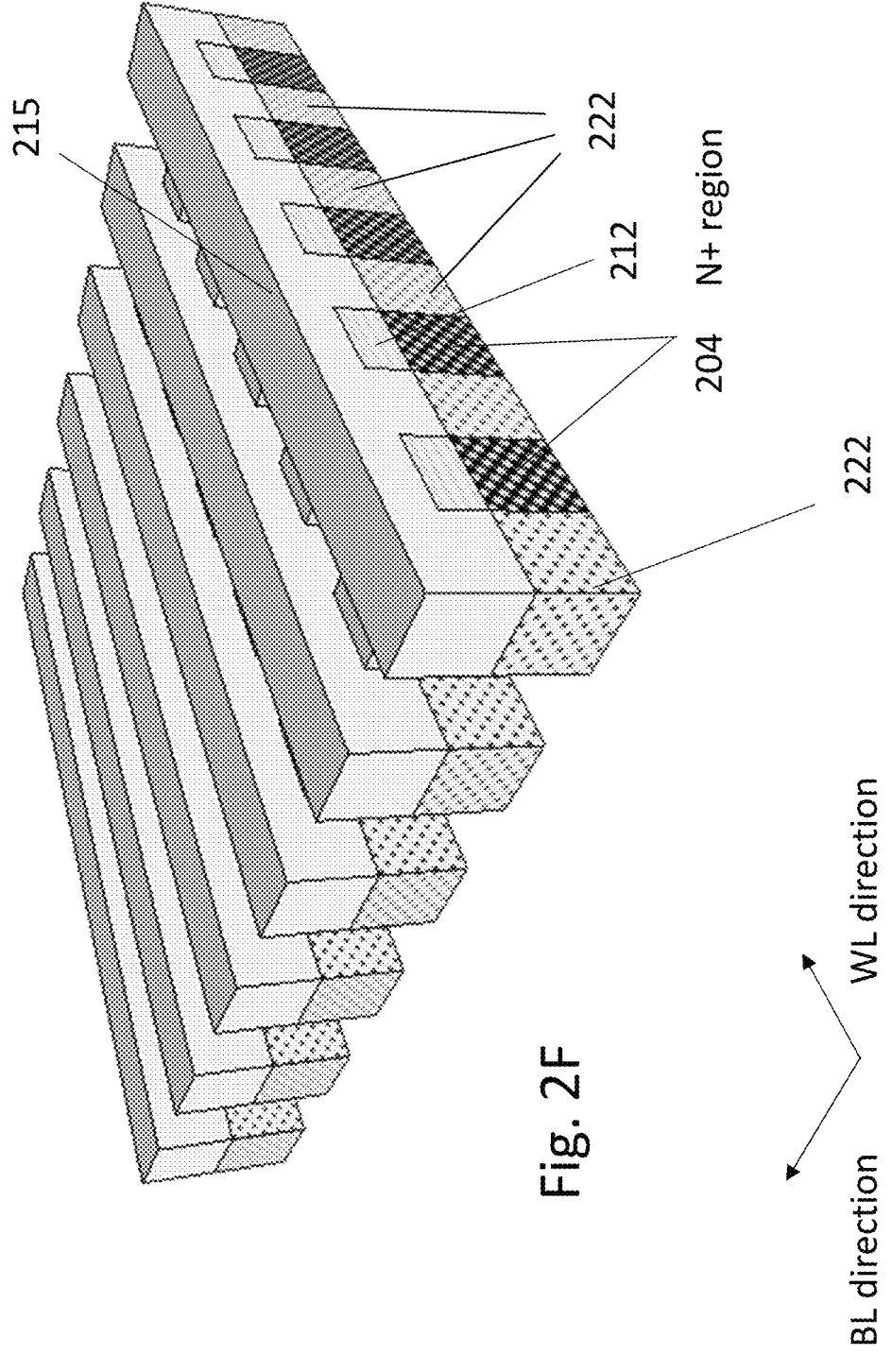
Figure 2G:
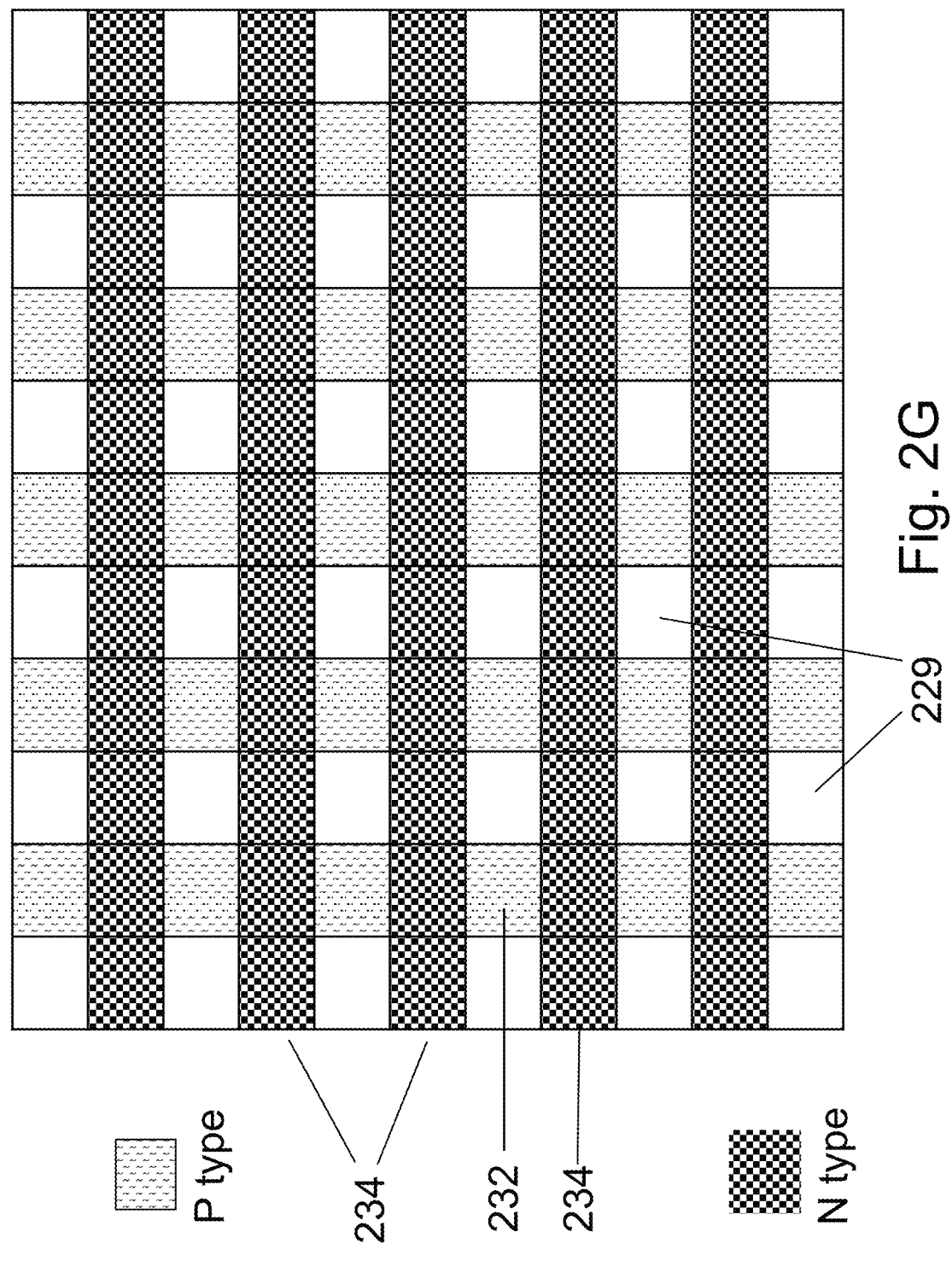

FIG. 2F illustrates the structure after etching the unprotected portions of P regions 202, thus forming p-regions 222. This results in S/D strips (N-regions 204) going in the bit-line direction with fully isolated P regions 222 disposed in between these S/D strips. Effectively forming an array of Fin shaped channels placed periodically between strips of N+ silicon which serve as the future transistor S/Ds and also as the bit-lines. In one embodiment, the fin height can be from 10 nm to 100 nm, the fin width can be 10 nm to 100 nm. FIG. 2G illustrates the resulting structure at the silicon layer from a top view. The etch portions 229 of the P regions—the removed portion of the original P regions 202 P strips would function as isolations between bit cell channels 232, and as will be explained later, this removed portion will be used to accommodate the sidewall gate stack. The original N+ regions 204 strips would act as the bit cell S/D and also as the bit-lines 234.

Figure 2H:
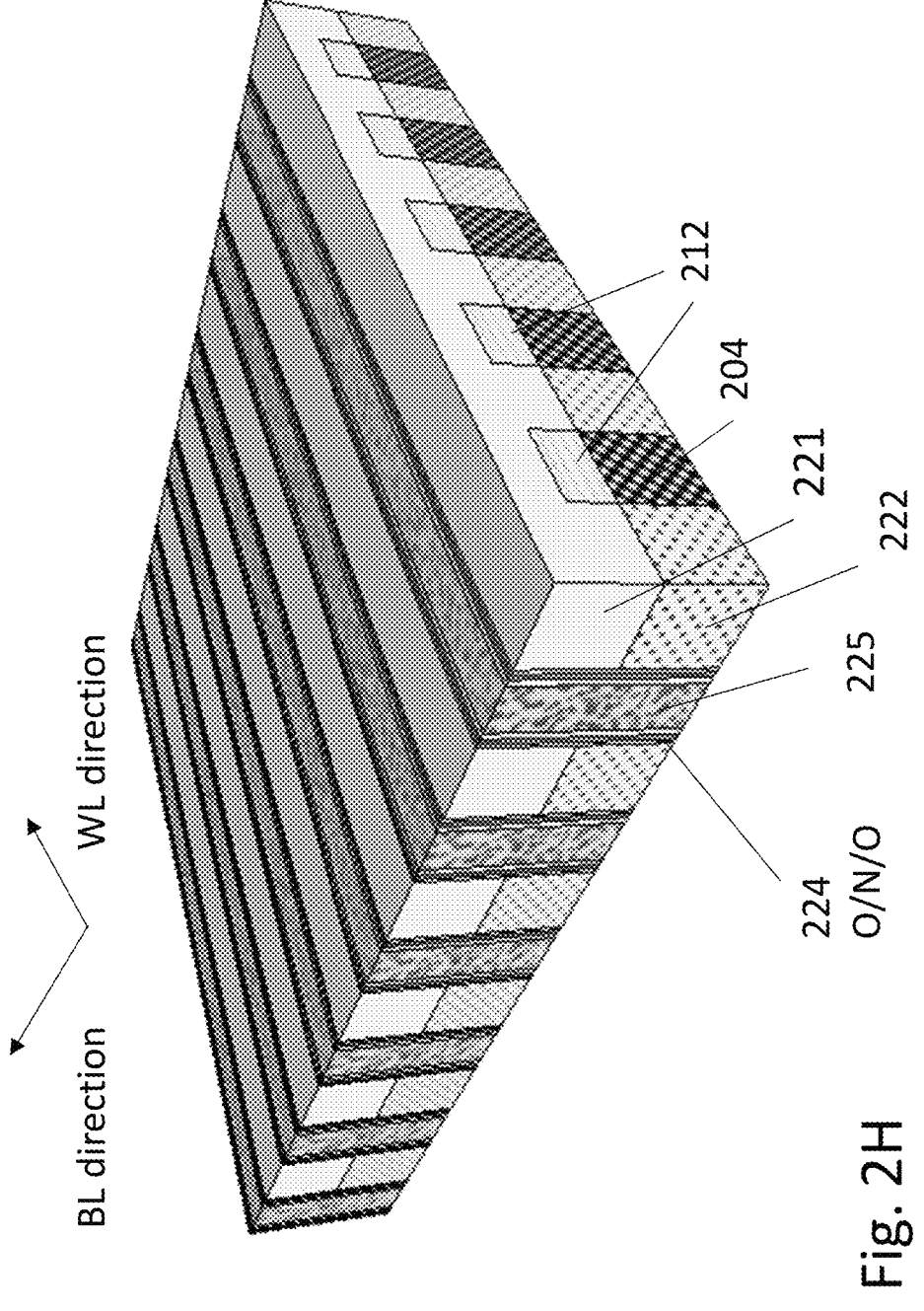

FIG. 2H illustrates the structure after the side gate structures/stack for the array, which may include a gate dielectric by first a deposition of a Tunnel oxide then a Charge trap layer and then a control oxide layer. These three layers are commonly called O/N/O 224 layers, but may comprise other materials and combinations known in the art for charge trapping. For example, the charge trap layer may be semiconductor quantum dots or metallic quantum dots where these dot size ranges from 1 nm to 10 nm. Alternatively, the charge trap layer may be high-k dielectric such as $HfO_2$ or it nitride. For simplicity herein the term ONO or O/N/O would be used to denote structures which include a charge trap layer/region and support barrier layers/regions which may allow controlled transfer of charge into or out of the charge trap layer. Such O/N/O stack could comprise material described herein or other material combinations including materials that have been included in a review paper by Chun Zhao et al titled: "Review on Non-Volatile Memory with High-k Dielectrics: Flash for Generation Beyond 32 nm"

published in Materials 2014, 7, 5117-5145; doi:10.3390/ma7075117, incorporated herein by reference. These layers could be deposited using Atomic Layer Deposition (ALD) techniques or compatible alternative. Then the side gate material 225 such as polysilicon may be deposited using Chemical Vapor Deposition (CVD) techniques or compatible alternative. Then the structure may be polished down using CMP to expose the etch mask 221 (remainder of etch mask regions 215). Consequently, the gate materials are separated by the etch mask 221, and thus each sidewall channel of P regions 222 can be independently controlled by its sidewall gate 225. Thermal oxides, formed by a thermally activated reaction of oxygen or some form of oxygen (such as water), may result in unwanted redistribution of dopants or other materials within the device at the time of that thermal oxidation. One technique to overcome this would be to use radical oxidation for the formation of the tunneling oxide. For example, by a TEL SPA (slot plane antenna) tool/machine, wherein oxygen radicals are generated and utilized to form thin thermal oxides (generally of single crystal silicon) at less than 400 degC.

Alternatively thermal oxide could be grown on the P silicon before the step of FIG. 2A. Additional alternative is to defer the step of dopant activation to be done after the formation of the tunneling oxide and account for the thermal budget of all prior thermal processing steps.

Figures 2I, 2J:
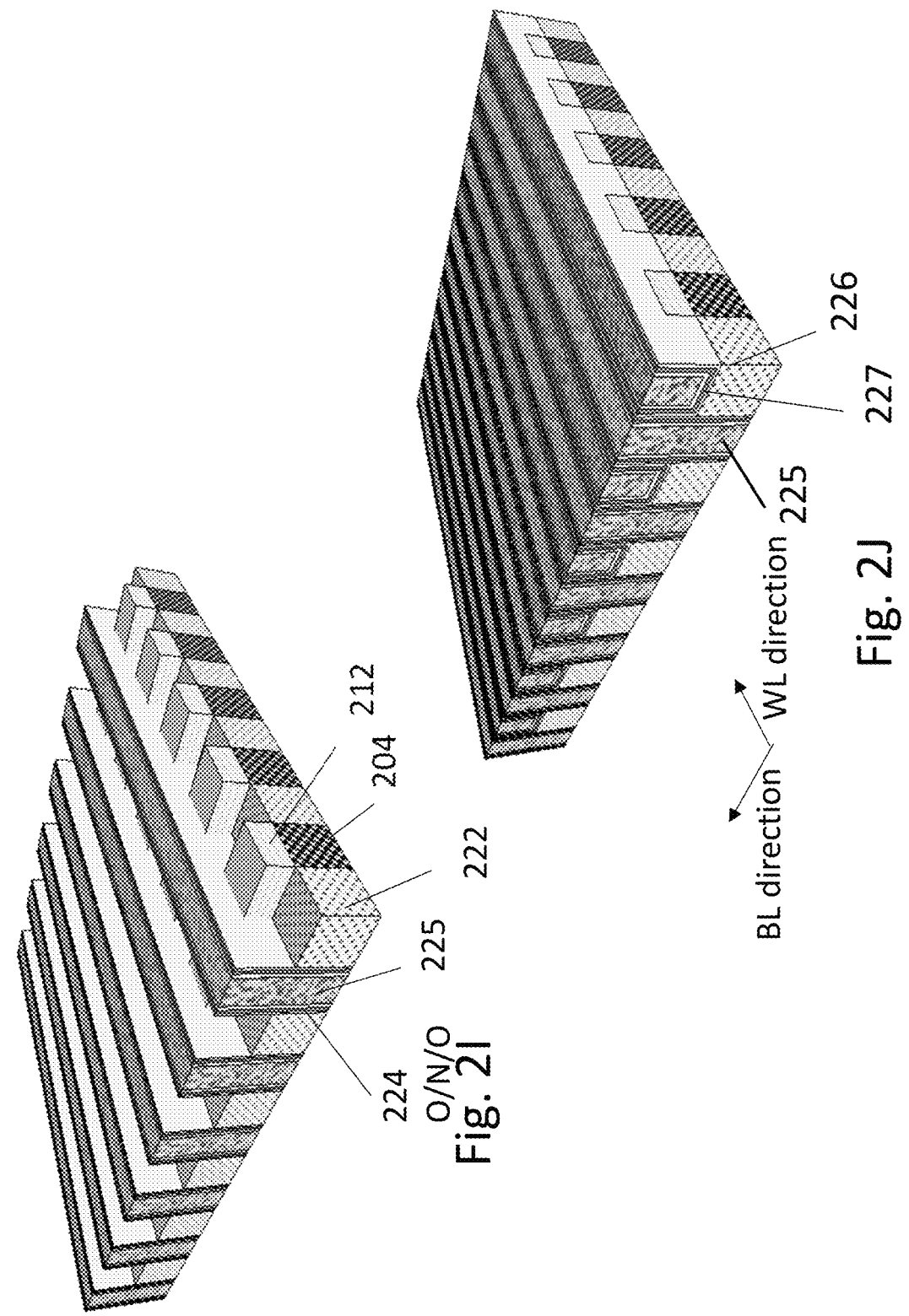

FIG. 2I illustrates the structure after the selective removal of the exposed regions of the etch mask 221. In one embodiment of the present invention, the cell fabrication may be complete here and may continue to the interconnect process. As another embodiment of the present invention, the cell fabrication may be continued in the following process for a higher bit density by adding a top gate material.

FIG. 2J illustrates the structure after adding the top gates by first using a similar flow to FIG. 2H: which may include a gate dielectric by first a deposition of a Tunnel oxide then a Charge trap layer and then a control oxide layer—These three layers are commonly called O/N/O 226 layers, but may comprise other materials and combinations known in the art for charge trapping. For example, the charge trap layer may be semiconductor quantum dots or metallic quantum dots where these dot size ranges from 1 nm to 10 nm. Alternatively, the charge trap layer may be high-k dielectric such as $HfO_2$ or it nitride. In some cases a radical oxidation may be utilized. These layers could be deposited using Atomic Layer Deposition (ALD) techniques or compatible alternative. Then the top gate material 227 such as polysilicon may be deposited using Chemical Vapor Deposition (CVD) techniques or compatible alternative. Then the structure may be polished down using CMP to expose the side gates 225.

Figure 2K:
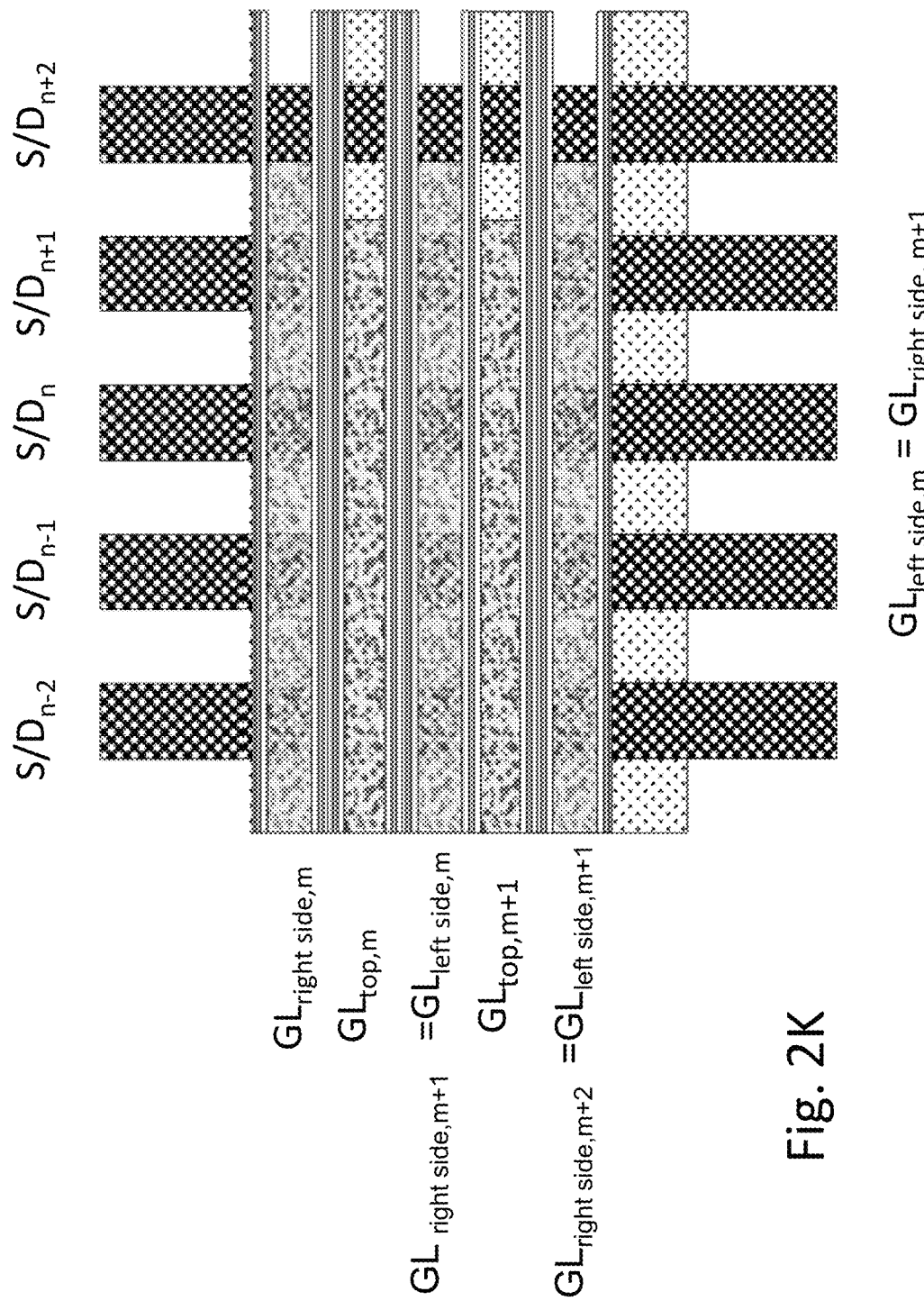

FIG. 2K illustrates a small portion of the resultant structure. Using n for counting cells going along the word-lines and m for cell going along the bit-lines, the structure illustrates the cells and control lines around cell m,n. It shows top gate GLtop,m with two side gates on its sides: GLright side,m and GLleft side,m. The side gate left of cell m is also the right side gate for cell m+1. FIG. 3 also shows 5 sections of bit-lines which also serves as the S/D for the channel in between them.

Figure 3A:
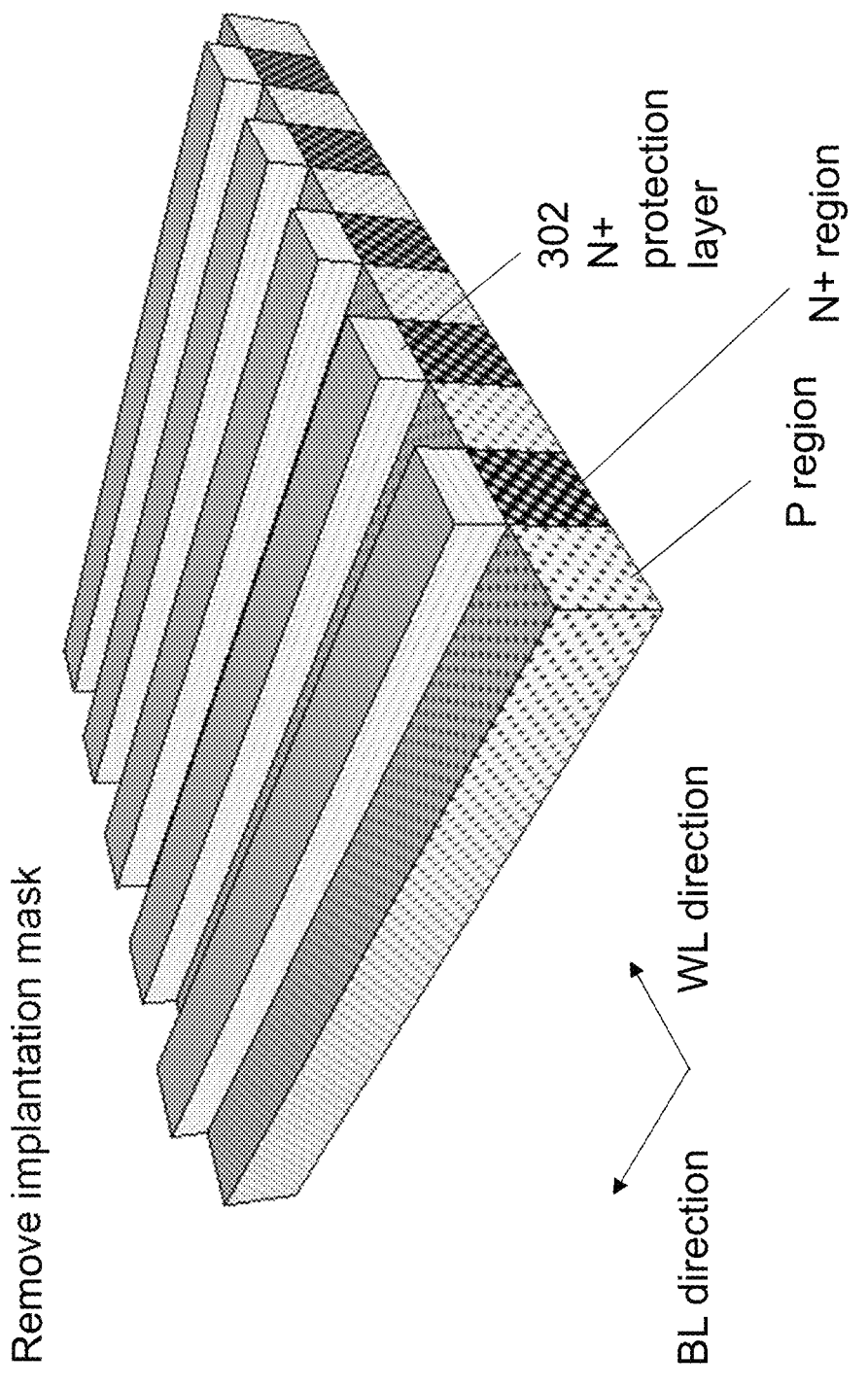

An alternative flow is presented using illustrations FIGS. 3A-3D. FIG. 3A illustrates the structure illustrated in FIG. 2D. It could be desired to optimize the flow so that the N+ protection layer 302 remaining at this step is relatively thin, for example, about 10 angstroms, 20 angstroms, 30 angstroms, 50 angstroms, 100 angstroms or 200 angstroms.

Figure 3B:
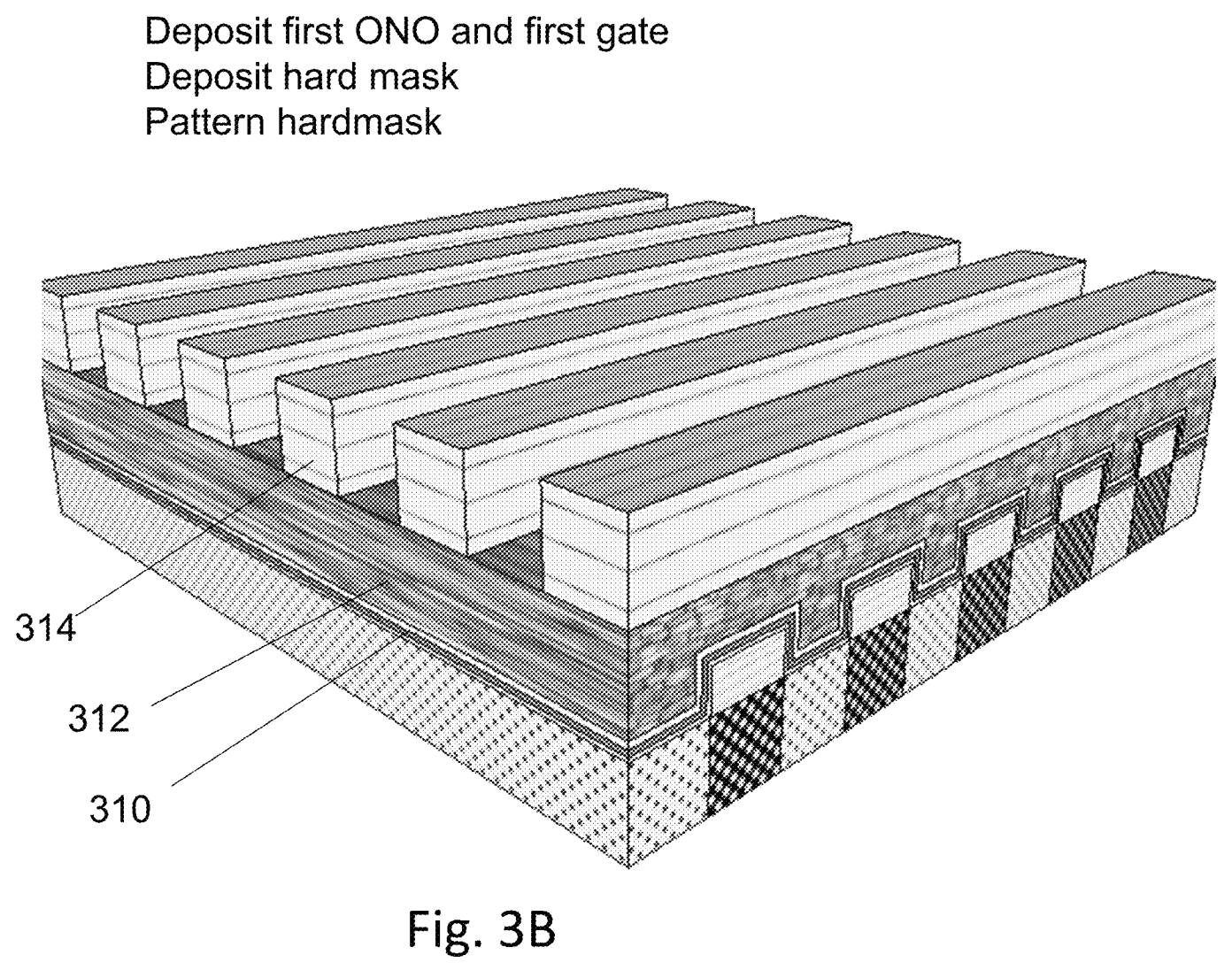

FIG. 3B illustrates the structure of FIG. 3A after formation of the first O/N/O 310, top gates 312 and then forming and patterning hard mask 314 of strips in the Word Line (WL) direction.

Figure 3C:
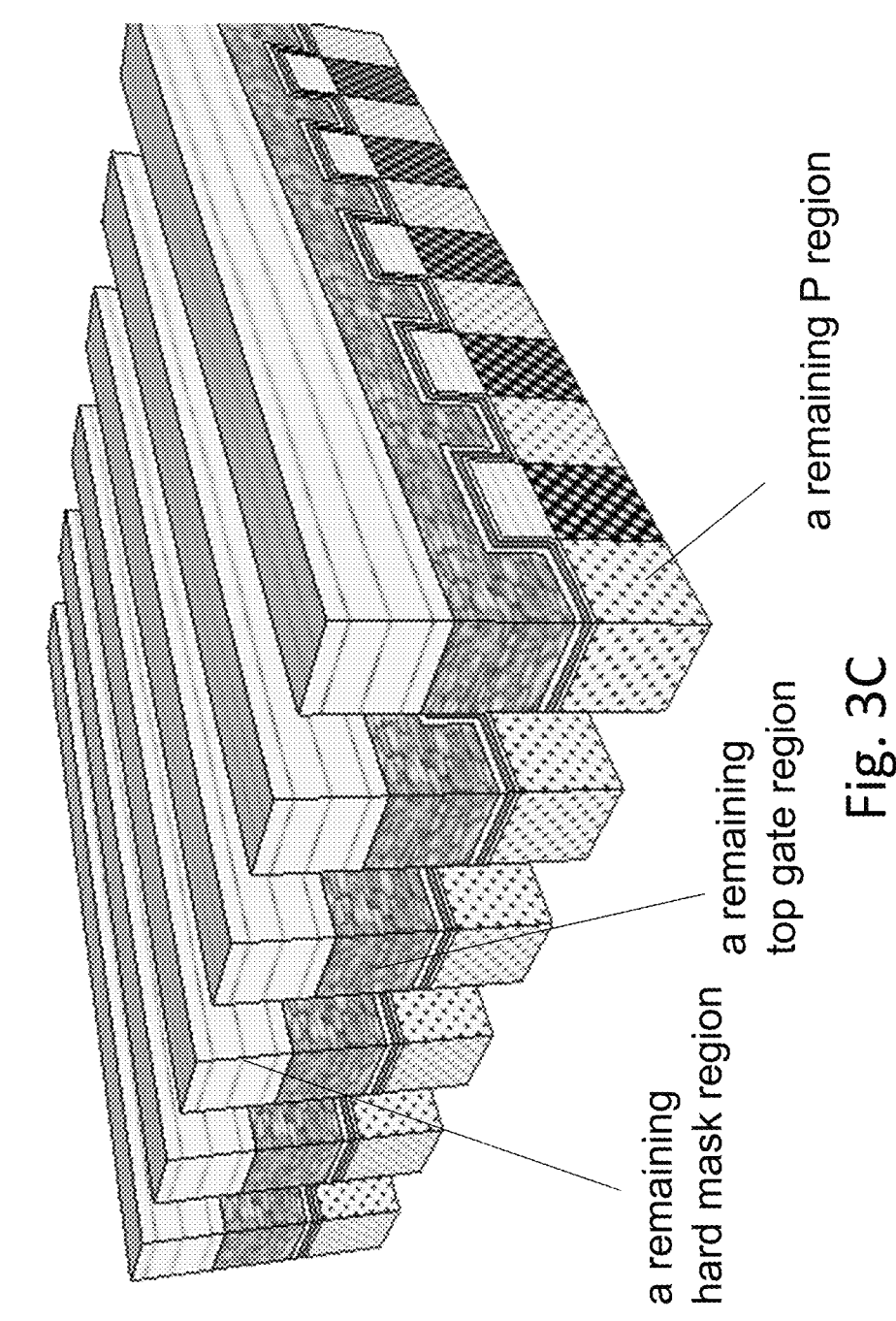

FIG. 3C illustrates the structure of FIG. 3B after etching the unmasked gate, first O/N/O material and the unprotected P silicon.

Figure 3D:
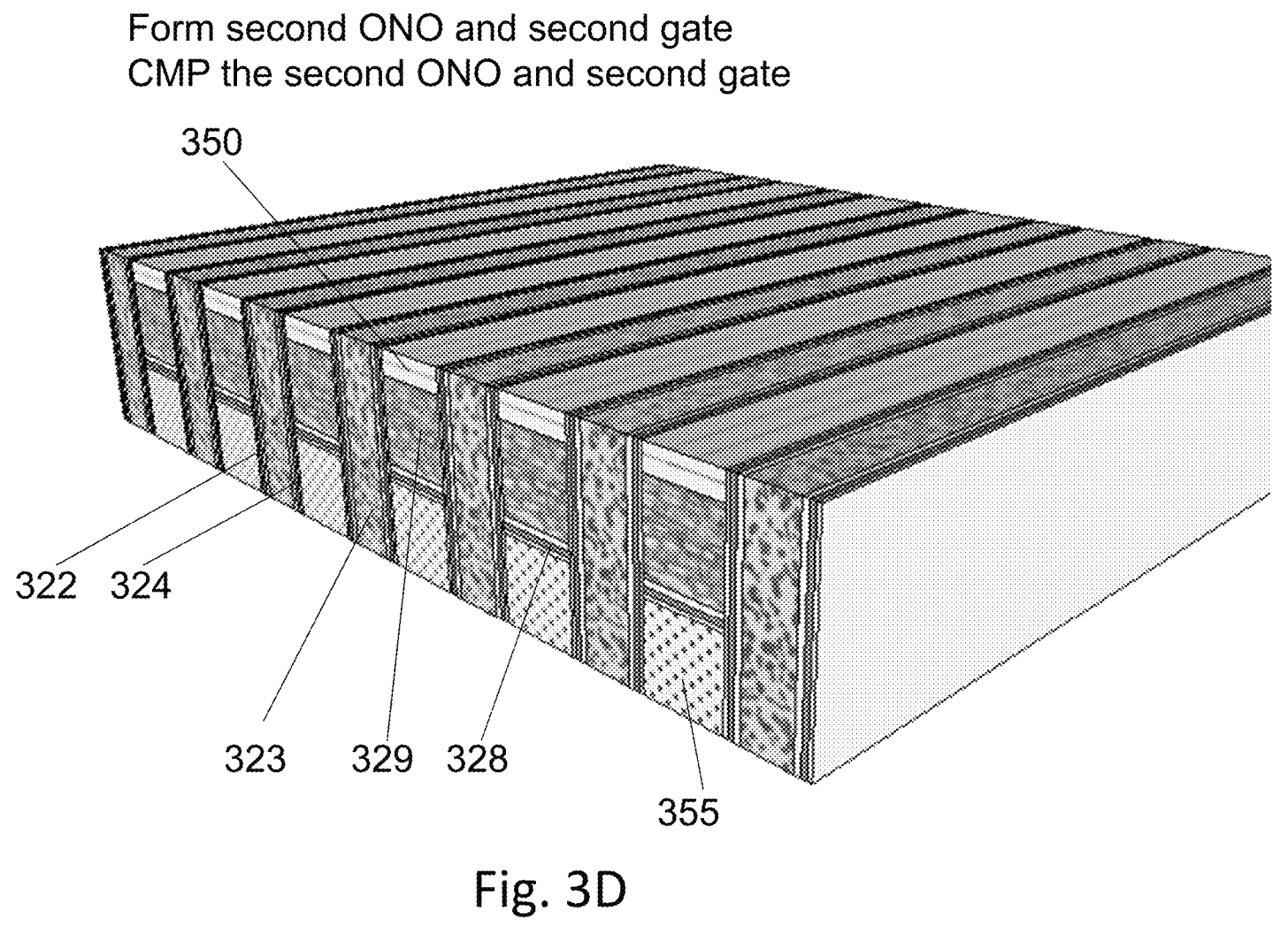

FIG. 3D illustrates the structure of FIG. 3C after forming side O/N/O 322, 324 and side gates 323. And then CMP the structure, thus leaving a thin hard mask region 350 separating the side gates 323, and disposed underneath it the top gates 329 and the first O/N/O 328. Side O/N/O 322, 324 and side gates 323 may be disposed between p regions 355 and top gates 329.

Figure 4:
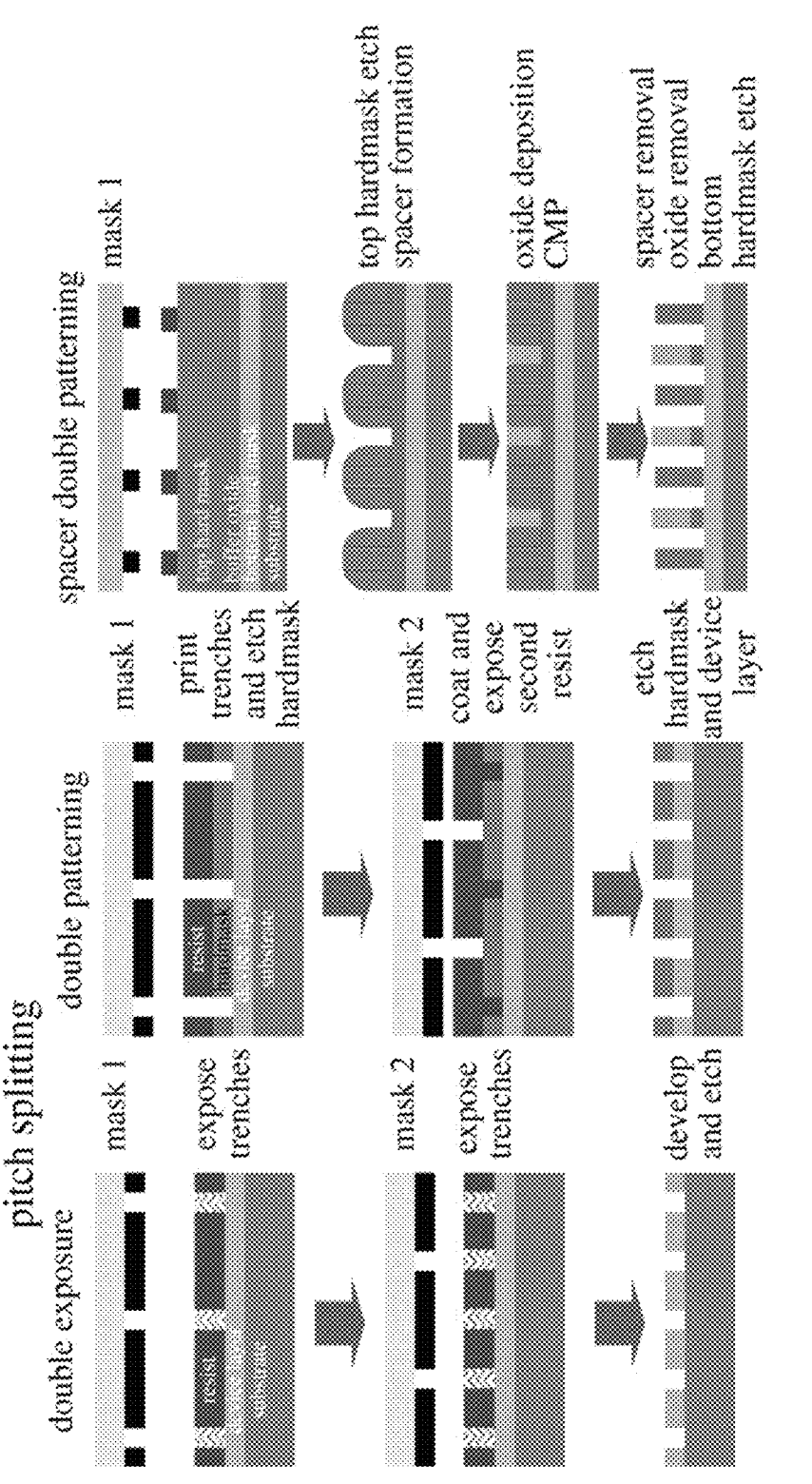
FIG. 4 illustrates known in the art alternatives for low cost grid patterning.

FIG. 4 illustrates three known in the current art process flows for forming parallel running lines with low cost lithography providing high pattern resolution by smart process steps. It illustrates two types of pitch splitting techniques and one for spacer based technique. These techniques could be used for the processing of HD-NOR structure as its array flow is based on parallel lines substantially equally spaced.

When the HD-NOR structure is implemented, for example, on a silicon-on-insulator substrate, the HD-NOR structure could be dual use one providing effectively a universal memory. As illustrated in FIG. 5, every cell has a floating P channel 504 with N+ source and N drain 510 on its side, forming a known in the art SOI based floating body DRAM. Such dual function memory cell was described in a paper by Jin-Woo Han et. al. titled: "A Unified-RAM (URAM) Cell for Multi-Functioning Capacitorless DRAM and NVM", published at IEEE IEDM 2007, incorporated herein by reference. These DRAM cells could further enhanced by adapting "Autonomous Refresh of Floating Body Cell (FBC)" techniques, which could be also called 'self-refresh'. In a common DRAM refresh a refresh cycle means that each cell is being read and re-written individually. In a 'self-refresh' many or even all cells could be refreshed together by driving a specific current (may be a current range or minimum current, the value being determined by engineering choices) through them. The cell holding 'zero' will keep its zero state and the cell holding 'one' will get recharged to recover the loss of floating body charge due to leakage. This technique had been detailed in a paper by Takashi Ohsawa et. al. titled: "Autonomous Refresh of Floating Body Cell (FBC)" published in IEDM 2008, and in follow-up paper titled: "Autonomous Refresh of Floating-Body Cell due to Current Anomaly of Impact Ionization" published by IEEE TRANSACTIONS ON ELECTRON DEVICES, VOL. 56, NO. 10, OCTOBER 2009, the entirety of all the forgoing incorporated herein by reference.

In many cases the volatile operation could interfere with the non-volatile operation of the memory cells. So it is common to avoid using them together or in close proximity. A portion of the HD-NOR that is designated to be used as an FB-RAM would be programmed to have all its NV storage cells set to a known state such as all its bits being reset.

There are many use modes for such an enhanced memory, including, splitting the memory bank for volatile and non-volatile portions, power down with saving the volatile information into the non volatile portion, and sleep mode for power reductions by moving the volatile information into the non volatile portion.

Figure 5A:
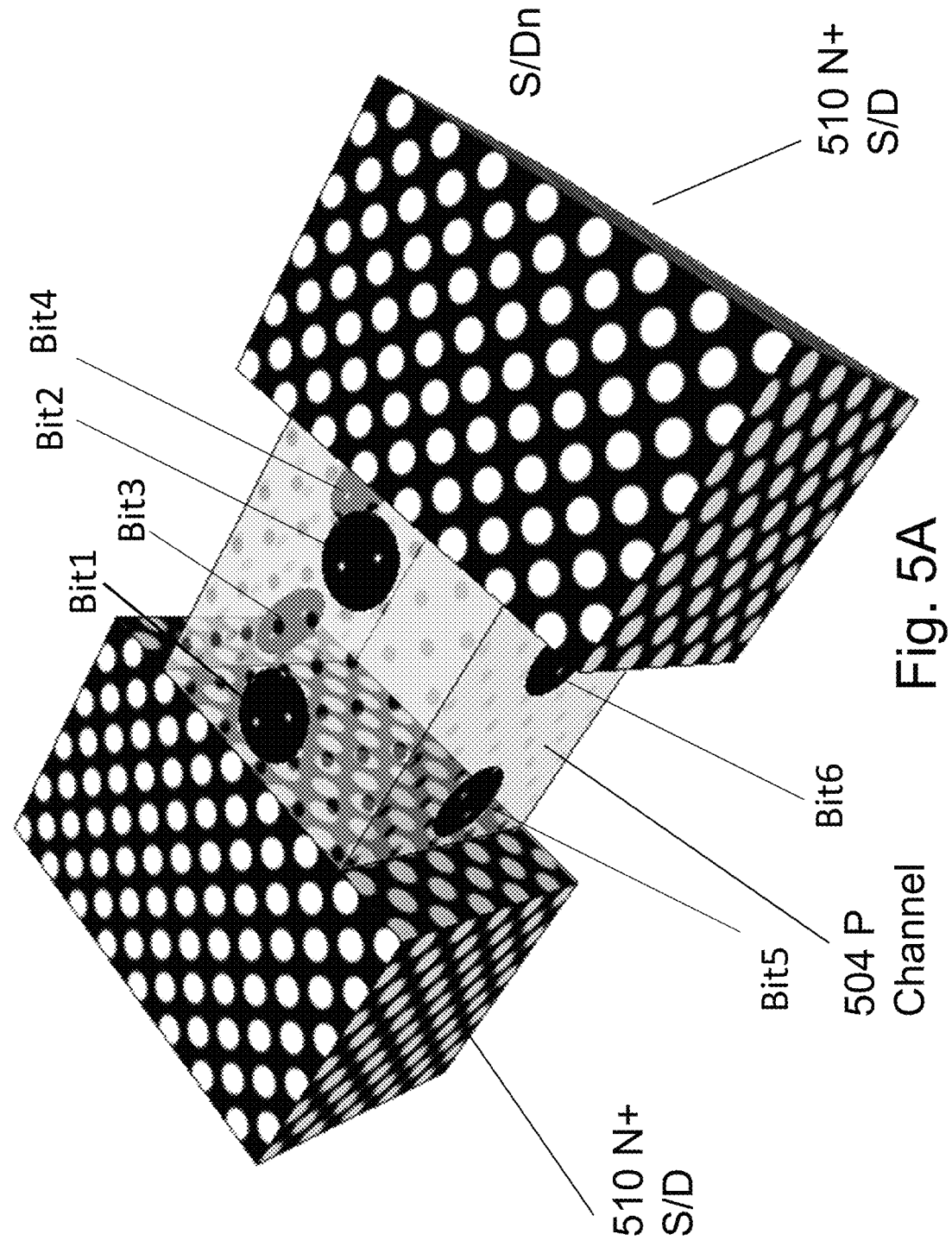
FIGS. 5A and 5B are example illustrations one memory cell basic structure.

Additional enhancement to such HD-NOR, is to implement MirrorBit® technology as was made commercial by Spansion for NOR products. And apply such approach to each of the independent O/N/O+gates surrounding the given channel as is illustrated in FIG. 5A. Similar techniques were presented for SOI-FinFET type NOR with 4 bits per cell as been detailed in U.S. Pat. No. 7,091,551, incorporated herein by reference.

Figure 5B:
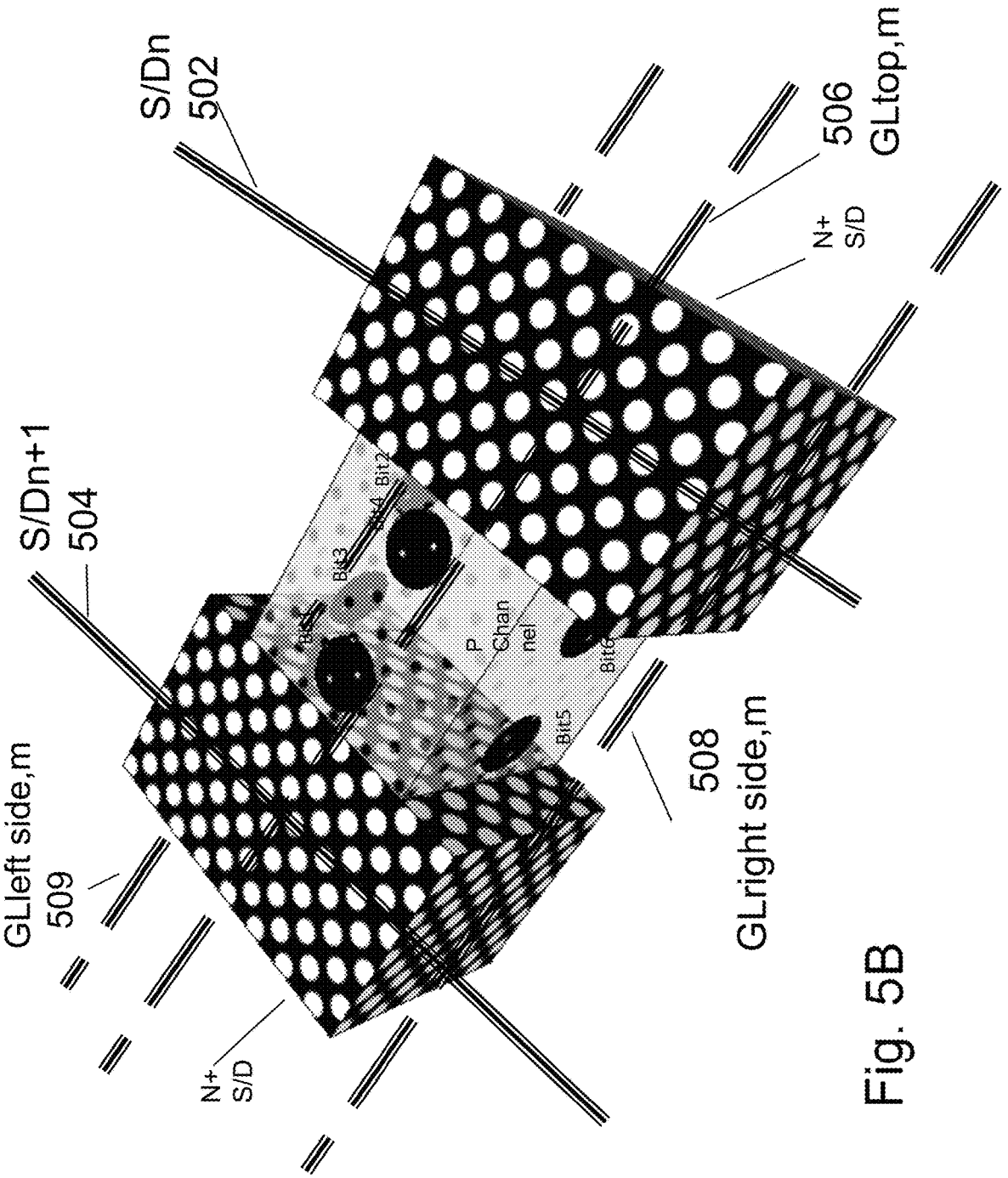

FIG. 5B illustrates on top of the memory cell of FIG. 5A exemplary memory control lines for cell m,n. The lower bit-line 502 is labeled S/Dn, the higher bit-line 504 is labeled S/Dn+1. The top word-line 506 is labeled GLtop,m, the right side word-line 508 is labeled GLright side,m, and the left side word-line 509 is labeled GLleft side,m.

FIG. 6 provides a table for the exemplary write or read of each of the memory bits of a cell n,m which is between bit-line n and bit-line n+1, and having a word-line/top gate m, with reference to FIG. 5B.

The 8v indicates a voltage just high enough to drive charge into the charge trap under its control.

The 4v indicate about half of the 8v which would access the read operation but would not be high enough to cause charge tunneling through and enabling charged being trapped or de-trapped.

Examining the table of FIG. 6 reveals that the charge trapping or reading may be performed solely with the gate controlling the specific side being in parallel with the facet of the channel. The other two gates may not be active at that moment. The absolute values of the voltages/biases in FIG. 6 (or any of the voltage/bias tables herein) may be adjusted due to engineering and design choices, as well as driven by material choices and doping types.

Figure 7:
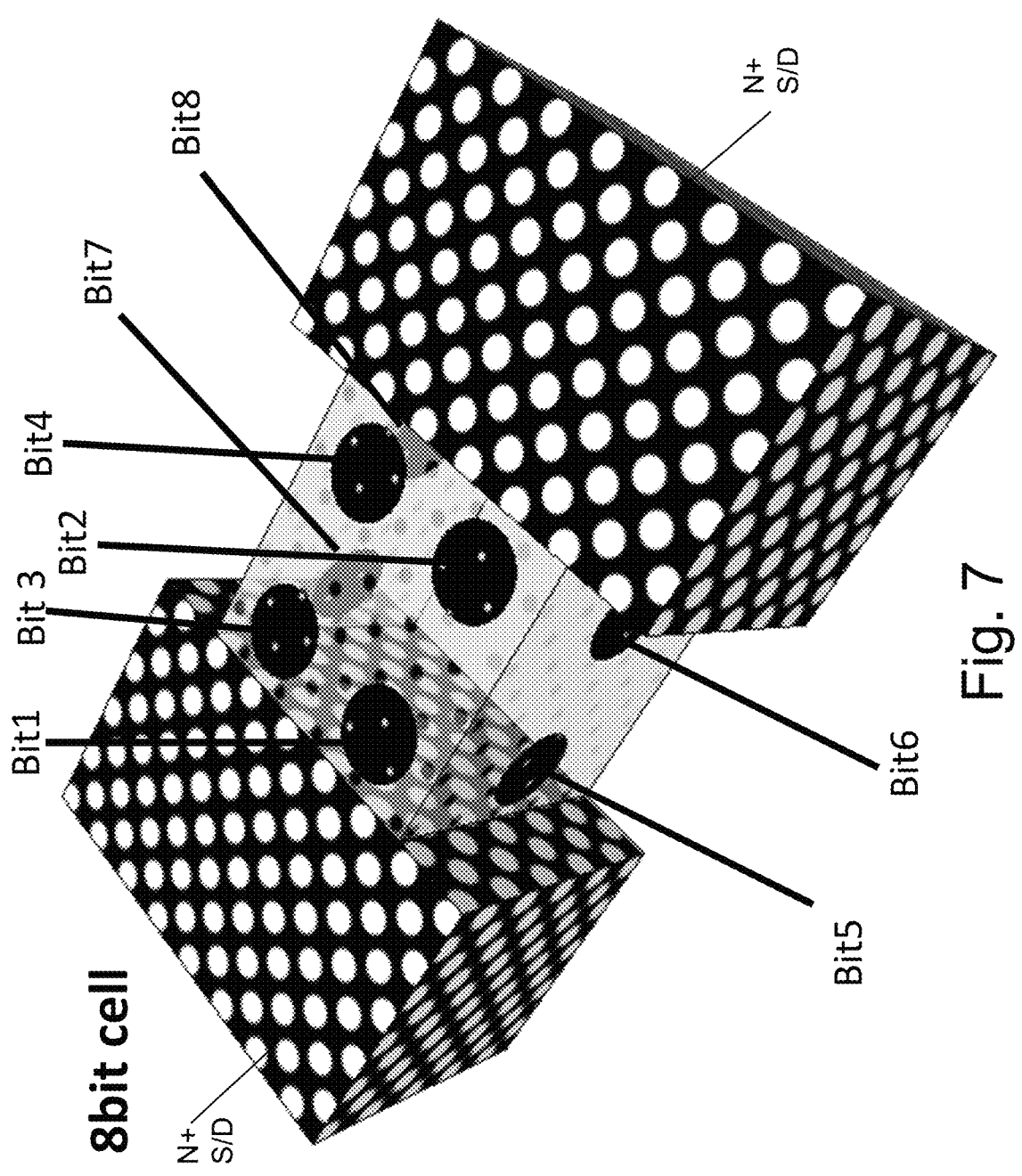
FIG. 7 is an example illustration of another memory cell basic structure.

With this new memory structure a new form of memory enhancement could be applied. FIG. 7 illustrates an 8 bit memory arrangement. In this new technique the side gate helps split the top facet into a right side and a left side to double the storage capacity of the top facet. For a write operation, a voltage such as 4V or −4V applied to the supporting neighboring gates may direct the charge formation toward one side of the channel from an opposite side channel but would not be high enough to cause charge tunneling through the supporting gate side.

FIG. 8 provides a table for the exemplary write or read of each of the memory bits of a cell n,m which is between bit-line n and bit-line n+1, and having a word-line/top gate m, with reference to FIG. 7.

By using the left side gate to pull the charges to the left, the top gate can controllably write bit1 and bit2 and respectively erase them.

By using the right side gate to pull the charges to the right the top gate can controllably write bit3 and bit4 and respectively erase it.

Figure 9:
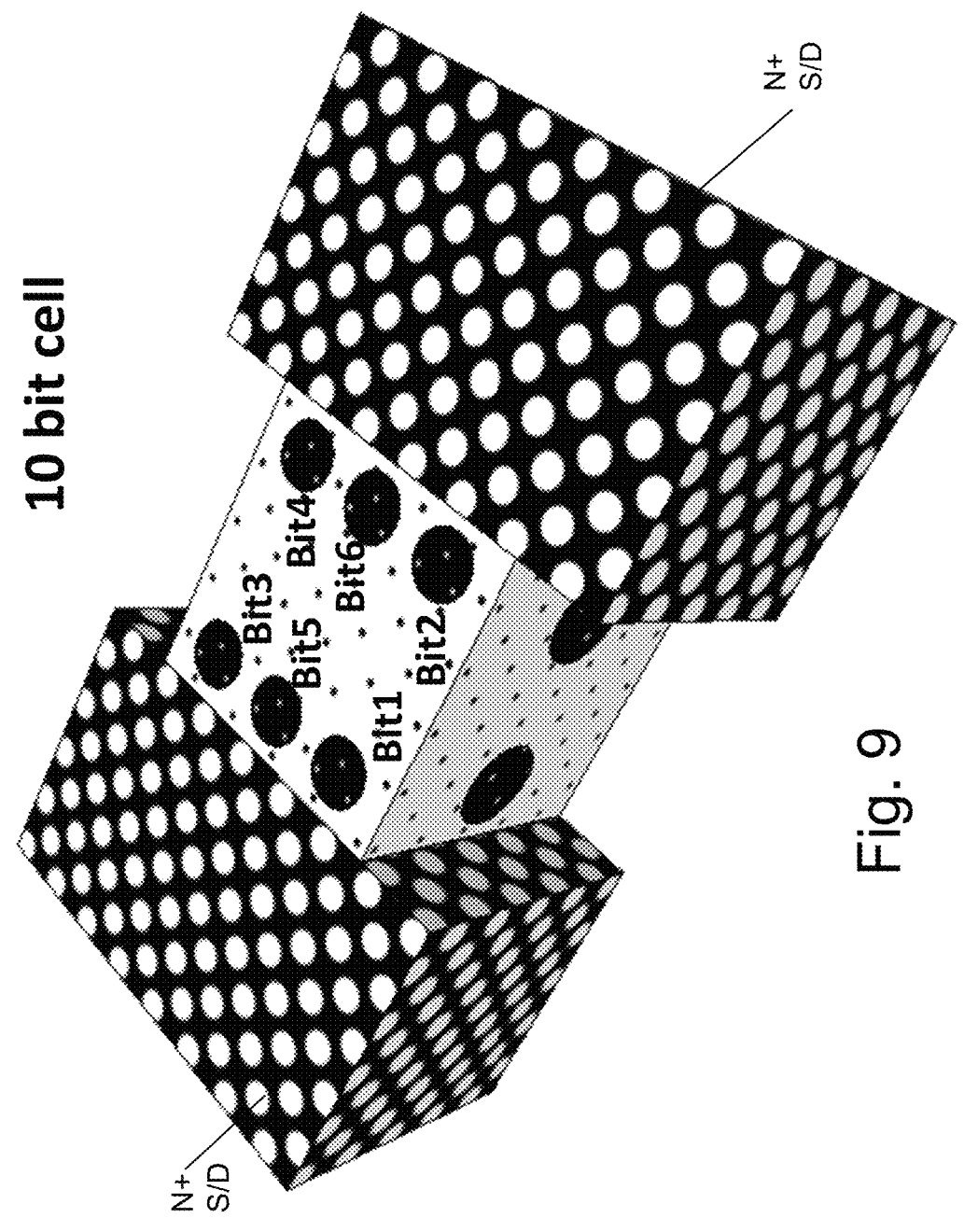
FIG. 9 is an example illustration of another memory cell basic structure.

Pushing the side control further we can increase the memory capacity of the top facet to 6 and the cell total to 10, as is illustrated in FIG. 9. It should be noted that the increased capacity of such an HD-NOR memory device could limit how small the size of the memory cell could be scaled. It is expected that each bit may need its own 20-30 nm region, which may be round, elliptical, etc., and may include an area which may range from 150 nm$^2$ to 800 nm$^2$, and a volume of 500 nm$^3$ to 16,000 nm$^3$. Accordingly the top facet could be kept larger than about 60 nm×40 nm.

FIG. 10 provides a table for the exemplary write or read of each of the memory bits of a cell n,m which is between bit-line n and bit-line n+1, and having a word-line/top gate m.

By using both the right side gate and the left side gate to push the charges away from the sides and into the middle of the top facet the top gate can controllably write bit3 and bit4 and respectively erase them.

This increase of the top facet bit capacity may be applied in the same for the side facet. To do so the structure needs a bottom gate.

Figure 11:
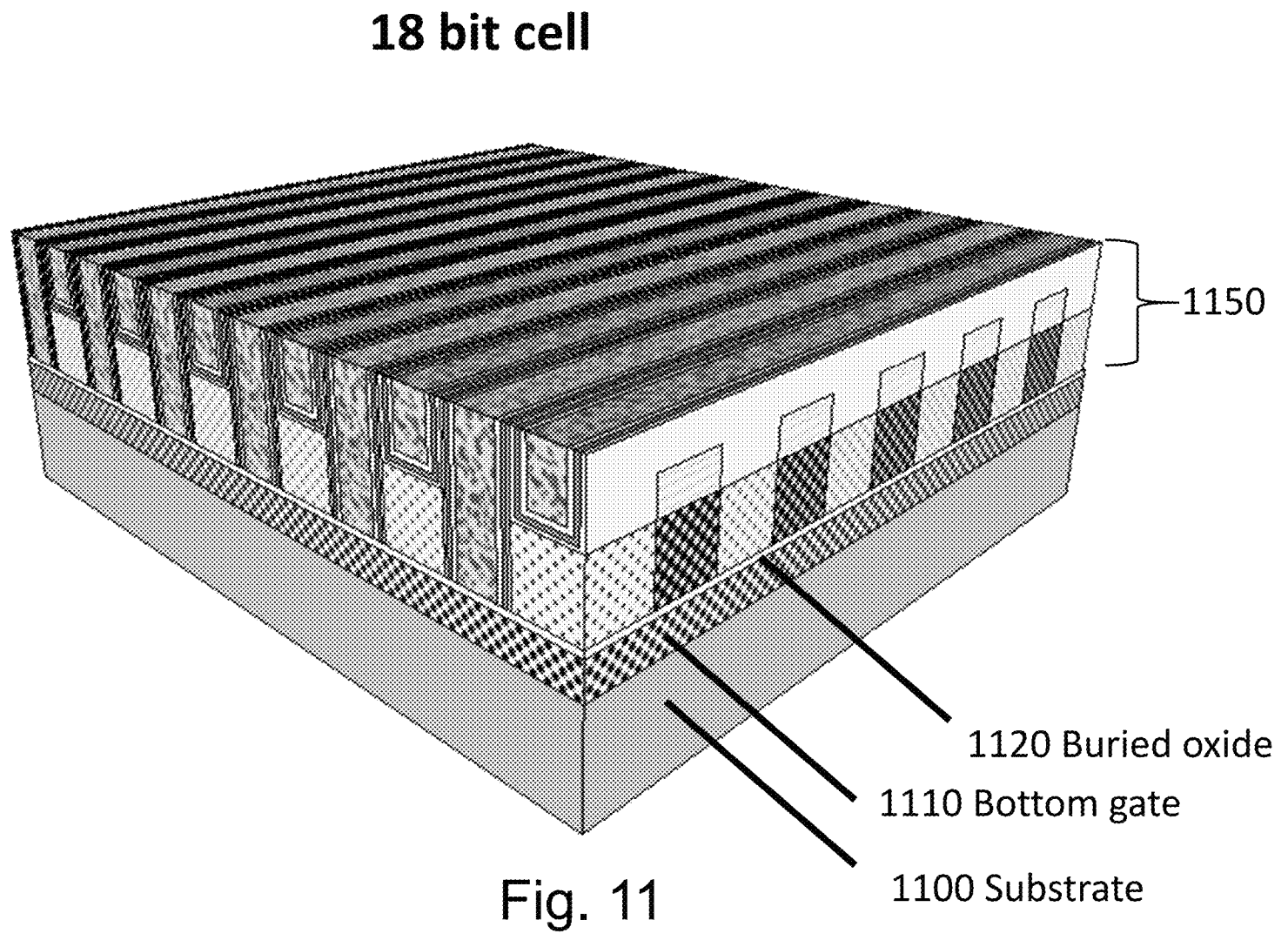

FIG. 11 illustrates the memory structure 1150 (for example, similar to the memory structure of FIG. 2J) being formed with a bottom gate 1110 by having a portion of the SOI substrate 1000 doped, for example, by ion implantation, to form N+ regions for the areas designated under the HD-NOR, and adding access to control that region's electrical potential. The buried oxide (BOX) 1120 of such SOI or ultrathin buried oxide could be kept thin enough for such bottom gate to have good electrostatic control of the O/N/O of the relevant side facets of the memory cell. One skilled in the art would recognize that there may be other methods to achieve a bottom gate.

Figure 12:
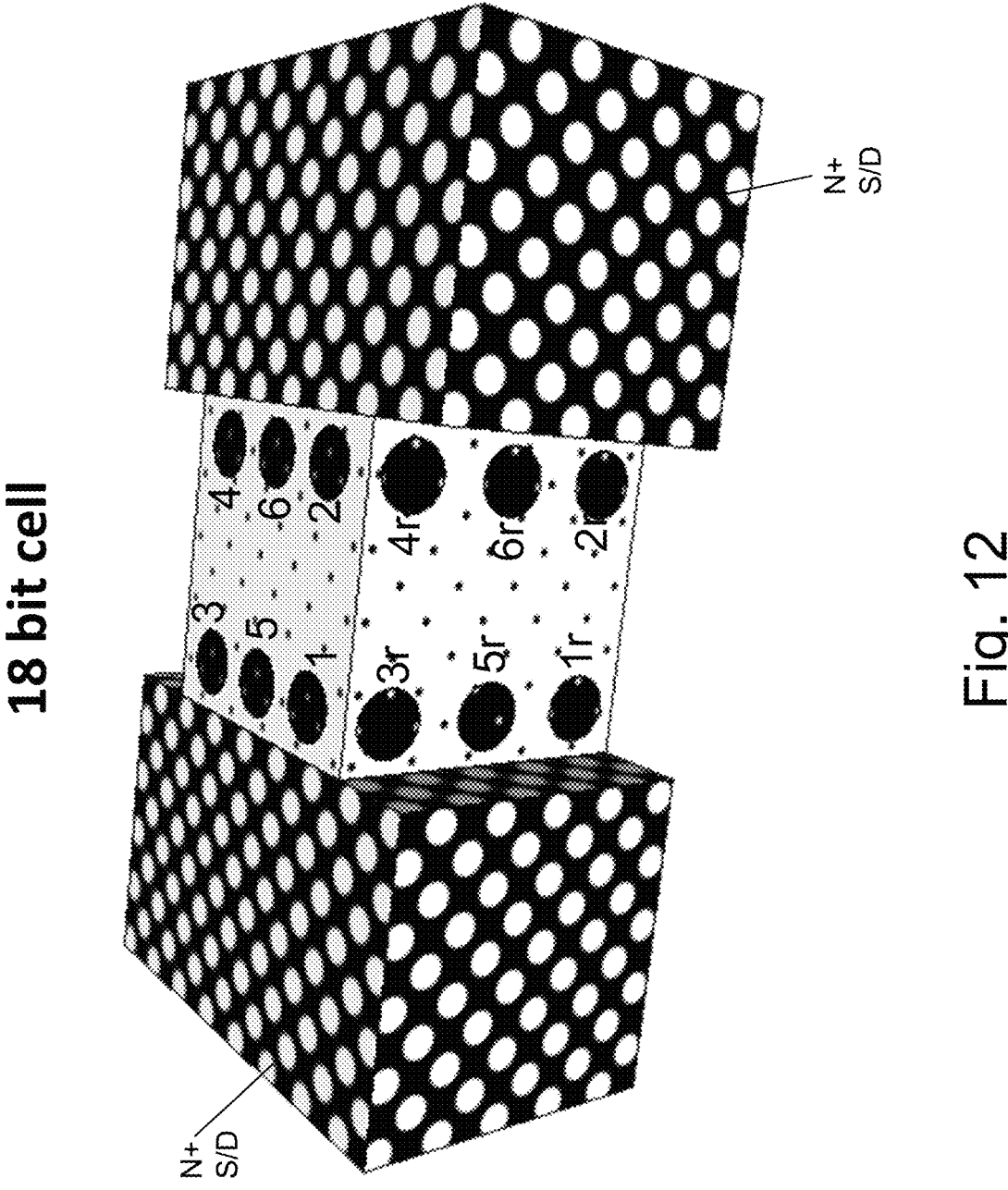
FIG. 12 is an example illustration of another memory cell basic structure.

FIG. 12 illustrates the memory cell capacity allocation with a bottom gate added to the HD-NOR structure.

The table of FIG. 10 could be modified to provide the write read conditions for each side by replacing right and left side with top and bottom accordingly. The bits sited on top are marked 1,2, 3, 4, 5, 6 those on the right side are marked 1r,2r, 3r, 4r, 5r, 6r, and not shown are those on the right side are marked 1l,2l, 3l, 4l, 5l, 6l. On the left side 1l, 2l are close to the bottom while 3l,4l are close to the top.

FIG. 13A provide a table for the exemplary write or read of each of the right side memory bits of a cell n,m which is between bit-line n and bit-line n+1, and having a word-line/top gate m. The new added bottom gate is identified in the table as Bottom Gate.

FIG. 13B provide a table for the exemplary write or read of each of the left side memory bits of a cell n,m which is between bit-line n and bit-line n+1, and having a word-line/top gate m. The new bottom gate is identified in the table as Bottom Gate.

Figure 14A:
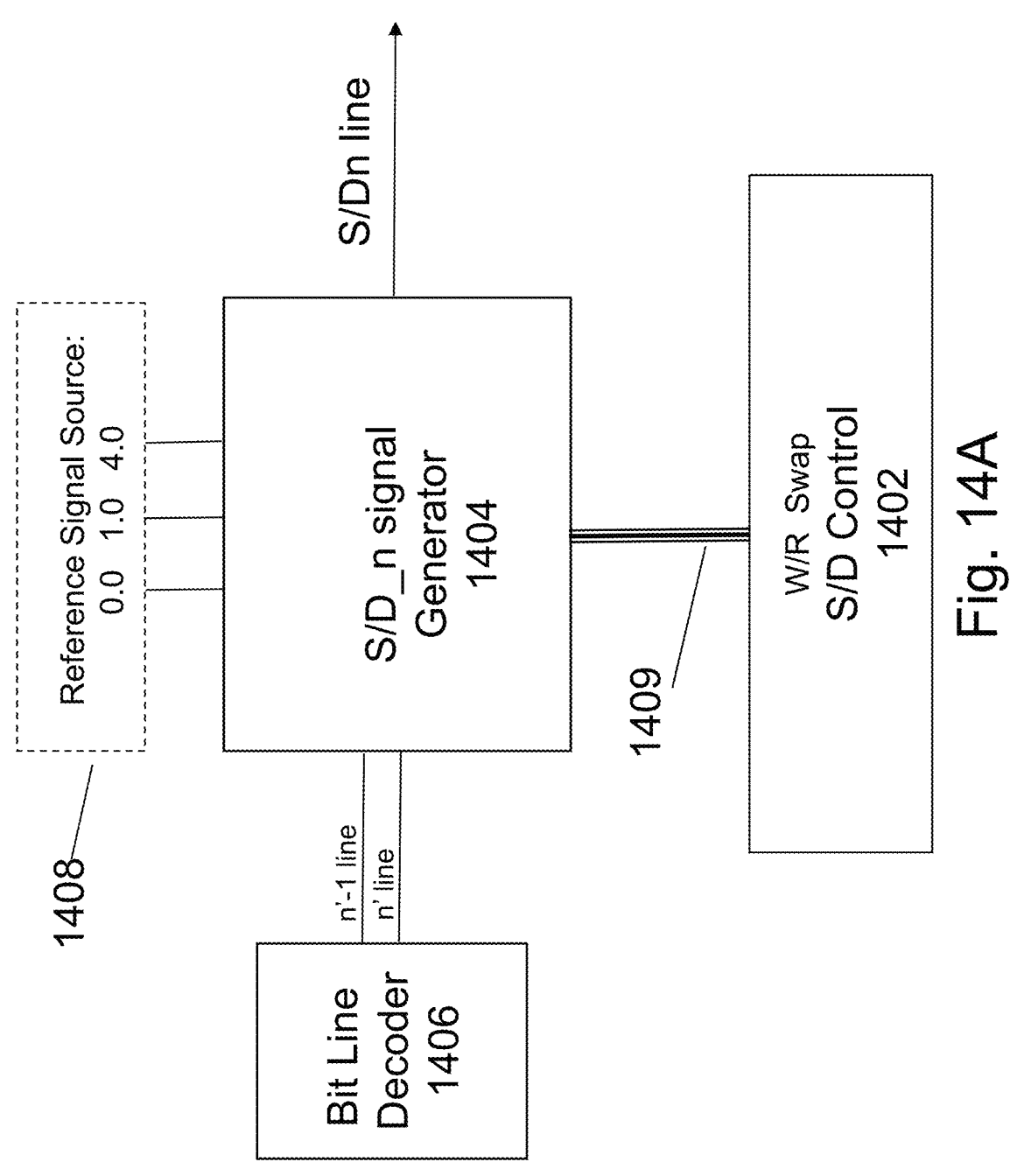
FIGS. 14A-14C are example illustrations of building blocks for the HD-NOR peripheral circuits.

FIG. 14A illustrates some exemplary building blocks for the HD-NOR bit-line related peripheral circuits. The bit-line decoder 1406 function is to at least decode an address of k bits to $2^k$ lines of which one is high while all the remainder may be low. The reference signal generator 1408 provides the required voltages needed to operate the read write operations. All the voltages suggested herein are suggested voltages for some conceptual HD-NOR. This level could be adjusted for specific designs based on the choice of materials, process flow, layer thicknesses, and feature sizes. The S/D_n signal generator 1404 may be activated by the signals on lines from the bit line decoder 1406 the n−1 line and the n line. The signal it generates would reflect if it is to generate the S/D_n signal according to the tables provided in at least FIGS. 6, 8, 10, 13A and 13B, or in the S/D_n+1 signal for the case that n−1 line is asserted. The S/D Control 1402 provides instruction to all the $2^k$ S/D signal generators unite (1404) for what operation should be performed and on which bit. The S/D Control 1402 drives a bus carrying these instructing signals which could include write read signals and swap instructions. The output signal S/Dn line would be generated based on these signals and the tables provided in at least FIGS. 6, 8, 10, 13A and 13B.

Figure 14B:
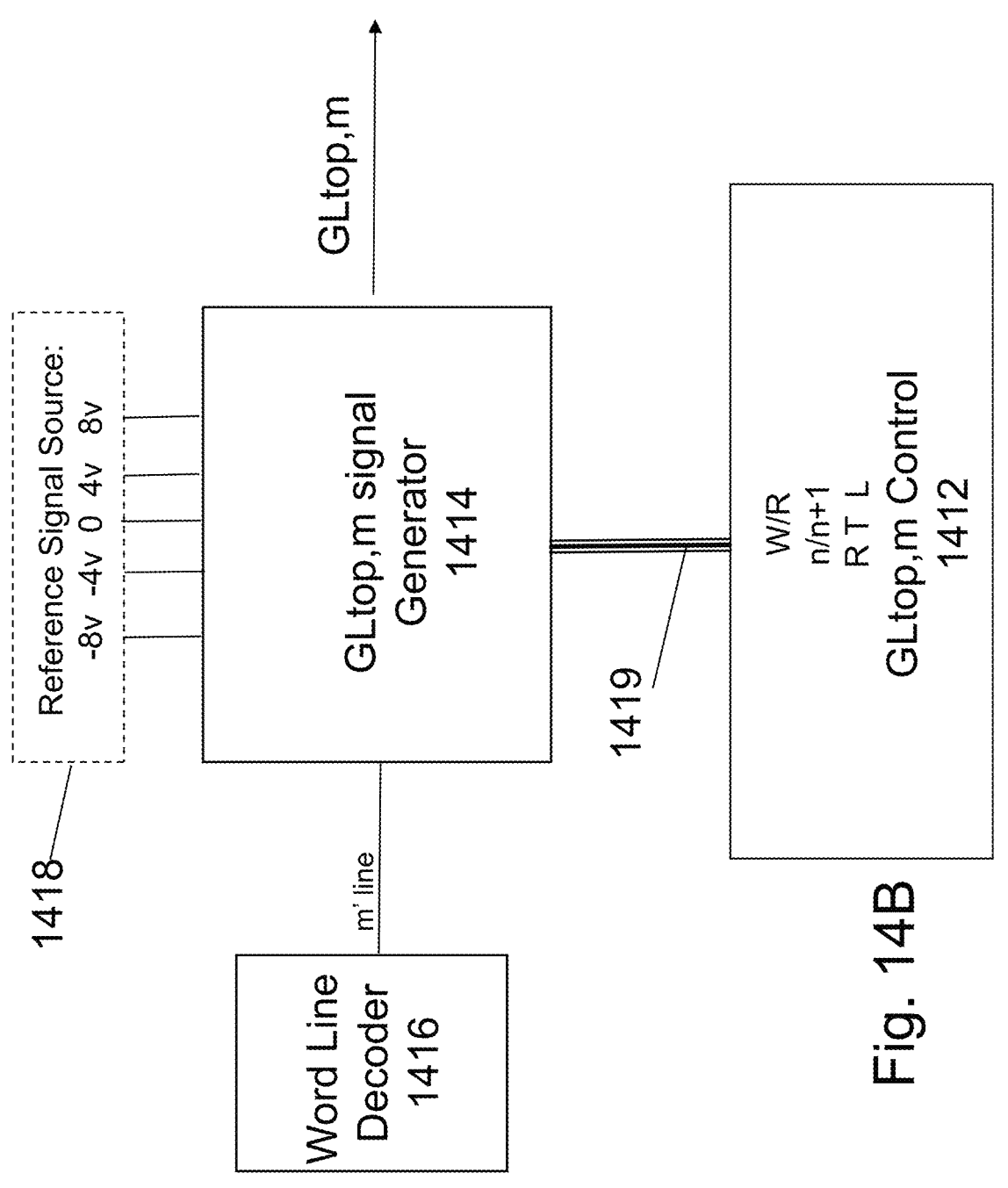

FIG. 14B illustrates some exemplary building blocks for the HD-NOR top word-lines related peripheral circuits. The Word-Line decoder 1416 function is to at least decode an address of j bits to $2^j$ lines of which one is high while all the rest may be low. The reference signal generator 1418 provides the required voltages needed to operate the read write operations. All the voltages suggested herein are suggested voltages for some conceptual HD-NOR. This level could be adjusted for specific designs based on the choice of materials, process flow, layer thicknesses, and feature sizes. The GLtop, m signal generator 1414 is activated by signals on the m lines from the word-line decoder 1416. The GLtop,m Control 1412 provide instructions to all the $2^j$ the GLtop,m signal generators 1414 for what operation should be performed and on which bit. The GLtop,m Control 1412 drives a bus carrying these instruction signals which could include write read signals and depend of which facet is in now in action: Right signal Top signal Left (R T L) signal and n/n+1 signal (these define which facet and which of the 6 bits on that facet is now in action). The output signal GLtop,m line would be generated based on these signals and the tables provided in FIGS. 6, 8, 10, 13A and 13B.

Figure 14C:
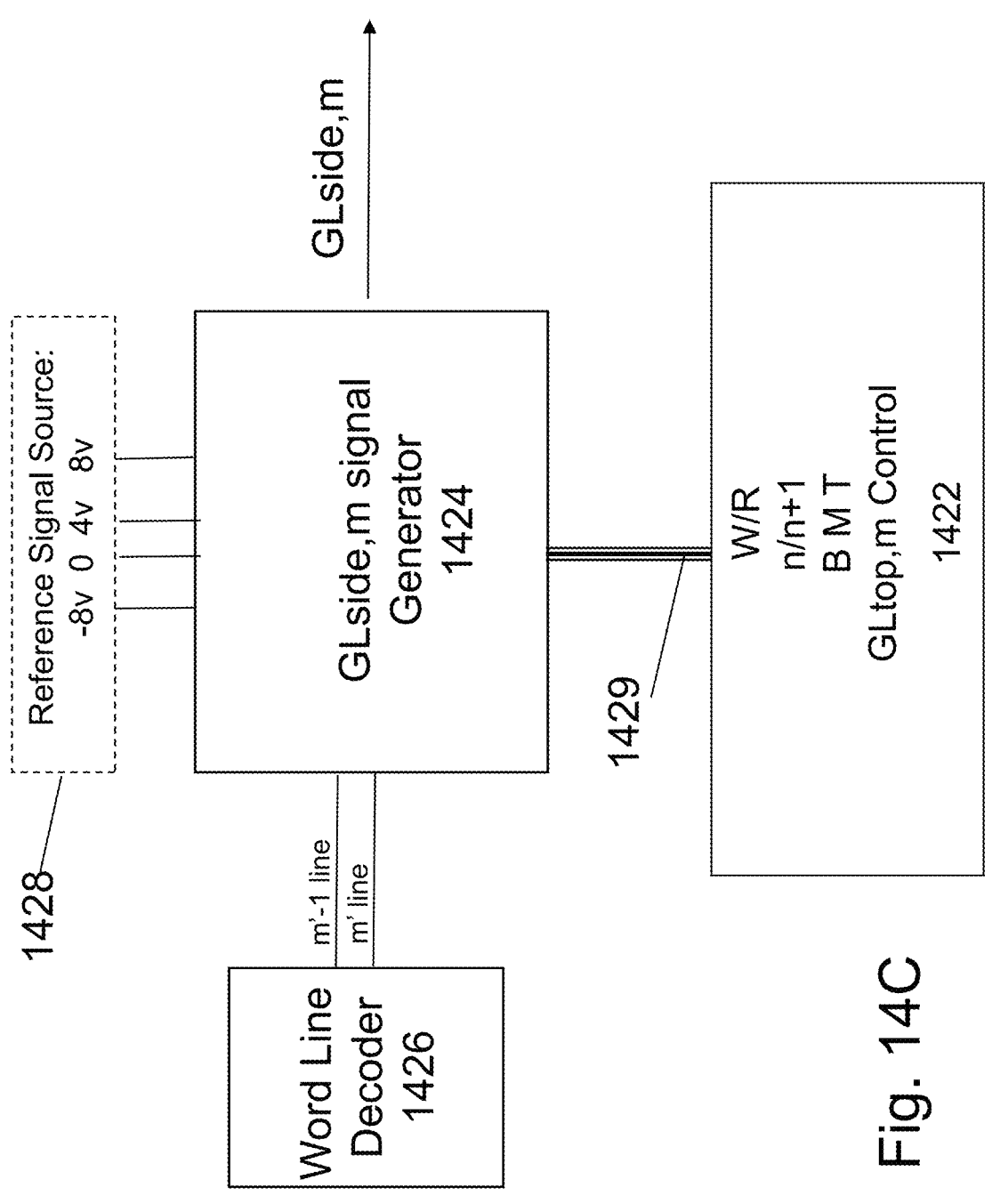

FIG. 14C illustrates some exemplary building blocks for the HD-NOR side word-lines related peripheral circuits. The Word-Line decoder 1426 function is to decode an address of j bits to $2^j$ lines of which one is high while all the rest may be low. The reference signal generator 1428 provides the required voltages required to operate the read write operations. All the voltages suggested herein are suggested voltages for some conceptual HD-NOR. This level could be adjusted for specific designs based on the choice of materials, process flow, layer thicknesses, and feature sizes. The GLside, m signal generator 1424 may be activated by signals on the lines from the word line decoder 1426 the m−1 line and the m line 1416. Accordingly it will function to generate the right side signals or the left side signals. The GLside,m Control 1422 provides instruction to all the 2j the GLside,m signal generators 1424 for what operation should be performed and on which bit. The GLside,m Control 1412 drives a bus carrying these instructing signals which could include write, read signals and depends of which facet is in now in action: Bottom signal, Middle signal, Top signal (B M T) and n/n+1 signal (these define which facet and which of the 6 bits on that facet is now in action). The output signal GLside,m line would be generated based on these signals and the tables provided in FIGS. 6, 8, 10, 13A and 13B.

The control of the bottom gate is relatively straightforward as it may be shared for all cells and it will be activated according the tables in FIGS. 13A and 13B.

Another known enhancement technique is to control the amount of charge being trapped in a cell to allow coding of more than 1 bit based on the amount of charge. These different enhancement techniques could be combined to achieve even higher number of bits per cell. Current charge trap memories are known to achieve 3 bits per cell. A white paper titled "MirrorBit® Quad Technology: The First 4-bit-per-cell Flash Memory Spansion™ MirrorBit Quad Technology to Expand Flash Memory Innovation for Electronic Devices" was published by Spansion-www.spansion, Doc. 43704A (SEPTEMBER 2006), incorporated herein by reference. The paper shows the use of MirrorBit in which every bit site could be programmed to one of 4 levels representing 2 bits, providing in total 4 bits per cell. Adapting such to the HD-NOR could result with a 54 bits per cell non-volatile memory structure. And the structure could be used to have some of the memory used as fast access FB-RAM for which a self-refresh mode could be added. In addition known techniques such as Probabilistic error correction in multi-bit-per-cell flash memory as described in U.S. Pat. No. 8,966,342, incorporated herein by reference, could be integrated for increased robustness of such memory operations.

A known technique to increase performance is to strengthen the bit-lines and the word-lines with upper metal layer strips running in parallel above these lines and periodically being connected to them. This could be important for large blocks of HD-NOR.

The HD-NOR as presented herein utilized SOI substrates. These substrates are more expensive than bulk substrate. The HD-NOR structure could be used as embedded memory for SoC devices. Having the SOI requirement might limit the use of the HD-NOR, as most of the SOC design are using bulk type silicon. One possible technique to overcome this limitation is to use local SOI on bulk. For example the bulk substrate would be processed with epitaxial of SiGe and then epitaxial of silicon on top of the SiGe. The high selectivity of the SiGe layer to etch in respect to silicon could allow later to sacrifice regions of SiGe and to replace them with isolation regions forming local SOI under the HD-NOR structure. Such technique has been detailed in papers by Kyoung Hwan Yeo et al. titled: "A Partially Insulated Field-Effect Transistor (PiFET) as a Candidate for Scaled Transistors" published at IEEE ELECTRON DEVICE LETTERS, VOL. 25, NO. 6, JUNE 2004, and by Chang Woo Oh et al. in paper titled: "A Hybrid Integration of Ultrathin-Body Partially Insulated MOSFETs and a Bulk MOSFET for Better IC Performance: A Multiple-VTH Technology Using Partial SOI Structure" published at IEEE ELECTRON DEVICE LETTERS, VOL. 31, NO. 1, JANUARY 2010, the forgoing incorporated herein by reference. An optional stage to perform the step of replacing the sacrificial layer with isolation could be immediately after etching the unused P regions 229 as is illustrated in reference to FIG. 2G herein.

Another of sacrificial layer could be a porous layer formed by an anodizing process followed by an epitaxial step as was developed by Cannon under the ELTRAN process for the purpose of manufacturing SOI wafers. The porous layer could later be replaced or fully oxidized. The anodizing process for porous formation could be made very selectively by proper doping. U.S. Pat. No. 8,470,689, incorporated herein by reference, teaches such use selectivity for forming a multilayer structure. This concept could be adapted to form the back gate and isolation with very good layer control for the formation of an 18 bits HD-NOR structure.

Another alternative is first to deep implant to form the N type back gate, than light implant the top layer to form minimal N type but high enough to protect it from the anodizing process. Then open holes in the designated locations for cell isolation etch—within regions 229 as is illustrated in reference to FIG. 2G. Then anodize the wafer forming the porous sacrifice layer for the future bottom gate and reducing the need for an epitaxial step. The channel area would later be doped to make them P type.

FIG. 15 illustrates an exemplary architecture of a HD-NOR array. It could be a standalone device structure or embedded within a larger SoC. It illustrates a modular memory structure of 64 memory blocks 1501, 1502 with the peripheral circuits built-in a corresponding modular structure with 8 top units Pt_i to control the word-lines and additional 8 bottom units Pb_i to control the word-lines, and 8 left side units Pl_i to control the bit-lines and 8 right side units Pr_i to control the bit-lines.

These could be used to drive the control lines from both sides to improve performance and reduce variability.

In addition it could be used as redundancy so single control unit failure could be recovered.

This architecture could also support additional modes of operation.

The structure could be designed to allow independent access to 8 blocks provided none of them share the Peripherals circuits.

The structure could be designed to support synchronized access to up to 8 units sharing the same row or sharing the same column reducing access power and still provide multiple bits.

The structure could be designed to support on chip transfer from the non volatile portion to the high speed FB-RAM portion or the other way. Such transfer could be done in parallel to or from 8 blocks reducing time and power for such transfer. Such capabilities could allow high speed access with low power operating mode. So data is transferred to the FB-DRAM designated block for fast access but could stored back into the NOR NV section for sleep or power down.

The corners Clt, Crt, Clb, Crb could be used for device top level control for these operating modes, to generate the special voltage source required for read and write, and for interface to external devices.

The HD-NOR was previously presented herein on an SOI wafer/substrate. Alternatively it could be constructed on bulk borrowing the isolation concept used in modern Fin-FET technology. In such bulk implementation it would be challenging to form the bottom gate resulting with the 10 bit per cell option. The optional use mode of Floating Body DRAM would also be more challenging to achieve. Yet by adding under the cell isolation a two state memory of the type developed by Zeno Semiconductor, as disclosed in U.S. Pat. No. 9,030,872, incorporated herein by reference, could be implemented.

Another alternative is to build special SOI-like wafers to support a full 6 bits in the bottom facet. Such special M-SOI wafer could then be used to build the HD-NOR on top and aligned to the backside word lines.

Figures 16A, 16B:
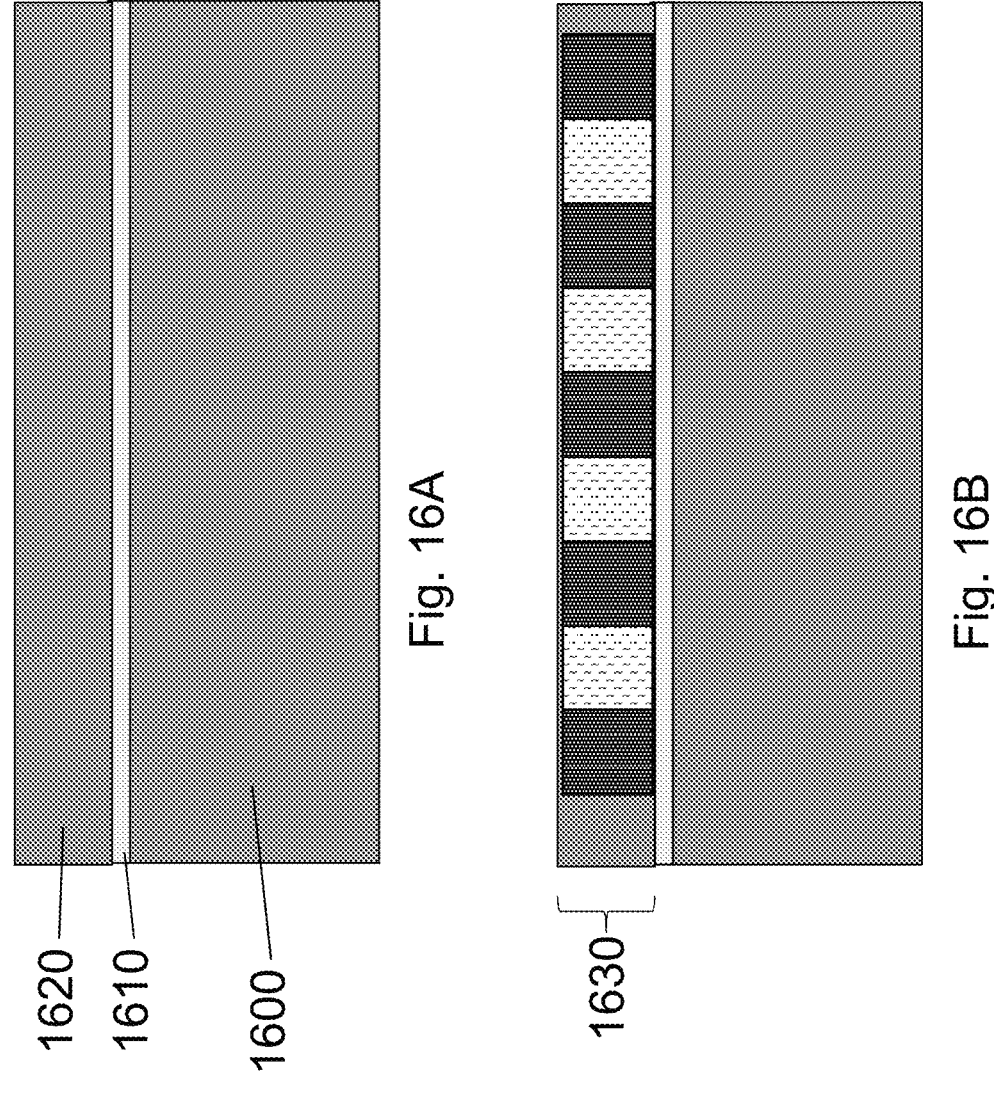
FIGS. 16A-16E are example illustrations of the formation of an M-SOI wafer and finished structures.

FIG. 16A illustrates a standard SOI substrate, which may include substrate 1600, BOX 1610 and silicon 1620. FIG. 16B illustrates the formation of an HD-NOR structure 1630 in silicon 1620.

Figures 16C, 16D, 16E:
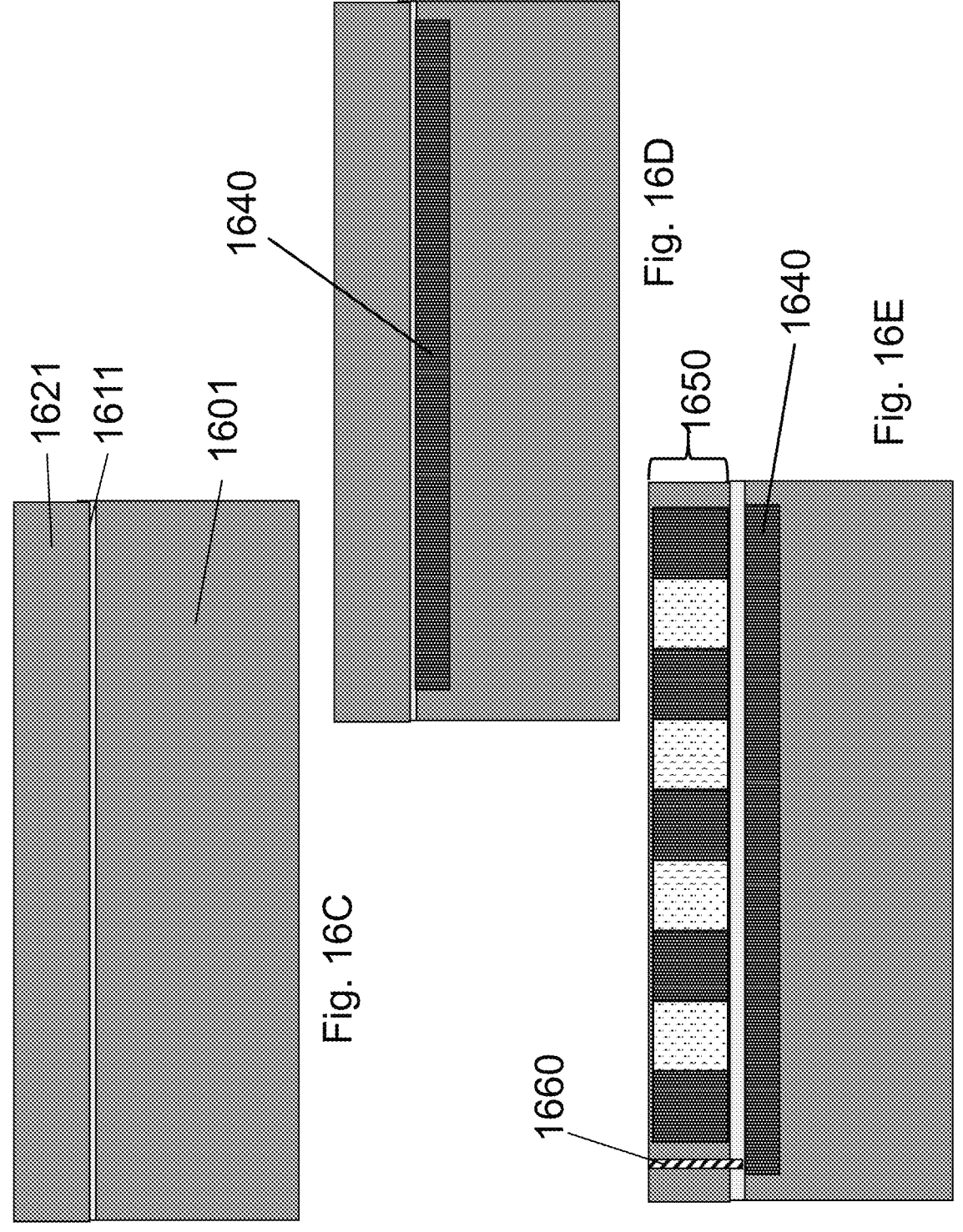

FIG. 16C illustrates structure of a very thin or ultra thin buried oxide SOI substrate, such as is used for FD-SOI which may include substrate 1601, thinBOX 1611 and silicon 1621. FIG. 16D illustrates the structure after doping a designated back gate 1640 and activating it, utilizing, for example, ion implantation and RTP annealing. FIG. 16E illustrates the structure after forming the HD-NOR structure 1650 and contact 1660 to the back gate 1640.

Figures 16F, 16G, 16H:
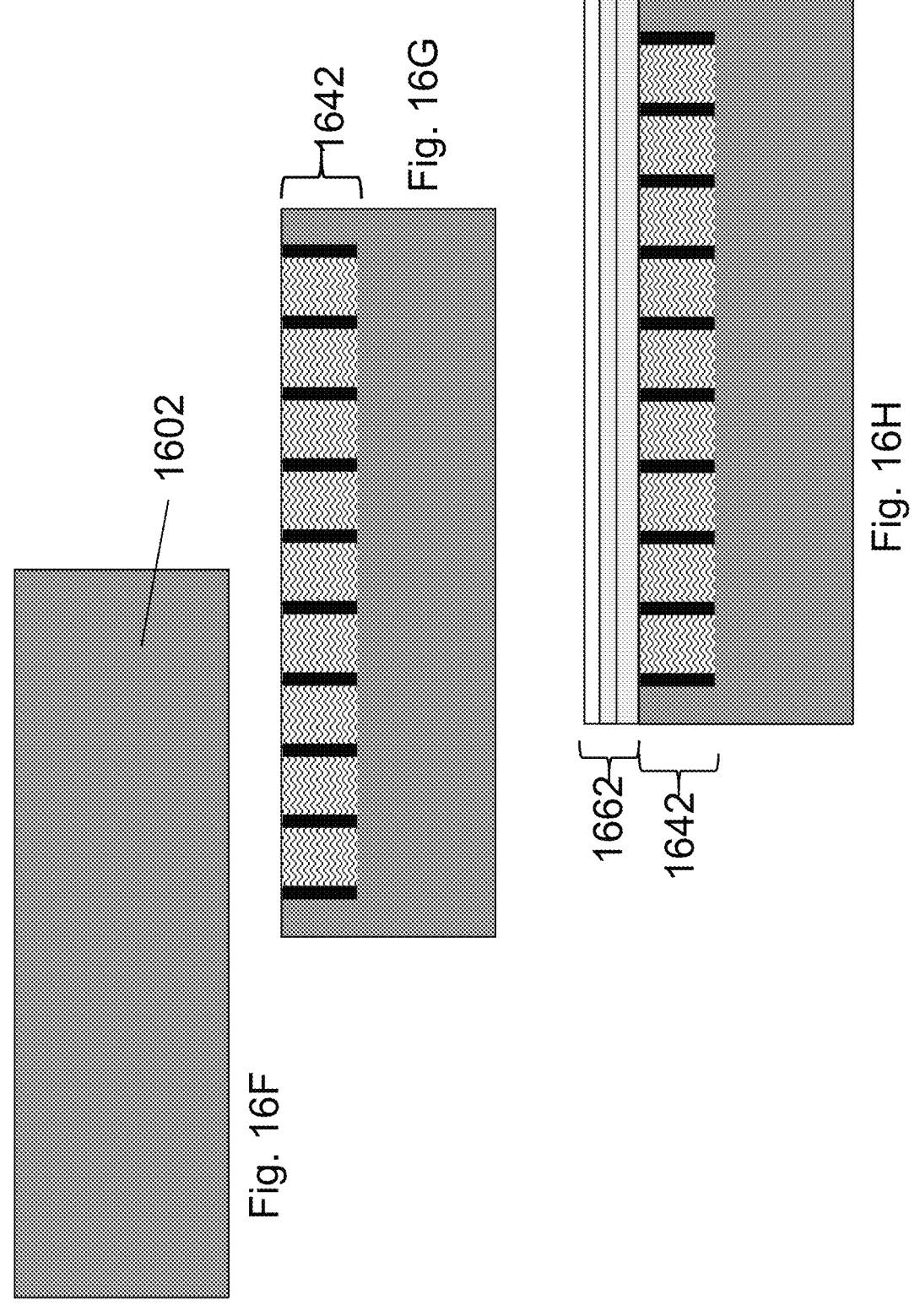
FIGS. 16F-16J are example illustrations of the formation of an M-bulk wafer and finished structures.
Figures 16I, 16J:
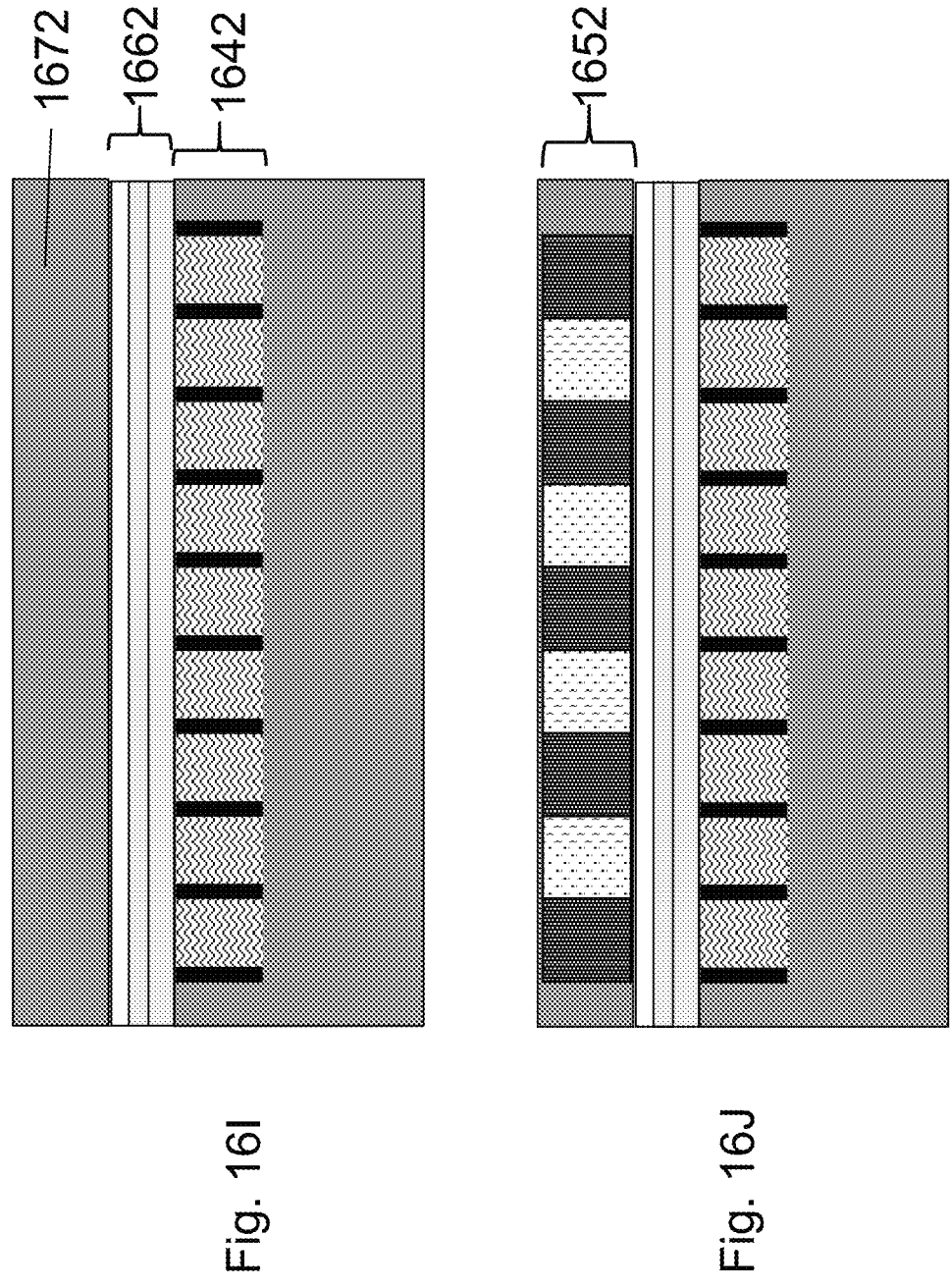

FIG. 16F illustrates structure of bulk substrate 1602. FIG. 16G illustrates the formation of back-gate grid 1642 which would also be the back word-lines. The gate material could be chosen from a range of options such as polysilicon, N type silicon, metals such as tungsten which would withstand high process temperature processing of the following processing. The grid of back-gates could be isolated by oxide or other isolation materials. FIG. 16H illustrates the addition of the O/N/O layers 1662 for the back gate grid 1642. FIG. 16I illustrates the structure after bonding a transferred monocrystalline silicon layer 1672. The transfer could utilize ion-cut or ELTRAN or any other layer transfer technique. The O/N/O layers 1662 could be split between the base structure of FIG. 16H and the transferred layer to facilitate the bonding. FIG. 16J illustrates forming the HD-NOR 1652, which may include the 24 bit per cell option. The connection to the back word-lines (back gate grid 1642) may be done at the line out edges.

Figures 17A, 17B, 17C:
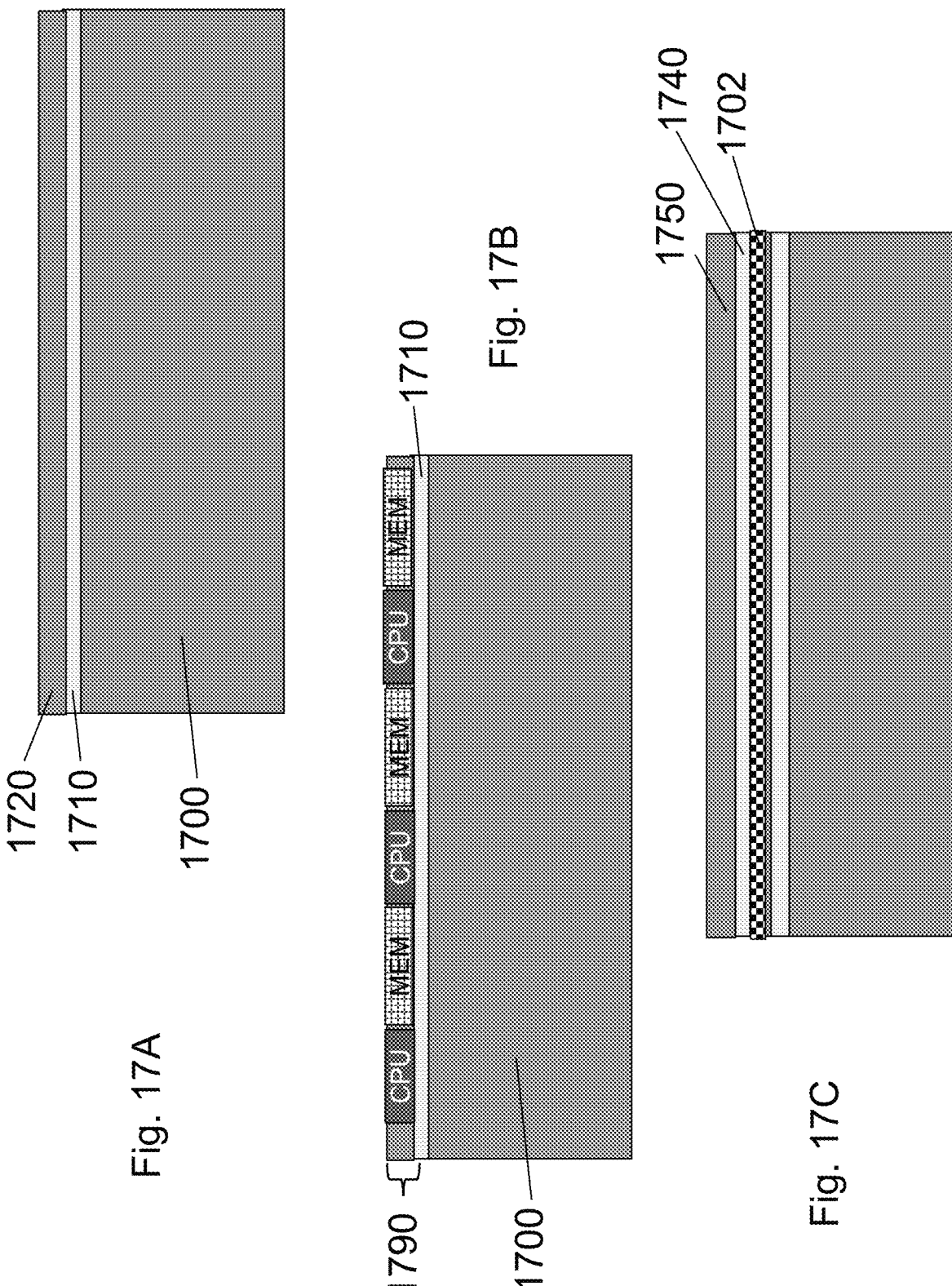
FIGS. 17A-17F are example illustrations of the use of a memory substrate and integration with logic structures.

Another alternative is to provide an HD-NOR structure. For example, as illustrated in FIG. 2J previously herein, as a 'Memory Substrate'. Thus a vendor can fabricate the Memory Substrate, cover with isolation and then transfer on top of a bare wafer using ion-cut, ELTRAN or other layer transfer technique. Such 'Memory Substrate' could be a useful fabric for SOC applications. Designers could customize the underlying memory fabric by etching through to break it into memory blocks per their need. The memory peripherals could be fabricated on the upper layer and then using through layer via connects to the bit-lines and word-lines. An EDA tool with HD-NOR peripherals library and memory compiler could be tied together to support a designer in integration for an SoC product. FIG. 17A illustrates a reference SOI wafer which may include substrate 1700, BOX 1710 and silicon 1720. FIG. 17B illustrates it after forming multi-core circuits 1790 on it, for example, of processor blocks—CPU and memory blocks—MEM.

Figures 17D, 17E, 17F:
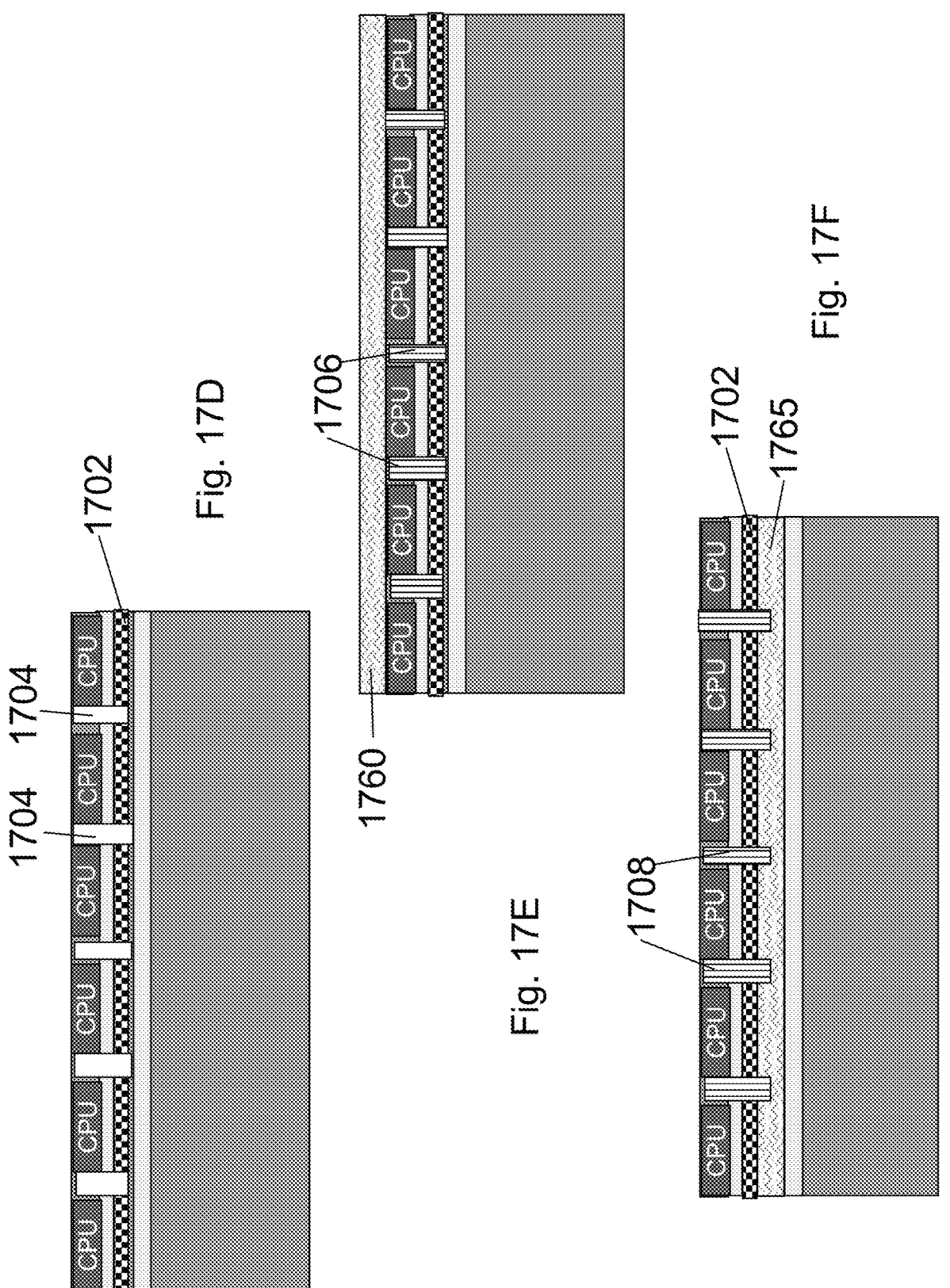

FIG. 17C illustrates a Memory SOI substrate with generic HD-NOR fabric 1702 built inside, and may include an isolation oxide layer 1740 on top of the HD-NOR fabric 1702 and a monocrystalline silicon layer 1750 on top. These may be formed by layer transfer. The structure may be similar to those presented in FIGS. 16E and 161. FIG. 17D illustrates adding the multi-cores but just of processor block—CPU and etching trenches 1704 to customize the generic memory terrain and to open access into it. FIG. 17E illustrates adding the peripheral circuits 1760 for controlling the generic underlying memory block and the connections 1706 to the processors.

An alternative system approach could be to use the custom logic 1765 as the base and to bond the NOR fabric 1702 on top of the logic circuit and etch holes 1708 in the NOR fabric 1702 for the adding of connections to the circuits underneath, as illustrated in FIG. 17F. In such alternative, the NOR fabric alignment precision would be based on the wafer bonder precision, which is far less precise than lithographic alignment (~200 nm vs. 2 nm). Yet, the NOR fabric is a repeating fabric and techniques described in U.S. Pat. No. 8,405,420, incorporated herein by reference, could be used to allow accommodation of the bonder misalignment and still form an effective 3D system integration.

Figures 18A, 18B:
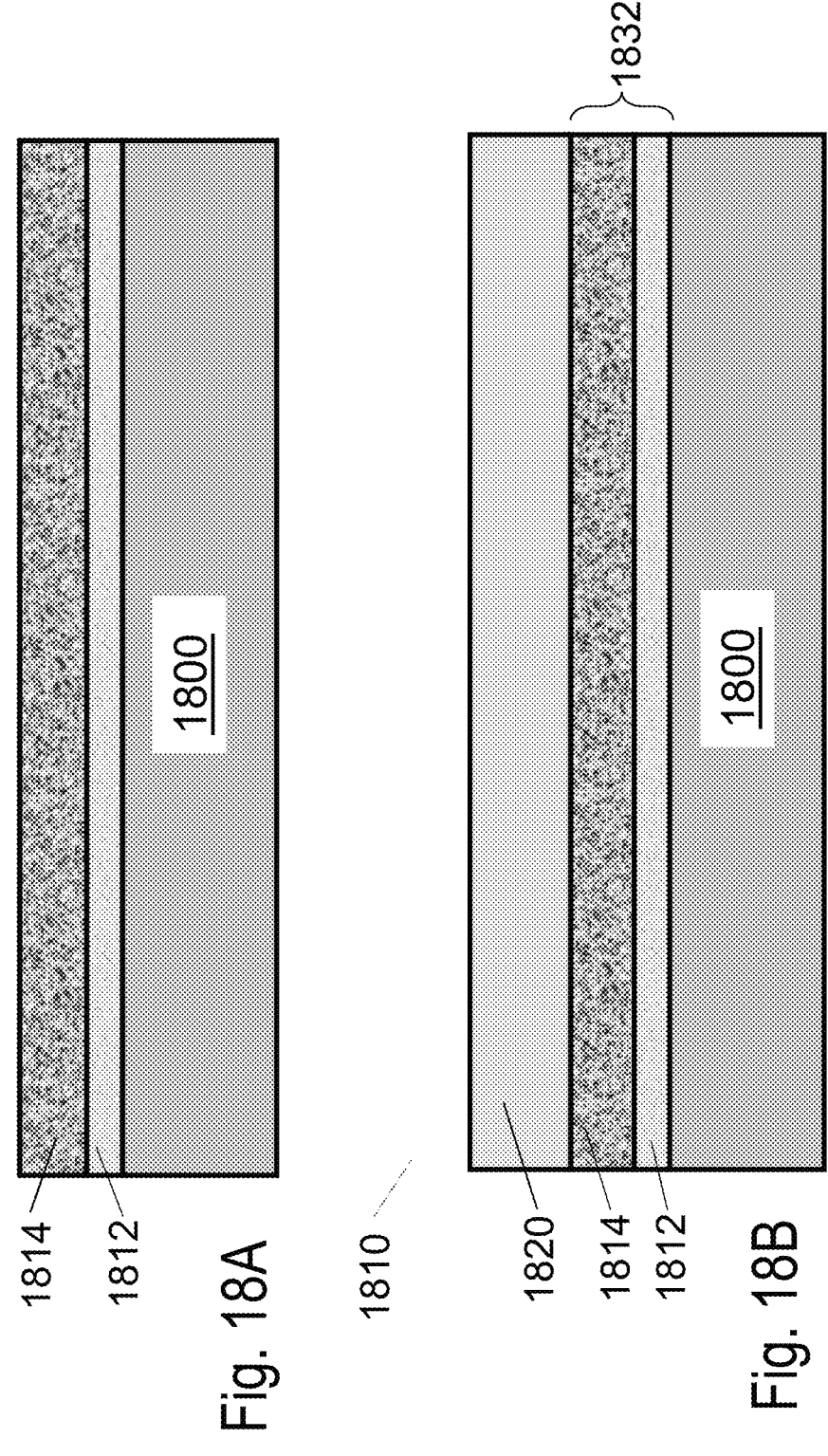
FIGS. 18A and 18B are example illustrations of the formation of a porous layered donor wafer.
Figure 19:
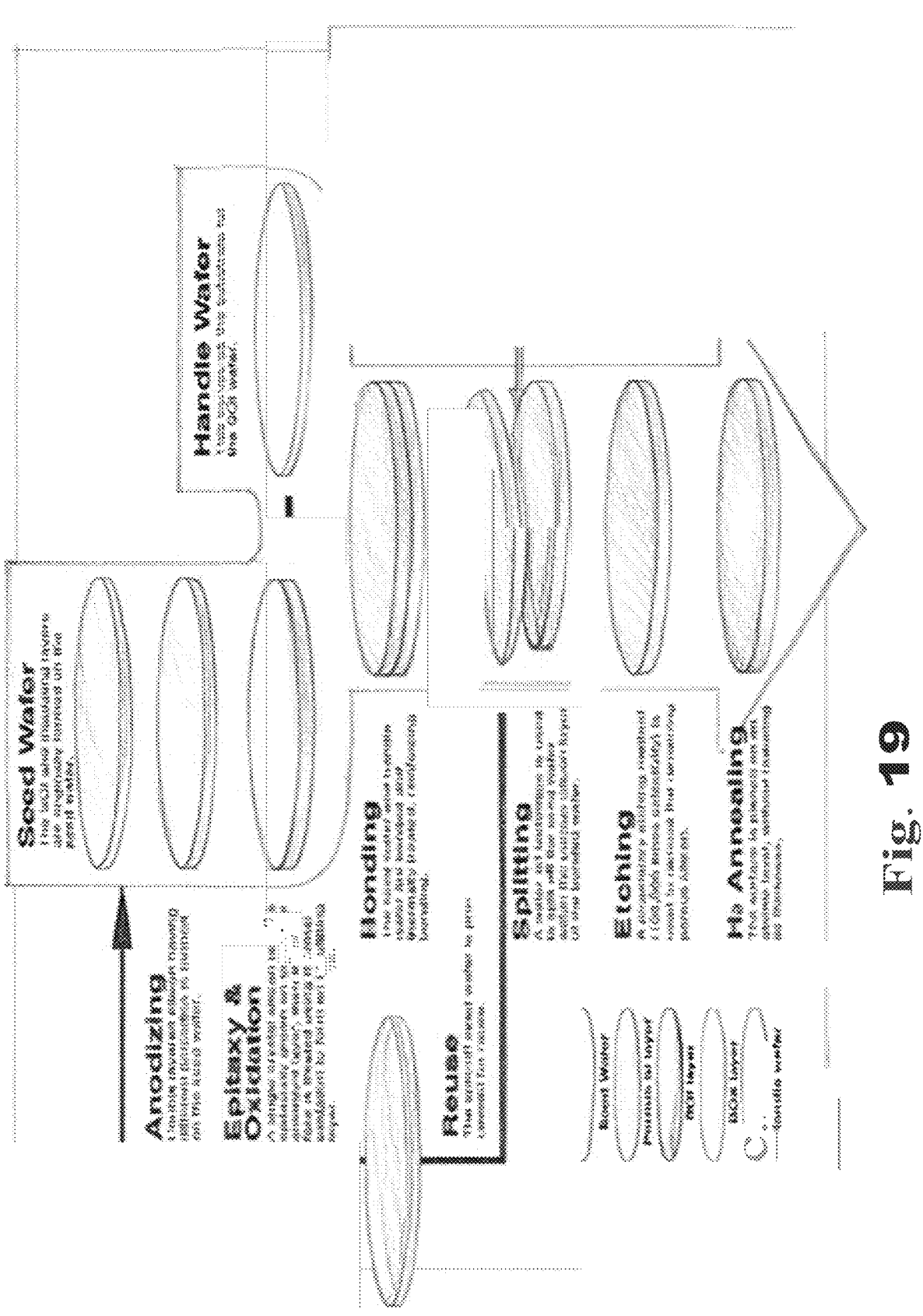
FIG. 19 is an example illustration of the general top-level flow of the ELTRAN process.

In another alternative instead of the base wafer being an SOI wafer as is illustrated in FIGS. 16A-16B, a donor wafer such as illustrated in FIG. 18A could be used. The wafer could include a porous structure 1812/1814 and a mono-crystallized layer 1820 on top of it. Such donor wafer fabrication could use a modified flow of the one developed by Cannon, named ELTRAN, as detailed in a paper by T. Yonehara, entitled "ELTRANO (SOI-Epi Wafer™) Technology", published in Chapter 4, pp. 53, Silicon Wafer Bonding Technology for VLSI and MEMES applications, INSPEC, IEE, 2002, incorporated herein by reference. The general top-level flow of the ELTRAN process for the fabrication of SOI wafer is illustrated in prior-art FIG. 19.

As illustrated in FIG. 18A, a donor wafer 1810 may be constructed. Lower porous layer 1812 and upper porous layer 1814 may be formed by means of anodization on a substrate 1800 such as, for example, a mono-crystalline silicon wafer. The anodization process may involve passing a current through a solution of HF and ethanol with the single-crystal silicon wafer as the anode in order to form microscopic pores of diameters of a few nm on the surface of the wafer at a density of about $10^{11}/cm^2$. The reaction occurs at the far end of the pores, meaning that the pores progressively elongate into the inside of the wafer. The structure of the porous silicon can be controlled by the concentration of the solution, the current density and the resistivity of the silicon. Moreover, the thickness of the porous silicon layer can be controlled by the length of time for which the anodization is carried out. The easiest way of controlling the porous structure is to vary the current density. By doing this a porous layer that has a multi-layered structure, for example, lower porous layer 1812 and upper porous layer 1814, may be formed. In this example, the layer of porous silicon closest to the top surface, upper porous layer 1814, was formed in the base silicon wafer using a low current density, and then after this the current density was raised and a second layer of different/higher porosity was formed (lower porous layer 1812). The upper layer of porous silicon upper porous layer 1814 contains microscopic pores of diameter a few nm, and below this is formed lower porous layer 1812 for which the pore diameter is a few times greater than the upper porous layer 1814.

Dry oxidation of the porous silicon may be carried out at a low temperature of about 400° C. This results in oxidization of about 1~3 nm of the inner walls of the pores, thus preventing the structure of the porous silicon from changing, such as bending or relaxing for example, under a subsequent high-temperature treatment.

Baking may be carried out at about 1000~1100° C. in a hydrogen atmosphere in a CVD epitaxial reactor. Hydrogen pre-baking causes the pores in the porous silicon surface to close up to the extent that the density of these pores goes down from about $10^{11}/cm^2$ before to less than $10^4/cm^2$, and hence the surface is smoothed. To reduce defects, a pre-injection method could be used whereby a small additional amount of silicon is provided from the gas phase (for example as silane) during the hydrogen pre-baking and surface diffusion is made to occur so that the remaining pores in the surface of the porous silicon close-up.

After the pre-injection, epitaxial growth may be carried out at temperatures of about 900~1000° C. The epitaxial layer illustrated as epi layer 1820 in FIG. 18B could be grown to a few nm thick layer, for example, such as about 5 nm or about 10 nm; or to a moderately thick layer, such as, for example, about 100 nm or about 200 nm; or to a relatively thick layer, such as, for example, about 1 micron, or about 3 microns thick. The donor wafer 1810 would then have a silicon layer, epi layer 1820, on top of a cut structure 1832. Cut structure 1832 may include the porous layers, such as lower porous layer 1812 and upper porous layer 1814. Epi layer 1820 may include more than 2 layers (for example three differing pore densities) or may be accomplished by a single layer of changing characteristics, for example, a linearly (or non-linear) changing porosity, or a combination of both. Donor wafer 1810 may include substrate 1800, epi layer 1820 and cut structure 1832, which may include lower porous layer 1812 and upper porous layer 1814. The process may also be modified to leave an edge pore exclusion zone (not shown) including and back from the wafer edge that would not receive the anodization and thereby result in no pores being formed. This could be useful for at least mechanical strength, sealing, selectivity objectives. The edge pore exclusion zone may include widths of 1 um to 5 mm and may include/cover the wafer edge, or be pulled back from the edge. The edge pore exclusion zone may also be designed to not be a continuous ring around the wafer's edge, but rather include breaks/regions in the pore exclusion zone ring of porous silicon to improve the future cleaving process, giving direct or near-direct pore access from the wafer edge at select points/regions/cross-sections, which may result in fewer defects.

A key advantage of the porous base layer transfer technology is the ability of acquiring a base wafer with 'cut' porous structure built-in, run a conventional process including high temperature steps such as doping activation and then later bonds it to a target wafer and then cut.

Figures 20A, 20B:
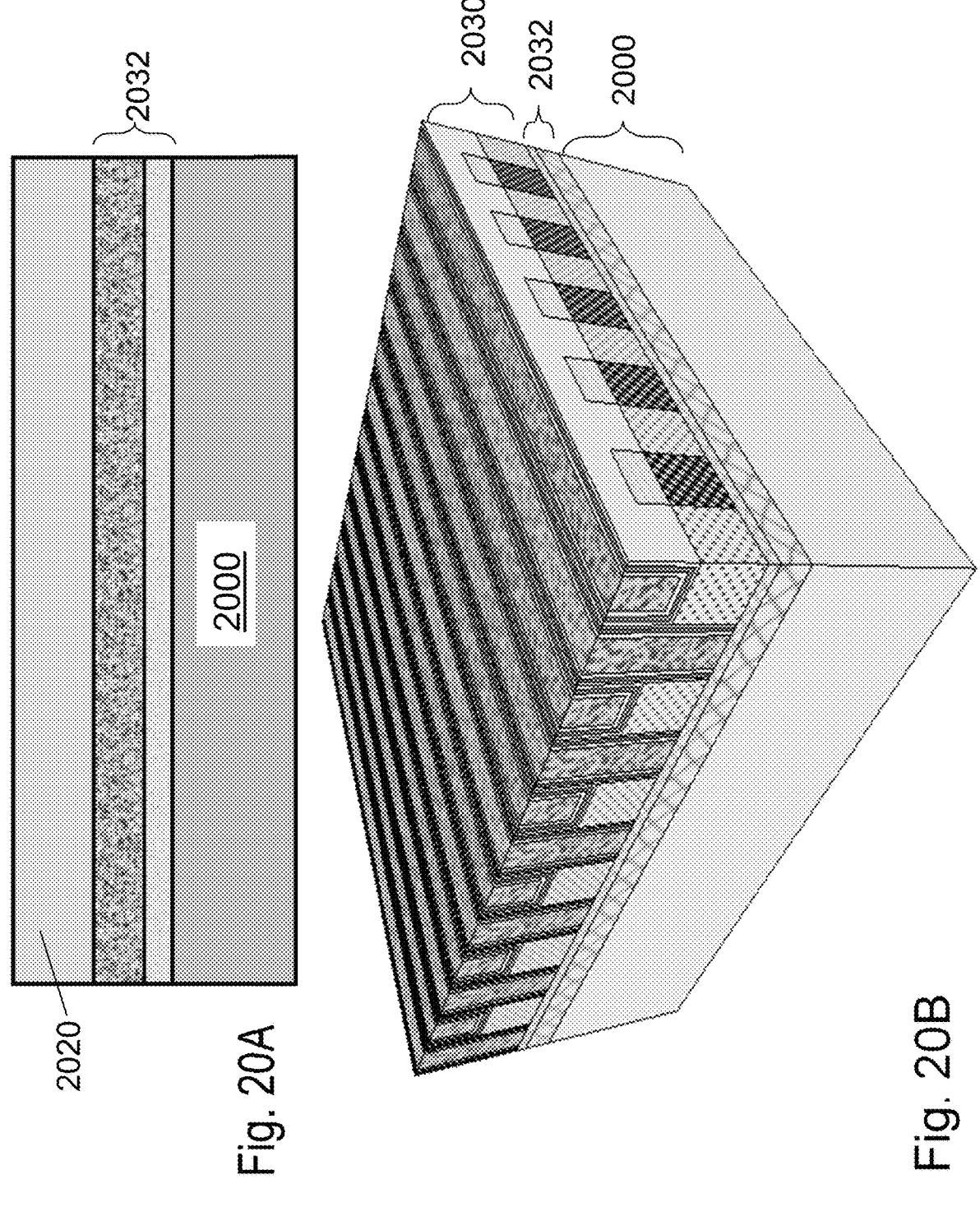

FIG. 20A illustrates a donor wafer with silicon base substrate 2000, porous double layer cut structure 2032 and top silicon 2020. FIG. 20B illustrate the structure after forming the NOR structure on the top silicon 2020. Resulting with base substrate 2000, cut structure 2032, and top NOR structure 2030 with 3 active facets per cell, which is similar to 1150 or the structure illustrated in FIG. 2I herein.

Figure 20C:
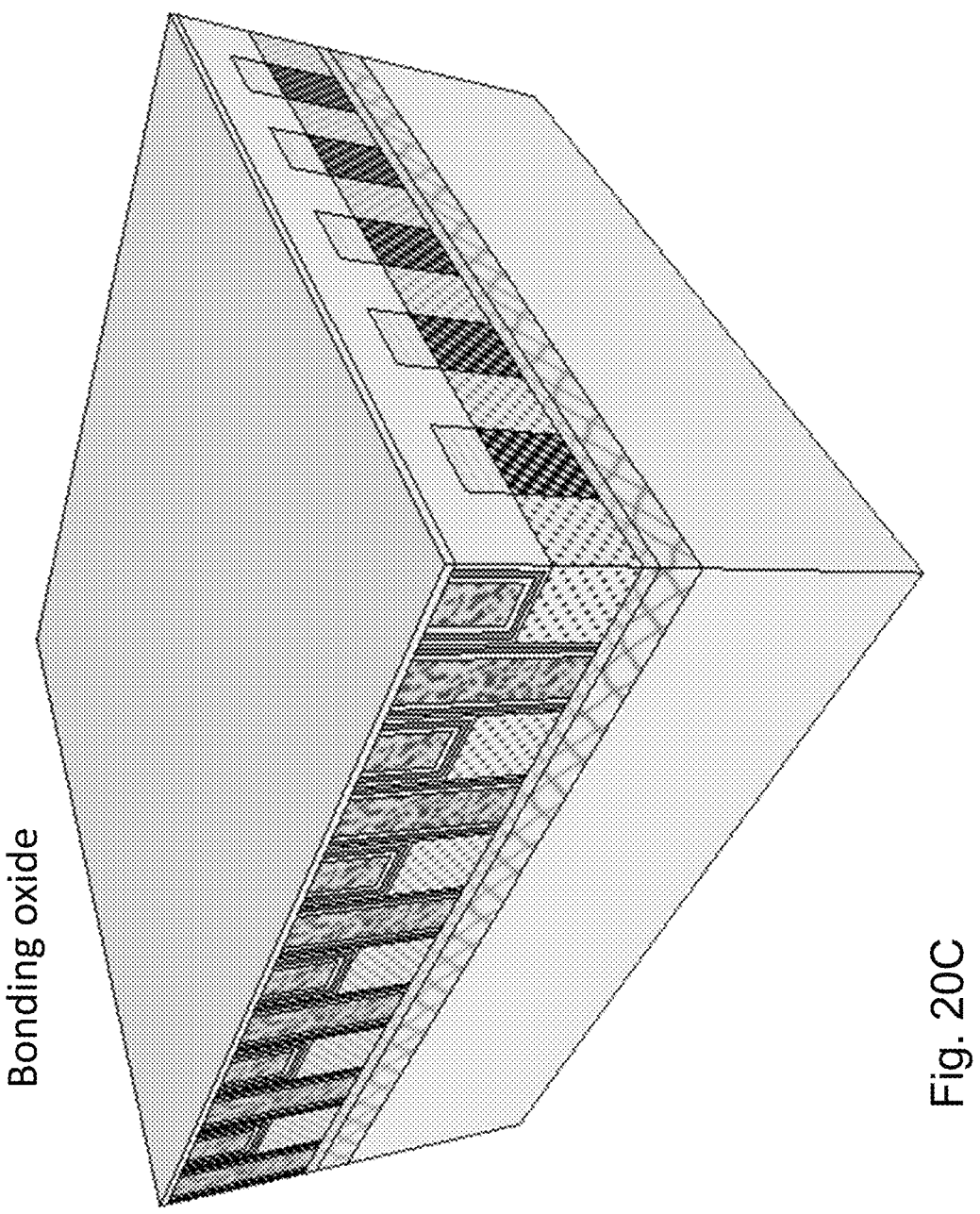
Figure 20D:
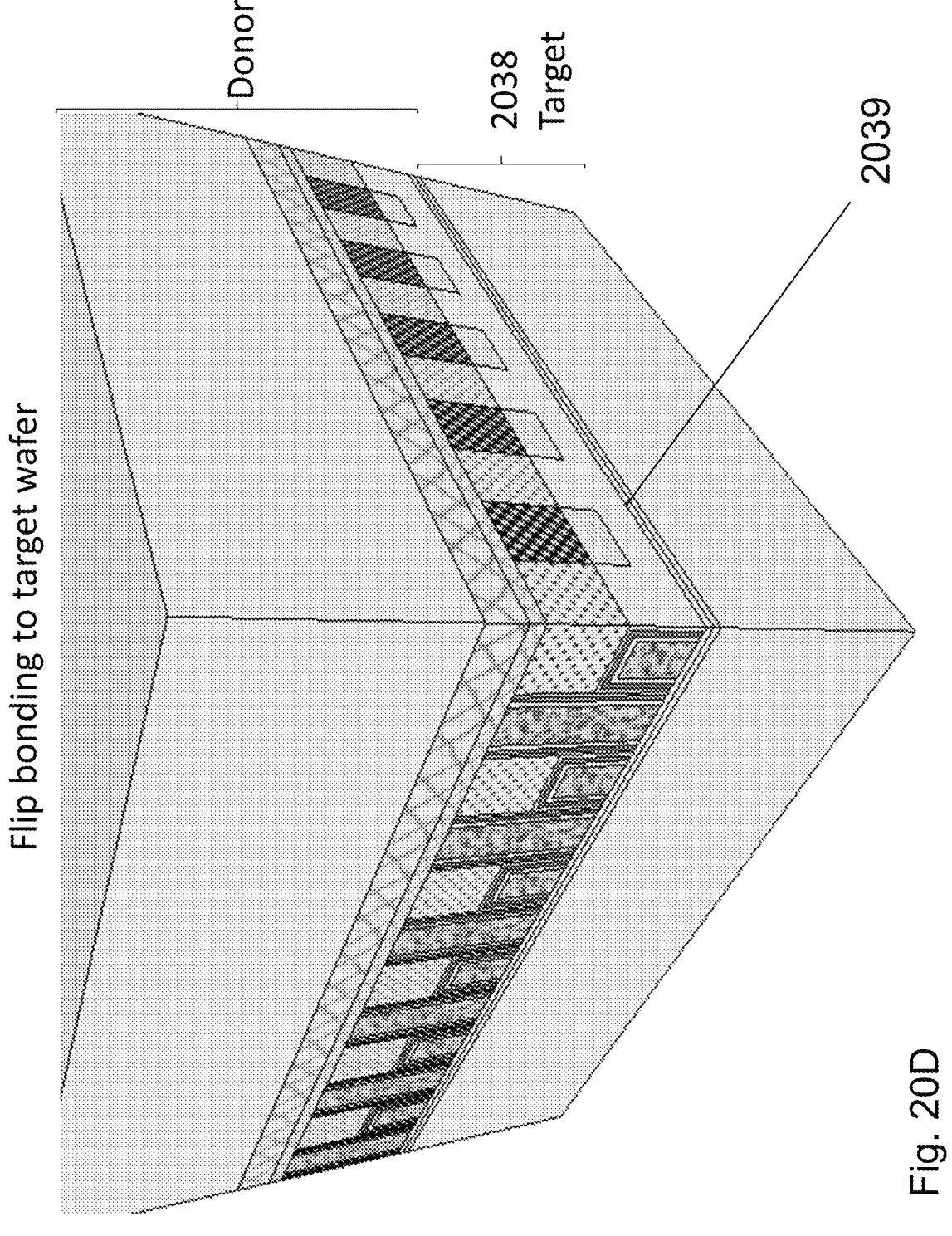

FIGS. 20C and 20D illustrate the structure after flipping it and bonding it on top of a wafer with a top oxide layer, and then cutting the porous cut structure 2032, lifting off the base substrate 2000 which could be sent to recycle and reuse.

Figure 20E:
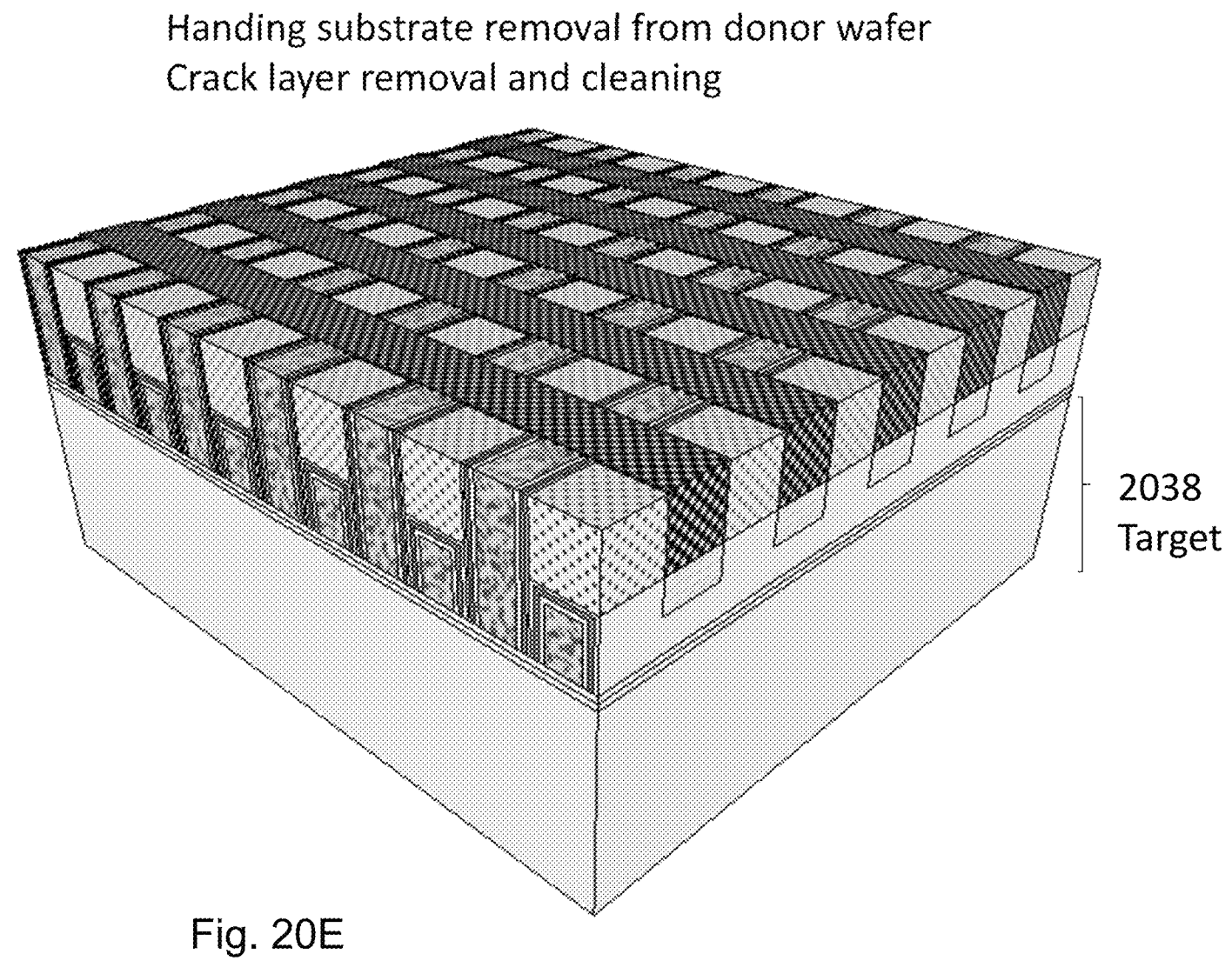

FIG. 20E illustrates the structure after cleaning off the porous residues.

Figure 20F:
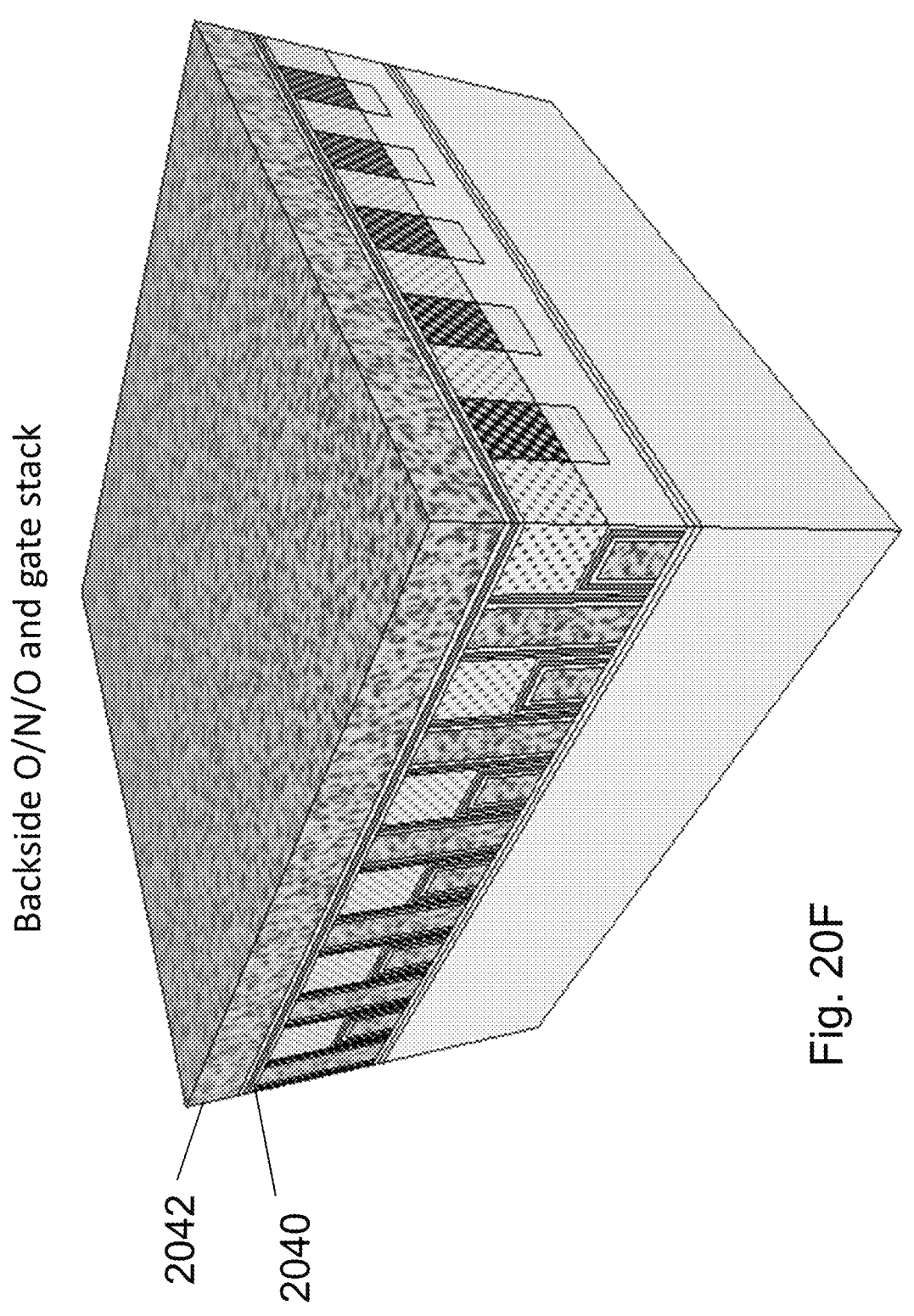

FIG. 20F illustrates then adding O/N/O layers on the now exposed 'back-side'.

Figure 20G:
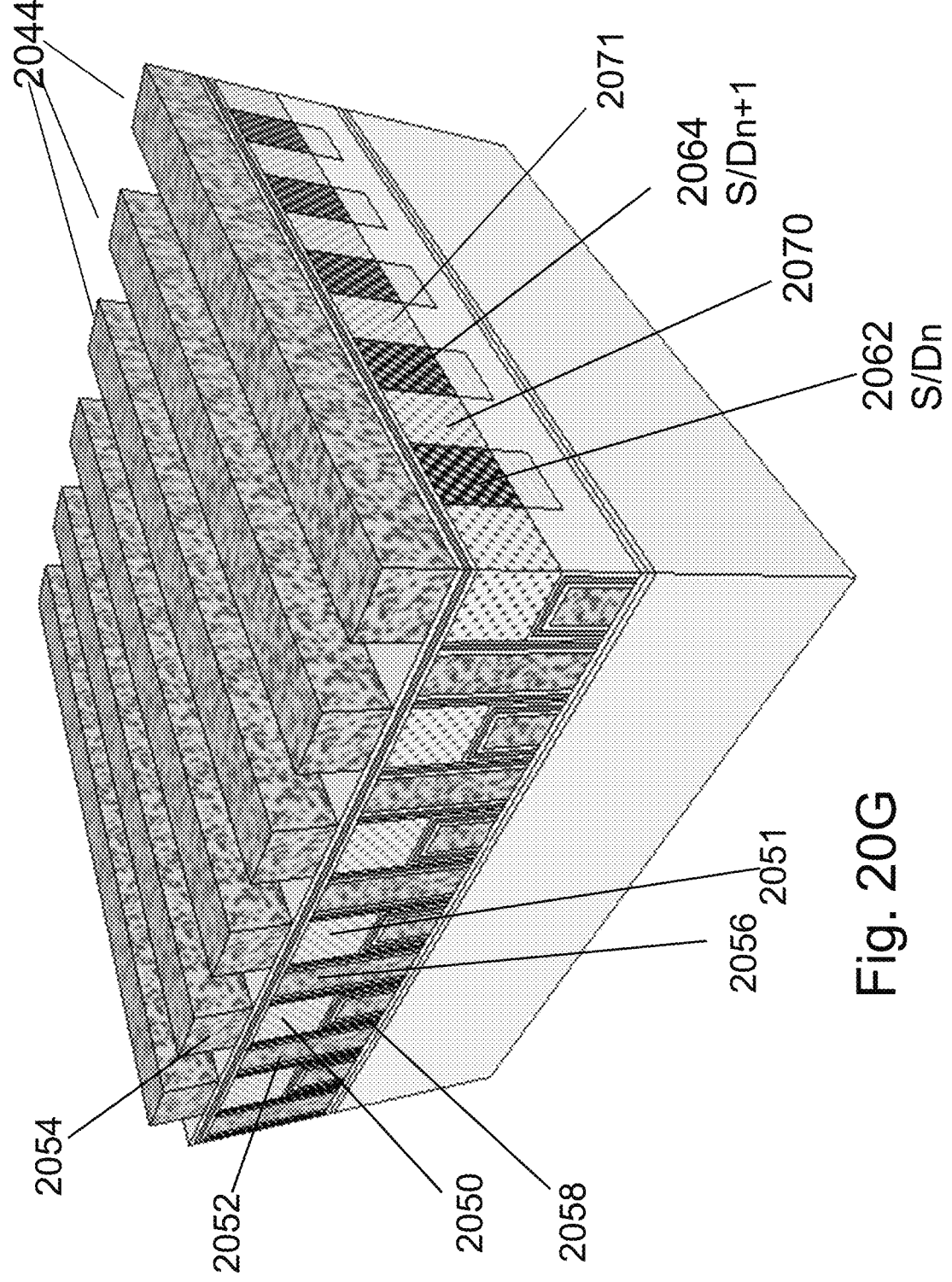

FIG. 20G illustrates then forming gates for the fourth channel facet resulting in four facets each with control gate (C-Gate), right gates (R-Gates) and left gates (L-gates). Thus, channels 2050 are surrounded with gates 2052, 2054, 2056, 2058 to all four facets that are not connected to the S/D lines.

An alternative fabrication technique is to not use porous base donor wafer but rather use a bulk wafer and form the porous cut layer as part of forming the 2D NOR structure. Specifically, following the step of etching the P regions for channel isolation as illustrated in FIG. 2F and FIG. 2G herein, place the entire structure into an anodizing process forming the porous cut structure underneath through the openings 229. To avoid anodizing the active channel due to the isotropic nature of the anodizing etch process, the O/N/O layers 224, or part of it, could be first deposited then a short RIE etch could be used to reopen the bottom of 229 and then an anodizing step could be used to form the porous structure underneath saving the need for epitaxy of layer 2020. In such an alternative then after flipping, bonding, and cut the now exposed back side needs to be planarized, using, for example CMP or $H_2$ annealing. After which O/N/O and fourth gate could be formed.

Additional alternative is to increase the number of bits per facet by utilizing techniques such as non-uniform channel as presented in a paper by Gu Haiming et al titled "Novel multi-bit non-uniform channel charge trapping memory device with virtual-source NAND flash array" published in Vol. 31, No. 10 Journal of Semiconductors October 2010, incorporated herein by reference.

Additional alternative is to increase the number of bits per facet by utilizing techniques such as advanced charge trap layer such as one utilizing ambipolar polymer as presented in a paper by Ye Zhou et al titled "Nonvolatile multilevel data storage memory device from controlled ambipolar charge trapping mechanism" published in SCIENTIFIC REPORTS|3: 2319|DOI: 10.1038/srep02319, incorporated herein by reference.

Additional alternative is to increase the number of bits per facet by utilizing techniques such as advanced charge trap layer such as one utilizing multilayer silicon nanocrystal as presented by T. Z. Lu et al in a paper titled "Multilevel Charge Storage in Silicon nanocrystal Multilayers" published in Appl. Phys. Lett. 87, 202110 (2005), incorporated herein by reference.

Additional alternative is to increase the number of bits per facet by utilizing techniques such as advanced charge trap layer such as one utilizing multi-layered Ge/Si nanocrystals as presented by Guangli WANG et al in a paper titled "Charge trapping memory devices employing multi-layered Ge/Si nanocrystals for storage fabricated with ALD and PLD methods" published in Front. Optoelectron. China 2011, 4(2): 146-149, incorporated herein by reference.

For one skilled in the art, other variations or alternatives known for charge trap memory with the required corresponding enhancements to the channel or to the charge trap—O/N/O layers may be employed.

Figure 21:
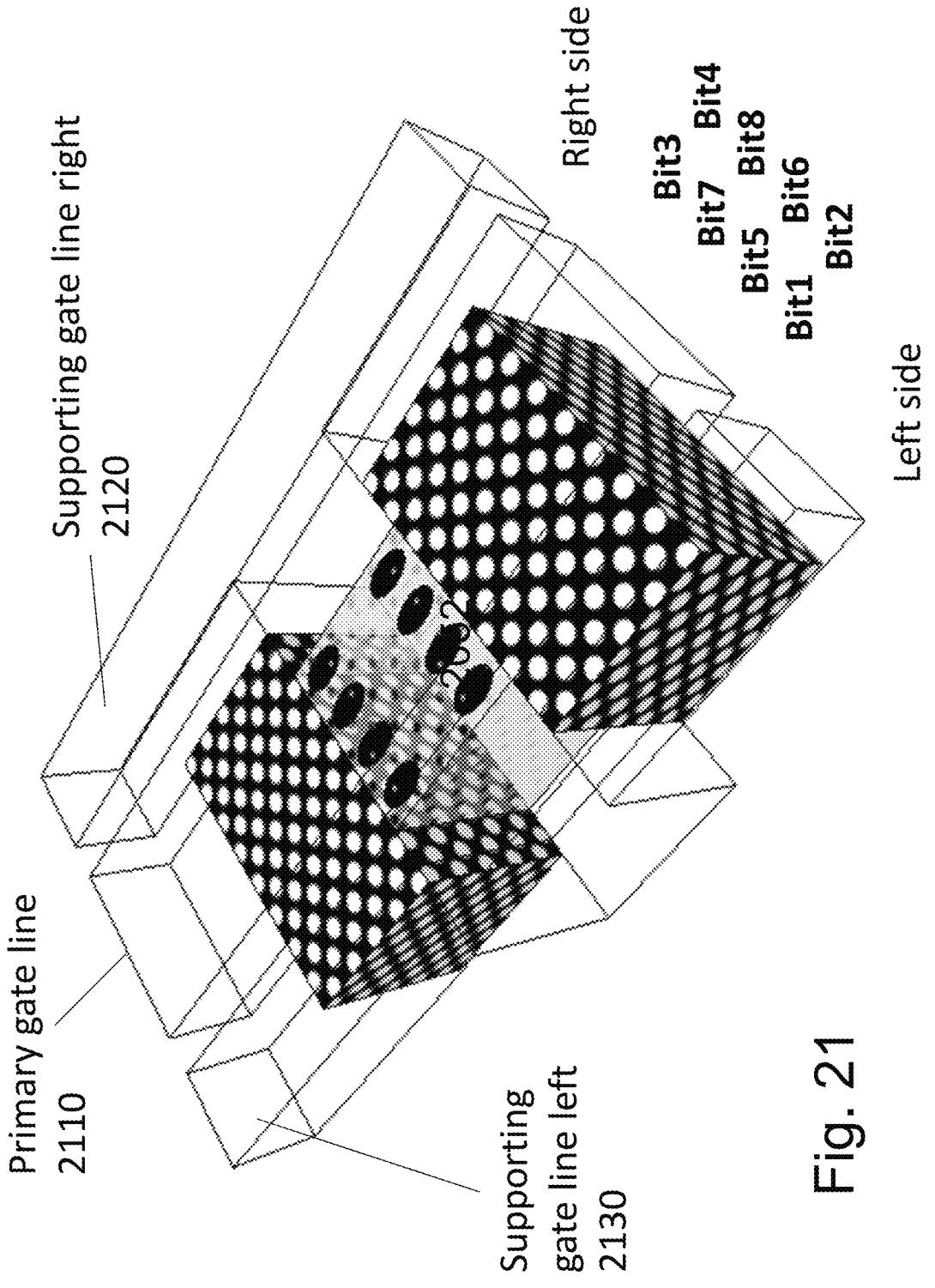
FIG. 21 is an example illustration of a channel with a facet holding 8 bits.

FIG. 21 illustrates 8 bit naming and location on a facet. Each of the four facets have a primary gate line 2110 which we can call C-Gate, a supporting gate line right 2120 which we call R-Gate, and supporting gate line left 2130 which we can call L-Gate. Reference to FIG. 20F, it could be:

> C-Gate 2052 with R-Gate 2058 and L-Gate 2054 or alternatively,
> C-Gate 2054 with R-Gate 2052 and L-Gate 2056 or alternatively,
> C-Gate 2056 with R-Gate 2054 and L-Gate 2058 or alternatively,
> C-Gate 2058 with R-Gate 2056 and L-Gate 2052 FIG. 22 illustrates the operating condition for that storage facet. The read is by measuring the current (Vth) between the S/Dn 2062 to S/Dn+1 2064 shown in FIG. 20F.

Engineering the memory peripheral circuits for the memory matrix including the circuits to generate the required signals for the memory control lines and the sense circuits to sense the memory content is a well practiced memory engineering task. The memory structure presented herein adds some less common variations as a word-line controlling a gate may be function as a R-Gate or as C-Gate or as L-Gate depend on the specific channel presently in action. In the following we review the high level architecture for such a memory control circuit.

The following discussion would be for a specific one of the many alternative architecture options—of an 8 bit per facet as illustrated in FIG. 20F and FIG. 21. However, this methodology may be applied to a variety of architecture options.

As an alternative the gate control lines of the cells adjacent to a channel which is being written to or read from could be biased to a negative voltage such as −4v to disable these adjacent channels. For example, if in reference to FIG. 3 a GLtop,m is active as being the control gate (C-Gate) for the channel underneath it and GLleft,m is acting as L-Gate, then GLtop,m+1 and not shown GLbottom,m+1 are both being set to −4v negative (which still do not erase), and also GLleft,m+1 could be set to −4v negative, so the channel underneath GLtop,m+1 is deactivate to avoid disturb.

FIG. 22 illustrates the table of write read conditions to form 8 independent memory locations per facet resulting with 32 memory locations per channel.

Figure 23:
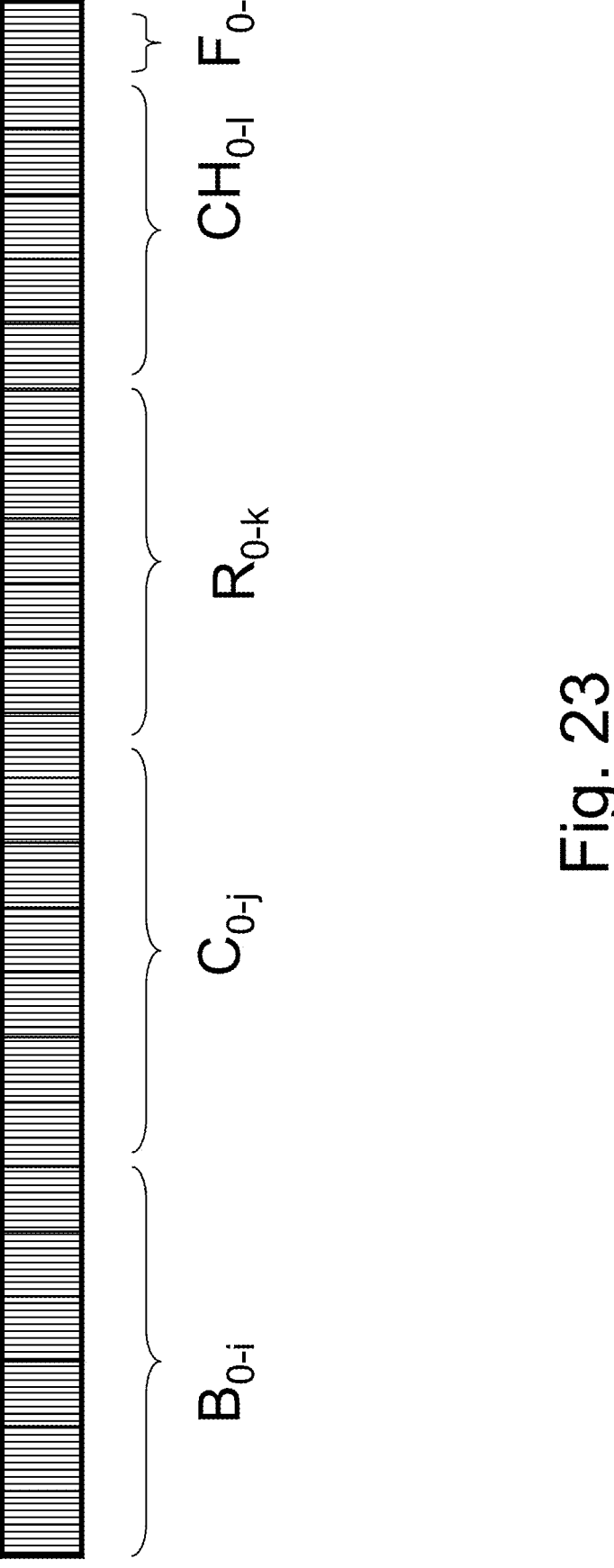
FIG. 23 is an example illustration of a memory addressing format.

FIG. 23 illustrate a memory addressing format 2300 which could include 0-2 bits to select the specific facet ($F_{0-1}$), a few bits to select the specific Channel ($CH_{0-1}$), a few bits to select the specific Row ($R_{0-k}$), a few bits to select the specific Column ($C_{0-j}$) and a few bits to select the specific memory Block ($B_{0-i}$). The decoding function of the Block is straightforward.

Figure 24A:
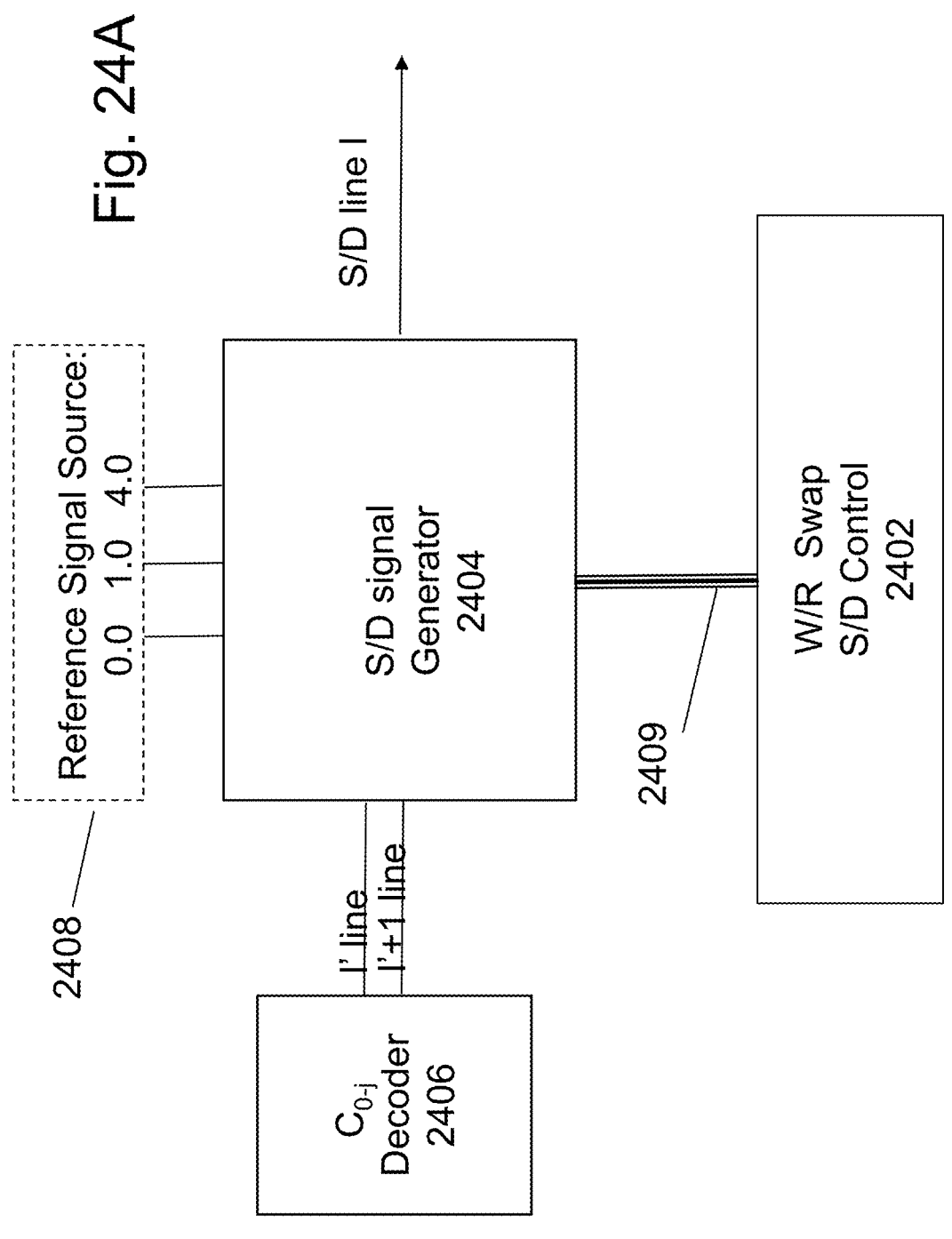
FIGS. 24A-24B are example illustrations of block diagrams of circuit control circuits.

FIG. 24A illustrates block diagram of the circuit controlling each of the bit-lines—S/D line l in which l denotes the active channel column. The decoder 2406 will assert one line of the l lines for each column. The signal generator 2408 will provide the required signals that could be applied to the S/D line. The signal generator 2404 will activate signals only to the S/D line l' for 'left'-S/Dn function activated by l' or 'right'—S/Dn+1 function activated by l'+1 to provide the proper signal to the selected channel according to the table of FIG. 22 and the operation control as signaled by the S/D control 2402 to activate write read or erase.

Figure 24B:
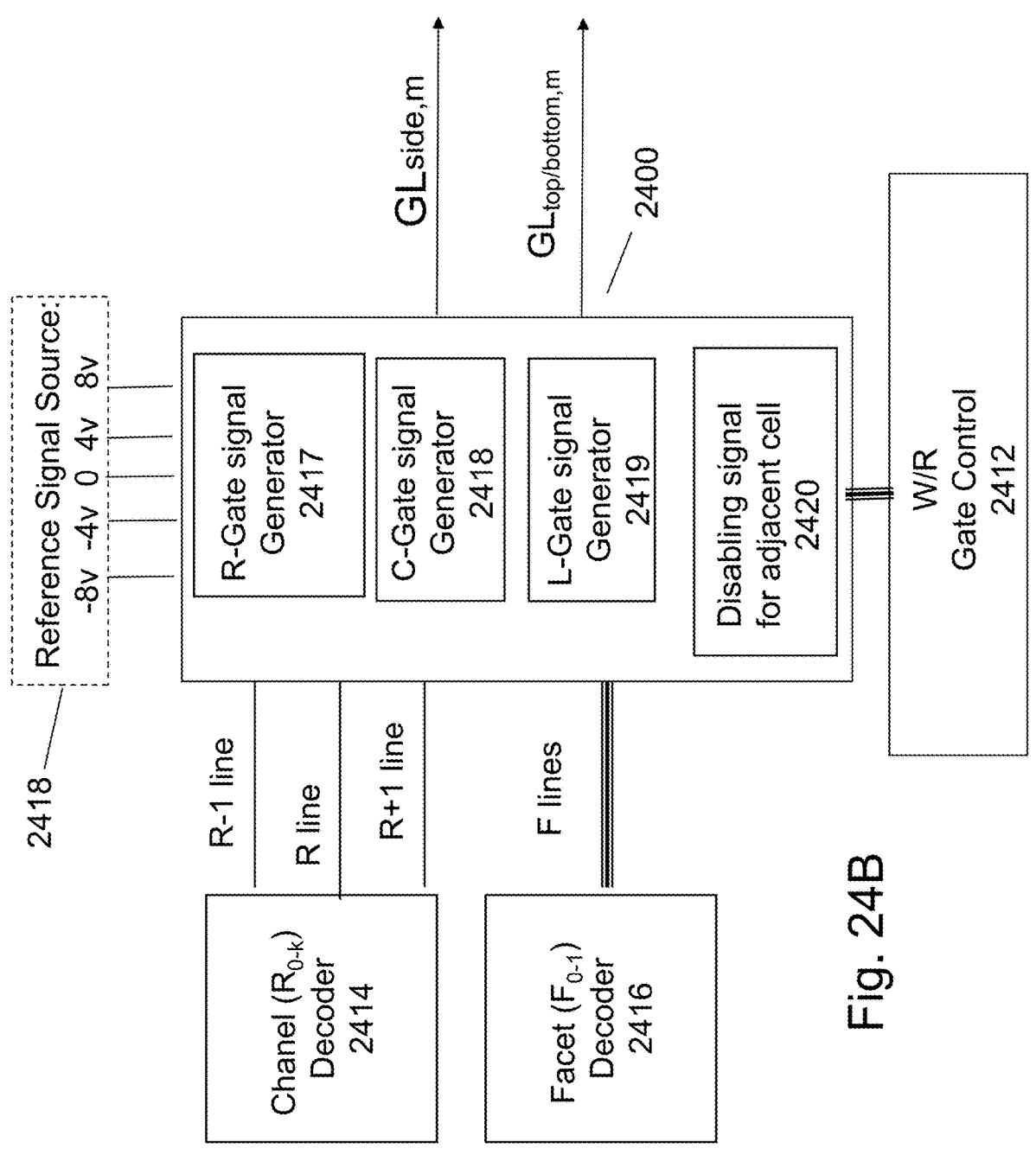

FIG. 24B illustrates a general block diagram of the circuits to control the gate-lines. Each gate-line could function as R-Gate, C-Gate or L-Gate according to the Chanel decoding and the Facet decoding. The Side-Gate-Lines could affect two adjacent channels so the Top/Bottom Gates could help select the active channel and disable the adjacent non-selected non-active channel, as activated by the channel decoder 2414. The gate line generator 2400 could generate GLside,m and GLtop/bottom, m signals. Each of these Gate Lines could function as R-Gate, C-Gate or L-Gate according to the selection of Facet as decoded by the Facet decoder 2416 and the activated channel line. For each Gate line the signal generator 2400 could include three generators: one for the R-Gate function 2417, one for the C-Gate function 2418, and one for the L-Gate function 2419. These generators would generate the right proper signal according to the selected function which could be signaled by the write/read control 2412 and using reference signals provided by the reference signal generator 2418.

The reference signal generator 2418 provides the required signals to operate the read write operations. All the voltages suggested herein are suggested voltages for some conceptual NOR. These signal levels could be adjusted for specific designs based on the choice of materials, process flow, layer thicknesses, and feature sizes.

Another known enhancement technique is to control the amount of charge being trapped in a cell to allow coding of more than 1 bit base on the amount of charge. These different enhancement techniques could be combined to achieve a higher number of bits per cell. Current charge trap memories are known to achieve 3 bits or 8 levels per cell. A white paper titled "MirrorBit® Quad Technology: The First 4-bit-per-cell Flash Memory Spansion™ MirrorBit Quad Technology to Expand Flash Memory Innovation for Electronic Devices" was published by Spansion-www.spansion, Doc. 43704A (SEPTEMBER 2006), incorporated herein by reference. The paper shows the use of MirrorBit in which every bit site could be program to one of 4 levels representing 2 bits, providing in total 4 bits per cell. Adapting such to the HD-NOR could result, if we use 4 levels per location, with 2×32=64 bits per cell, and with 8 levels per location, with 3×32=96 bits per cell of non volatile memory structure. And the same structure could be used to have some of the memory used as fast access FB-RAM for which a self-refresh mode could be added. In addition known techniques such as Probabilistic error correction in multi-bit-per-cell flash memory as described in U.S. Pat. No. 8,966,342, incorporated herein by reference, could be integrated for increased robustness of such memory operations.

In general memory design it is common to use partitioning which utilizes powers of 2, such as: 2, 4, 8, 16, 32, 64, . . . . Such work well with decoding and addressing. Yet, FIG. 9 illustrates a structure for which the number of bits sited within a facet is 6, which may be challenging for the decoding function. An optimal solution is to find a memory allocation which would be close enough to bridge over this challenge with minimal cost. For example, a facet of 6 sites might allow each site to have 3 levels representing a total memory space of 18 bits per facet. This could be mapped to an address space of 4 bits which would need 16 memory storage option out of the potential 18. A simple look up table could be used for the circuit to support such memory allocation allowing for 2 bits of the 18 to be left unused or for redundancy/check&parity bit use.

Figure 25:
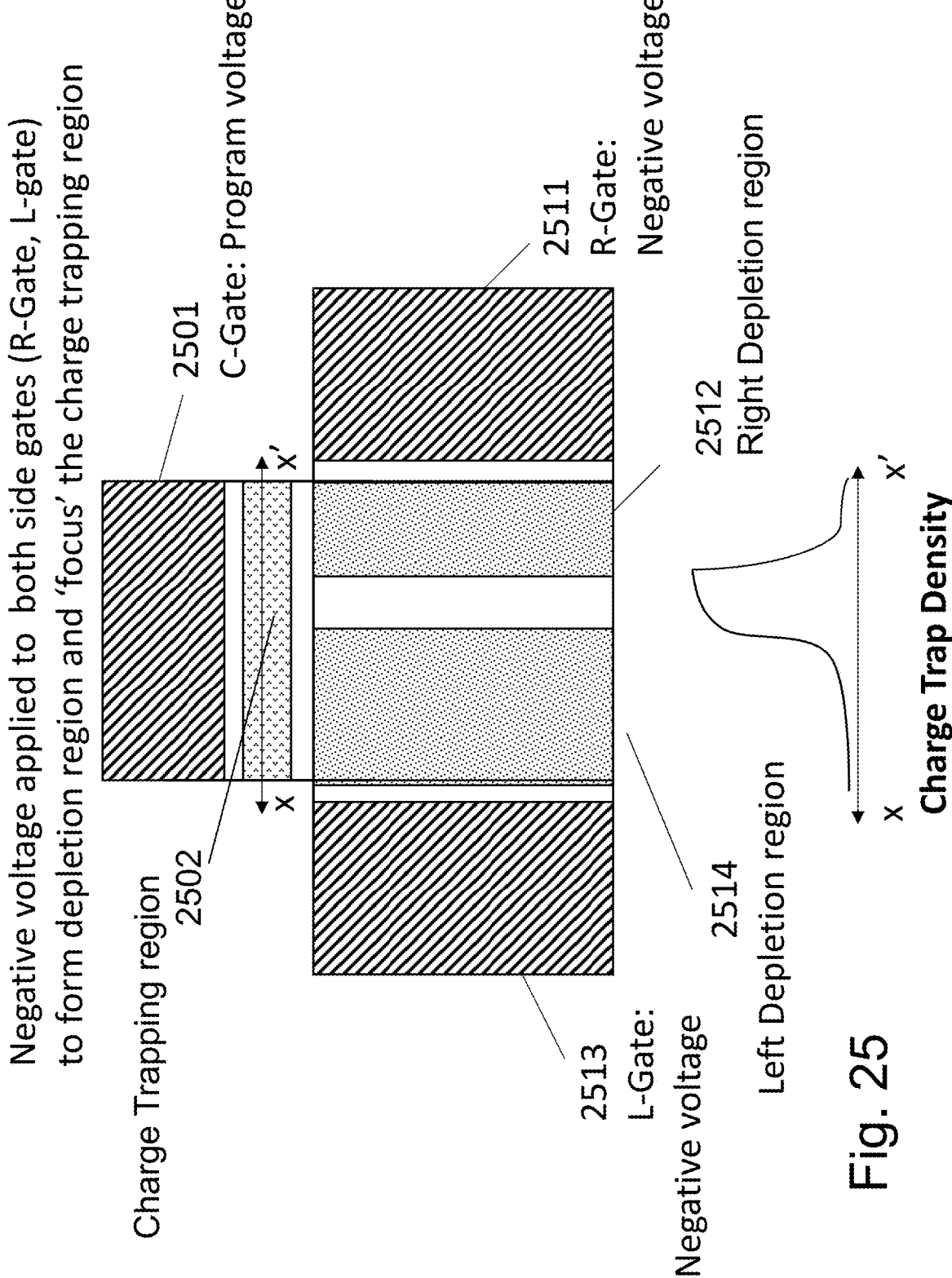
FIG. 25 is an example illustration of focusing the trapping region to a zone of charge trapping region.

The three gate control of the charge trap layers of 3D-NOR as illustrated in FIG. 21 could be used for distributed bits allocation rather than programming/erasing distinct sites, as illustrated in FIG. 25.

FIG. 25 illustrates the concept of utilizing the right 2511 and left gates 2513 to focus the trapping region to a zone of trapping region 2502 driven by the control gate 2501 high 'programming' voltage. The R-Gate voltage and the L-Gate voltage need to be below the voltage which forces charges into the charge trap layer (write) or loose the charges from the charge trap layer (erase). The negative voltage of the right gate depletes the channel region under its control 2512 while the negative voltage of the left gate depletes the channel region under its control 2514 to focus the region of charge trapping. Controlling the process could allow a scanning of the region within the channel for which charge could be available and accordingly allow forming a distribution of charges trapped at the trapping layer. This could be done by controlling the voltage of the side gates to form a scanning distribution of charges within the channel while control of the control gate 2501 programming voltage and the S/D charges forming current could control the amount of charges being trapped at the 'focus' zone 2502.

Figure 26:
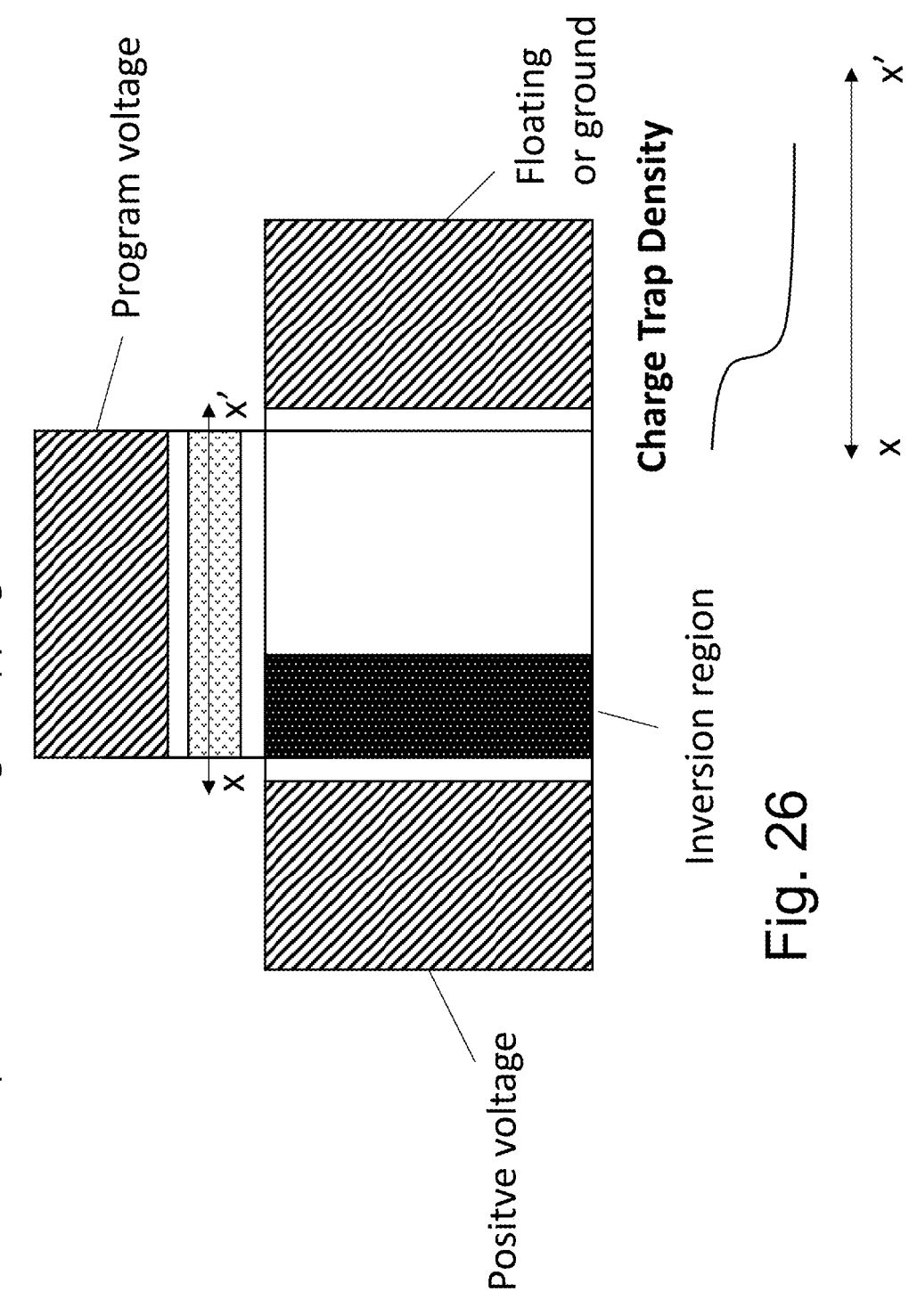
FIG. 26 is an additional example illustration of focusing the trapping region to a zone of charge trapping region.

FIG. 26 illustrates the use of positive voltage to form trapping 'focus.' Adding positive voltage to the R-Gate and L-Gate could be used to extend the width of the controlled regions within the channel.

Figure 27:
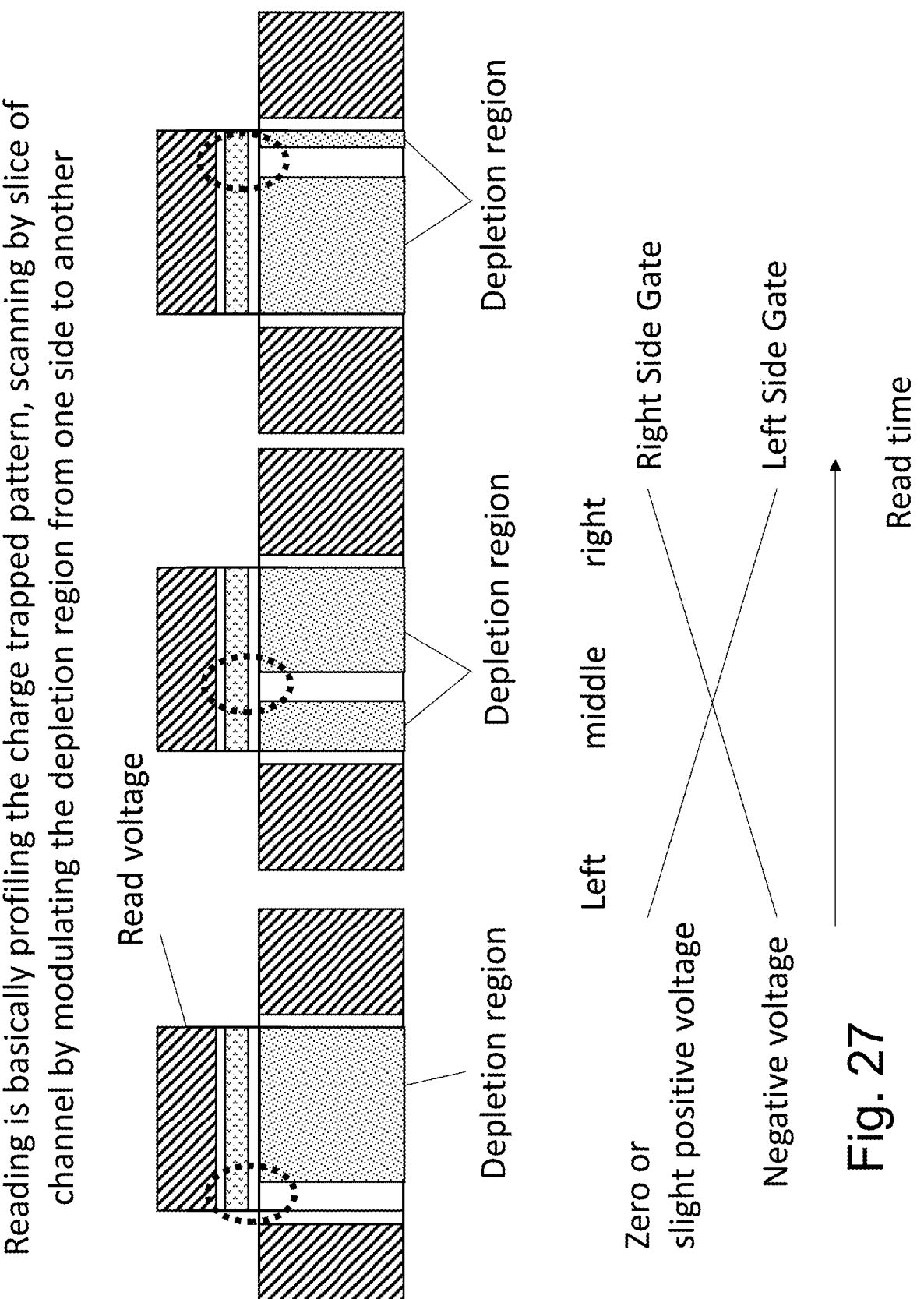
FIG. 27 is an example illustration of reading a zone of charge trapping region.

FIG. 27 illustrates the concept of using the scanning concept for reading. For reading, the R-Gate and the L-Gate could be controlled to form scanning similar to writing but the C-Gate voltage is kept below the voltage that drive charges in or out of the charge trap layer, and by monitoring the current through the channel by sensing the selected S/D lines and monitoring their current.

Figure 28:
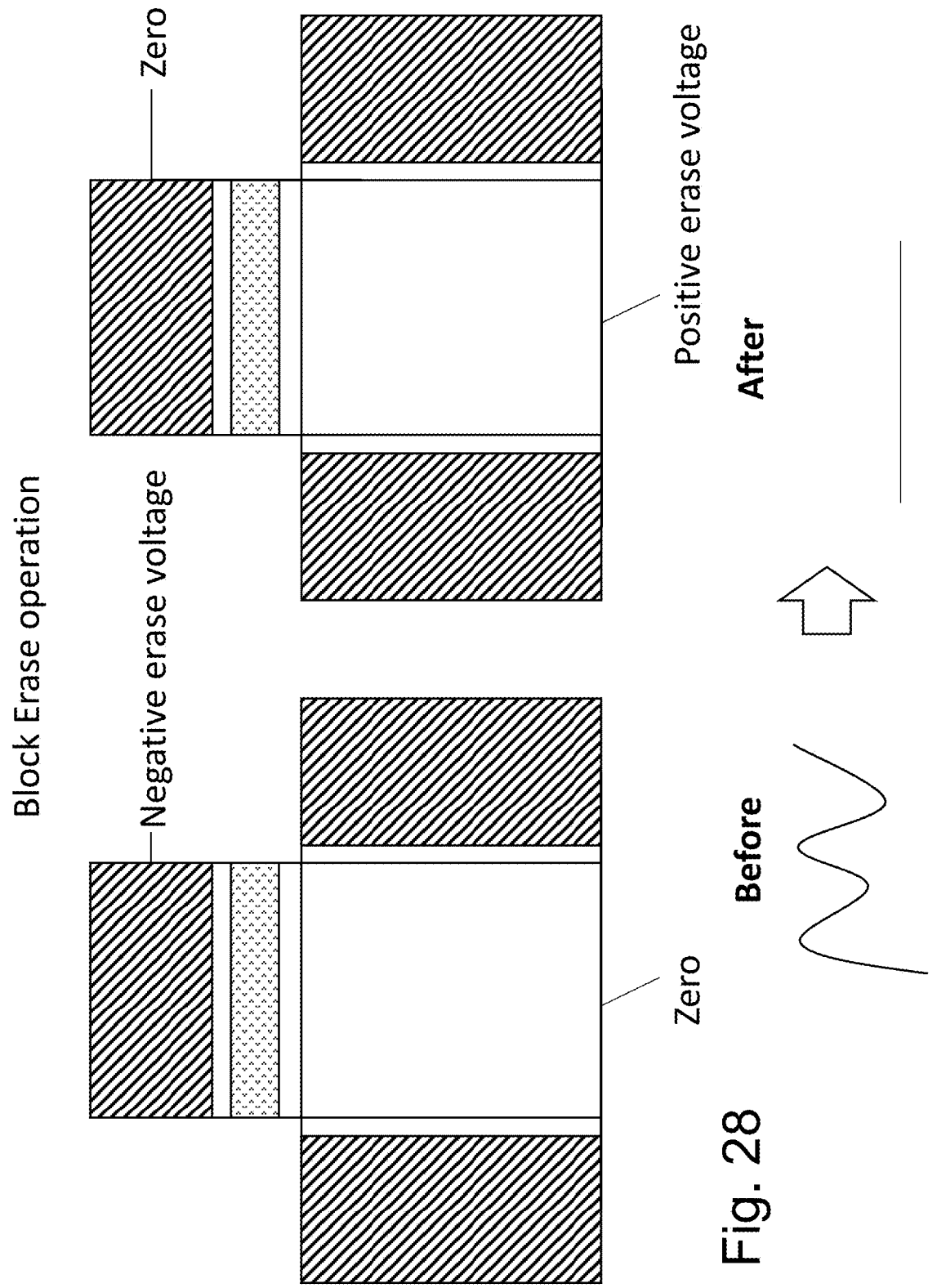
FIG. 28 is an example illustration of a block erase operation on a zone of charge trapping region.

FIG. 28 illustrates a block erase operation in which all the charges are being forced out from the respective trap zones.

This distributed form of storage could help reduce the sensitivity to local defect and increase the overall memory capacity.

For this distributed memory storage technique the Orthonormal basis signal processing techniques of linear algebra could be deployed. Quoting: Orthonormal Basis: A subset $\{v_1, \ldots, v_k\}$ of a vector space V, with the inner product $( , )$ is called orthonormal if $( v_i, v_j) = 0$ when $i \neq j$. That is, the vectors are mutually perpendicular. Moreover, they are all required to have length one: $( v_i, v_i) = 1$.

There many such basis and in signal processing it has been extensively studied in the art. A subset of these are called wavelets has been described in an article by G. BEYLKIN titled: "ON THE REPRESENTATION OF OPERATORS IN BASES OF COMPACTLY SUPPORTED WAVELETS" published SIAM J. NUMER. ANAL. c 1992 Society for Industrial and Applied Mathematics Vol. 6, No. 6, pp. 1716-1740, December 1992 011, incorporated herein by reference.

With Orthonormal set of vectors every 'bit site' could be represented by one of these vectors. So for n bits we would have n vectors. Writing a bit would be like adding a vector to the charge trap surface by scanning along the channel and modulating the amount stored according to the vector. Reading would be the inverse which could be the effect of multiplying the stored values by the reading vector. Accordingly if the vector was stored the value of the reading would be '1' and if it was not than it would be '0'. The vector itself could be multiply by a scalar which would represent a multilevel per vector.

Additional information on wavelets and related decomposition and reconstruction algorithms may be found in "Fundamentals of Wavelets Theory, Algorithms, and Applications," Goswami, J., C., et al., $2^{nd}$ Ed., J Wiley & Sons, 2010, especially chapters 6 and 7, the entire book is incorporated herein by reference. Orthonormal wavelets such as, for example, of Shannon (sine radians sampling), Meyer (smoothing of Shannon), Battle—Lemarié, and Daubechies may be utilized depending on engineering choices and optimizations. Biorthogonal wavelets, for example, of Cohen, Daubechies, and Feaveau, may be useful depending on engineering choices and optimizations. Moreover, additional information on wavelets may be found in B. Vidakovic, et al., "Wavelets for Kids, A Tutorial Introduction," 1994 Duke University, incorporated herein by reference.

Figure 29A:
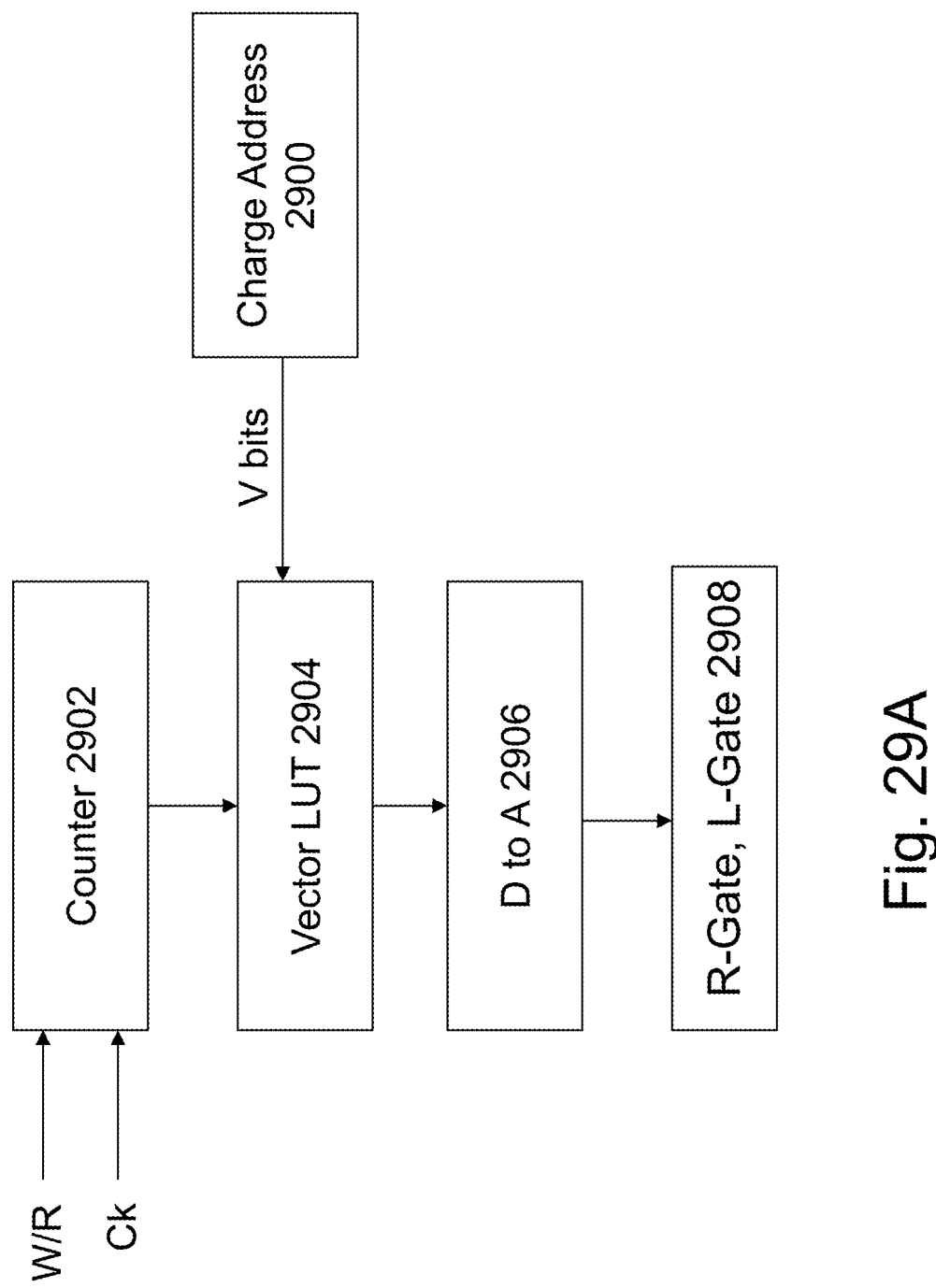
FIGS. 29A-29B are example illustrations of block diagrams of circuits to generate signals.

FIG. 29A illustrates block diagram of optional circuits to generate the signal for such storage approach. A counter 2902 will start counting per each write pulse or read pulse. The counting bits would be inputted into a look-up-table (LUT) 2904 along with additional vector selection bits—V bits from the charge address 2900. The look-up-table 2904 would carry the full set of vectors of which would be selected by the inputted V bits. The counter would facilitate the scanning process by going along the vector address Similar circuits could be used for the generator of each of the control signals for the R-Gate and L-Gate. The output of the LUT 2904 could be inputted to a digital to analog converter 2906. This circuit could be used for the read scanning signal generator and the write scanning signal generators. The signals 2908 for the R-Gate and L-Gate could be the same for read or write. Scalar multiplication could be achieved by the C-Gate and S/D signal, yet it could be alternatively achieved by controlling the scan time so by doubling the time about double the amount of charge could be trapped. Time control is less common as it impacts the memory access time.

Figure 29B:
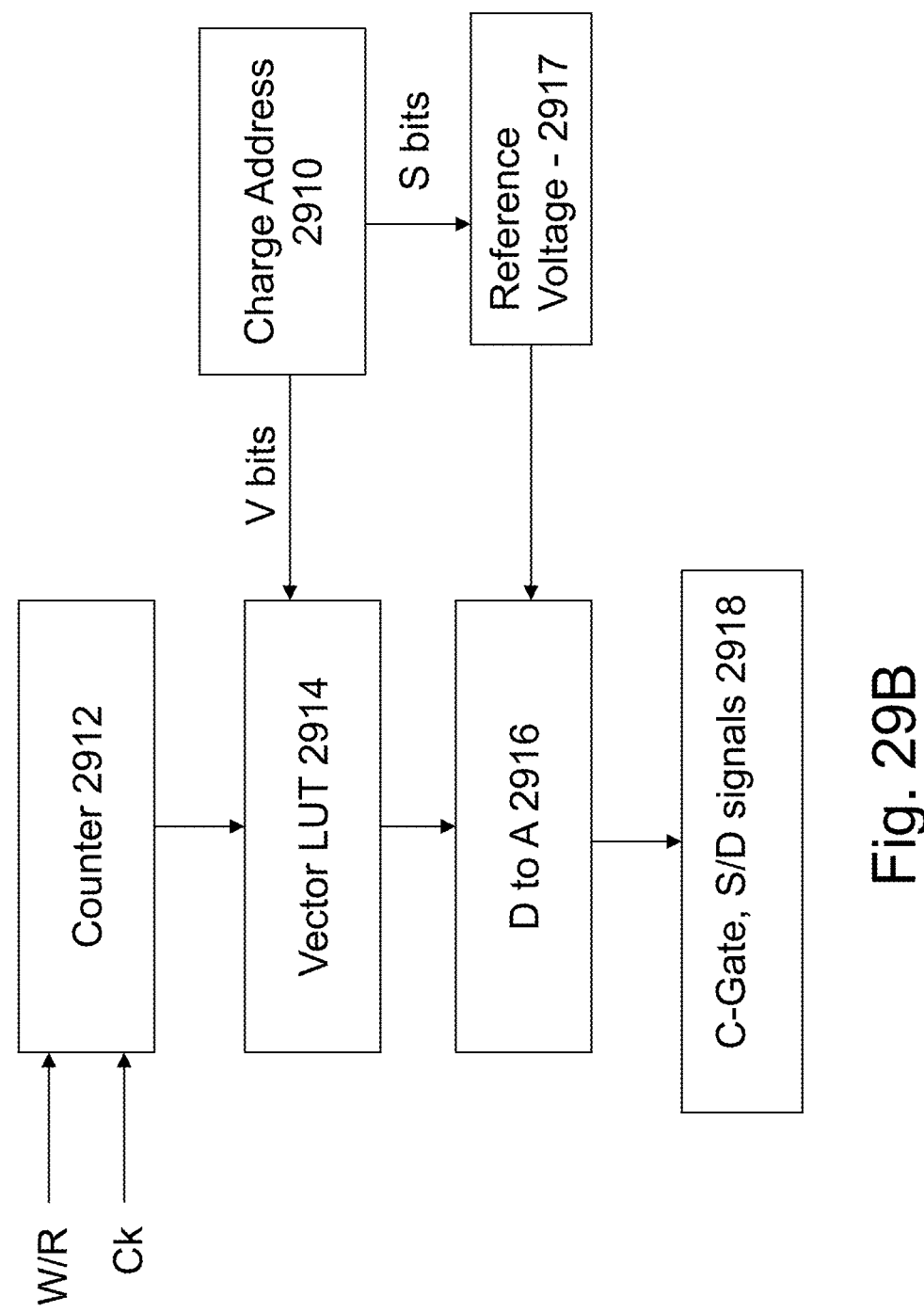

FIG. 29B illustrates block diagram of optional circuits to generate the signal for such storage approach. A counter 2912 will start counting per each write pulse or read pulse. The counting bits would be inputted into a look-up-table (LUT) 2914 along with additional vector selection bits—V bits from the charge address 2910. The look-up-table 2914 would carry the full set of vectors which would be selected by the inputted V bits. This is optional as the vector could be defined by the scanning process related to FIG. 29A, and accordingly the Vector LUT 2914 would become a fixed voltage or could incorporate the scalar multiplication currently illustrated by the reference voltage generator 2917. The counter 2912 would control the write and read operation during the scanning process Similar circuits could be used for the generator of each of the control signal for the C-Gate and S/D lines. The output of the LUT 2914 could be inputted to a multiplying digital to analog converter 2916. The scalar could be represented by the level from the Reference voltage generator 2917 according to the S bits from the charge address 2910 could be provided to the D to A 2916. This circuit could be used for the read signal generator and the write signal generators. The signals 2918 would support the write operation with high positive voltage, the read operation with mid-level positive voltage and erase operation with a high negative voltage.

For the read additional circuits could be added for the S/D line with integrating analog to digital converter. Such structures could support multiple signal processing techniques to allow flexibility between storage density, access speed and device yield.

The memory HD-NOR memory fabric could be used to empower SoC products by providing high density NV memory and high speed DRAM memory fabric underneath the logic SoC circuits as presented in respect to FIG. 17A to FIG. 17E herein. Additional alternative is to use this fabric architecture for programmable logic and general logic. Such could be done by allocating some blocks for memory and others for logic, alternatively two structures could be used such as a first memory terrain don top of its logic terrain and finally user logic. This is leveraging the HD-NOR fabric for many uses.

The O/N/O stacks within the HD-NOR fabric could be designed independently; for example, the facet(s) related to the top gates and the facet(s) related to the side gates could be different in many ways. An ONO stack could include the same materials with different thicknesses or different materials. Some of such alternative O/N/O stack materials have been presented in a paper by Chun Zhao titled "Review on Non-Volatile Memory with High-k Dielectrics Flash for Generation Beyond 32 nm" published at Materials 2014, 7, 5117-5145; doi:10.3390/ma7075117, incorporated herein by reference. An O/N/O stack could include band gap engineering for better performance. Such band gap engineering has been described in papers such as by Dong Hua. Li et al titled "Effects of Equivalent Oxide Thickness on Bandgap-Engineered SONOS Flash Memory" published at 2009 IEEE Nanotechnology Materials and Devices Conference Jun. 2-5, 2009, and by Hang-Ting Lue et al titled "BE-SONOS: A Bandgap Engineered SONOS with Excellent Performance and Reliability" published at IEDM 2005. And in patents such as U.S. Pat. Nos. 7,414,889, 7,512,016 and 7,839,696, all the forgoing references are incorporated herein by reference.

In the NOR architectures such as illustrated in FIG. 2A to FIG. 3D herein, the active O/N/O stack for the side gate is formed in-between the S/D lines. The flow as described will likely deposit the O/N/O material on substantially all exposed surfaces and not just on the desired facet and accordingly reducing the area for the side gates by two times the O/N/O thickness in each direction. In some applications it could be advantageous to form the side O/N/O stack extra thin. Such could result in shorter retention times but also with a shorter write and erase time. Such ultra-thin O/N/O is some times considered a DRAM (Dynamic Random Access Memory) alternative. Accordingly such HD-NOR memory could integrate multiple memory types in one device, for example, such as conventional NV (Non-Volatile) memory in the facets controlled by the top and bottom gates and faster memories with a shorter retention time in the facets controlled by the side gates. Such memories are presented in papers such as by H. Clement Wann and Chenming Hu titled "High-Endurance Ultra-Thin Tunnel Oxide in MONOS Device Structure for Dynamic Memory Application" published at IEEE ELECTRON DEVICE LETTERS, VOL. 16, NO. 11, NOVEMBER 1995, by Dong-Il Moon et al titled "A Novel FinFET with High-Speed and Prolonged Retention for Dynamic Memory" published at IEEE ELECTRON DEVICE LETTERS, VOL. 35, No. 12, DECEMBER 2014, and in U.S. Pat. Nos. 5,608,250, 8,329,535 and 9,025,386. Additional optional enhancement is to combine two level of memory forming structure in the gate stack such as presented by Daniel Schinke et al titled "Computing with Novel Floating-Gate Devices" published at IEEE Computer magazine FEBRUARY 2011, and also described by Daniel Johannes Schinke in 'A dissertation submitted to the Graduate Faculty of North Carolina State University' 2011, titled "Computing with Novel Floating Gate Devices"; and by Biplab Sarkar titled "Dual Floating Gate Unified Memory MOSFET With Simultaneous Dynamic and Non-Volatile Operation" published at IEEE ELECTRON DEVICE LETTERS, VOL. 35, NO. 1, JANUARY 2014, and by Yu-Chien Chiu, titled "Low Power 1T DRAM/NVM Versatile Memory Featuring Steep Sub-60-mV/decade Operation, Fast 20-ns Speed, and Robust 85oC-Extrapolated 1016 Endurance" published at IEEE 2015 Symposium on VLSI Technology, all of the forgoing are incorporated herein by reference.

Figure 30A:
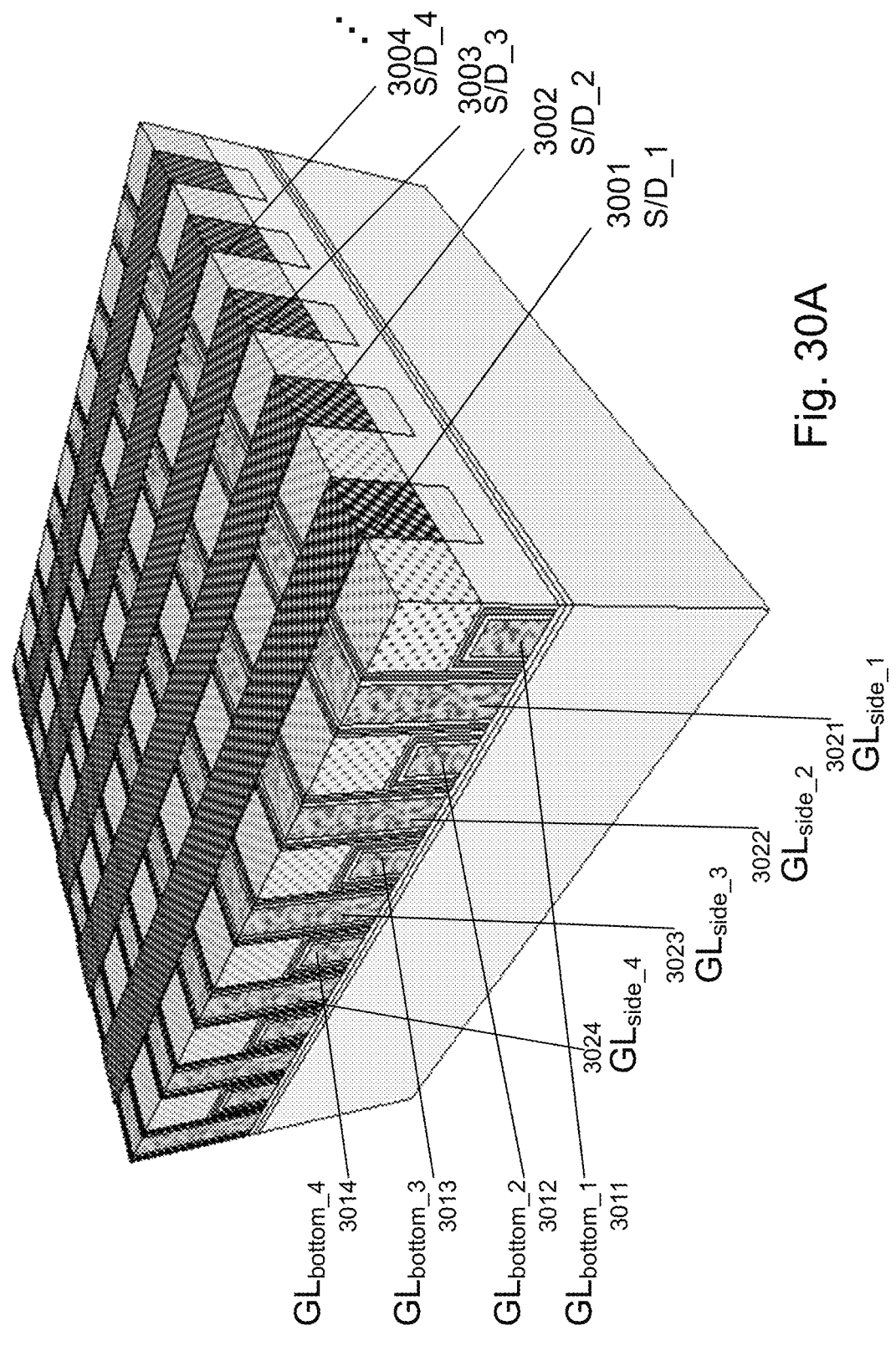
FIGS. 30A-30E are example illustrations of logic use of the HD-NOR fabric.

For a logic fabric the structures illustrated in FIG. 20D could be used. FIG. 30A illustrates such a fabric with control lines to control the S/D lines and the Gate lines. The Gate lines could be grouped to the Side lines which are affecting channels right to them and left to them and bottom lines that each is controlling an individual channel. Using the S/D lines 3001, 3002, 3003, 3004, . . . and the Bottom Gate lines 3011, 3012, 3013, 3014, . . . and Side Gate lines 3021, 3022, 3023, 3024 . . . every channel could be programmed to one of three states:

Active transistor—no charge in charge trap.

Always On transistor—connected link: Charge trap is substantially fully programmed with positive charge.

Always Off transistor—Disconnected link: Charge trap is fully programmed with negative charge.

Using these control lines the fabric could be programmed for future logic use.

Figures 30B, 30C, 30D, 30E:
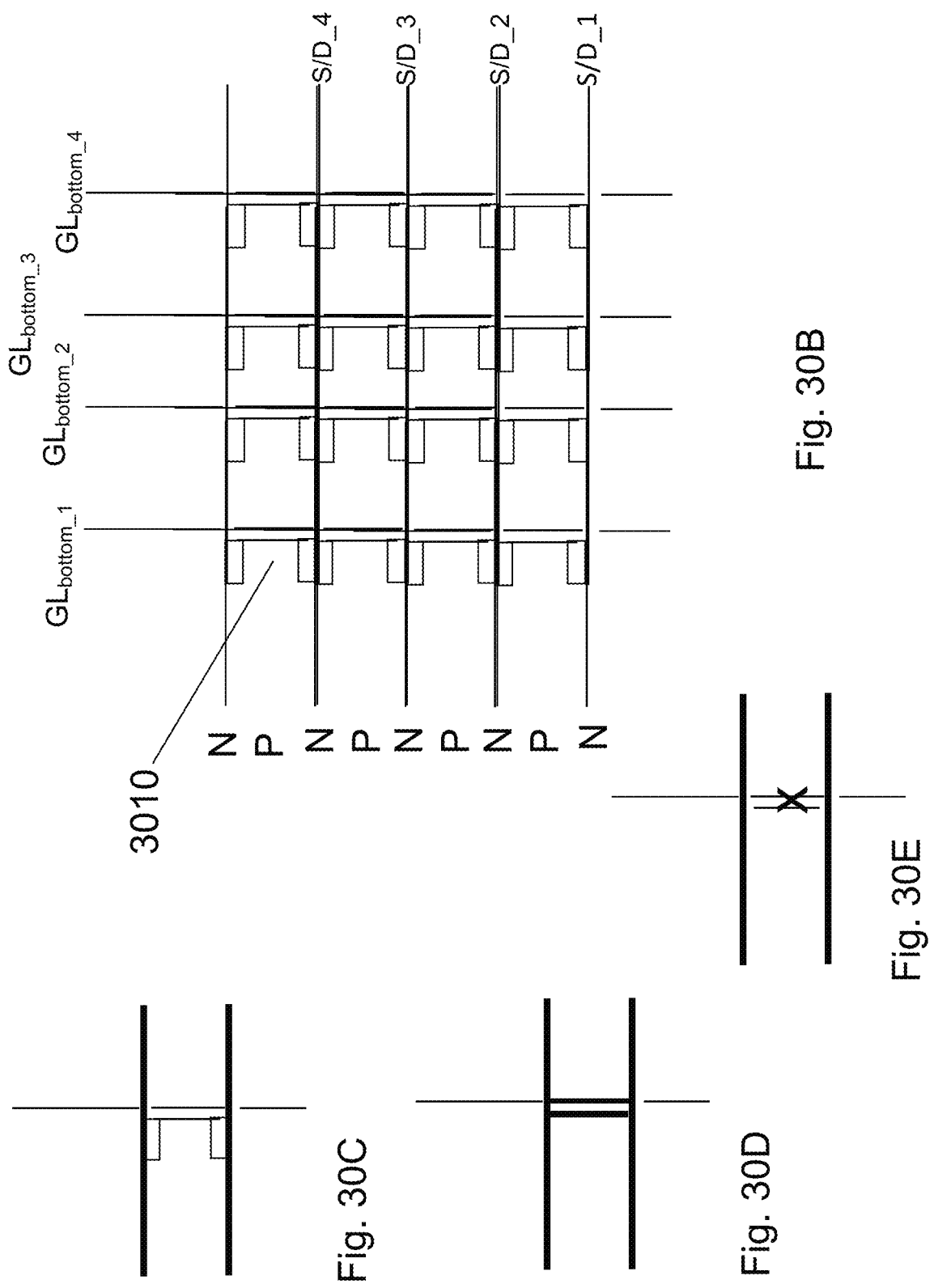

FIG. 30B illustrates a small matrix of such a programmable fabric terrain with 4×4 of programmable channels 3010. FIG. 30C illustrates such a channel programmed as an active transistor. FIG. 30D illustrates such a channel programmed as a conductive link. And FIG. 30E illustrates such a channel programmed as a disconnected link.

Additional elements which could be deployed for the logic use of the HD-NOR fabric is customizing the terrain for such logic use by etching the S/D at selected locations and connecting the edges of the disconnected S/D line to an active transistor on the custom logic terrain on top for allowing the control of programming as illustrated in FIG. 31A-FIG. 31E.

Figures 31A, 31B, 31C, 31D, 31E:
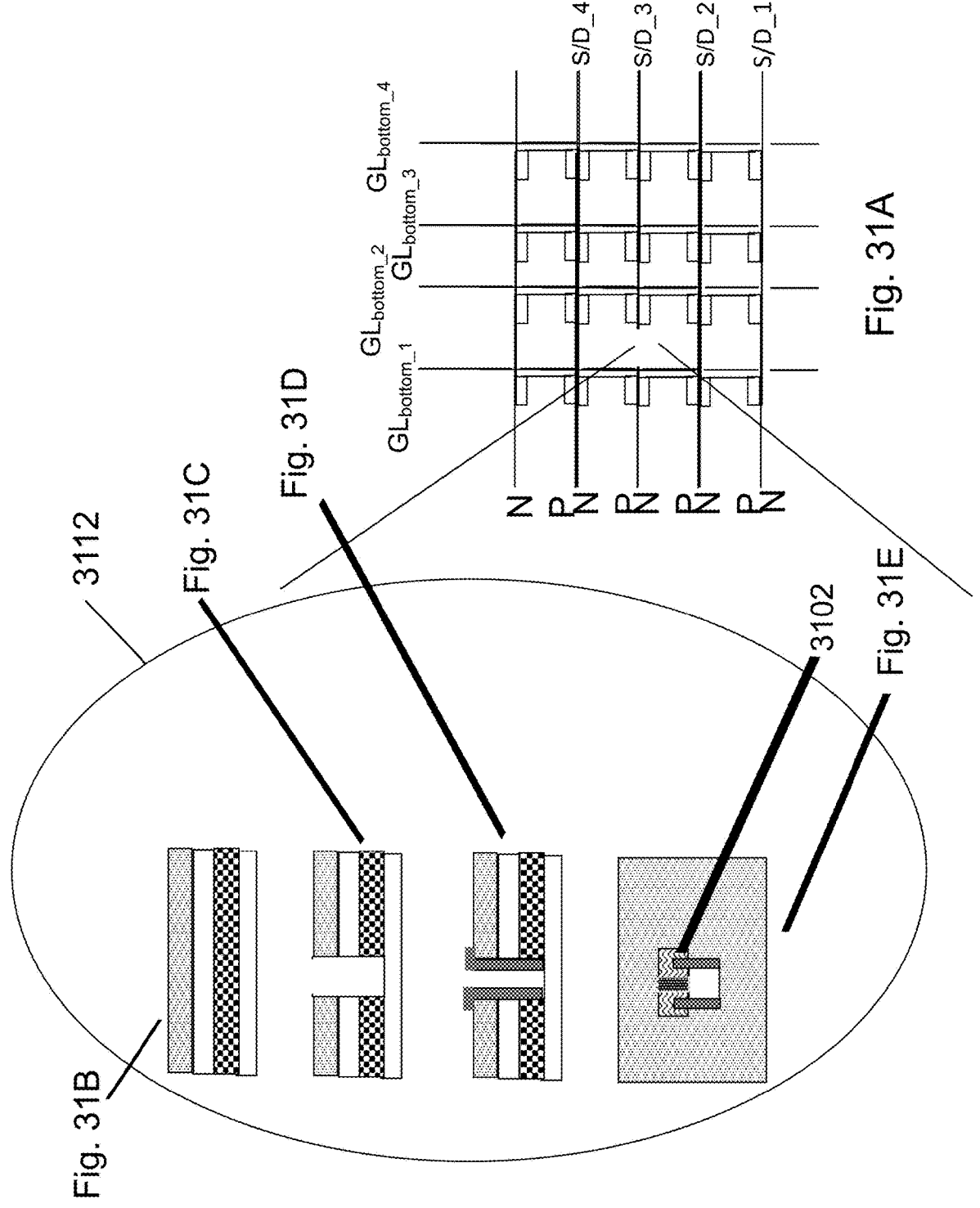
FIGS. 31A-31E are example illustrations of additional logic use of the HD-NOR fabric.

The 'bubble 3112 illustrates the detailed of formation of disconnect in the S/D_3 and forming a bypass transistor 3102 at the upper custom logic layer to support full array programming. FIG. 31B illustrates the structure of S/D line over oxide covered with oxide and covered with silicon for the custom logic. FIG. 31C illustrates etching the S/D through the multilayer structure, thus disconnecting the S/D line. FIG. 31D illustrates forming a connection to the disconnect edge and FIG. 31E illustrates the bypass transistor 3102 which could allow the full array programming. At programming time the bypass transistors could be activated to an on-state allowing the S/D line to function as if it was not cut.

This form of customizing the HD-NOR fabric could allow support for programmable logic as presented in the following.

Figures 32A, 32B, 32C:
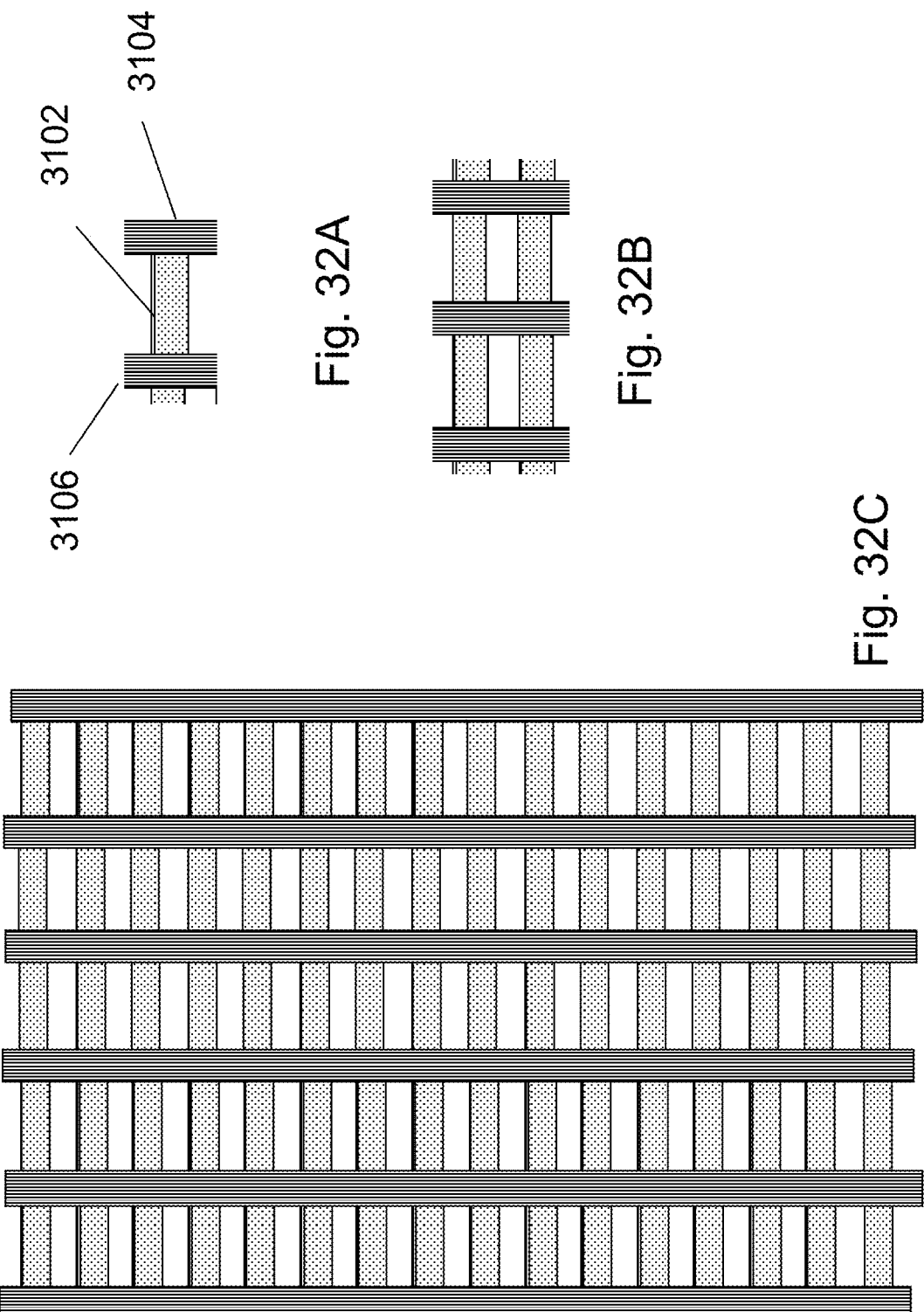
FIGS. 32A-32C are example illustrations of customizing the HD-NOR fabric to support programmable logic.

FIG. 32A is an illustration of a single cell of such memory substrate with S/D lines of N+ type silicon 3104, 3106 and P− type silicon 3102 in between. The charge trap regions and the gates are not shown as they are underneath or on the sides of P− type silicon 3102. FIG. 32B illustrates 4 such cells arranged as a 2×2 array and FIG. 32C illustrates a larger array of 5×16 cells.

Figures 33A, 33B, 33C, 33D, 33E, 33F:
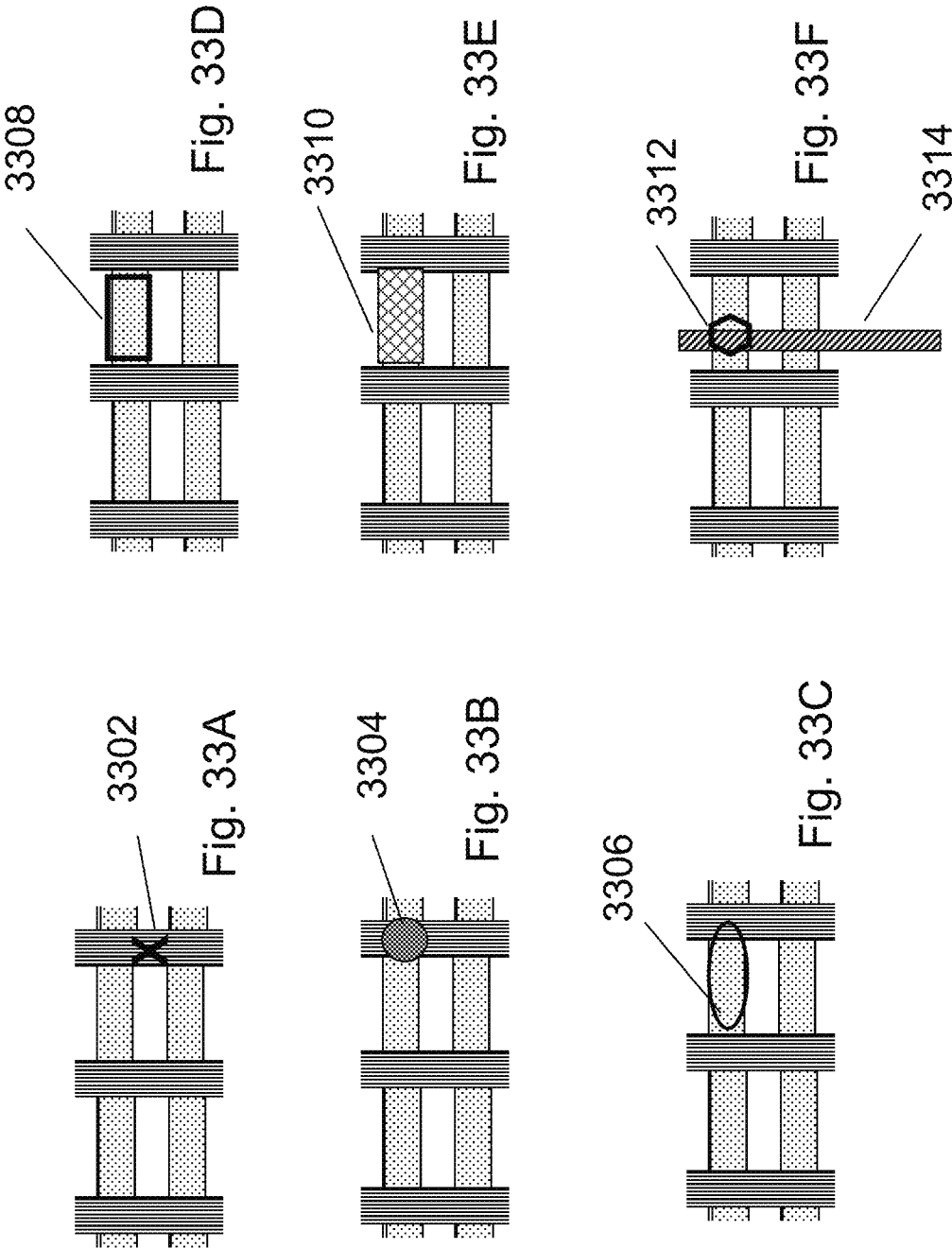
FIGS. 33A-33F are example illustrations of customizing the HD-NOR fabric to support programmable logic.

FIG. 33A illustrates an indication of forming a cut in the S/D line 3302 as presented in respect to FIG. 31A.

FIG. 33B illustrates connecting the S/D line to a ground 3304. This could be a programmable ground which would be activated at normal operation and deactivated at programming time.

FIG. 33C illustrates a channel being programmed to either an always on "0" or to an always off "1". This could replace the SRAM cell in a Look-Up-Table.

FIG. 33D illustrates programming the channel to always on 3308.

FIG. 33E illustrates programming the channel to always off 3310.

FIG. 33F illustrates the channel functioning as an active transistor with conductor 3314 going across it connected to the transistor gate as indicted by 3312.

Figures 34A, 34B:
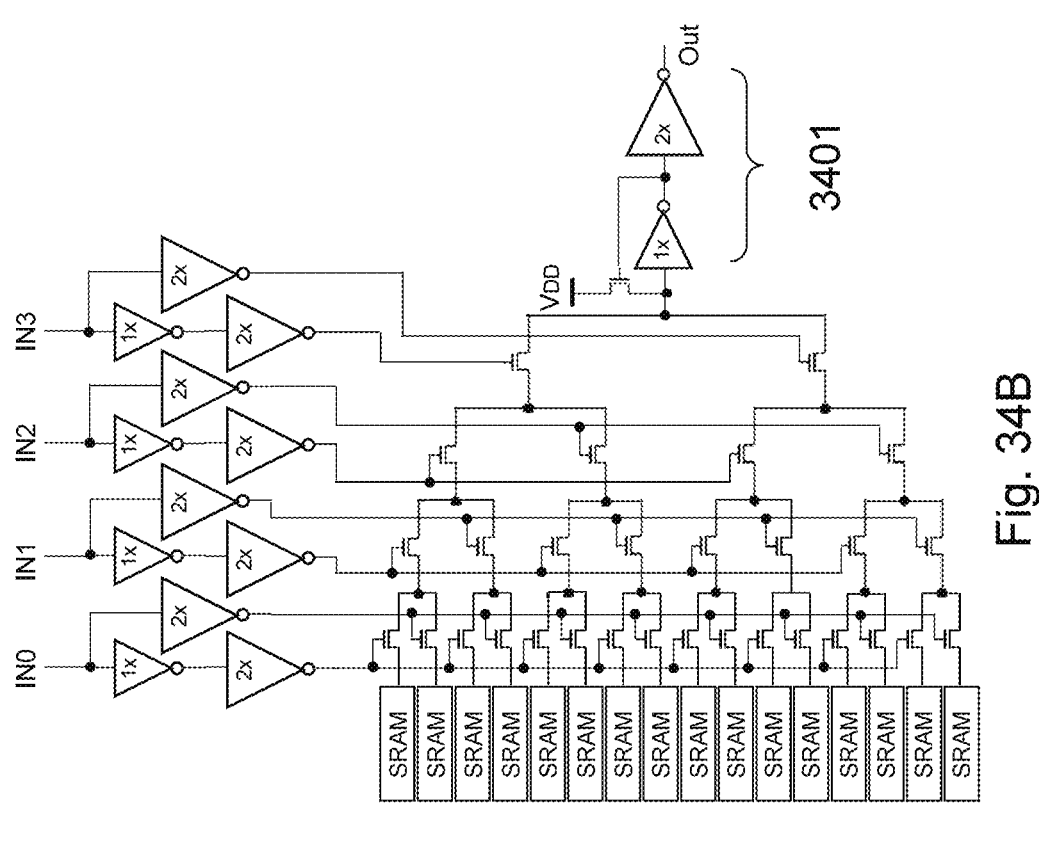
FIGS. 34A-34B are example illustrations of 4 bit Look-Up-Tables and LUT4 with the additional input drivers.

FIG. 34A is from one of Xilinx early patents U.S. Pat. No. 4,706,216 incorporated herein by reference. FIG. 34A illustrates the classic 4 bit Look-Up-Table (LUT4) which uses 16 SRAM bit-cells and a decoder constructed by N type transistors. FIG. 34B illustrates such a LUT4 with the additional input drivers to buffer the 4 inputs and for their inversion for controlling the decoder, and the output signal reconstruction circuits to reconstruct the decoder output to a full "0"/'1" signal. Some of the extra circuits would be constructed on the upper custom silicon layer while the main LUT4 of FIG. 34A could be implemented in the NOR substrate as is illustrated in FIG. 35 with symbol map on its right.

Figure 35:
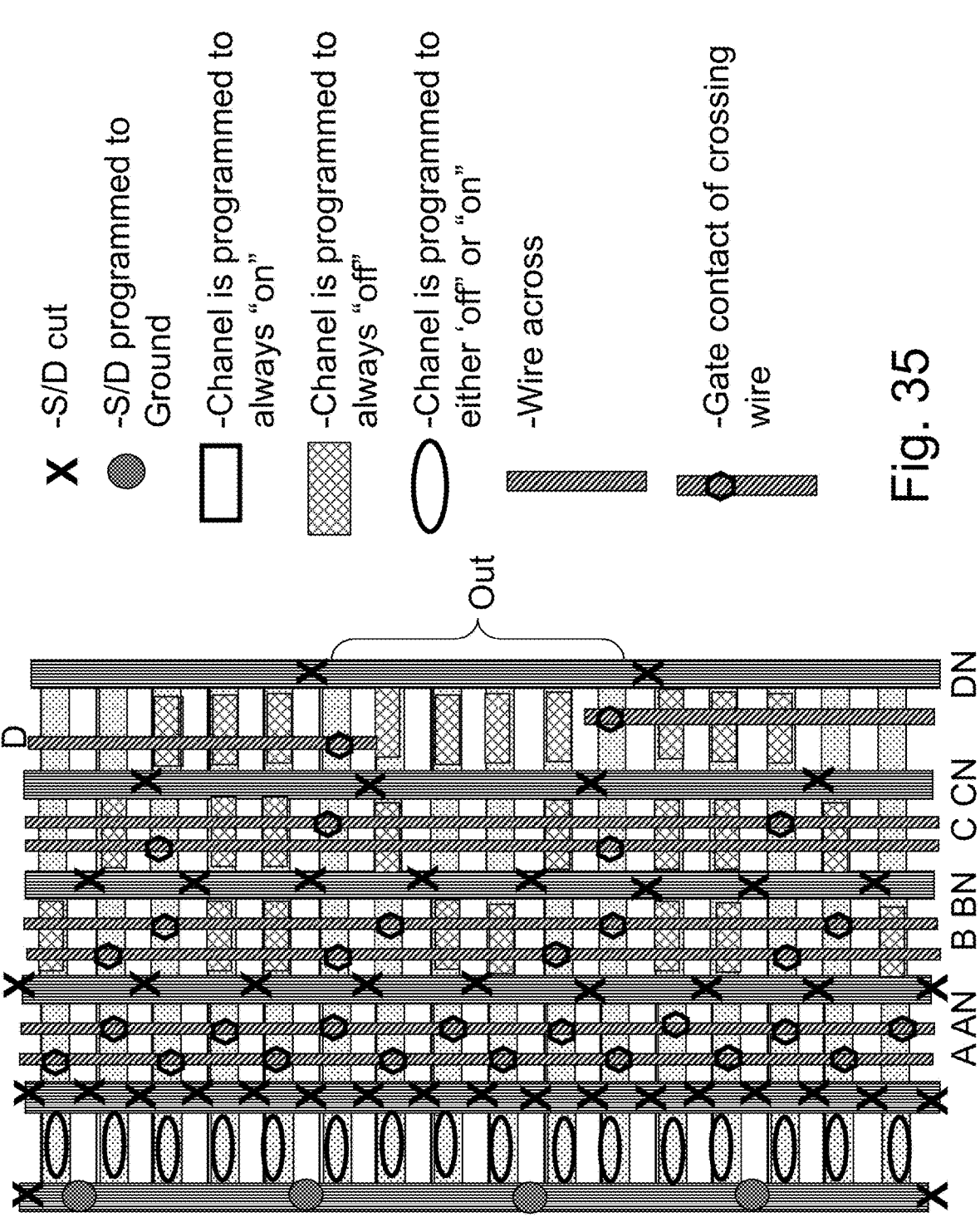
FIG. 35 is an example illustration of implementing a LUT4 in the HD-NOR fabric.

Use of the NOR structure as illustrated in FIG. 35 could be designed in a way in which the LUT4 decoders of multiple LUT4s are aligned to share the same S/D lines. In the decoder part of the LUT4 the transistors may be left un-programmed, and accordingly the S/D lines continuation technique described in FIGS. 31B-31F could be skipped, as its function is to restore the ability to program transistors for which their S/D line was disconnected (cut in the S/D line 3302).

Figure 36:
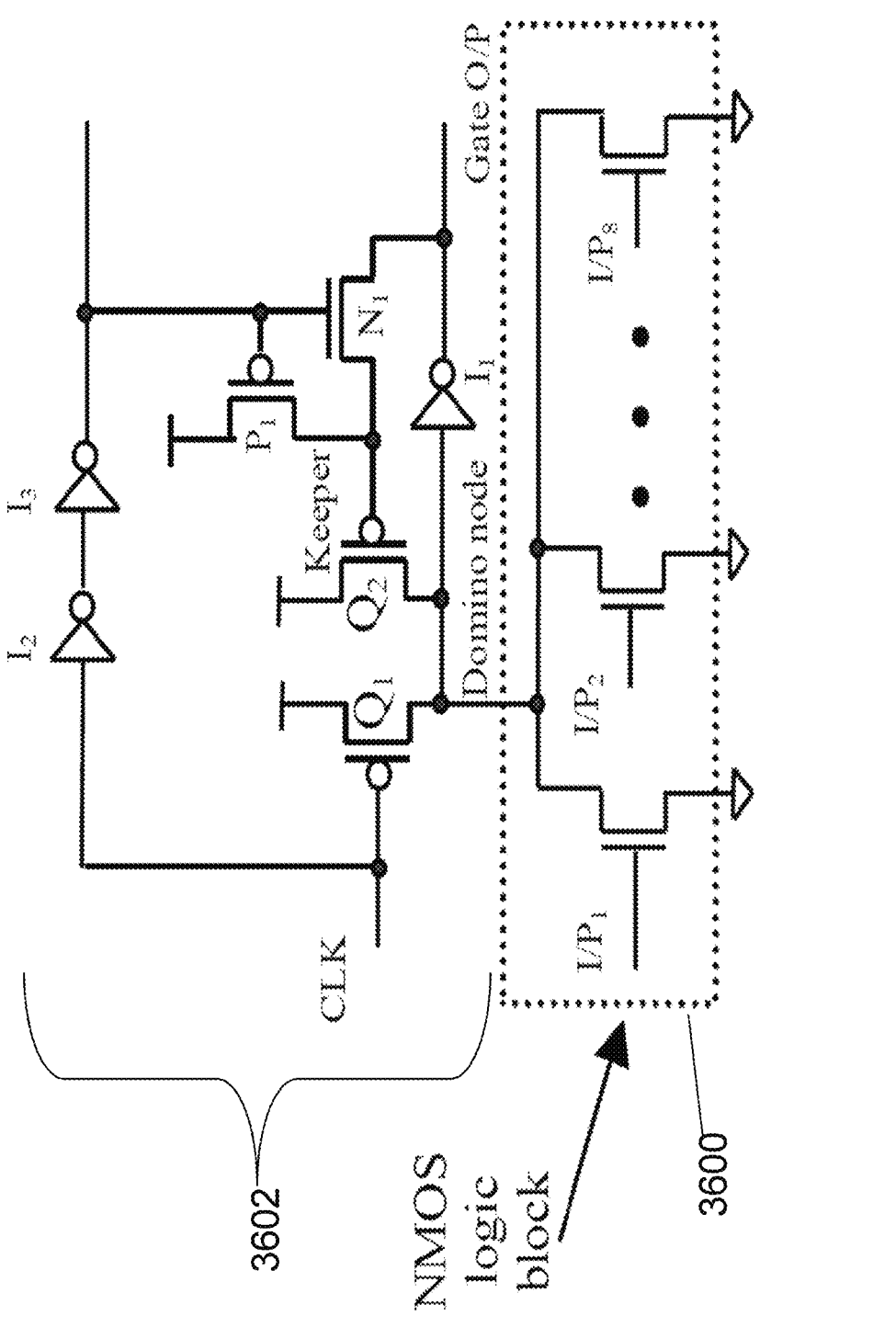
FIG. 36 is an example illustration of Domino logic.

The substrate of N channel transistors tightly packed in a 2D array in which every transistor could be configured as an active transistor or a connected path or a disconnected path provides a useful configurable terrain which could be used to form high density NV memory, high speed DRAM and or highly configurable logic terrain. Such a substrate overlaid by custom fabric could be used to form many attractive systems. For example, a NOR substrate of N channel transistors could be configured as domino logic that is known to be a very high speed design technique utilizing primarily N channel transistors. Such as in a paper by Allam, M. W et al titled "High-speed dynamic logic styles for scaled-down CMOS and MTCMOS technologies" publish at Low Power Electronics and Design, 2000. ISLPED '00, incorporated herein by reference. An improvement is presented allowing higher speed and lower power domino logic. FIG. 36 is a copy of FIG. 3 there illustrating the "Domino part" 3600 which is build by just N channel transistors and the signal reconstruction portion 3602 which include clock circuits CLK a pre-charge circuits Q1 and keeper circuits Q2, I1,I2,I3, N1, P1, which could be build on the overlaying custom fabric 1790. Another alternative was presented in a recent paper by Tonmoy Roy et al, titled "Novel FinFET Domino Logic Circuit Using Dual Keepers" published at: ICEEICT, 2014, incorporated herein by reference. Many other variations are known in the art with various specific names which we could refer to them all as domino logic.

Specific types of configurable logic could be formed in such NOR substrates. Within the field of programmable logic the most used fabric for which there is a wide range of design tools are the LUT based fabrics used for the most advanced FPGA and the PLA/PLD based fabrics used for some lower complexity lower devices.

Figure 37A:
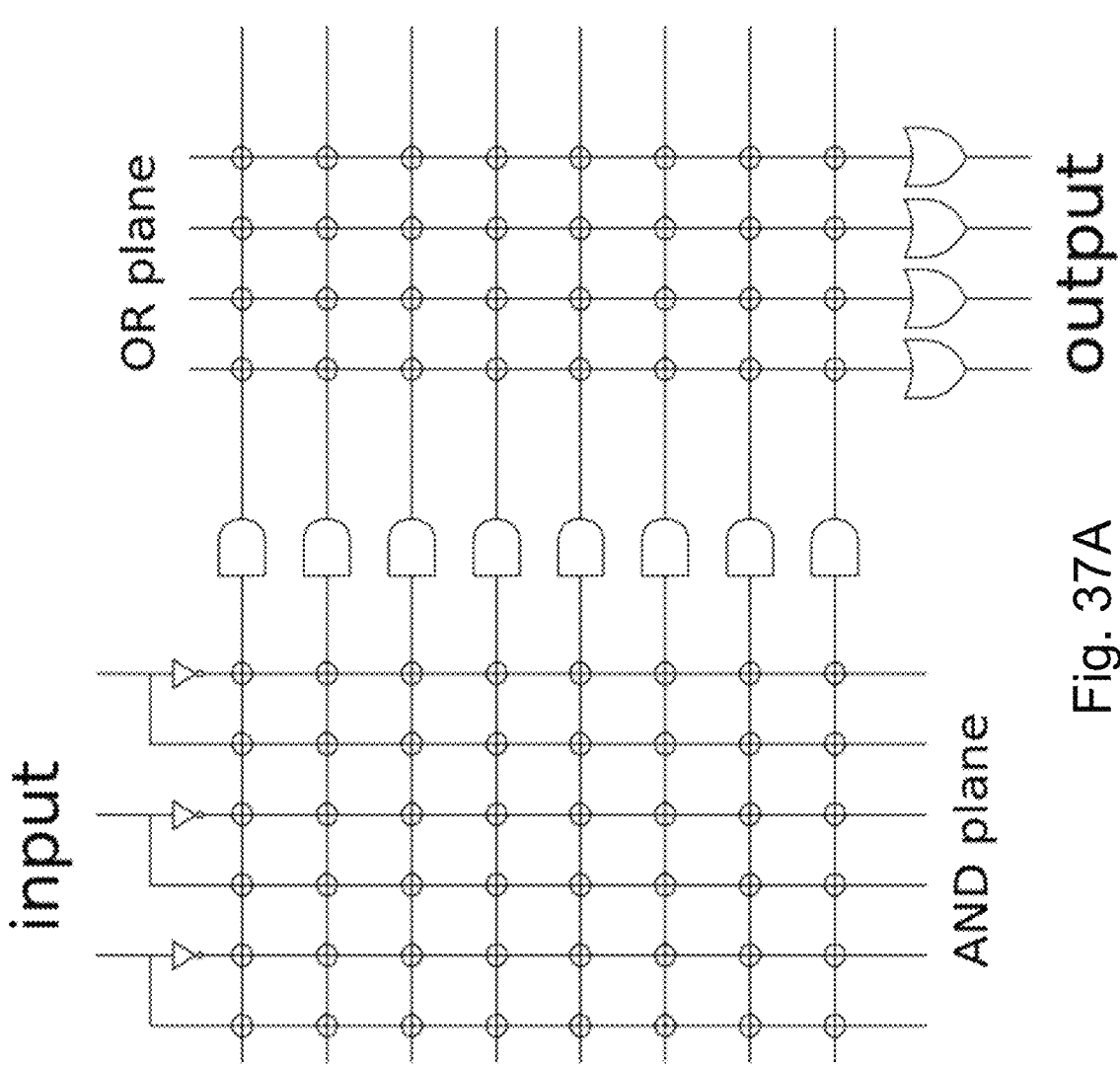
FIG. 37A is an example illustration of prior art Programmable logic array PLA structure.

FIG. 37A illustrates a simple prior art Programmable logic array PLA structure. These approaches were further developed with industry naming them Programmable array logic PAL, PLD and Complex programmable logic device CPLD.

Figure 37B:
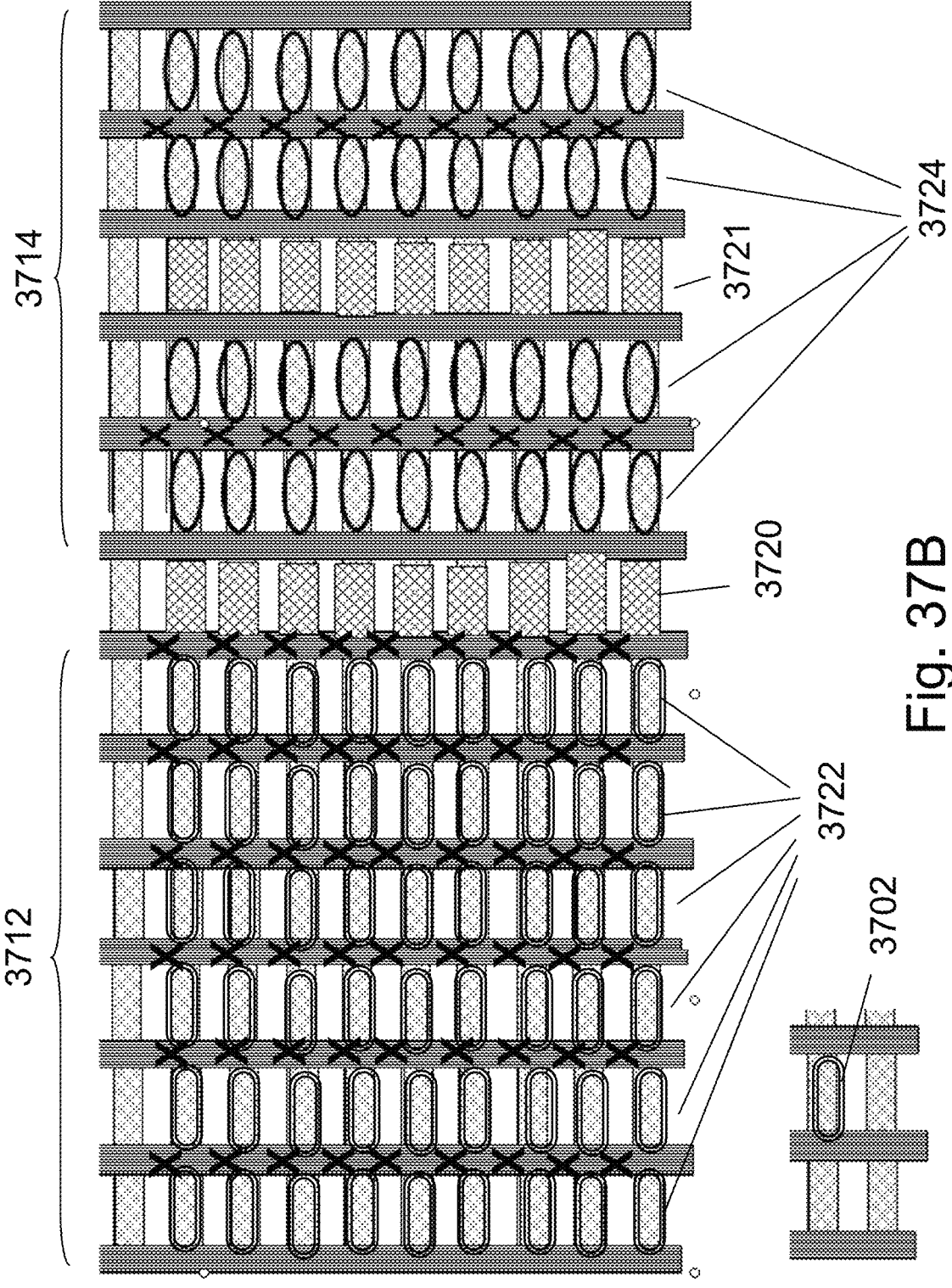
FIGS. 37B-37E are example illustrations of implementing a PLA in an HD-NOR fabric.

FIG. 37B illustrates the first step of utilizing NOR substrate to implement such a PLA. The left side 3712 illustrates the multiple NAND gates implementation. Each channel could be programmed to either left as active transistor or programmed to always on marked by 3702 symbol. The left side 3712 illustrates 9 horizontal strings of NAND gate 3722 each with 6 inputs. Channel programmed isolation 3720 is isolating the NAND portion from the wired-or portion 3714. In these drawing the symbols defined herein before in FIGS. 33A-F and FIG. 35 are used whenever possible.

In the wired-or portion 3714 there are isolated central bars 3742 for which there are programmable connections 3724 to each side to the wired-or bar. The two groups are isolated with isolations 3721.

Figure 37C:
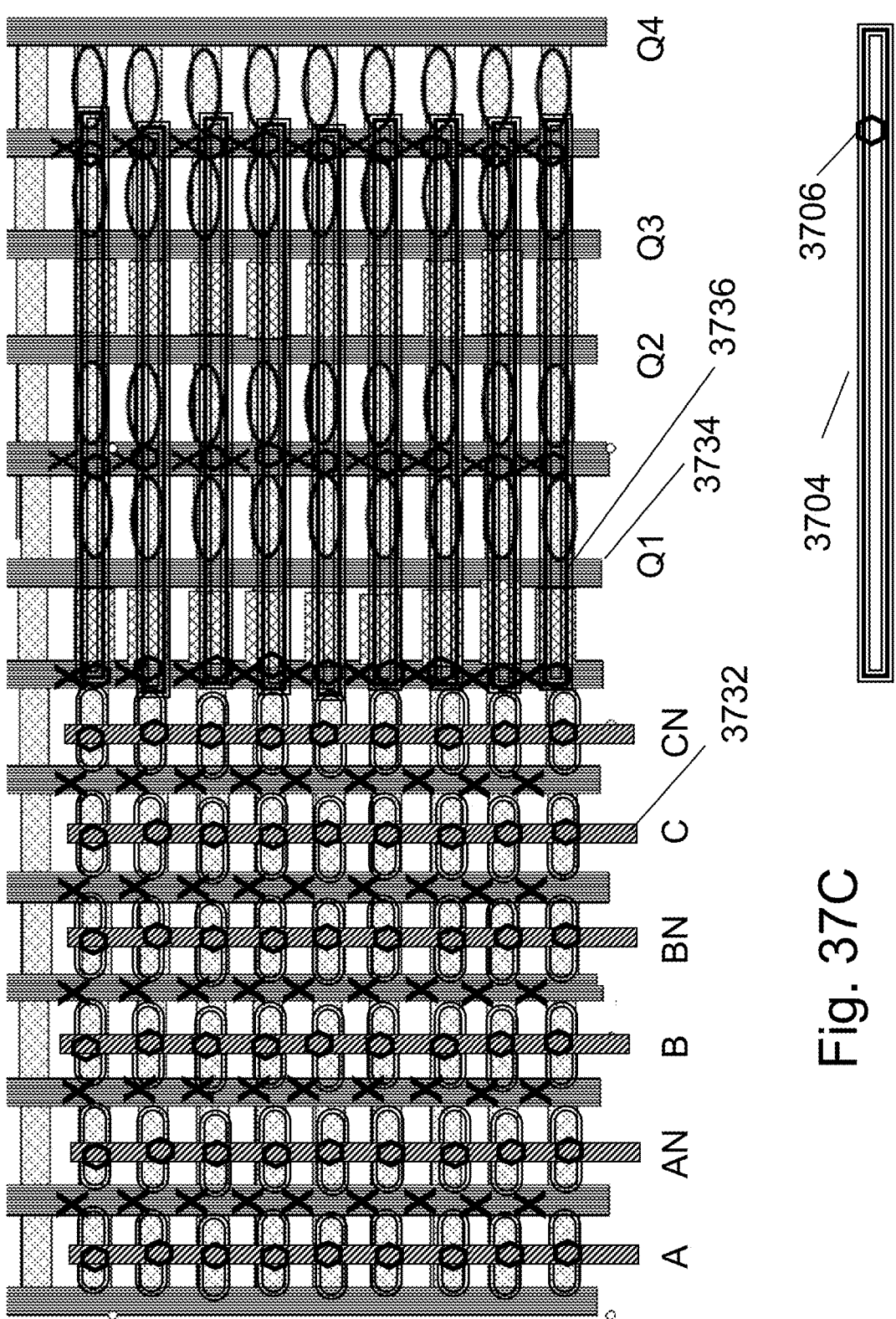

FIG. 37C is illustrating adding the top connection over the structure of FIG. 37B. The vertical connection bars 3732 are the input signals A, AN, B, BN, C, CN connected to all Programmable NAND strings. Then horizontal wires 3736 illustrated by symbol 3704 with connection to down 3706. The horizontal connections 3736 are connecting the 'NAND" outputs to the two bar 3742. The outputs of the programmable wired-or are Q1, Q2, Q3 and Q4.X Another alternative is to use the HD-NOR substrate for some of the required memory peripherals circuits. The left side 3712 of 37B illustrates construction of a wide AND circuit that is common for select lines decoder. The AND of FIG. 37B and Fig. C is oriented for the Gate-Lines/Word-Lines.

Figure 37D:
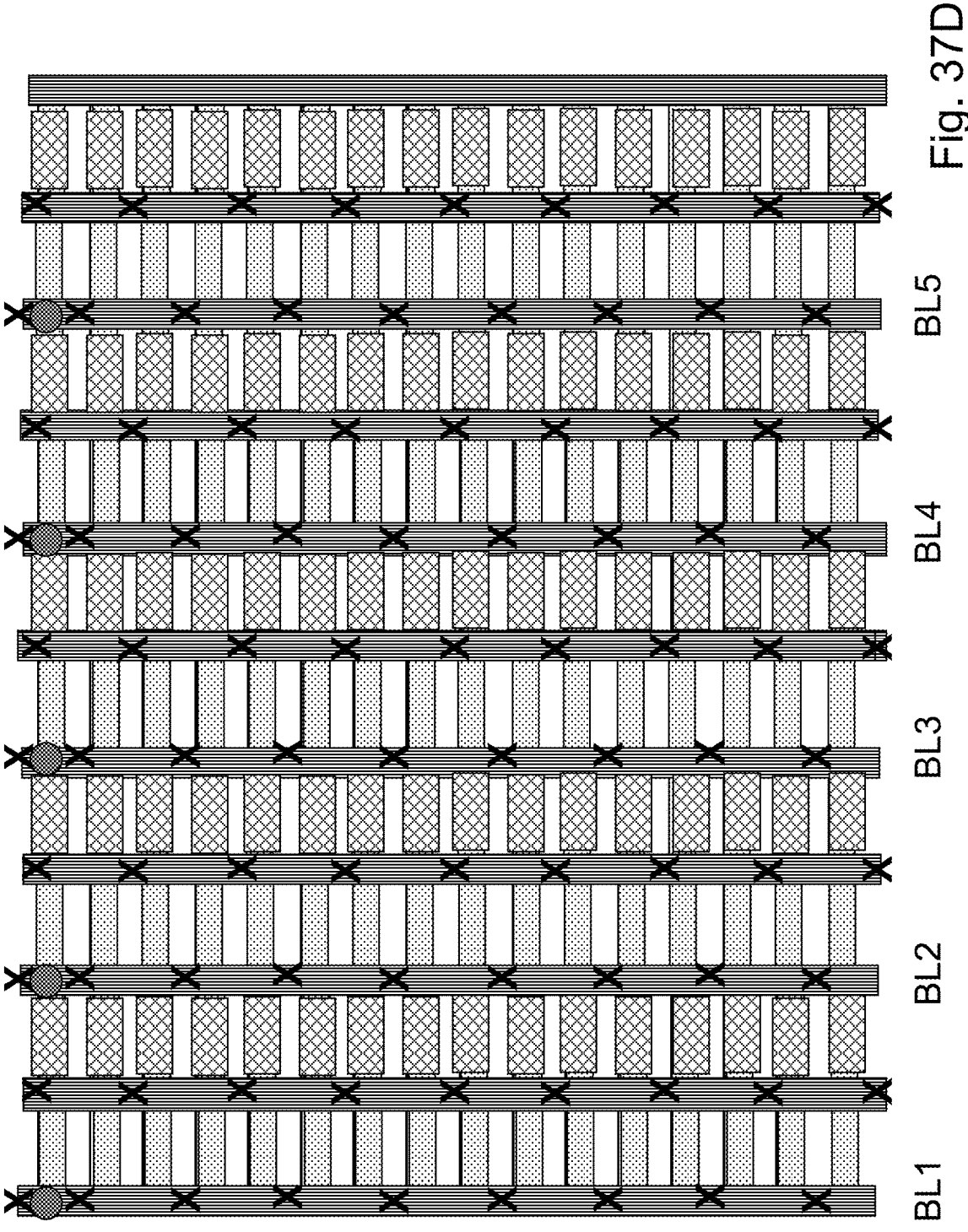
Figure 37E:
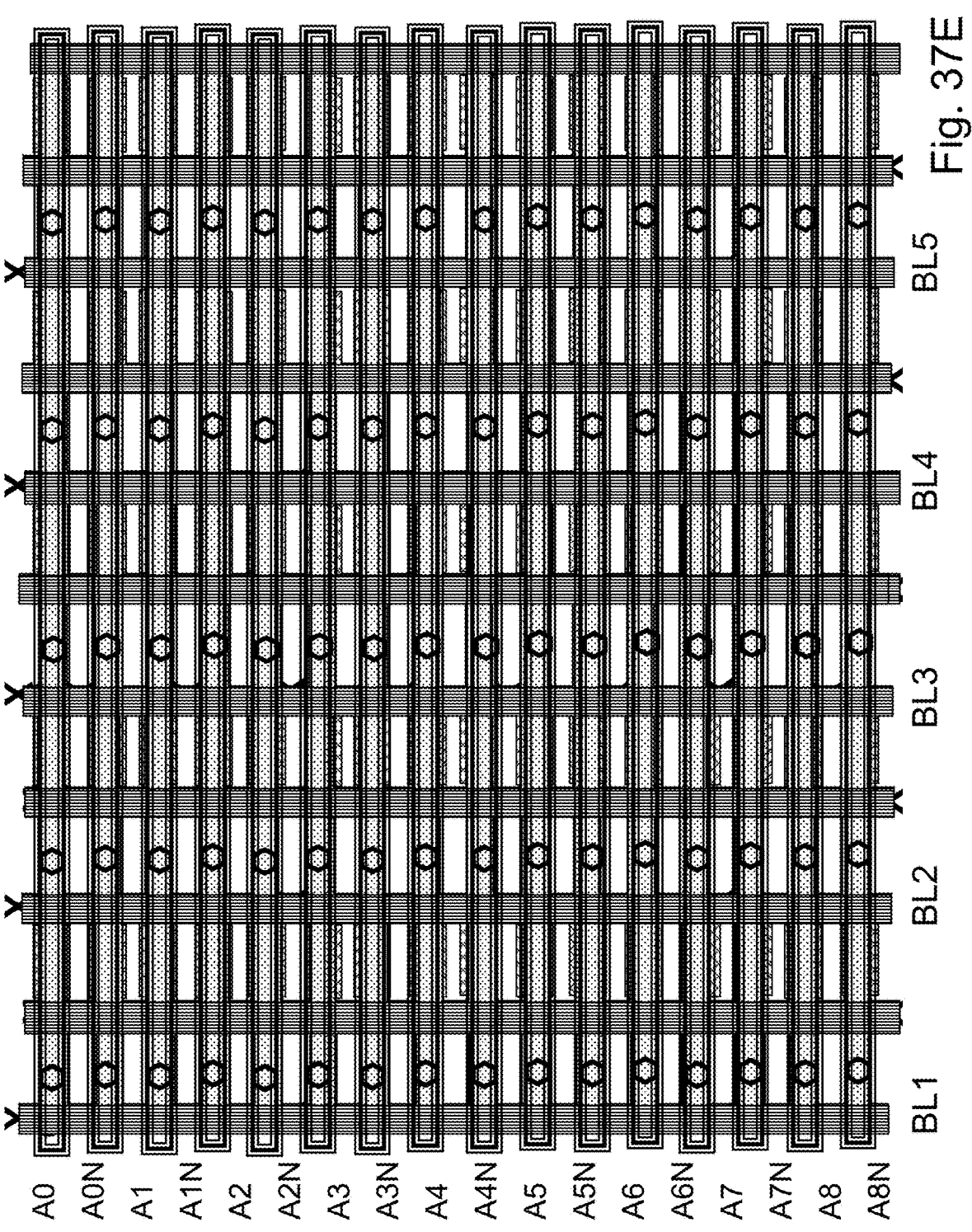

FIG. 37D illustrates forming a high fan in AND oriented for the S/D lines—Bit-Lines. FIG. 37D use symbols used before herein. All of the non-marked channels could be programmed to either 'left as active transistor' or made to be 'always on' and accordingly form the proper address decoding function. The output of the AND circuits are marked as BL1 to BL5. FIG. 37E illustrates the overlay of the horizontal connection lines bringing in the addresses marked as Address 0-A0 and its inverted signal A0N to address 8-A8 and its inverted signal A8N.

The points that the S/D line is cut is illustrated by an 'X'. At any of these points a proper circuit needs to be formed on-top to support the programming mode. Transistors as was presented in respect to FIG. 31A are an option. Alternatively diodes could also be used with a potential limitation on the number of bits programmed into the affected facets. For a diode it might be preferred to use one diode orientation to odd S/D lines and the other orientation for even S/D lines.

In another alternative additional poly-silicon NAND type could be added to the HD-NOR structure. The starting point could be the structure as illustrated in FIG. 2J before. In such case the terrain of horizontal going gates could be used leveraging the other side of the gates for additional memory capacity.

Figure 38A:
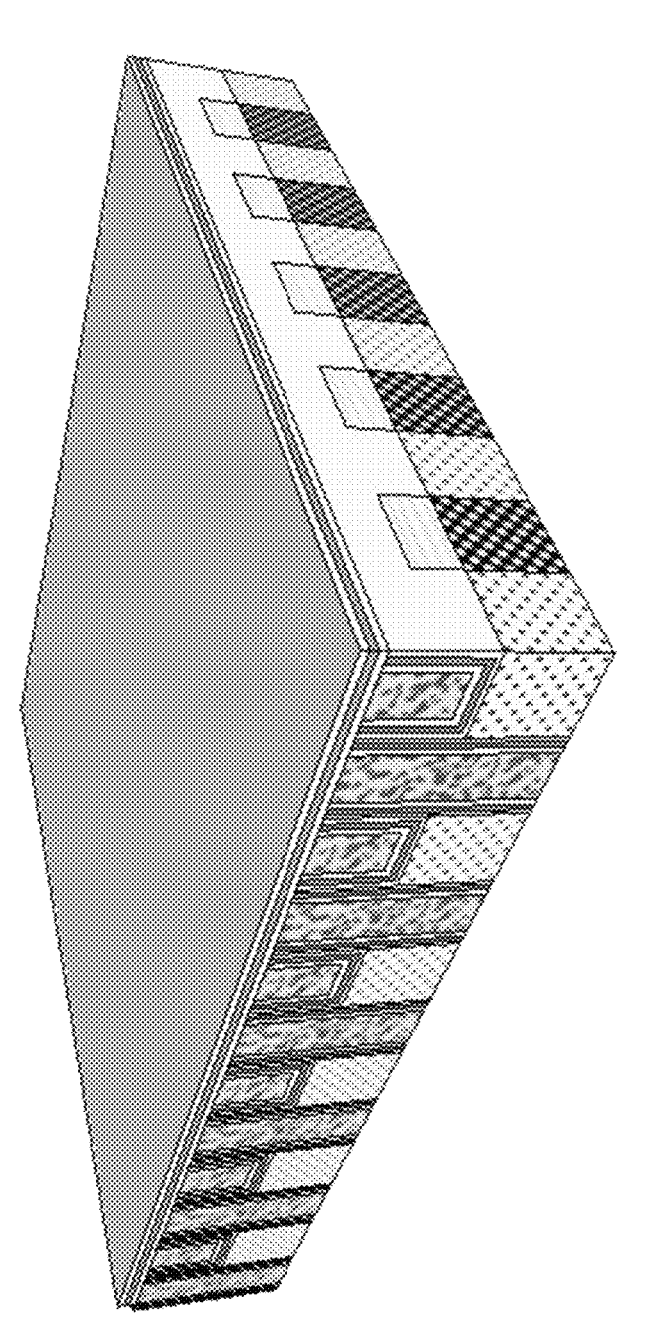

FIG. 38A illustrates the structure of FIG. 2J after adding a charge trap layer, for example, O/N/O layer, on top of the horizontal gates.

Figure 38B:
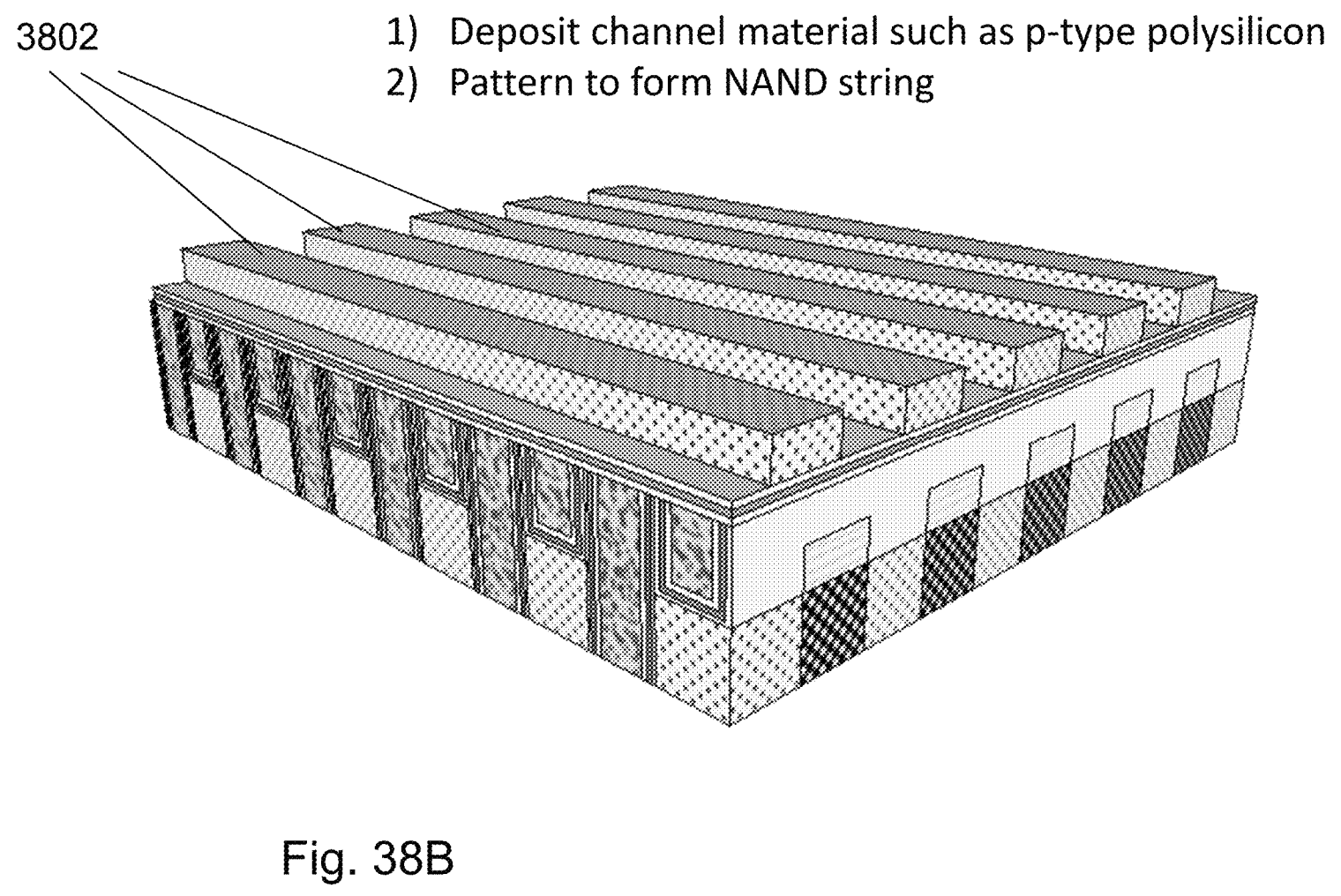

FIG. 38B illustrates the structure after adding on-top channel material, for example, such as depositing P type poly silicon or layer transferring a P type single crystal silicon layer, and then patterning/etching the on-top channel material, thus forming vertical to the gate NAND strings 3802.

Figure 38C:
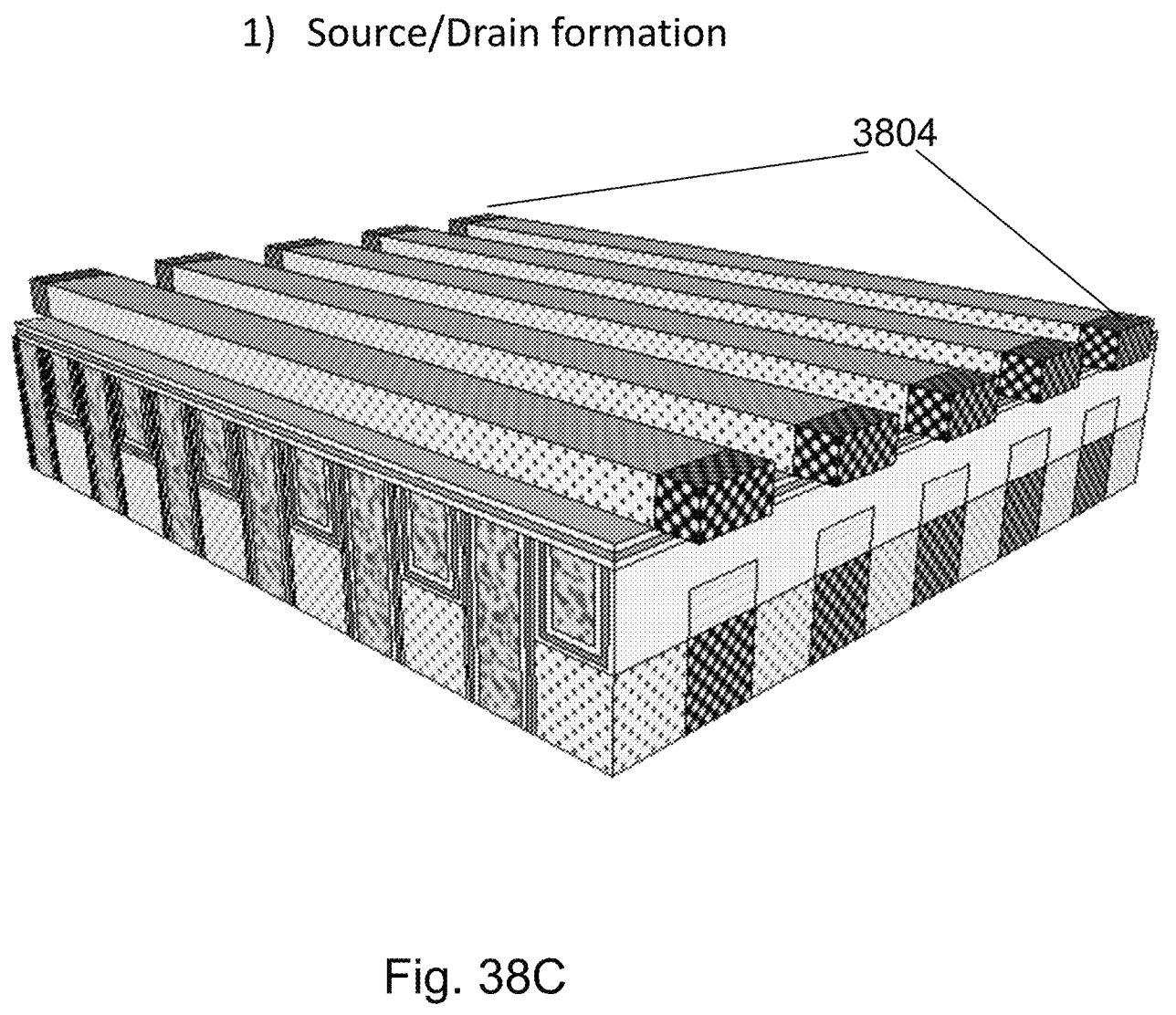

FIG. 38C illustrates the structure after adding Source and Drain 3804 N type to the NAND strings.

Figure 38D:
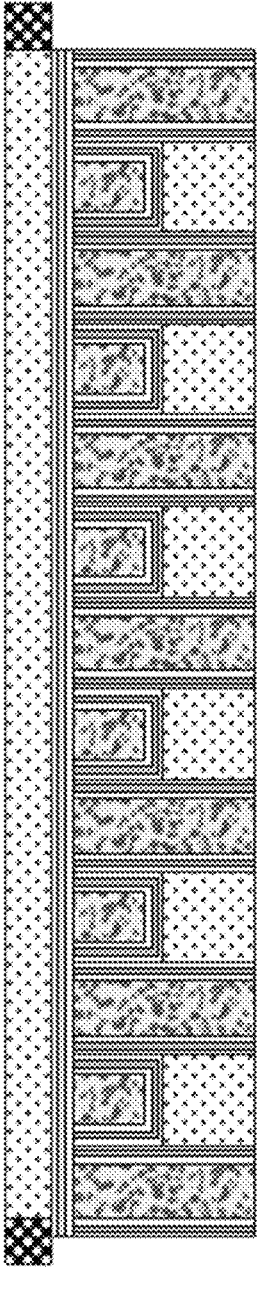

FIG. 38D illustrates the structure from the view point of vertical cut along gate NAND strings 3802.

Another alternative is to add-on additional polysilicon NOR structures leveraging the base HD-NOR flow to add additional layers of memory.

Figure 39A:
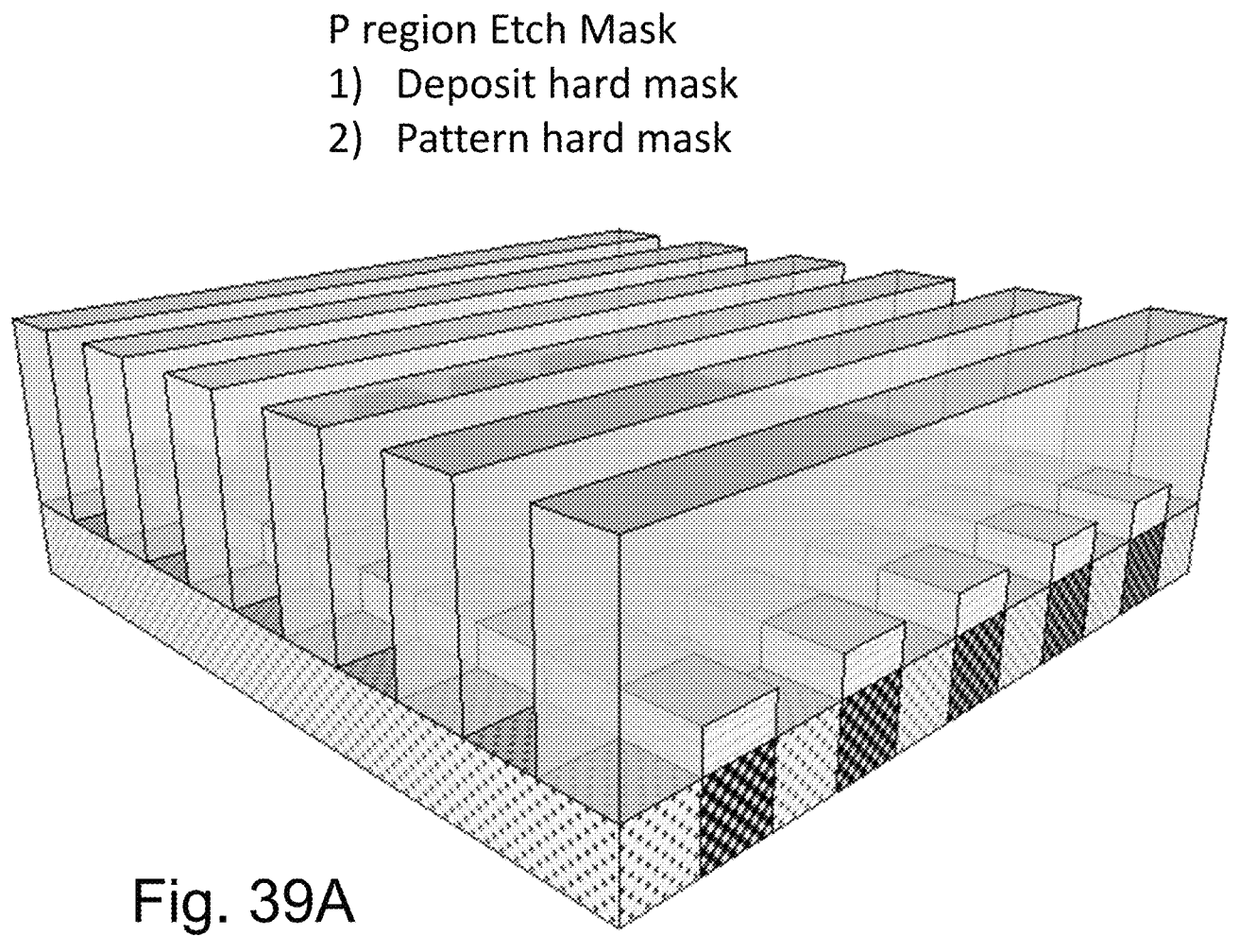
Figure 39B:
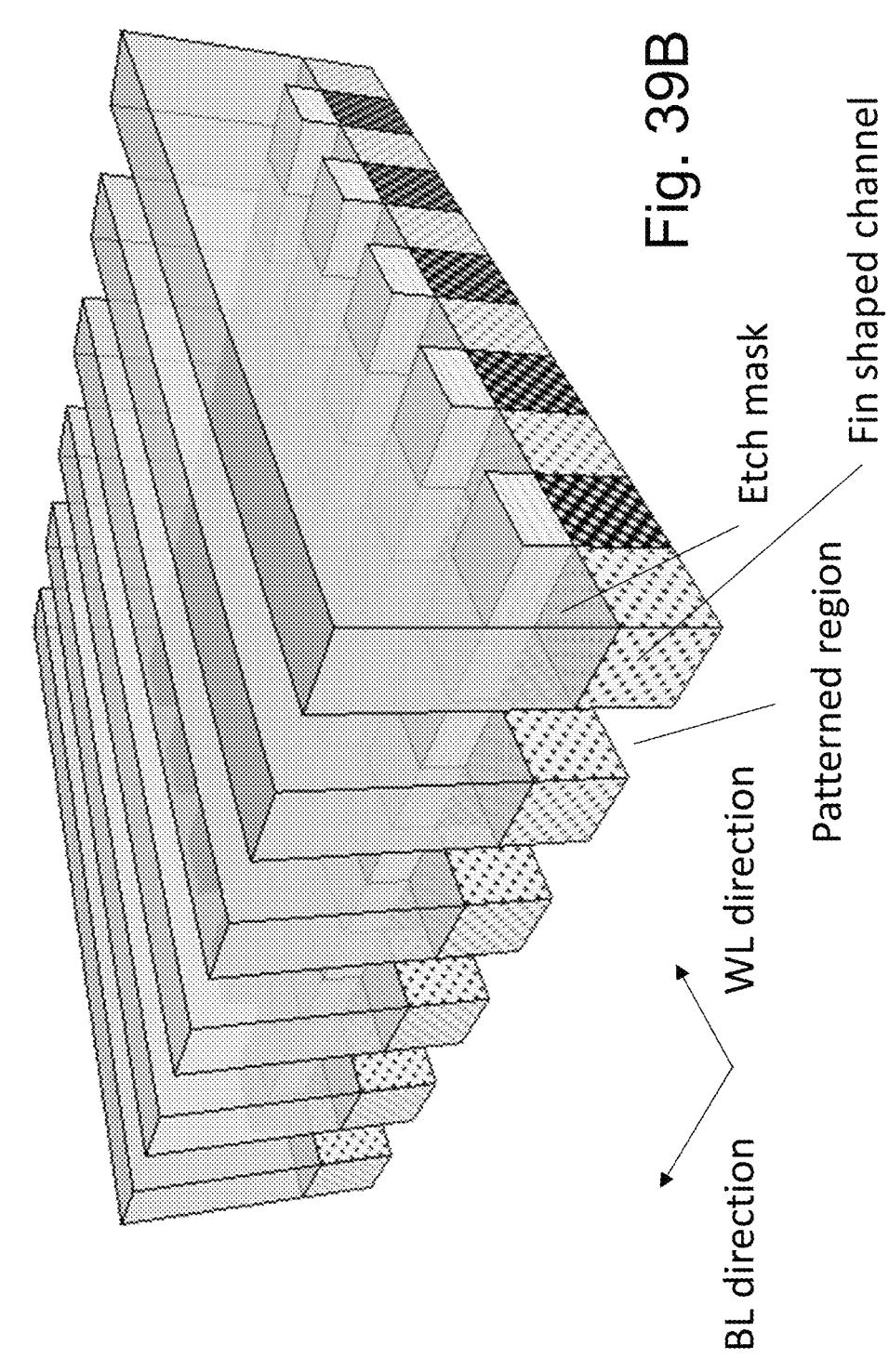
FIGS. 39A-39N are example illustrations of another method of NAND memory added to a HD-NOR structure.

It starts by modifying the structure of FIG. 2E by forming the hard mask of 215 much taller as is illustrated in FIG. 39A. The following steps as are illustrated in FIG. 39B and FIG. 39C are following the steps in a similar flow as was presented before up to FIG. 2H.

Figure 39C:
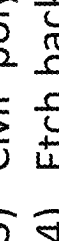

Additional steps are taking place to form the structure of FIG. 39C which include CMP and etch back the gate structure to form groves 3900.

Figure 39D:
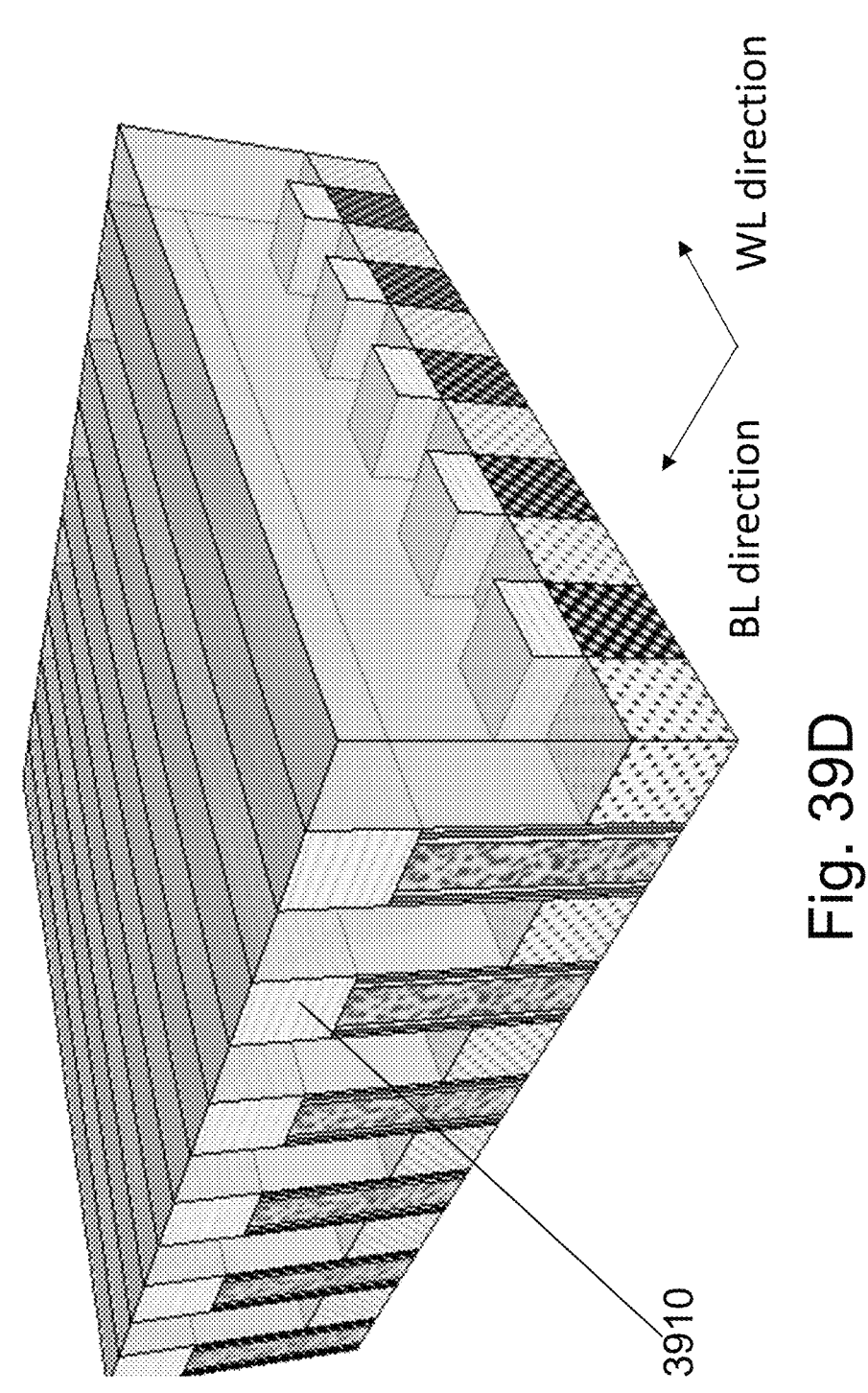

FIG. 39D illustrates the structure after filling these groves with second hard mask 3910.

Figure 39E:
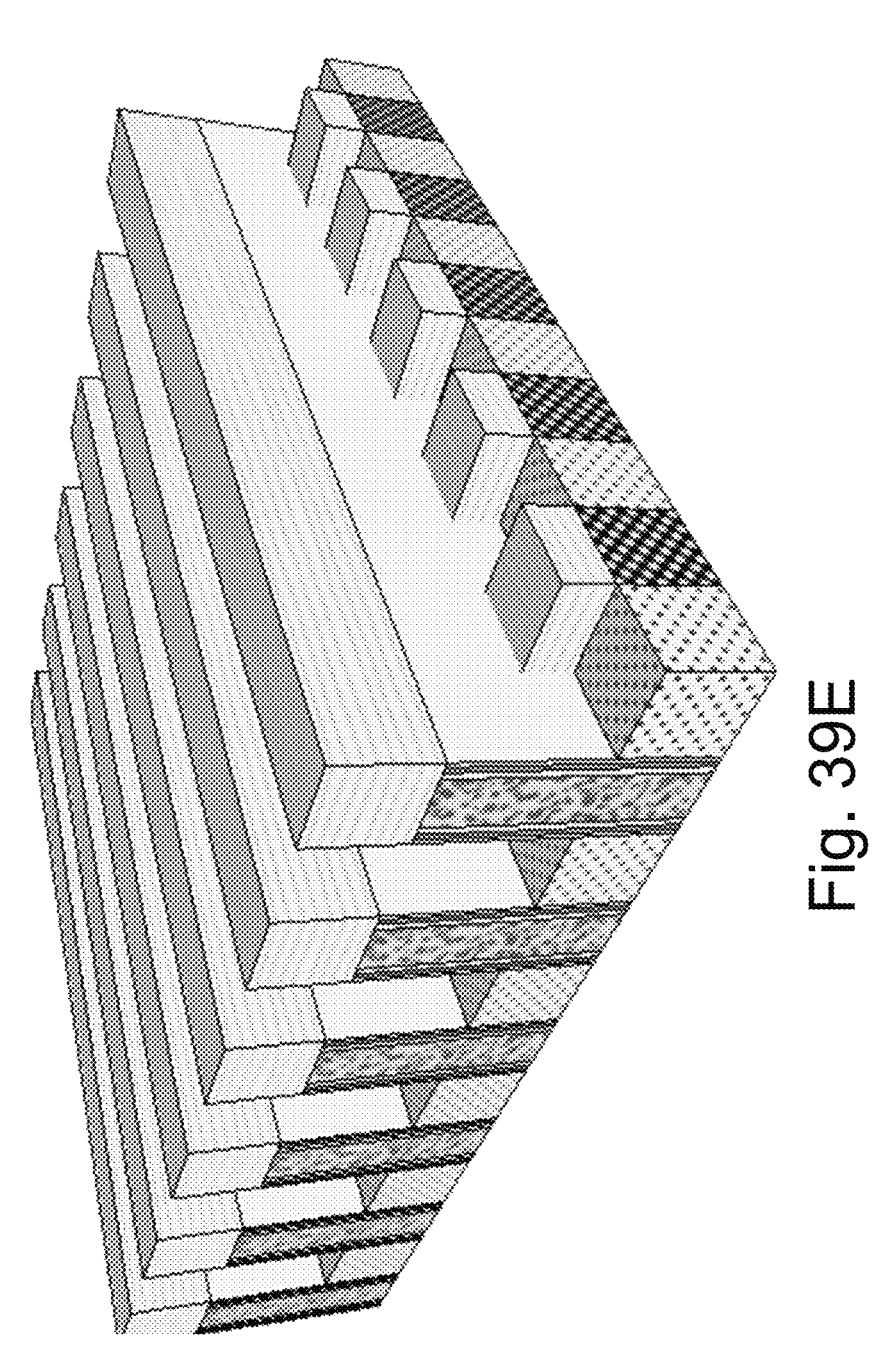

FIG. 39E illustrates the structure after removing the first hard mask.

Figure 39F:
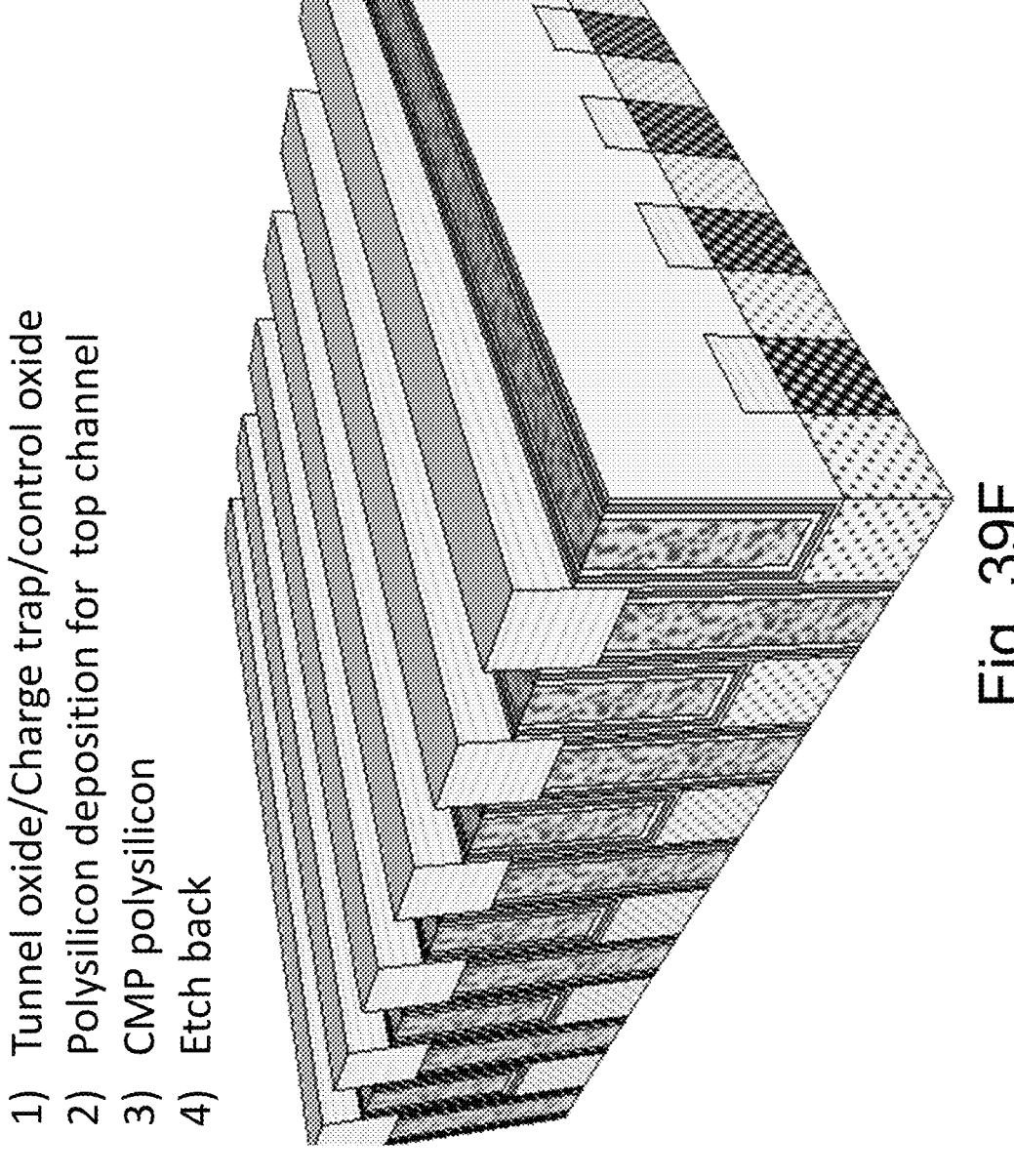

FIG. 39F illustrates the structure after adding O/N/O and gate material instead of the removed first hard mask, and then CMP and etchback leveraging the second hard mask.

Figure 39G:
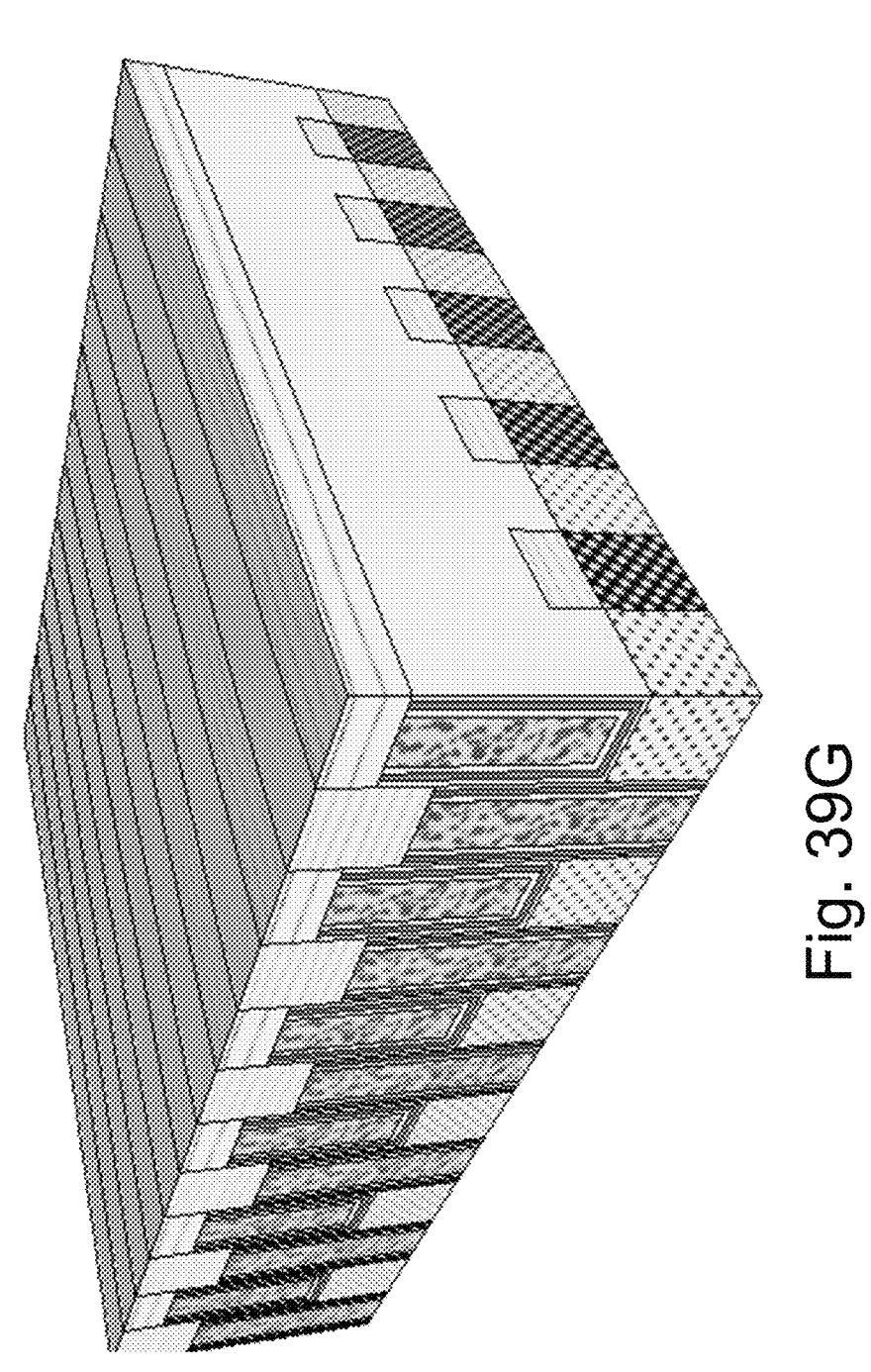

FIG. 39G illustrates the structure after filling in a third hard-mask. And then a planarization such as CMP.

Figure 39H:
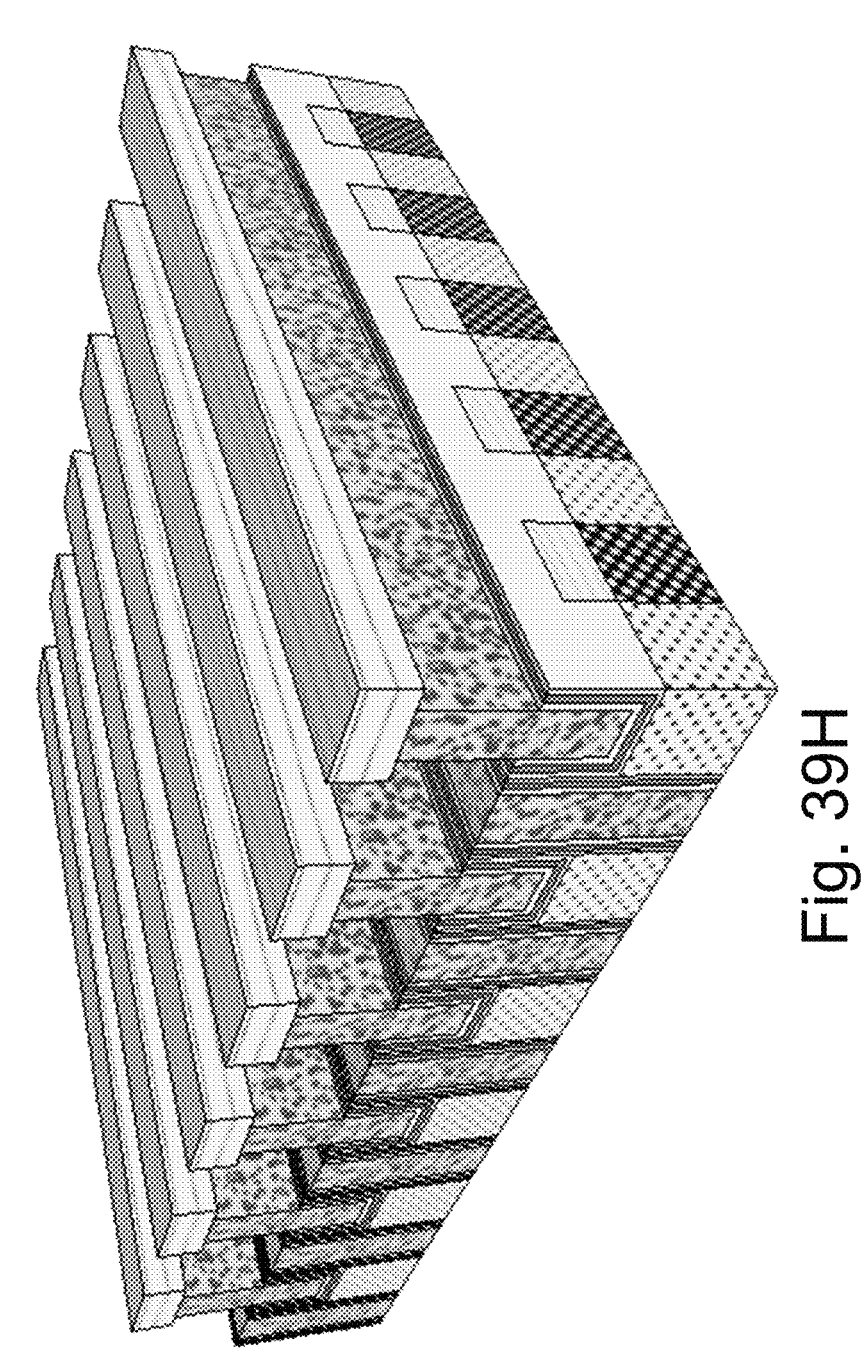

FIG. 39H illustrates the structure after removing the second hard-mask and selectively etch back some of the gate and O/N/O.

Figure 39I:
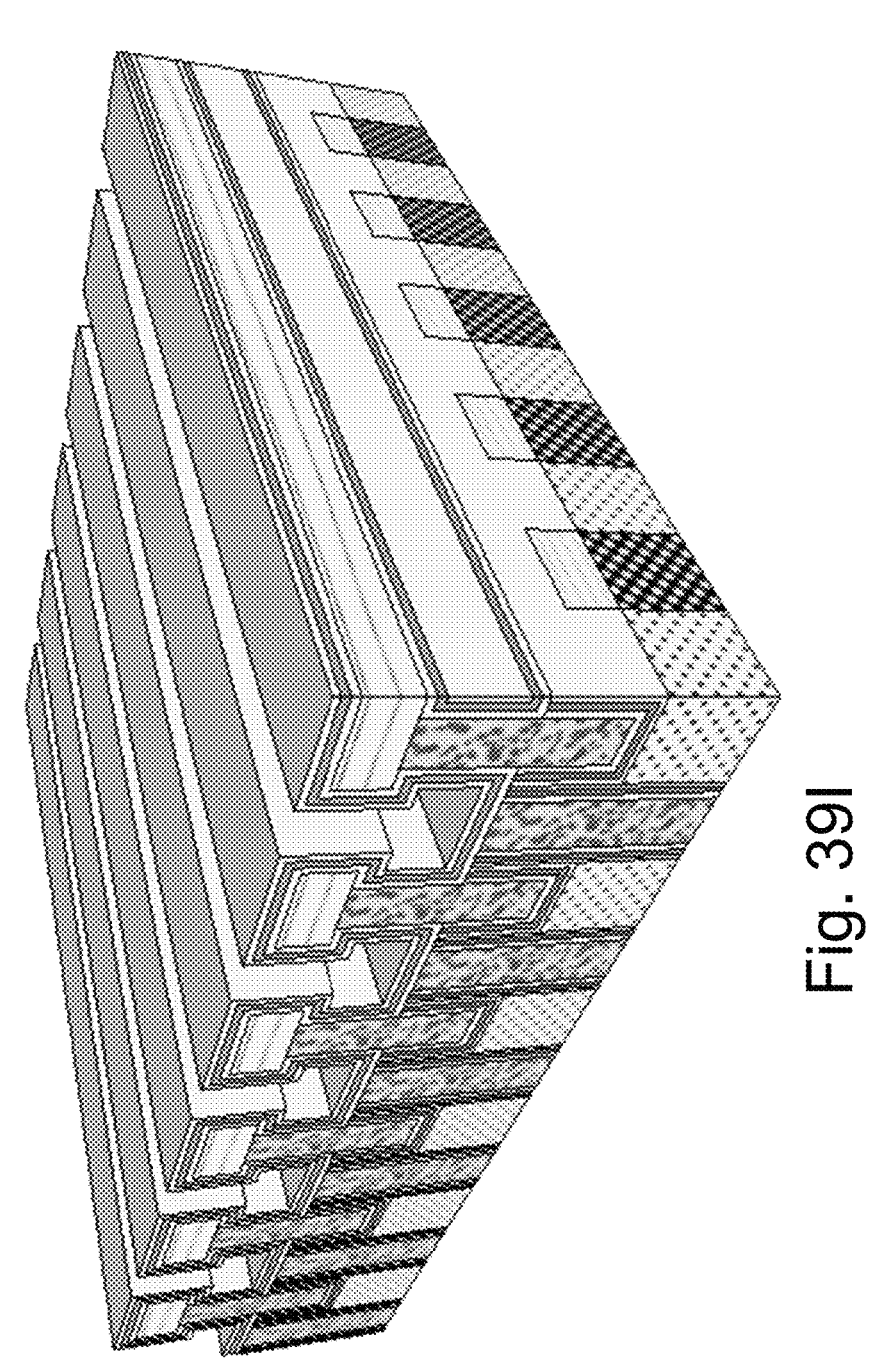

FIG. 39I illustrates the structure after adding new O/N/O.

Figure 39J:
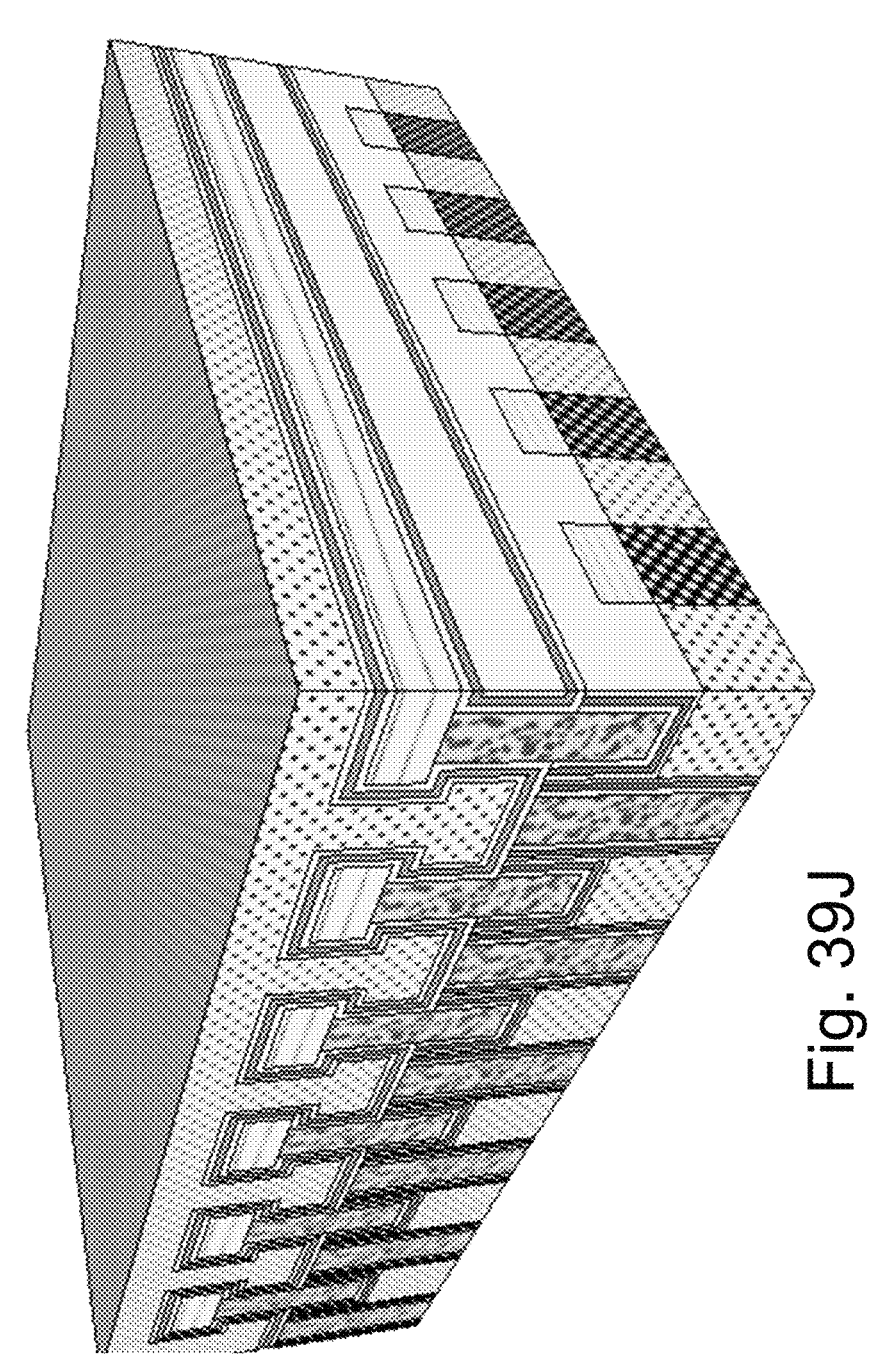

FIG. 39J illustrates the structure after adding new channel material such as P type poly-silicon.

Figure 39K:
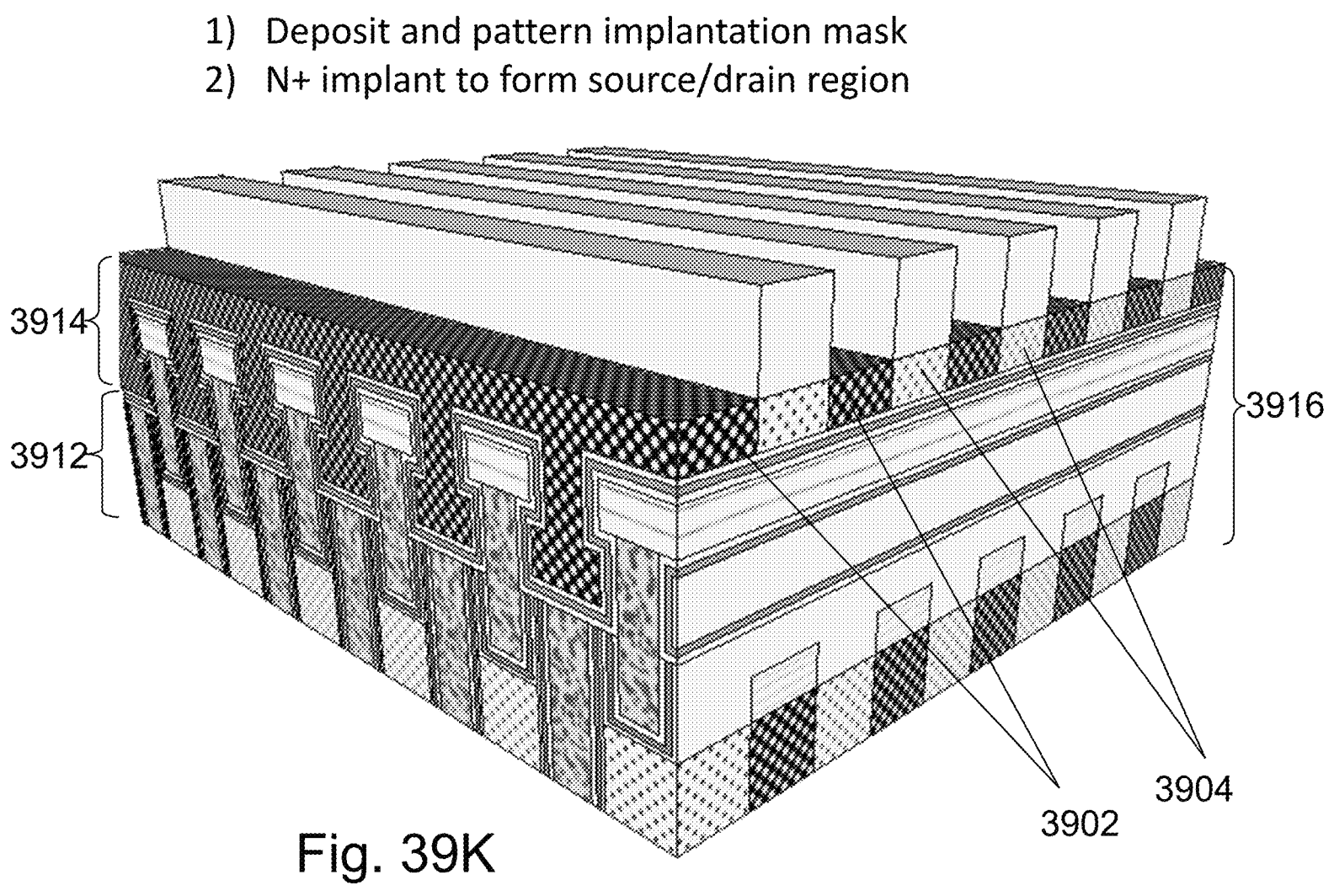

FIG. 39K illustrates the structure after implant mask patterning and implantation of the S/D lines in parallel to the original S/D lines, thus forming them as N+ regions for Source/Drains.

Figure 39L:
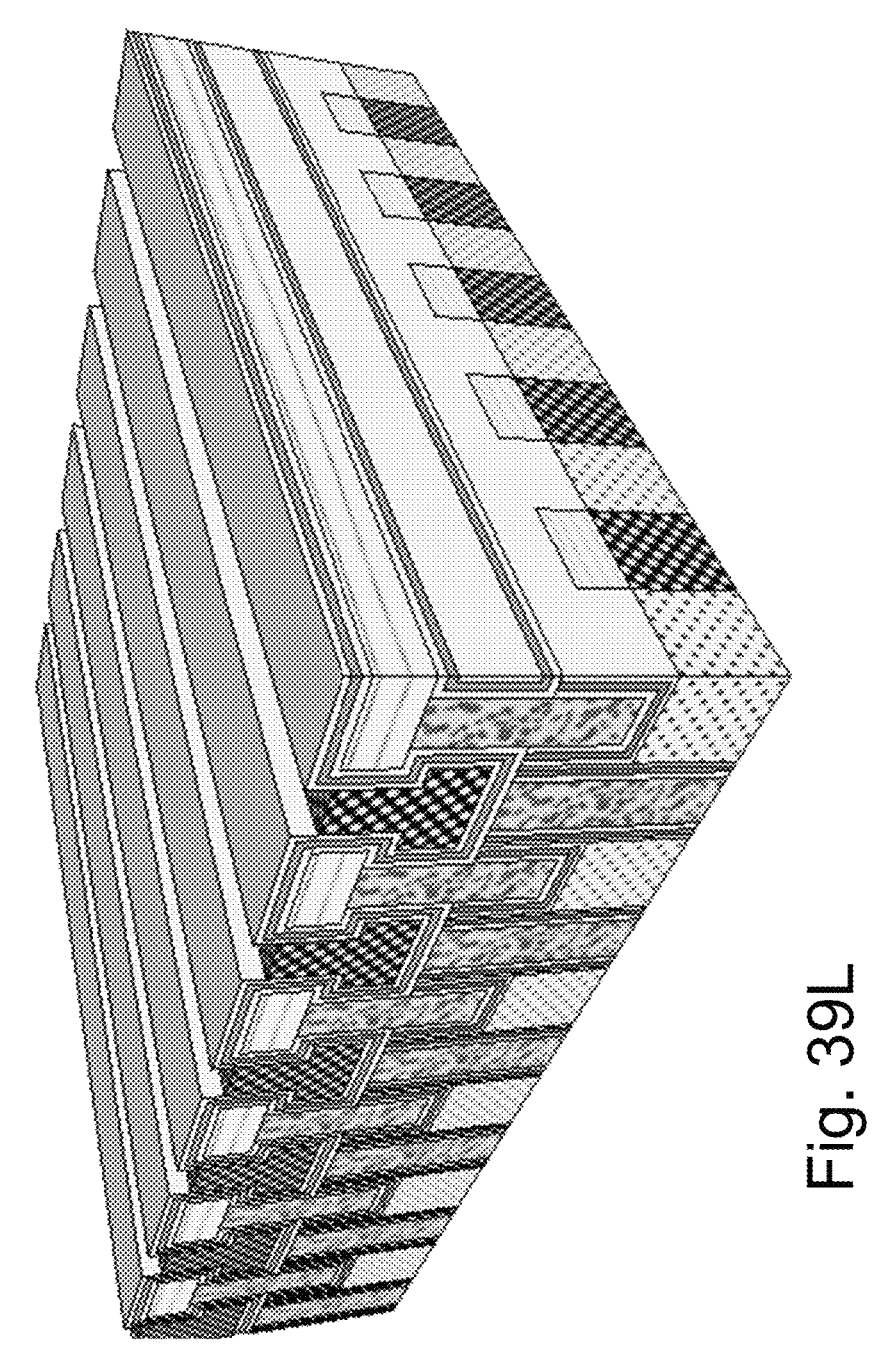

FIG. 39L illustrates the structure after removal of the implant mask etch back polysilicon layer.

Figure 39M:
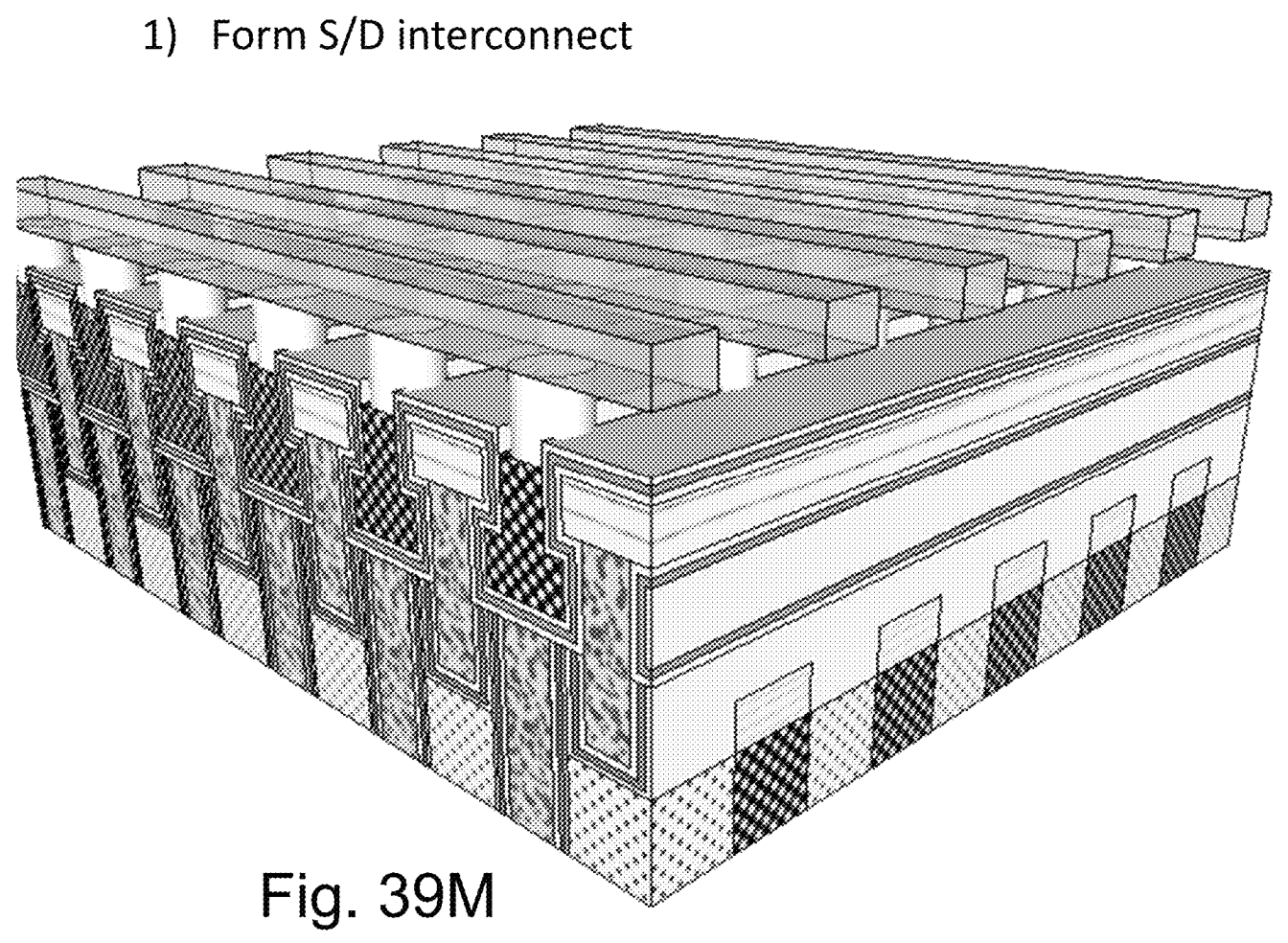

FIG. 39M illustrates the structure after adding connection forming the S/D access lines.

Figure 39N:
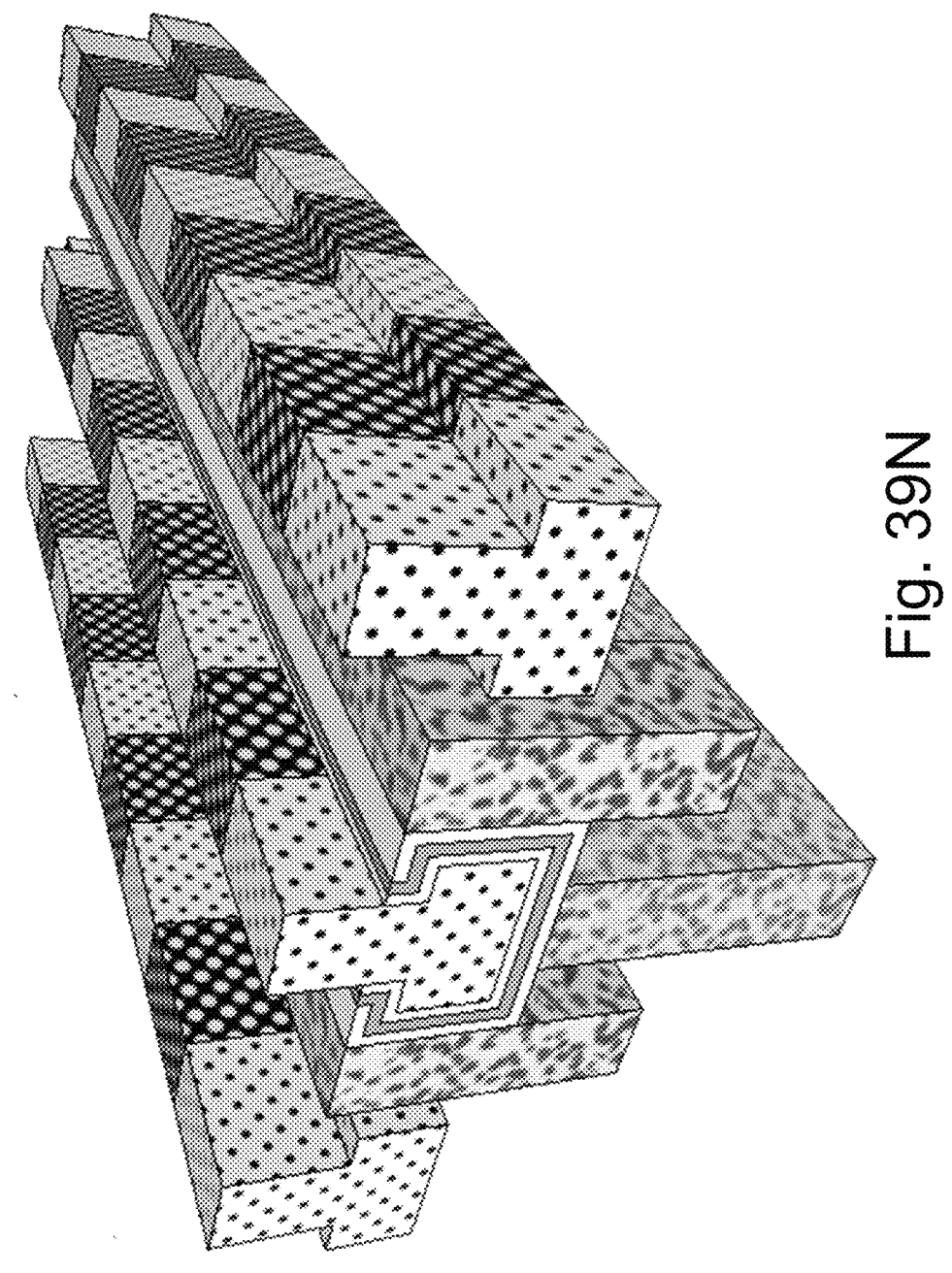

FIG. 39N illustrates the resulted structure of the original gate lines are now also controlling three facets of the top NOR structure with a channel each having three facets controlled by gates and with parallel access to their Source and Drains. As the same mechanism explained before, the polysilicon channel based top NOR structure can be configured to be used as multi-bit cells.

In alternative variation the structure in FIG. 39K could be processed to keep the N+ 3902 as S/D lines while removing the P− 3904 other than in the channels, resulting with double layer NOR structure which could be used as advance substrate and allow still high temperature (~500-900° C.) for building on top of it additional circuits. Accordingly the double layered NOR 3916 could be built on silicon 2020 as illustrated in FIG. 20A over a cut porous structure 2032 as an extension of FIG. 20B. It could include a memory as NV memory fabric 3914 and a universal fabric 3912 which be used for NV memory, high speed DRAM, logic fabric and/or programmable logic fabric as was described herein.

Figure 40A:
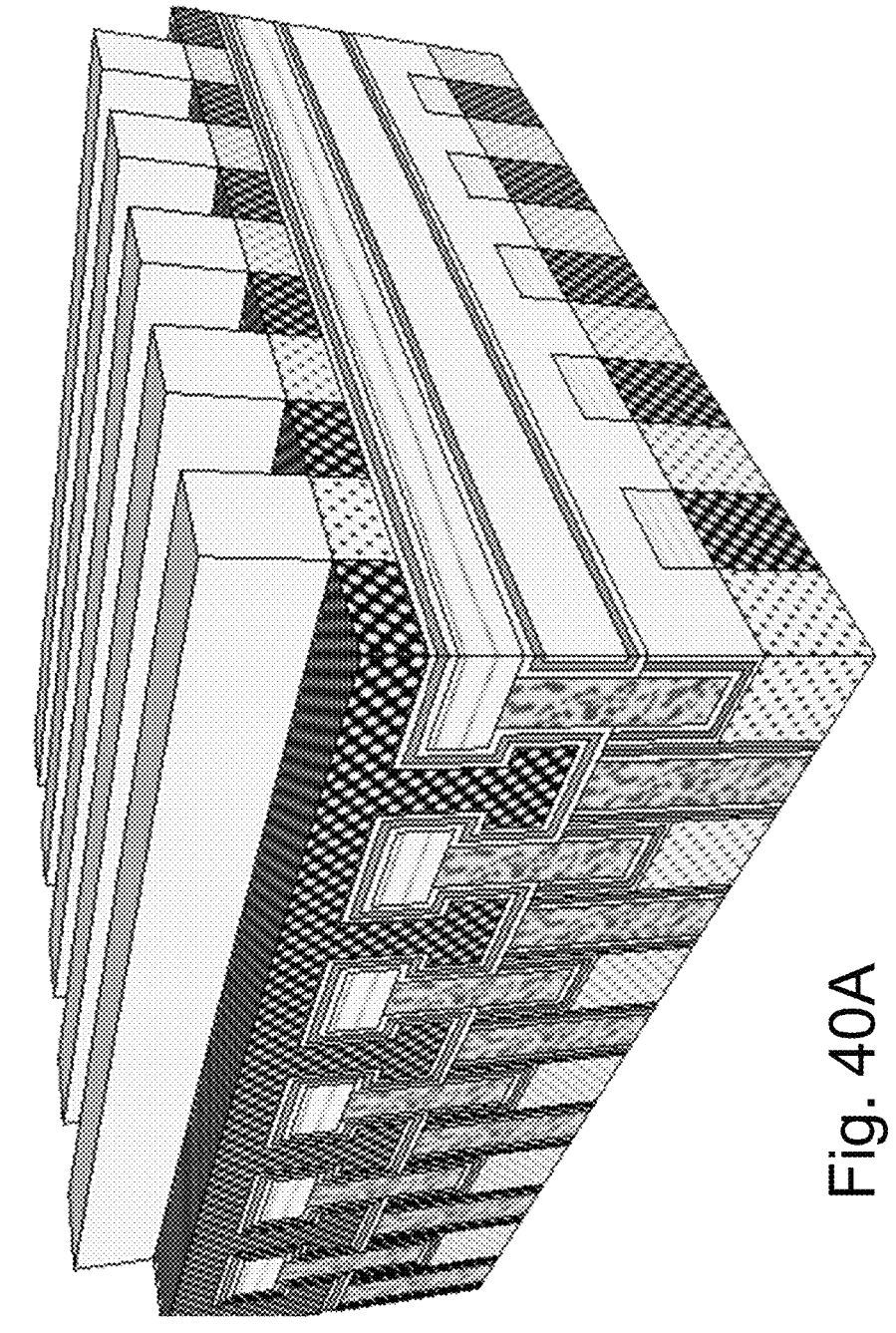
FIGS. 40A-40D are example illustrations of the formation and structure of a double layer NOR.
Figure 40B:
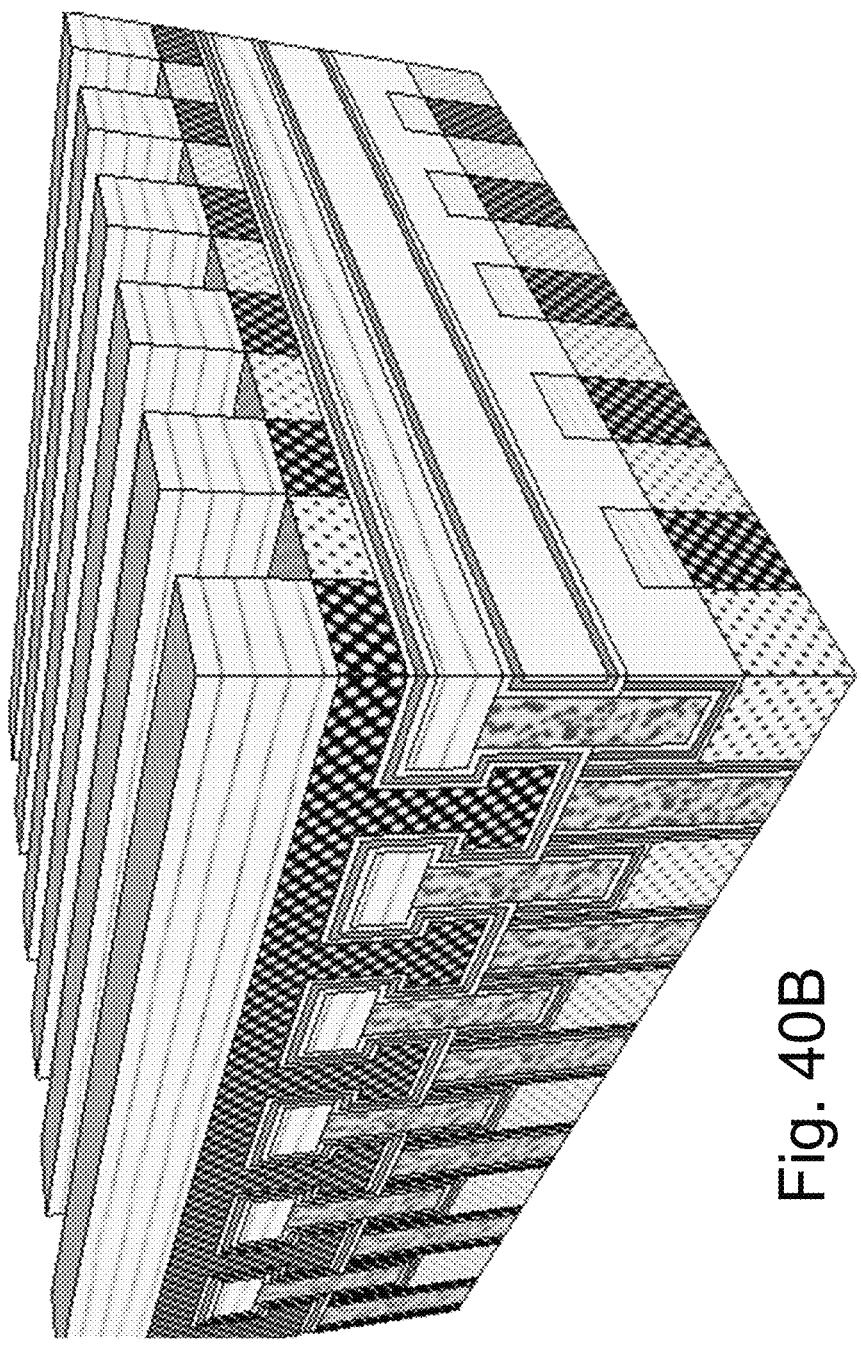
Figure 40C:
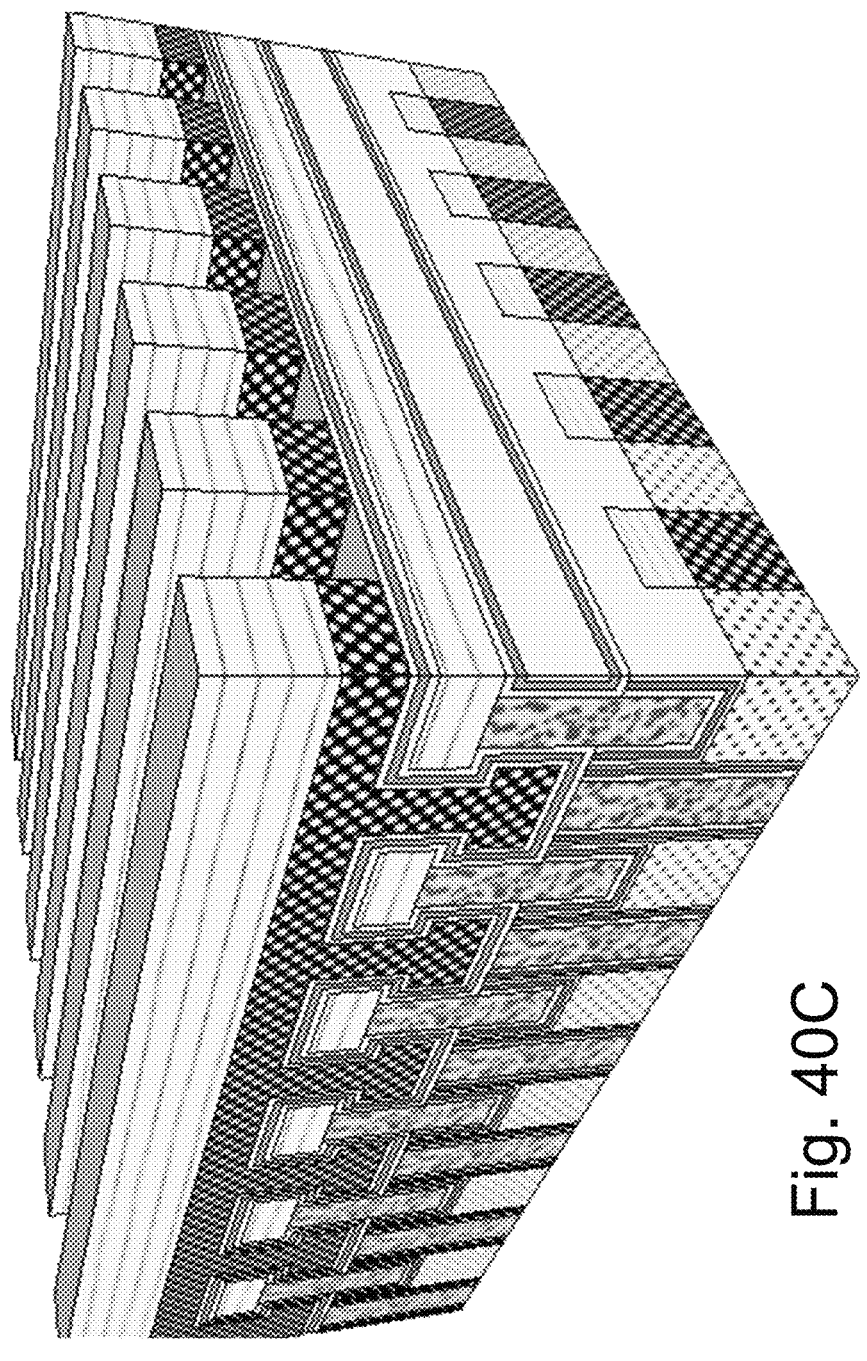
Figure 40D:
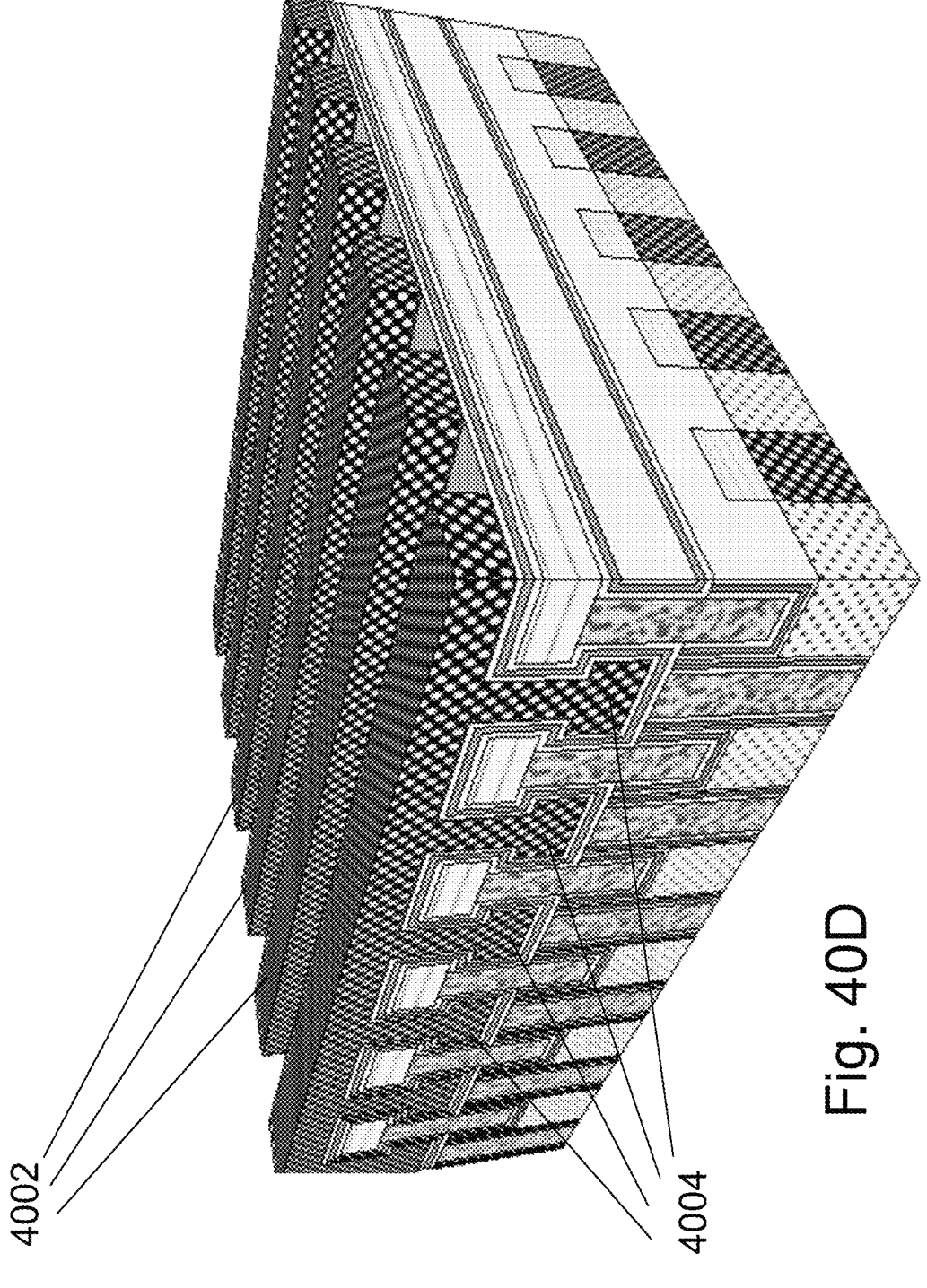

An optional flow for this alternative is illustrated in FIG. 40A to FIG. 40D in which FIG. 40D illustrates the resulting bitlines of the N+ which is also the S/D 4002 lines. These lines could be silicidized for better conduction as the actual Source and Drain are somewhat inside 4004.

Figure 41A:
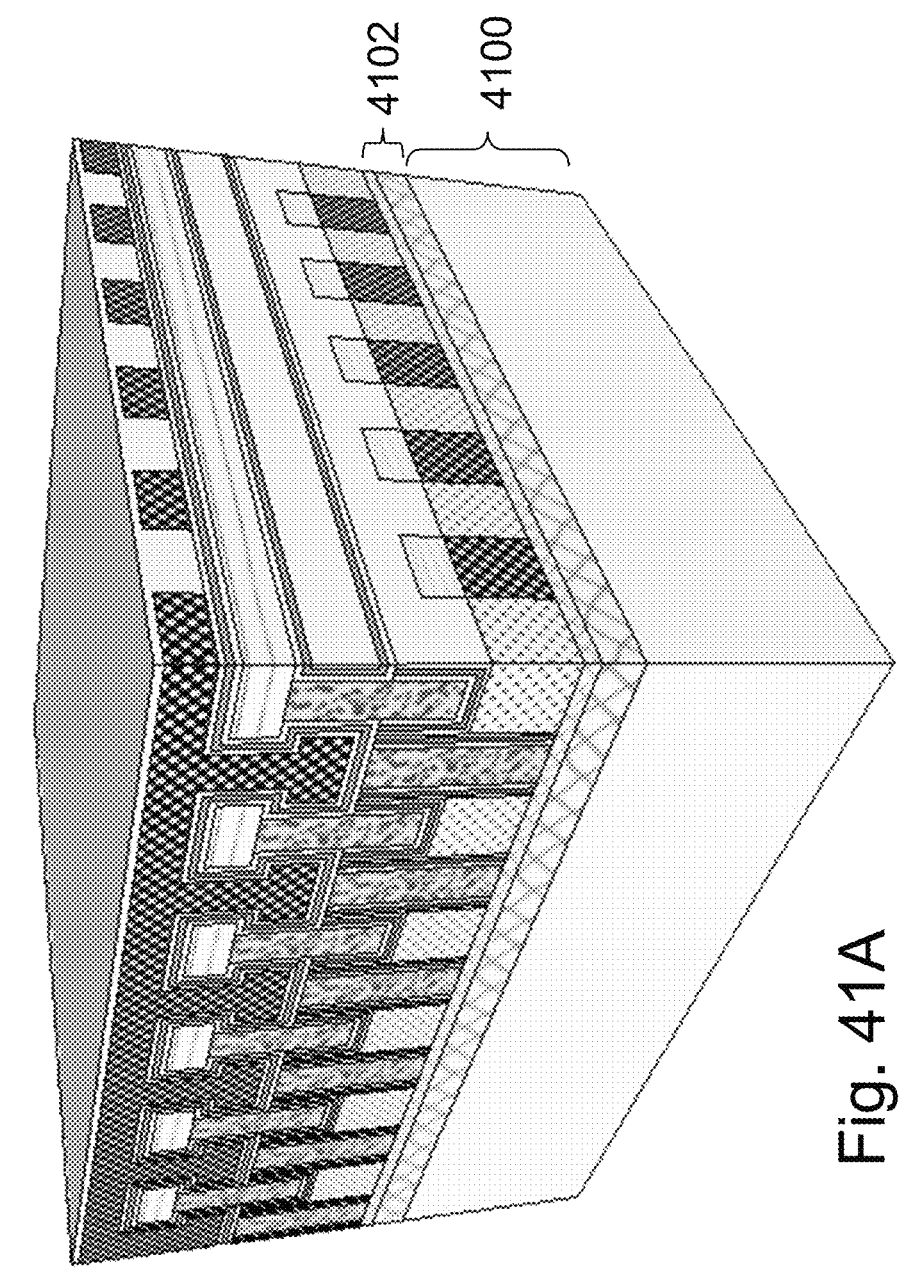
FIGS. 41A-41E are example illustrations of the formation and structure of a double layer NOR on porous cut enabled substrate.

FIG. 41A illustrates the double NOR structure on porous cut layers 4102 on top of carrier wafer 4100.

Figure 41B:
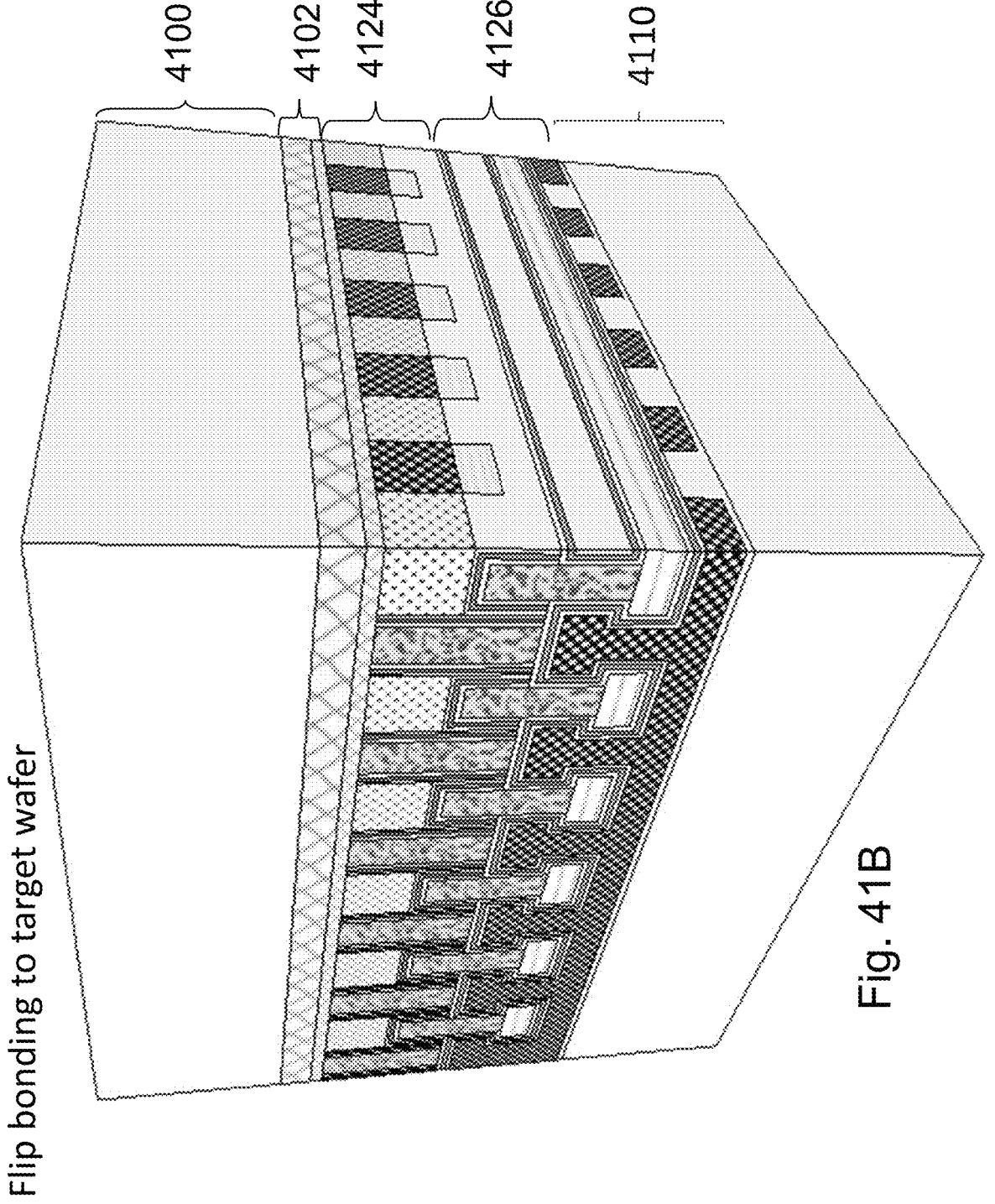

FIG. 41B illustrates the structure of FIG. 41A being flipped and bonded on top of a carrier substrate 4110. The poly-silicon based NOR 4126, then on top of it the crystalline based NOR 4124, and then the cut porous layers 4102 and the donor carrier 4100.

Figure 41C:
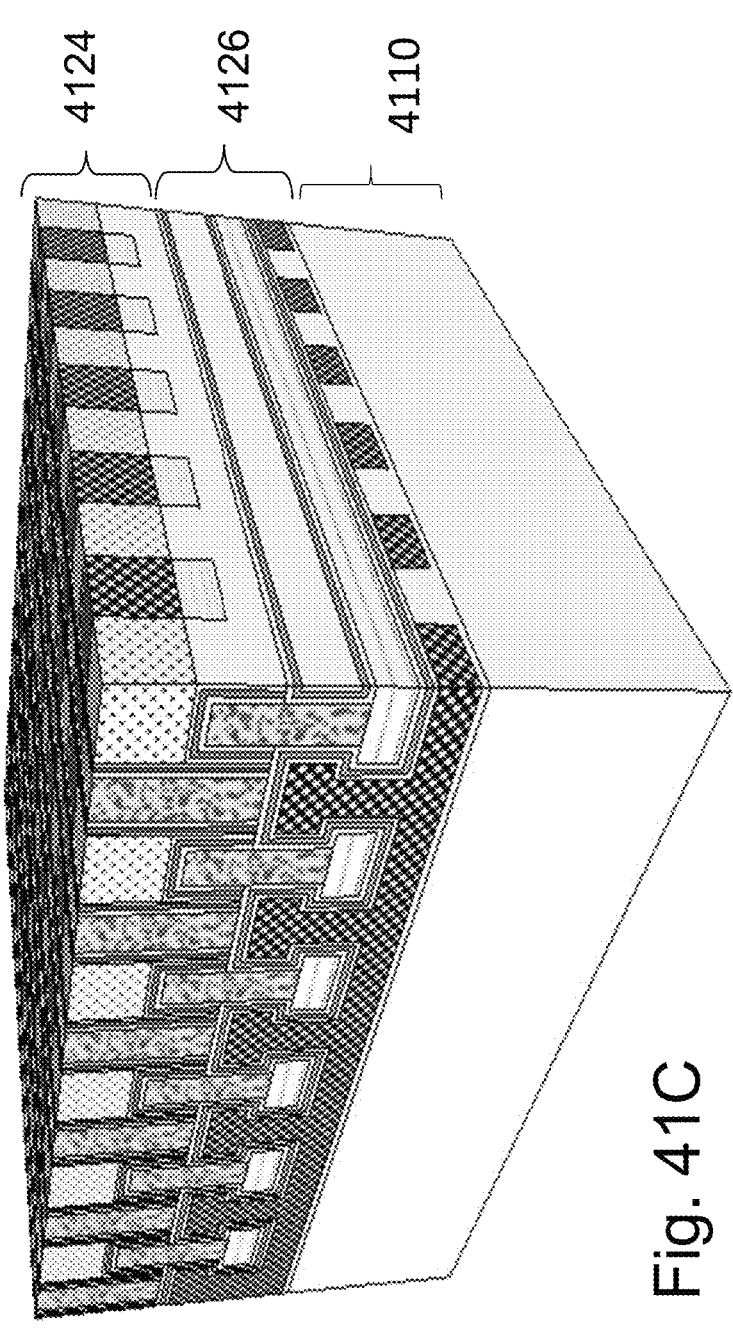

FIG. 41C illustrates the structure of FIG. 41B after cutting off the porous and the donor carrier 4120.

Figure 41D:
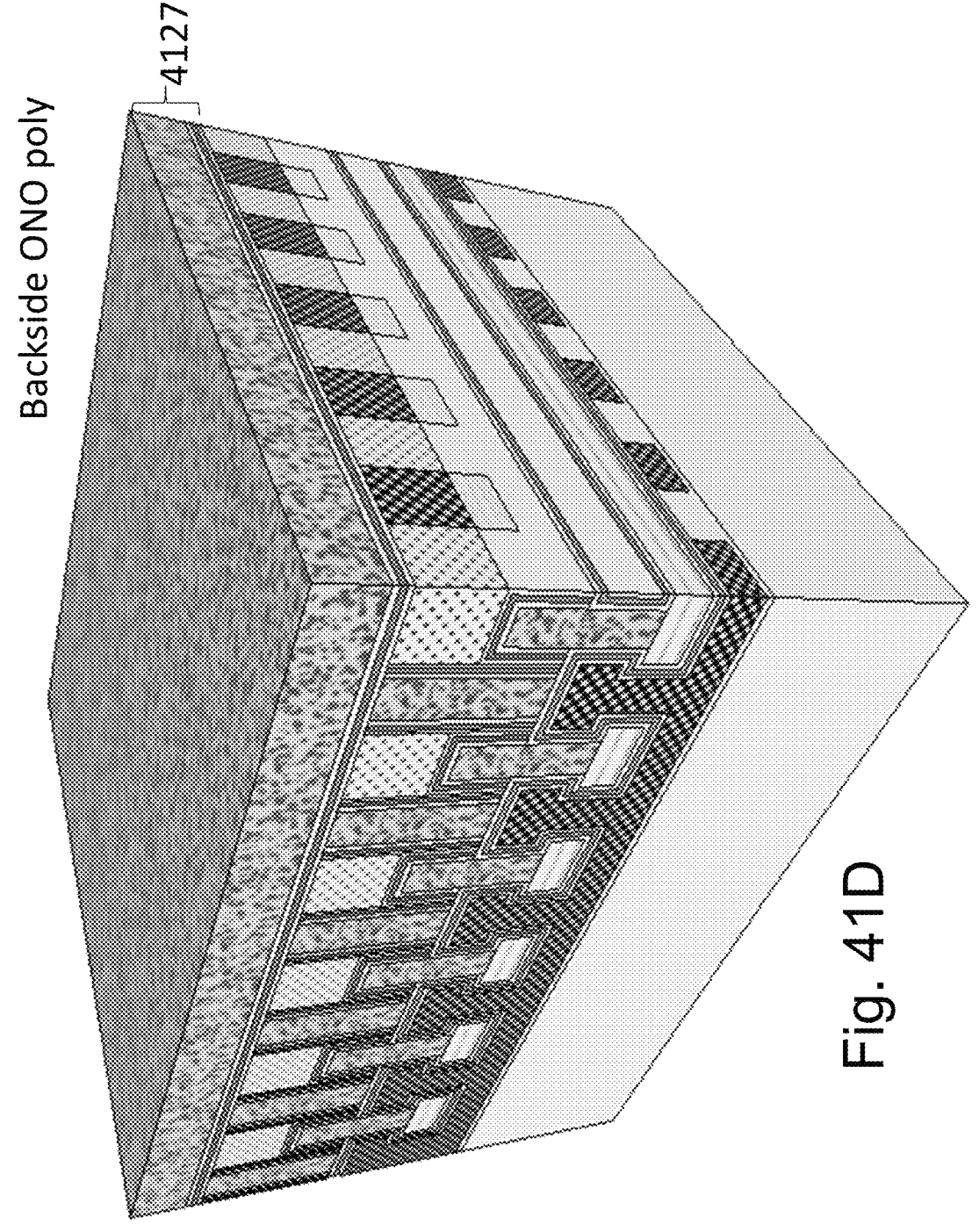

FIG. 41D illustrates covering the top of the structure of FIG. 41C with O/N/O layers and gate material 4127.

Figure 41E:
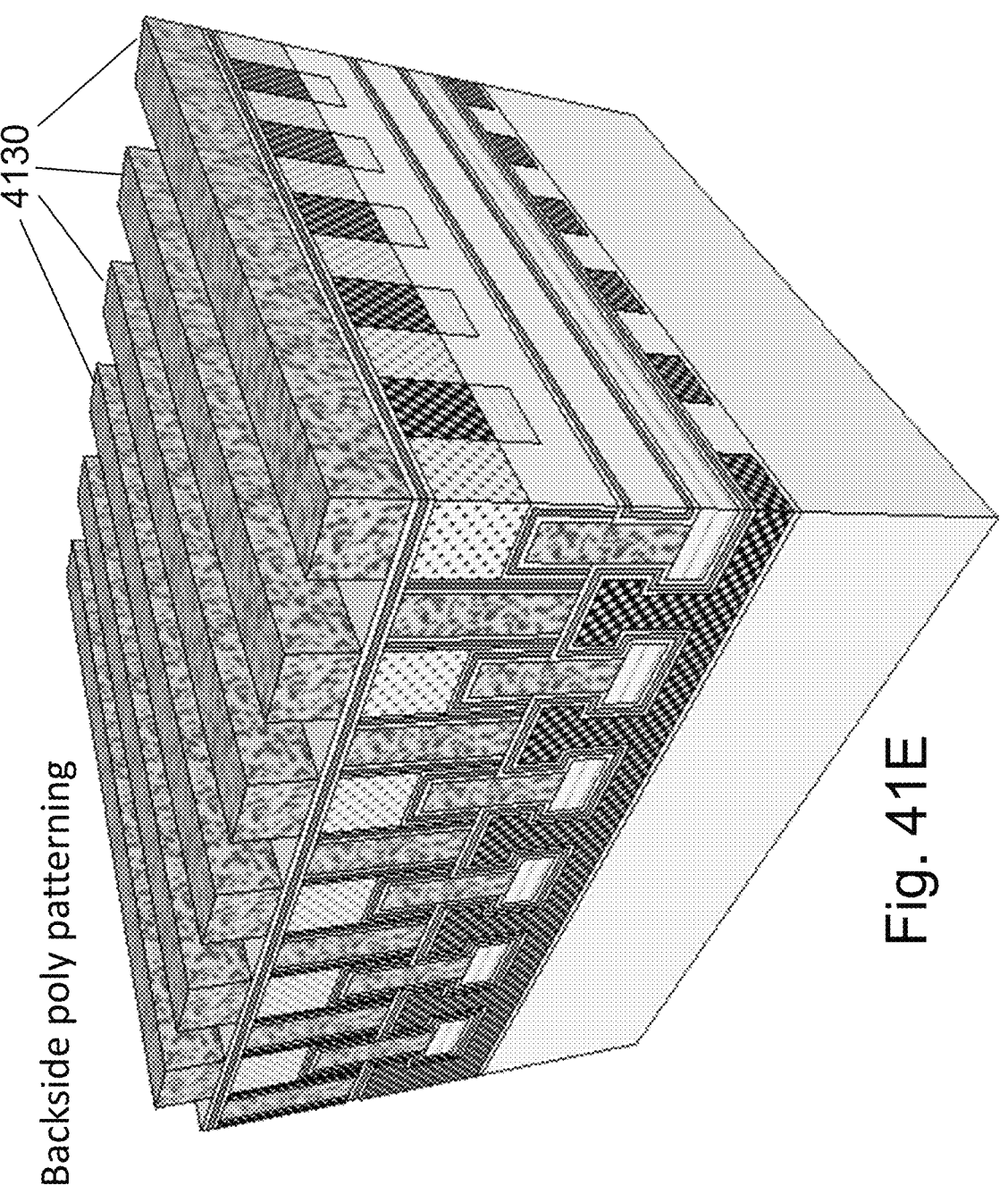

FIG. 41E illustrates patterning the top gate 4130, thus substantially completing the crystalline based NOR 4124 structure and enable its channel to have four facets which may be fully ready for memory usage as discussed before.

The structure of FIG. 41E with or without the top gates 4130 could be used as advanced substrates on which additional layers of transistors and connections could be built for the construction of a multi-level functional system.

Figures 42A, 42B:
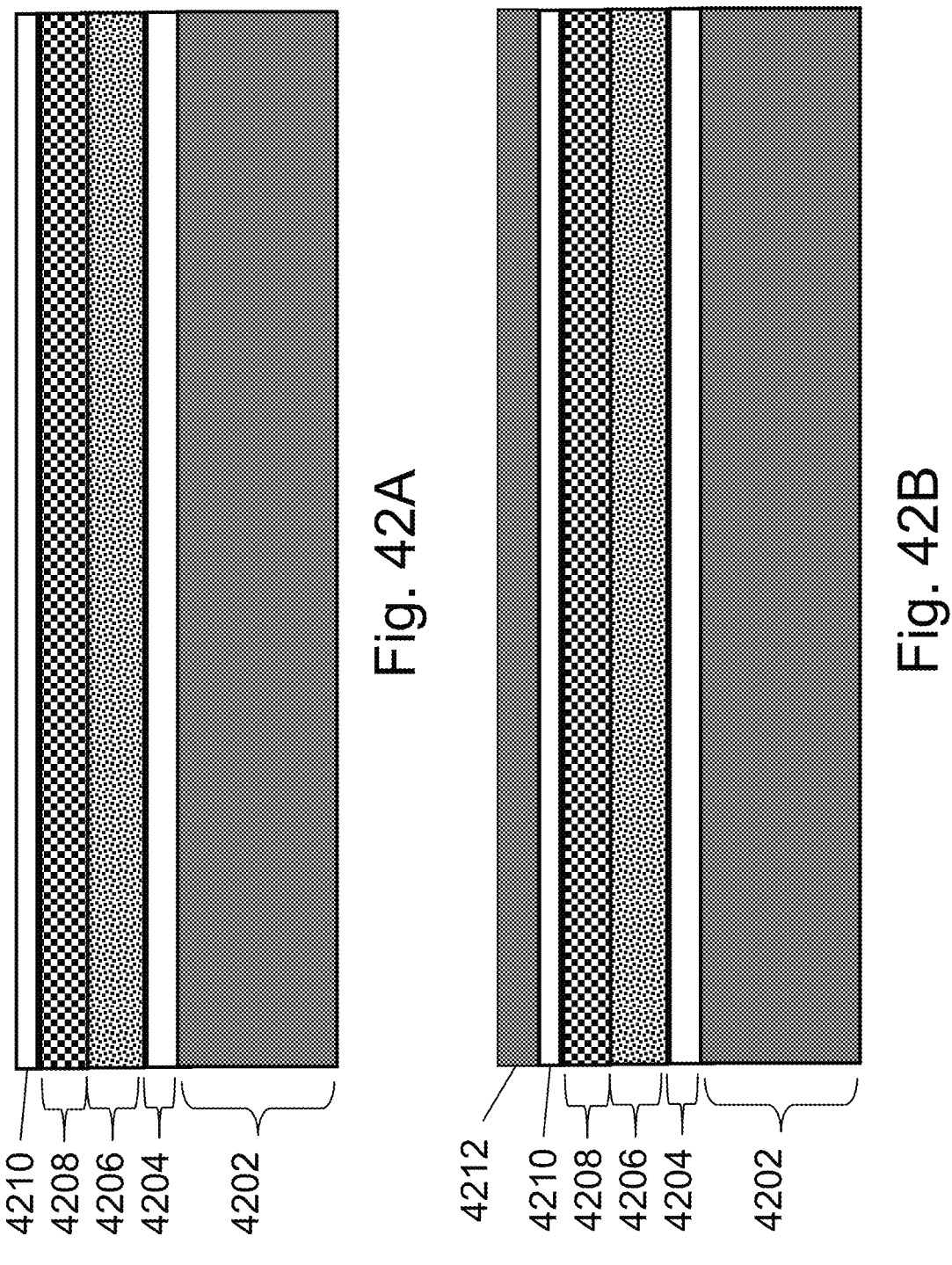
FIGS. 42A and 42B example illustrations of the formation and structure of an alternative advanced substrate.

FIG. 42A illustrates such an advanced substrate. Base silicon 4202 covered with oxide on which the structure 3916 is bonded. Thus the NV memory fabric 4126 which now marked 4206 may be overlaid by a universal fabric 4124 which is now marked as 4208 covered with oxide 4210. The advanced substrate could now be used for some applications by a step of customization by etching the S/D lines of 4208 structures and deposition of a connection through 4210.

Then as illustrated in FIG. 42B a silicon layer 4212 could be transferred on top which may then be processed forming desired transistors including N type and P type to integrate with advanced substrate for the desired application. And then metal layers could be added in to finish the full end application.

Figure 43:
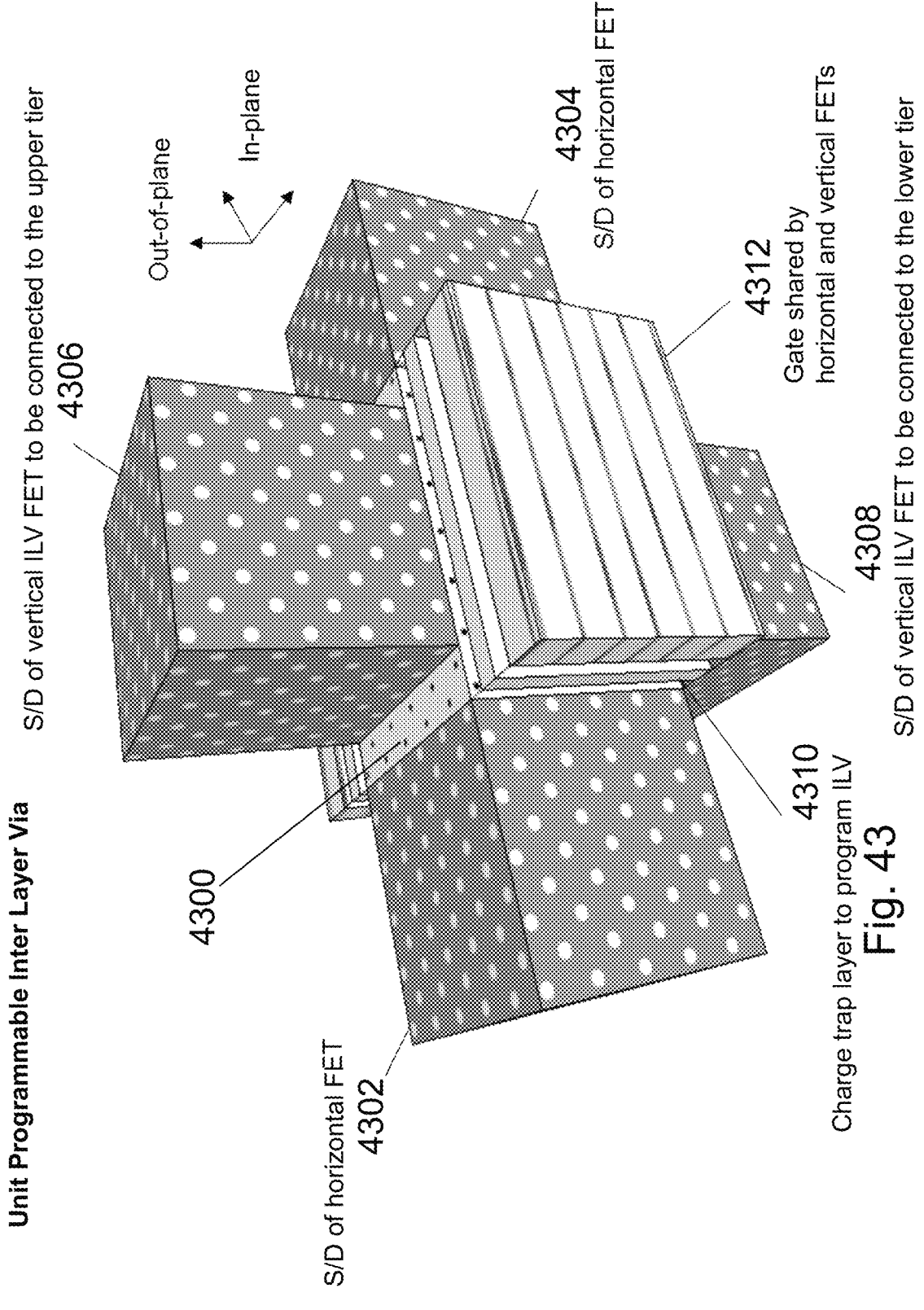
FIG. 43 is an example illustration of an HD NOR cell formed as a programmable via.
Figure 44:
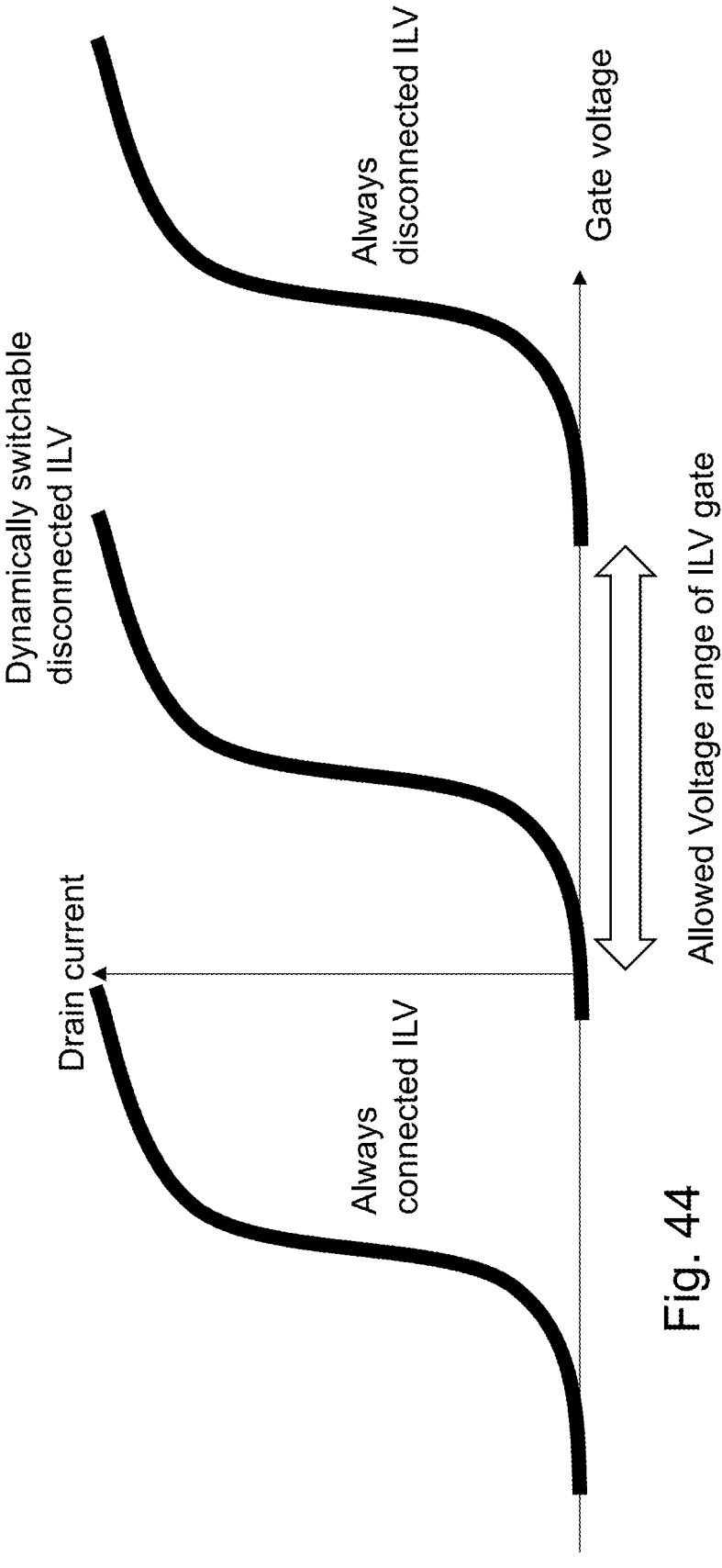
FIG. 44 is an example illustration of operating states for an HD NOR cell programmable via.

FIG. 43 illustrates an alternative enhancement of the basic NOR memory cell for forming a programmable via—Inter Layer Via "ILV". The enhancement would be applied to the starting structure illustrated in FIG. 2I. FIG. 43 illustrates the basic channel 4300 (which resembles channel 222) with side S/D 4302 and 4303 (which resemble 204) with O/N/O charge trap structure 4310 control by gate 4312 (resembling 224 and 225). For the programmable via—ILV application an additional vertical source/drain 4306 is added on top of the channel 4300, and additional vertical source/drain 4308 is added below the channel 4300. Thus, a channel that is serving a horizontal FET of an NPN (4304, 4300, 4310) transistor controlled by charge trap and gate (4310, 4312), which is also the channel of a vertical FET NPN transistor (4306, 4300, 4312). The horizontal transistor is used to program into the charge trap structure 4310 to shift the conduction characteristics of the vertical transistor forming effectively a programmable via—ILV. Accordingly the conduction between the top S/D 4306 and the bottom S/D 4308 could be programmed to be either always on, or always off or subject to the gate 4312 voltage. FIG. 44 illustrates these three operating states for which the ILV could be programmed to.

Figures 45A, 45B:
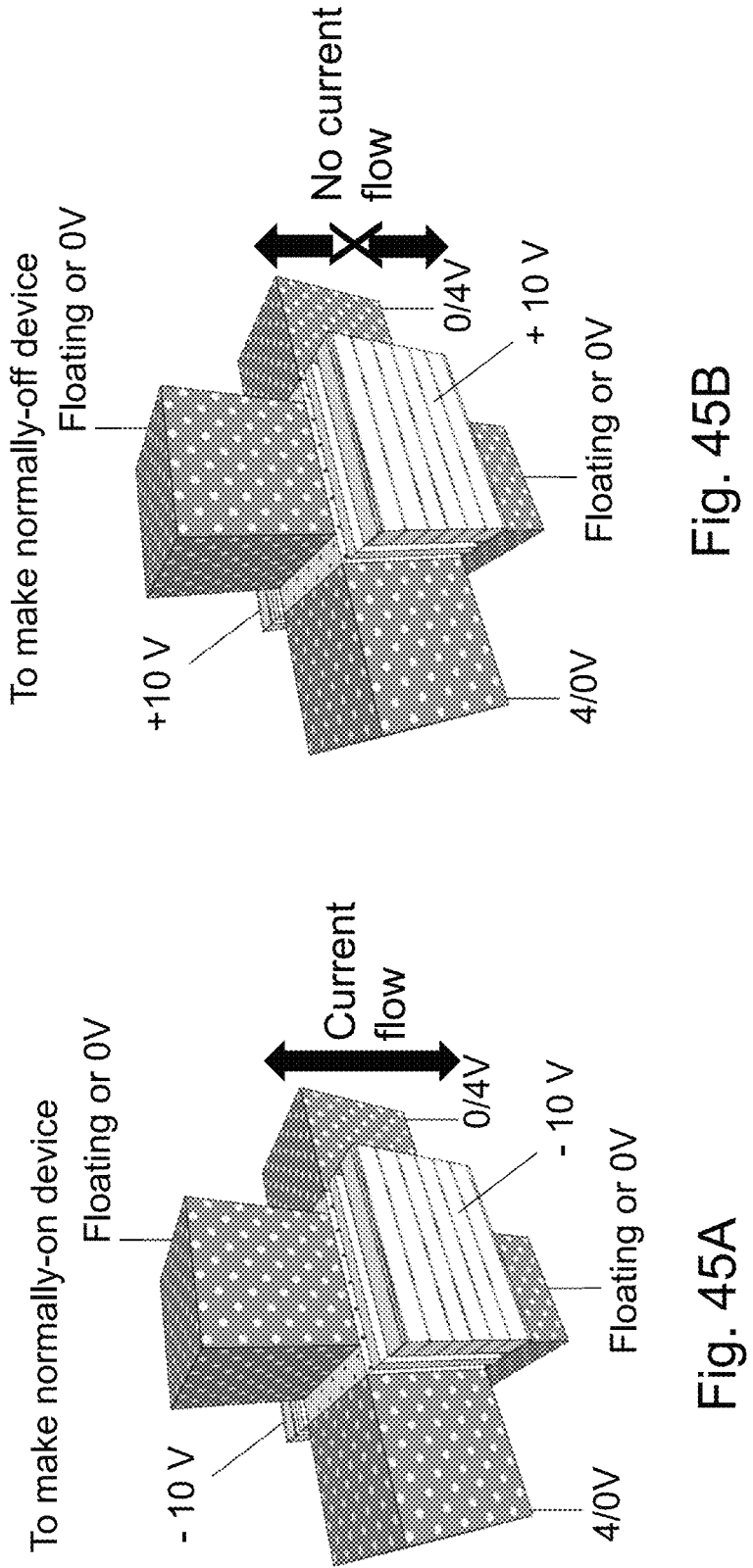
FIGS. 45A-45D are example illustrations programming conditions of an HD NOR cell programmable via.

FIG. 45A illustrates the ILV programming condition to be always on ILV by having the horizontal S/D driving a programming current through the channel and the gate pull down to a negative programming voltage to load a positive (holes) charge into the charge trap layer to have the vertical transistor always on.

FIG. 45B illustrates the ILV programming condition to be always off ILV by having the horizontal S/D driving a programming current through the channel and the gate pull up to positive programming voltage to load a negative (electron) charge into the charge trap layer to have the vertical transistor always off.

Figures 45C, 45D:
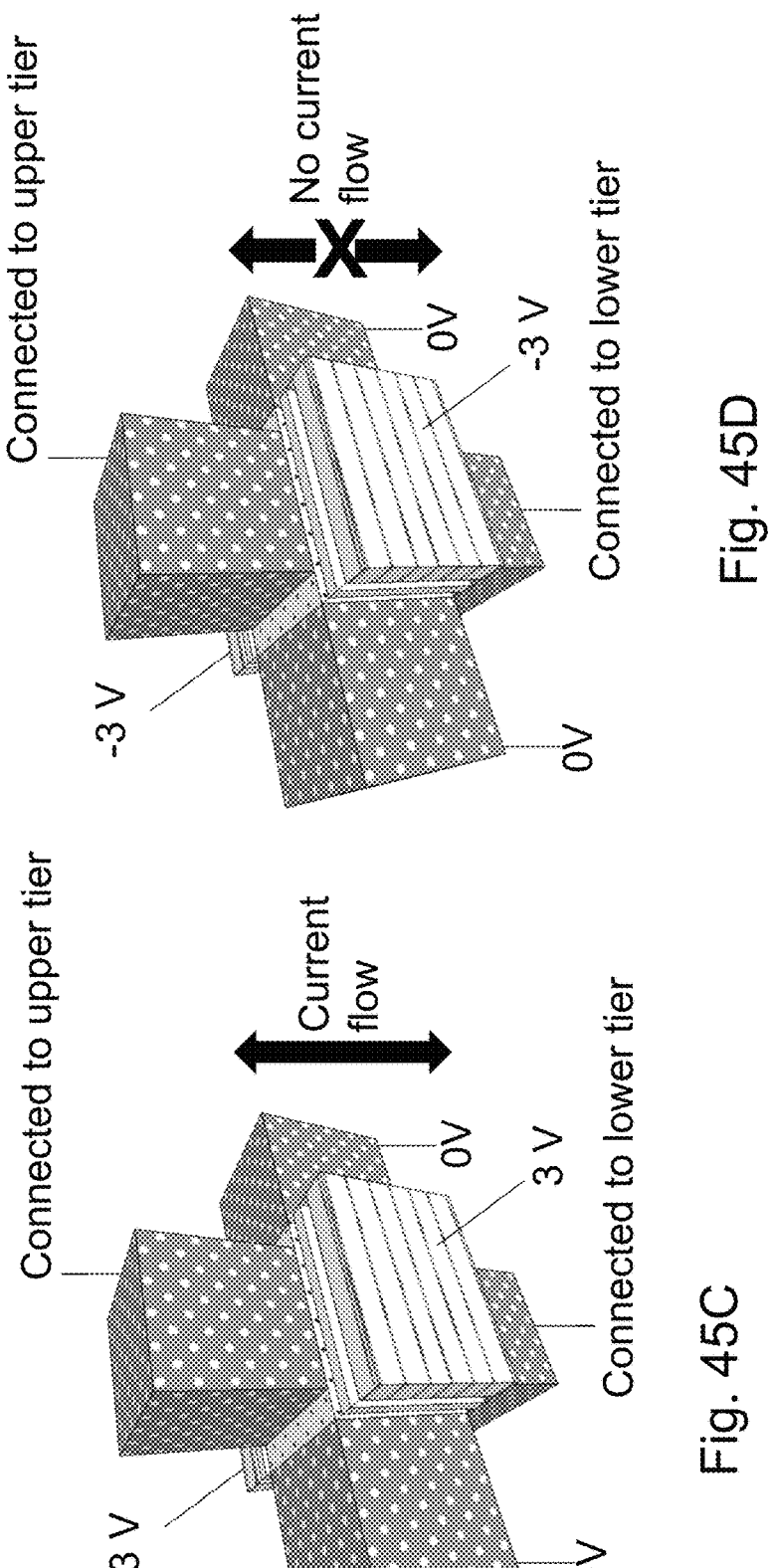

FIG. 45C illustrates the structure with no charge in the charge trap layer operating as an active vertical NPN transistor with its gate positive to have the vertical NPN transistor in an on state while in FIG. 45D the gate is negative to have the vertical NPN transistor in an off-state.

In all modes the horizontal S/D could be grounded or biased to a slight potential such as 0.1V or 0.2V to make them at reverse bias to avoid sneak paths/current between ILVs arranged in an array matrix through the horizontal S/D.

Figure 46:
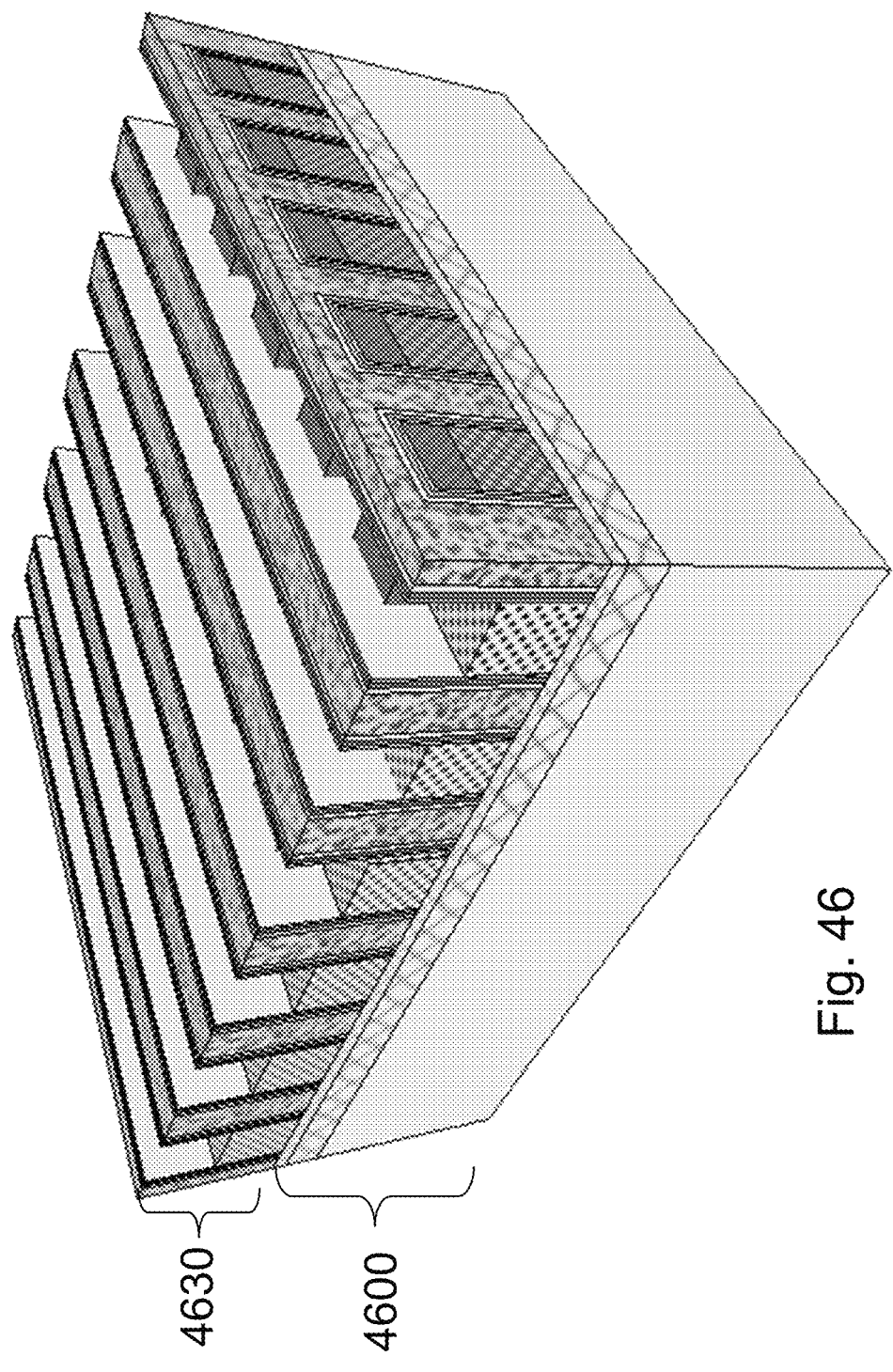
FIG. 46 is an example illustration a base structure of an HD NOR cell formation.

FIG. 46 illustrates the structure 4630 of FIG. 2I on top of a carrying wafer 4600, the carrying wafer 4600 may include a porous cut layer and oxide similar to what is illustrated in FIG. 20B herein.

Figure 47A:
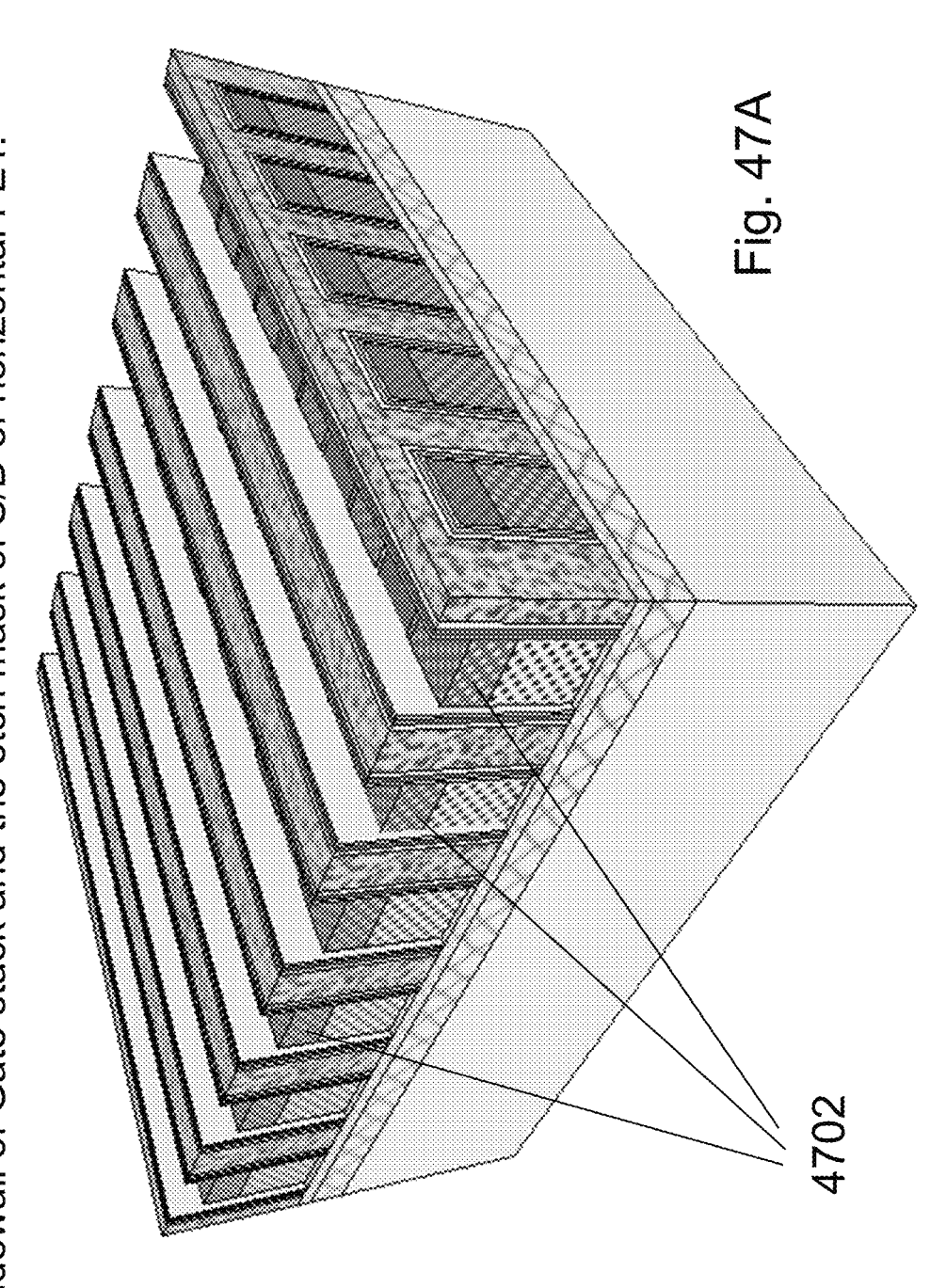

FIG. 47A illustrates the structure after forming the top S/D 4702 by selective epitaxy with N+ dopant. Alternately, the top S/D 4702 may be formed by deposition of in-situ doped polysilicon followed by planarization and etch back.

Figure 47B:
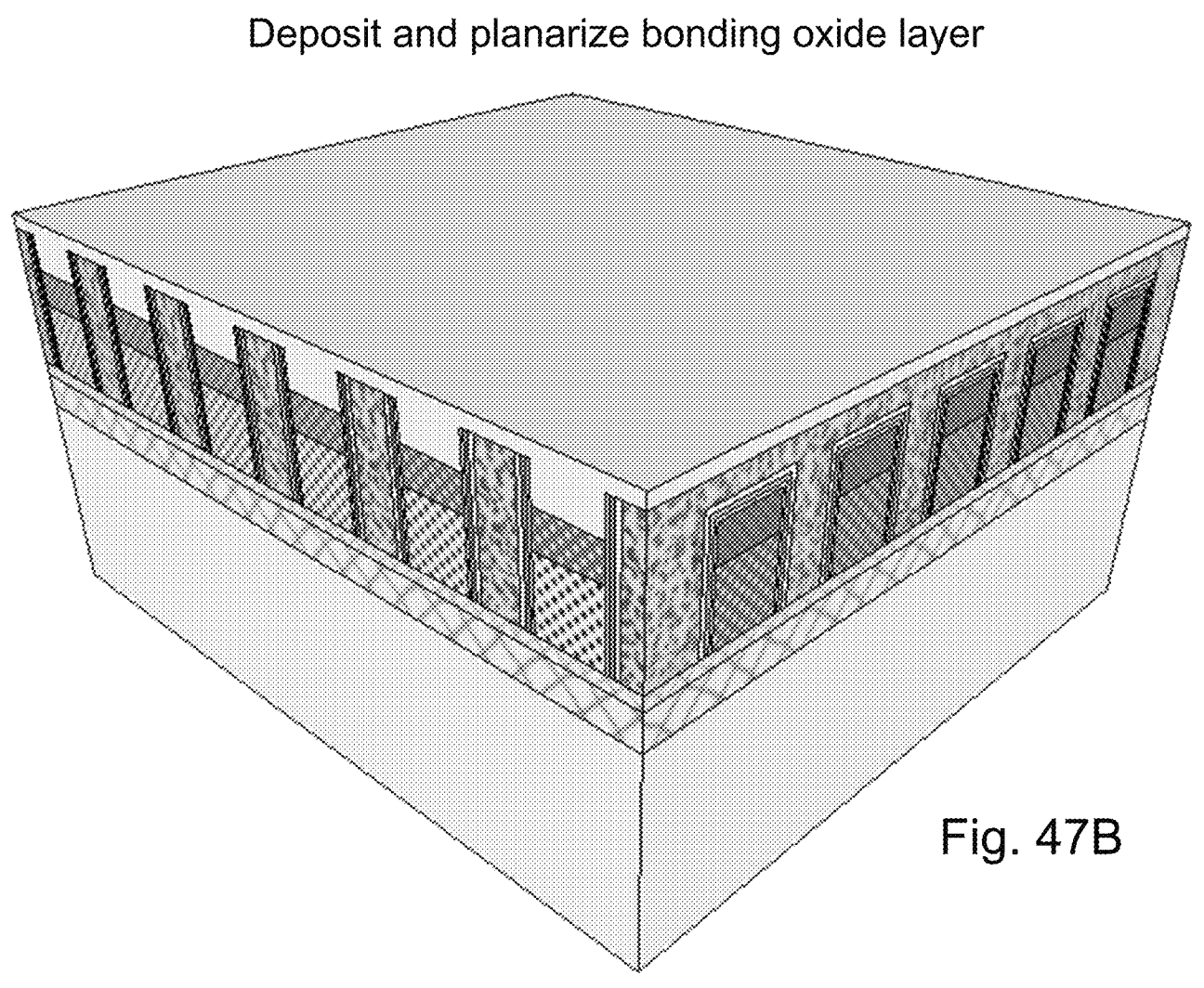

FIG. 47B illustrates the structure after deposition and planarization of a bonding oxide.

FIG. 47C illustrates the structure after flipping and bonding it to a target wafer and then lifting off the carrier wafer by cutting the porous layer.

Figure 47D:
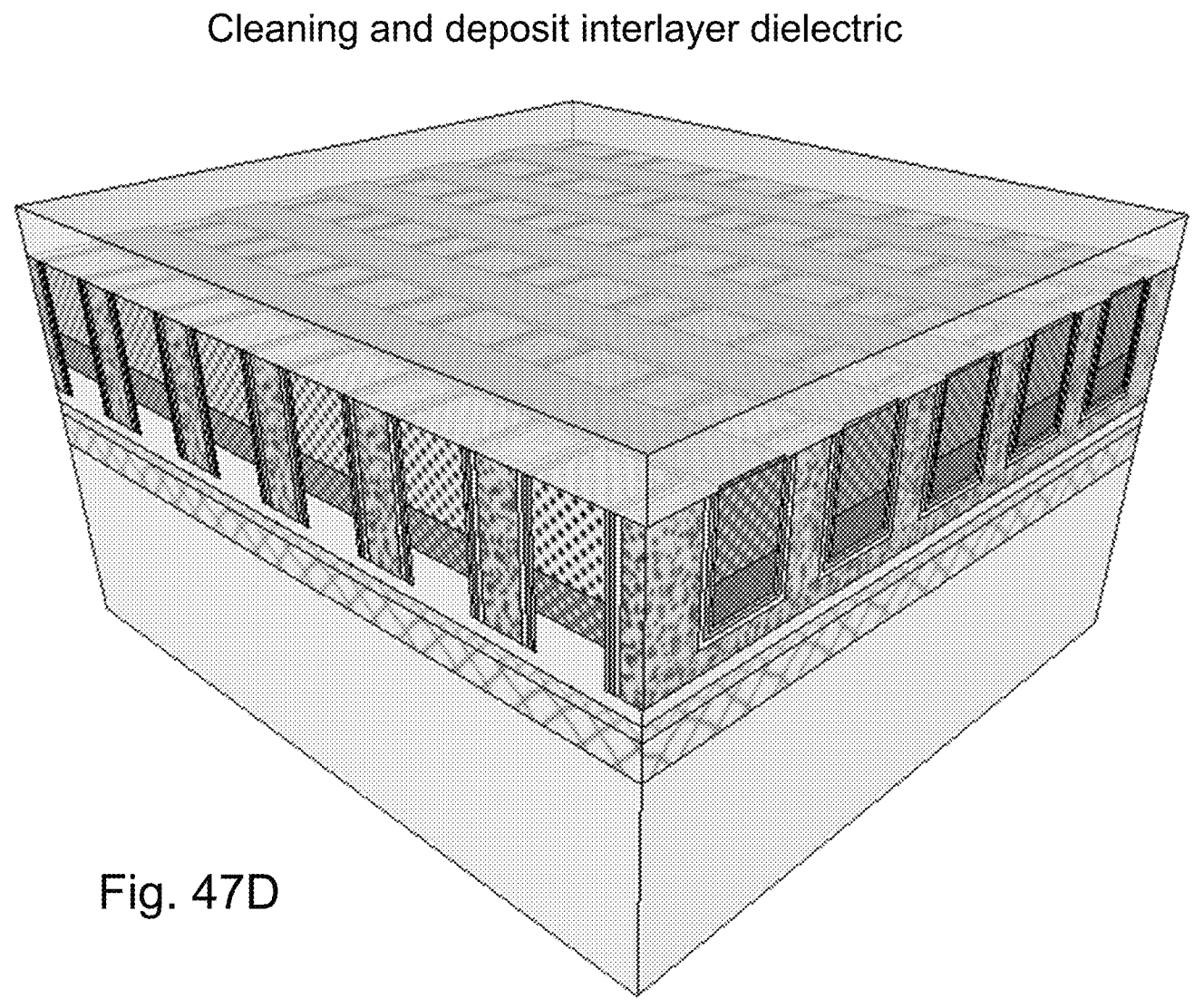

FIG. 47D illustrates the structure after cleaning the porous residues and depositing an interlayer dielectric.

Figure 47E:
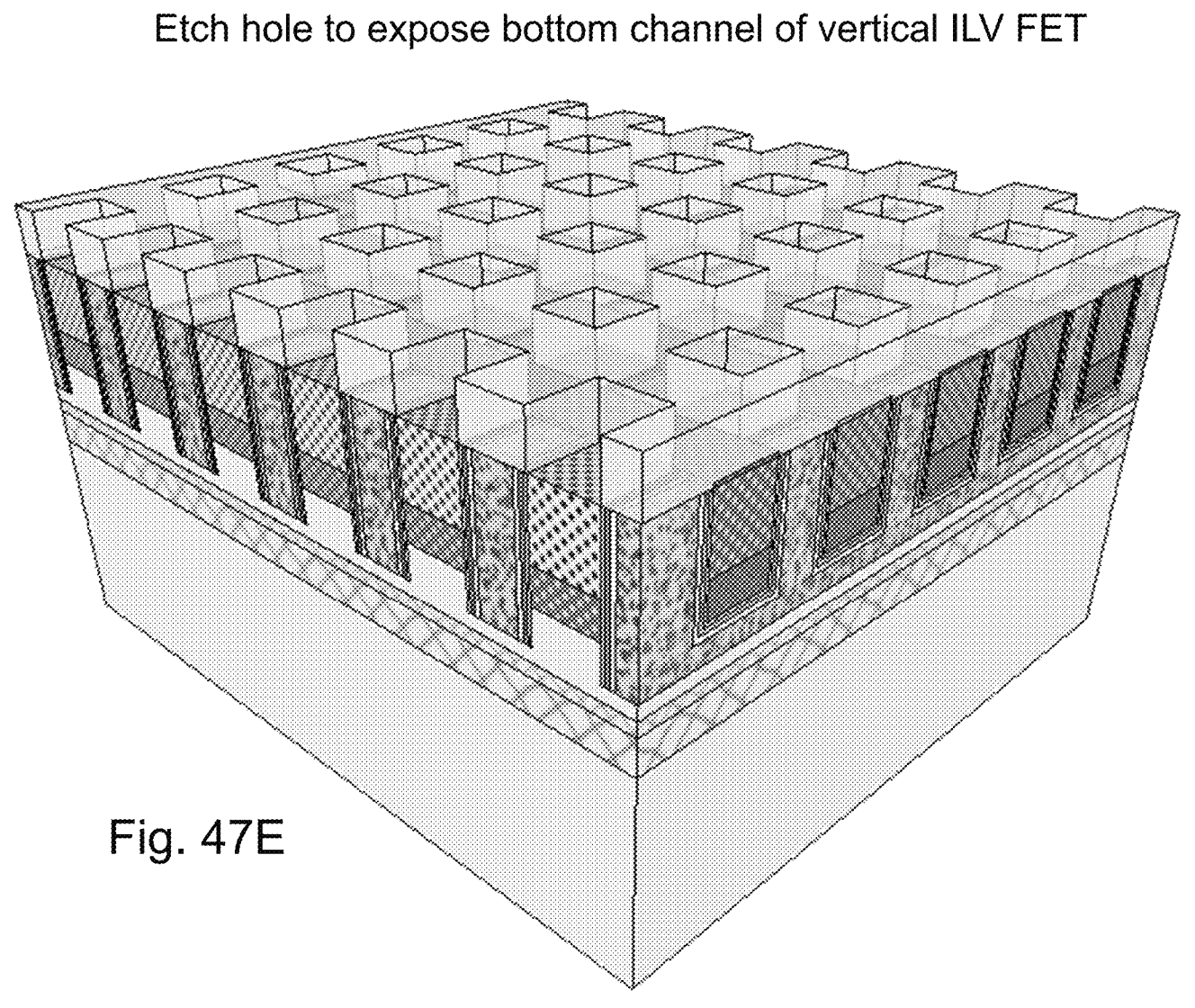

FIG. 47E illustrates the structure after opening holes to the channel locations.

Figure 47F:
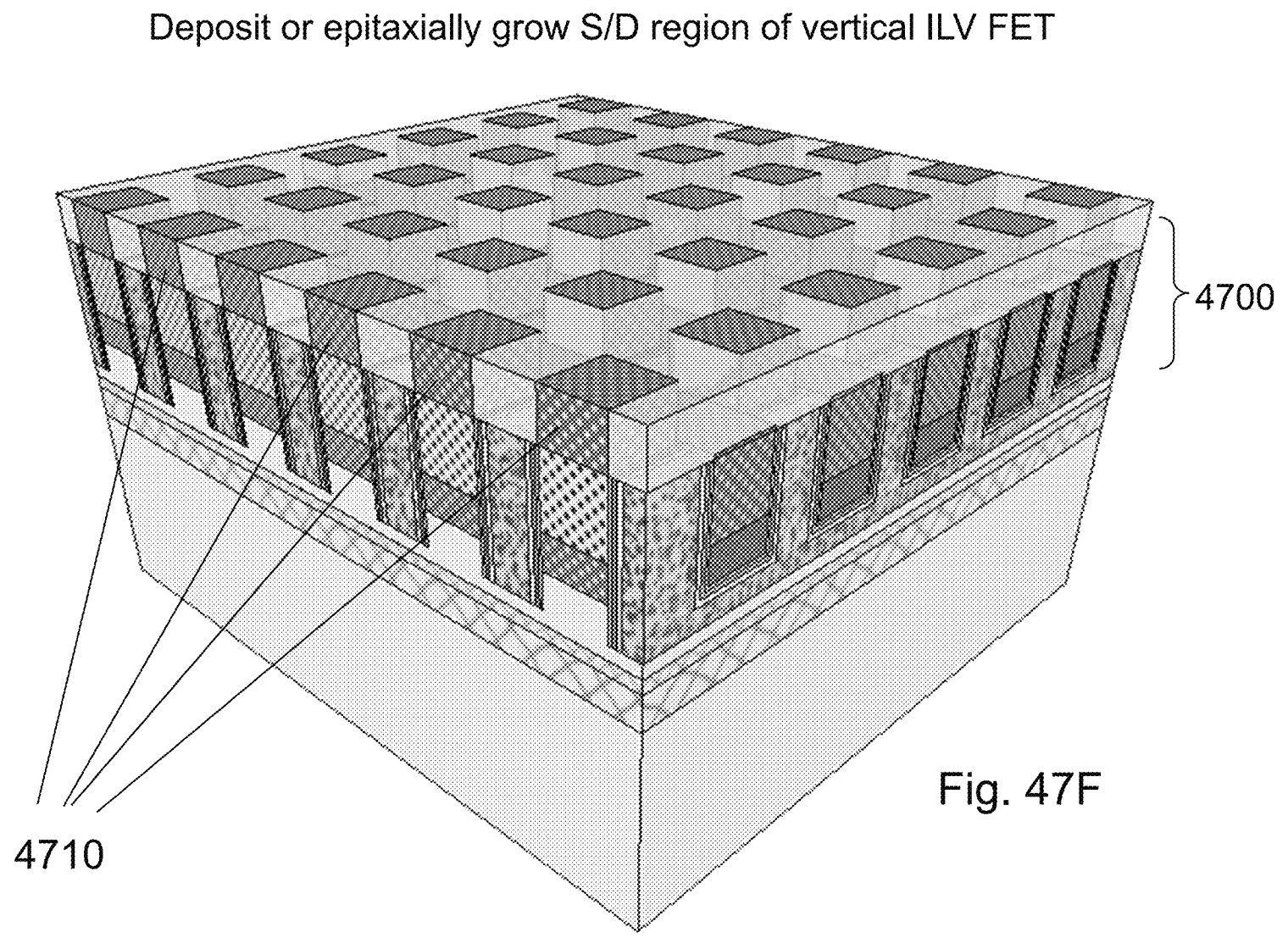

FIG. 47F illustrates completing the ILV by epitaxial grow of S/D 4710 of N+ silicon completing the ILV structures. Alternately, the bottom S/D 4710 may be formed by deposition of in-situ doped polysilicon followed by planarization and etch back. Contact metal could be added for future connection for the programmable via fabric. When forming a top and bottom S/D 4702, 4710, special care should be paid to avoid direct short between S/D arranged in horizontal FET. To do this, an insulating a spacer inside of the holes may be incorporated (not shown). Alternatively, a two-step growth such as thin p-type silicon followed by highly doped N+ silicon process may be introduced.

The programmable ILV fabric 4700 could be used for many applications.

One such application could be a 3D IC system. In U.S. Pat. No. 7,960,242, incorporated herein by reference, in respect to FIG. 80 and related text and figures, a connectivity scheme has been presented to allow fine vertical connectivity while having misalignment between strata. By properly opening a via after wafer bonding and taking into account the strata misalignment. Such technique required a via process after wafer bonding and space compatible with the worst case potential misalignment in at least one direction. Using the programmable ILV fabric 4700 could enable a fine vertical connectivity without those limitations. This is illustrated in FIGS. 48A-48C.

Figures 48A, 48B:
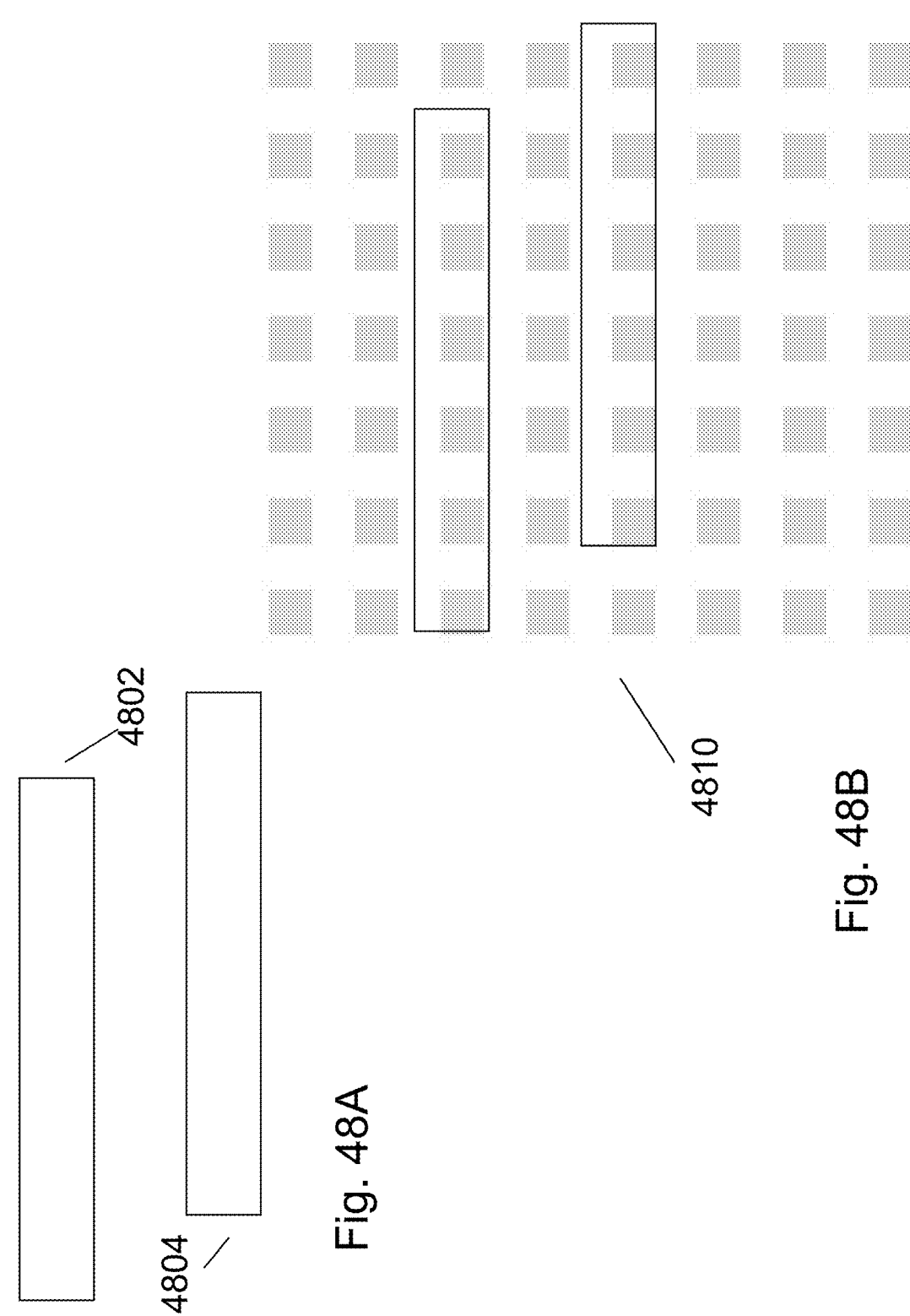
FIGS. 48A-48C are example illustrations of fine vertical connectivity using HD NOR cell programmable vias.

FIG. 48A illustrates two horizontal going strips 4802 and 4804 which could have a length compatible with the potential misalignment in the horizontal direction. These strips represent part of the connection bar at the lower stratum.

FIG. 48B illustrates overlaying the lower stratum with programmable ILV fabric 4810

Figure 48C:
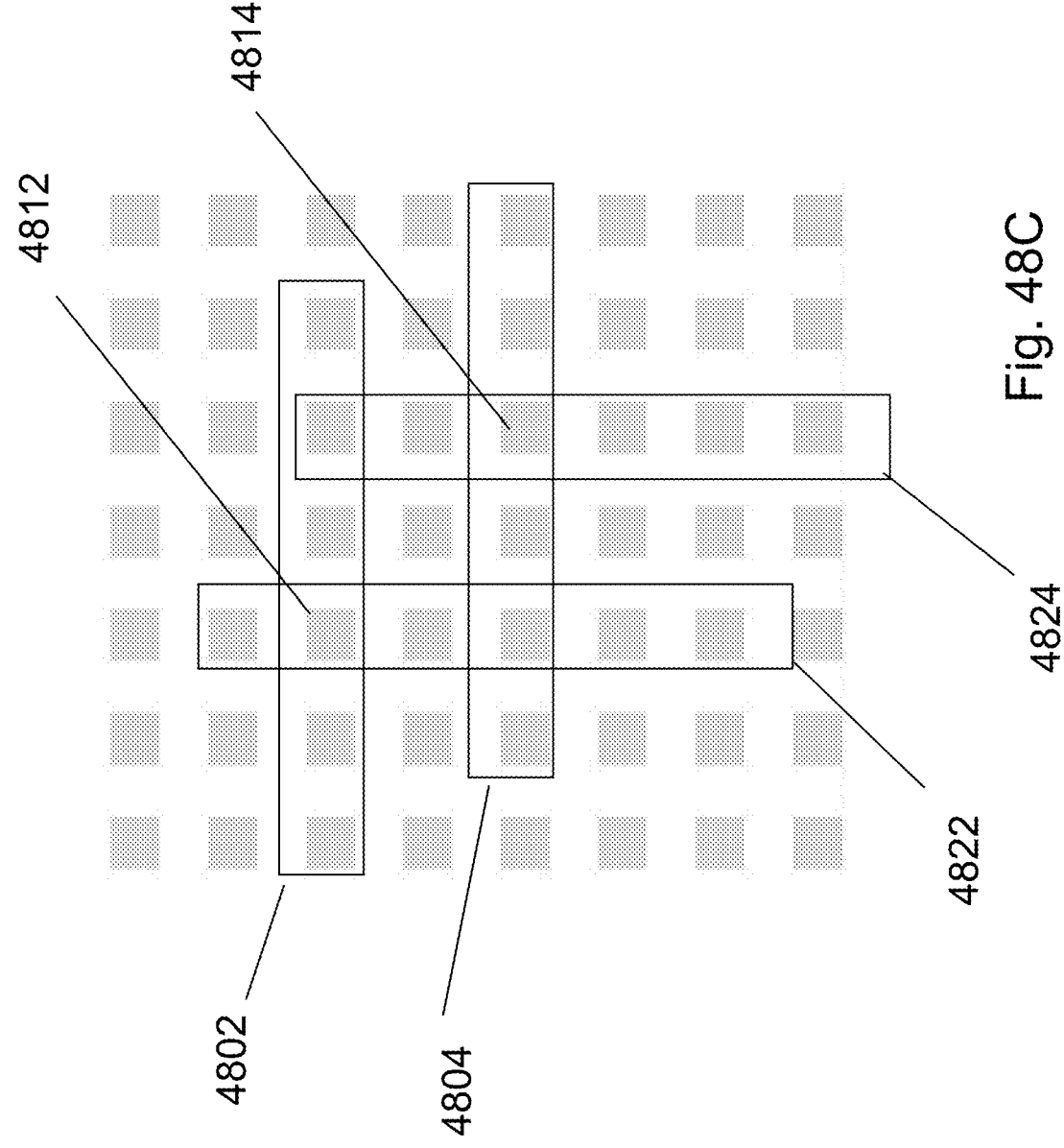

FIG. 48C illustrates the connectivity portion after overlaying with the upper stratum. At the bottom of the upper stratum the corresponding vertical strips 4822 and 4824 would be connected by the programmable ILV fabric to the horizontal upper strips of the lower stratum. The vertical strip could have a length compatible with the worst case potential vertical misalignment. Accordingly the corresponding horizontal strip and vertical strip should have a crossing section which could be used by the programmable ILV fabric to form the vertical connectivity. Accordingly after bonding the via 4812 could be programmed to connect the horizontal strip 4802 to the vertical strip 4822 while the via 4814 could programmed to connect the horizontal strip 4804 to the vertical strip 4824 while the other via in contact with these strips could be program to an off-state.

The bonding of the programmable ILV on top of the lower stratum could use well-known in the art hybrid bonding techniques which combines oxide to oxide bonding together with metal to metal bonding so the bonding process would also form the connection between the ILV and the strips 4802, 4804.

Logic fabrics that are customized or programmed by lithography defined via or anti-fused via are well known in the industry, such as been presented by U.S. Pat. Nos. 4,197,555, 6,331,733, 6,580,289 or 8,384,426 all are incorporated herein by reference. These teach programming logic cells and then programming interconnection fabric. U.S. Pat. No. 4,197,555 as related to FIG. 7 suggests alternating the horizontal strips between under via strips and over via strips while reversing the order for the vertical strip. In such a scheme, horizontal strips are connected by via at the strips end side to extend the routing in the horizontal direction until a change of direction is needed for which a middle strip via could be used to change the direction to the vertical direction. In U.S. Pat. No. 6,331,733 teaches an alternative scheme in which short strips are connecting by via the edges of two long strips Similar approaches have also been described in U.S. Pat. No. 8,384,426 such as illustrated in its FIG. 7. These two patents also teach additional longer tracks which periodically get connected to the short tracks. These and similar publications a teach via defined interconnect fabric and via defined programmable logics. These architectures could utilize the programmable ILV fabric 4700 for programmable connectivity fabric and programmable logic fabrics.

In a paper by Zvi Or-Bach et al titled "Modified ELTRANO—A Game Changer for Monolithic 3D" published at IEEE S3S Conference 2015, incorporated herein by reference, techniques to construct a multi strata device were presented.

Figure 49A:
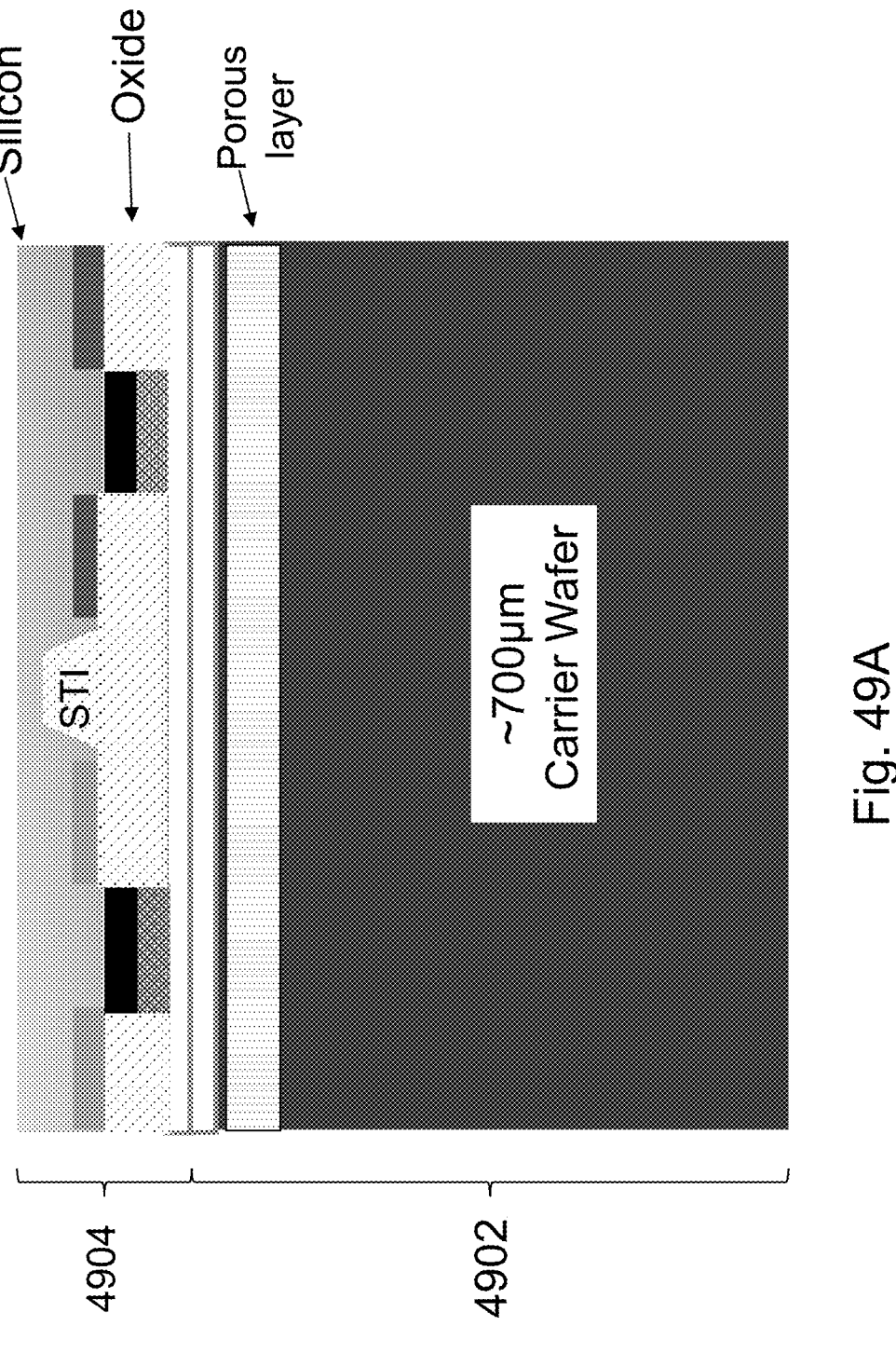
FIGS. 49A-49D are example illustrations of forming a multi strata device.

FIG. 49A illustrates a carrier wafer 4902 on which a first transistor stratum 4904 had been transferred.

Figure 49B:
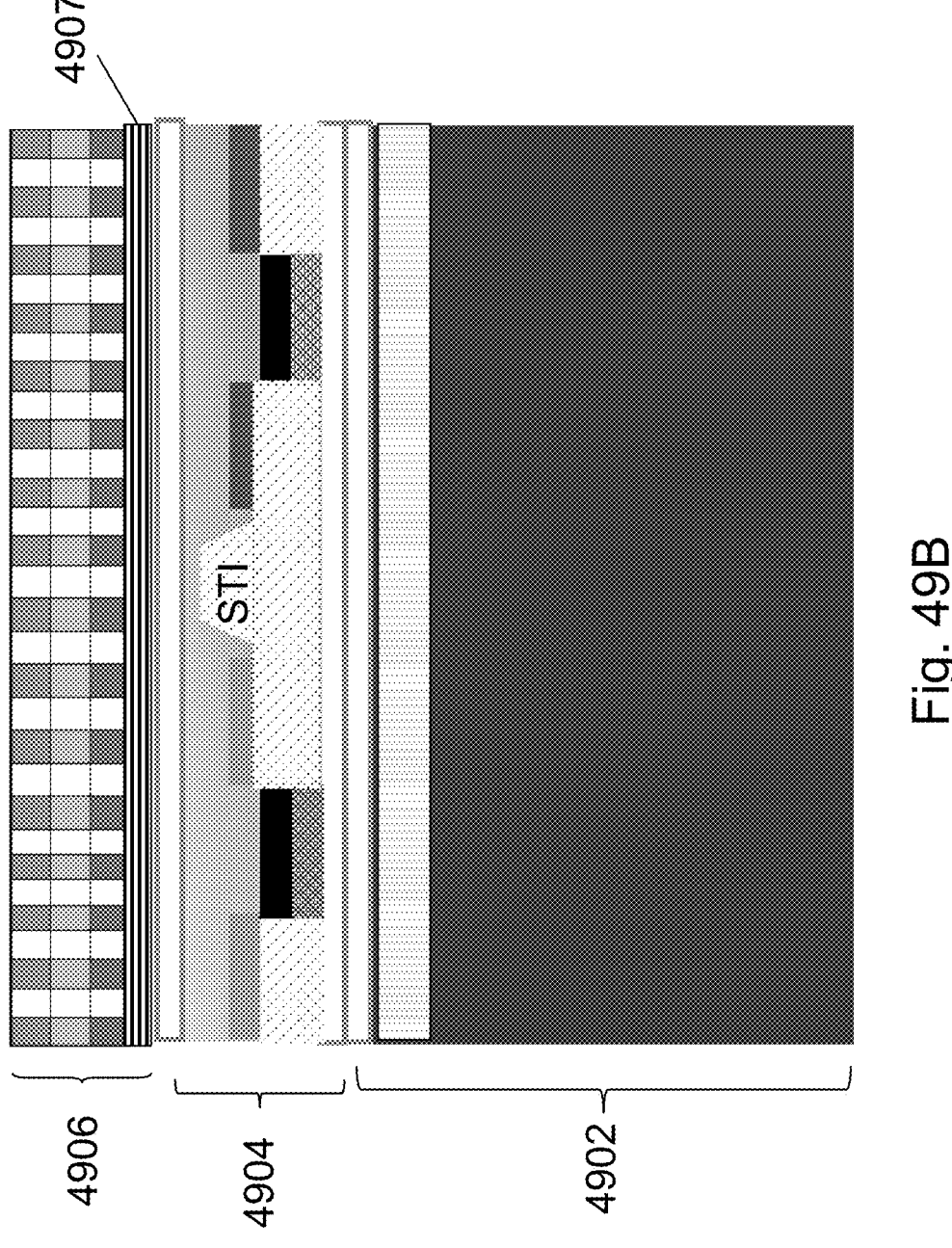

FIG. 49B illustrates a programmable ILV fabric 4906 with first layer of interconnect 4907 being bonded to the structure. As is true here and many other cases herein, drawings are not made to scale and even parts of the same drawings could be made in different scale for the various implementation/descriptions. This is especially true for the presented 3D system in which layers are bonded on top of each other could be the result of very different process lines with different process rules and dimensions. Accordingly the transistors in layer 4904 could be processed in far tighter dimensions or much looser dimensions than the drawing scale indicates. A specific 3D system could be constructed based on flows described herein with far different process rules than these drawings suggest. A 3D system design is done based on the functionality desired with respective consideration of cost, power, performance, and other parameters and engineering, design, and economic considerations.

Figure 49C:
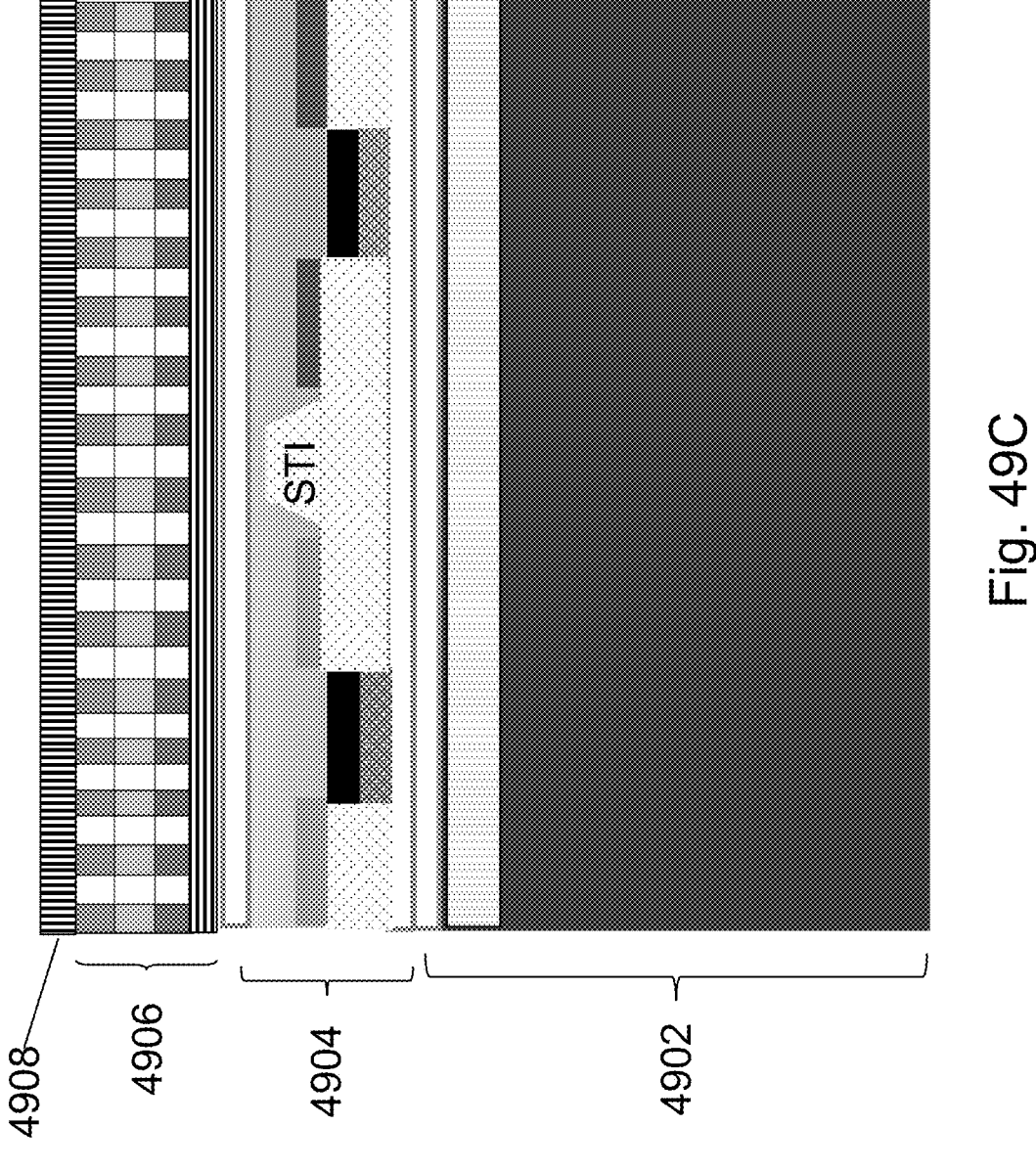

FIG. 49C illustrates adding an additional connectivity structure 4908 on the other side of programmable ILV fabric 4906 completing a programmable connectivity fabric which could utilize one of the known architectures for via defined connectivity structure.

Figure 49D:
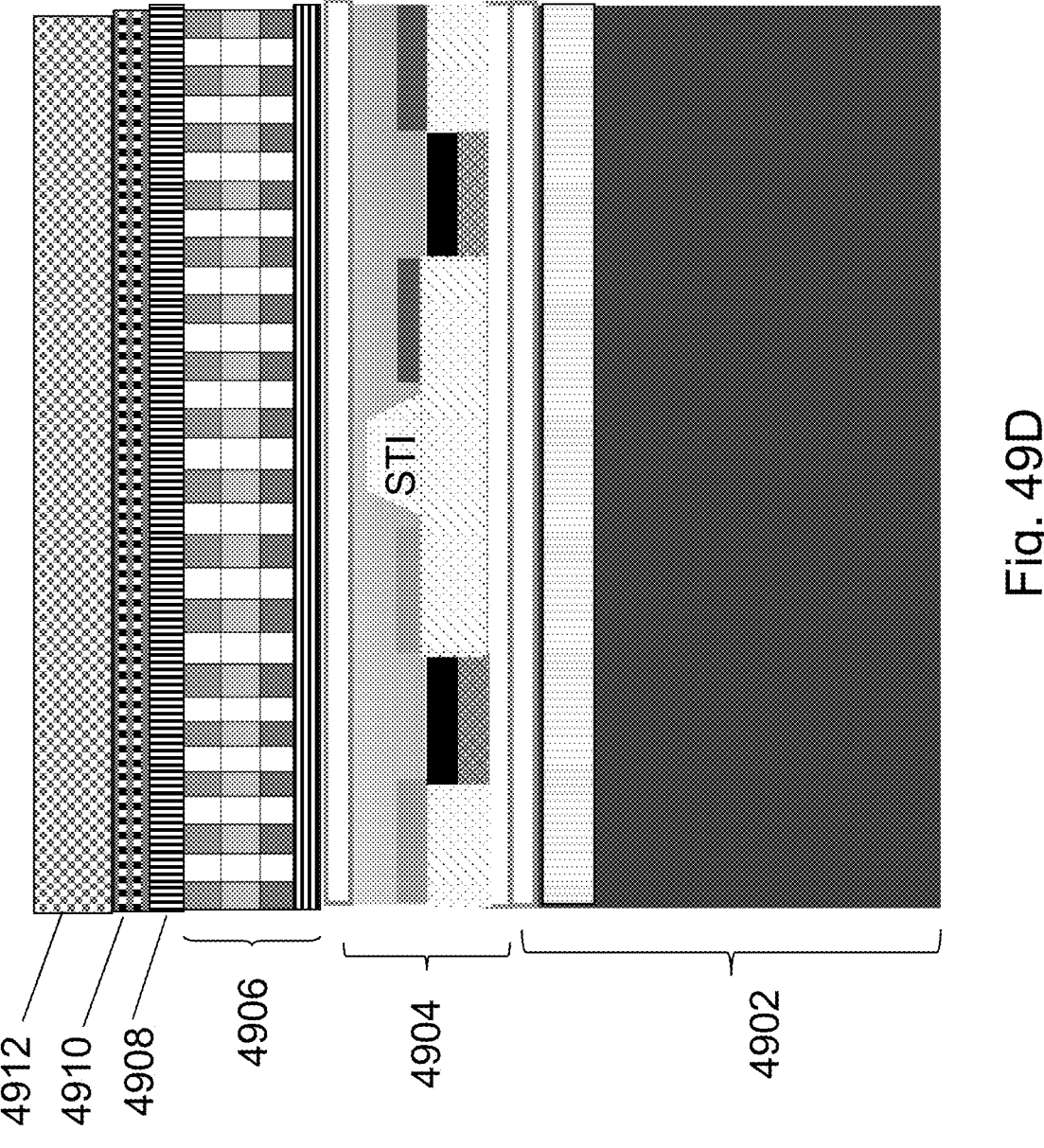

FIG. 49D illustrates an optional addition of long track connectivity layers 4910, and an optional addition of active layer 4912 which could provide re-buffering for the routing tracks and other functions, for example, such as I/O to external devices.

Substantially the entire structure could now be flipped and bonded onto a final carrier. And connections between the circuit fabric 4904 and the programmable connectivity fabric 4906, 4908, 4910, 4912 could be made in addition to interconnection to form the designed circuits using the 4904 stratum.

Figure 50:
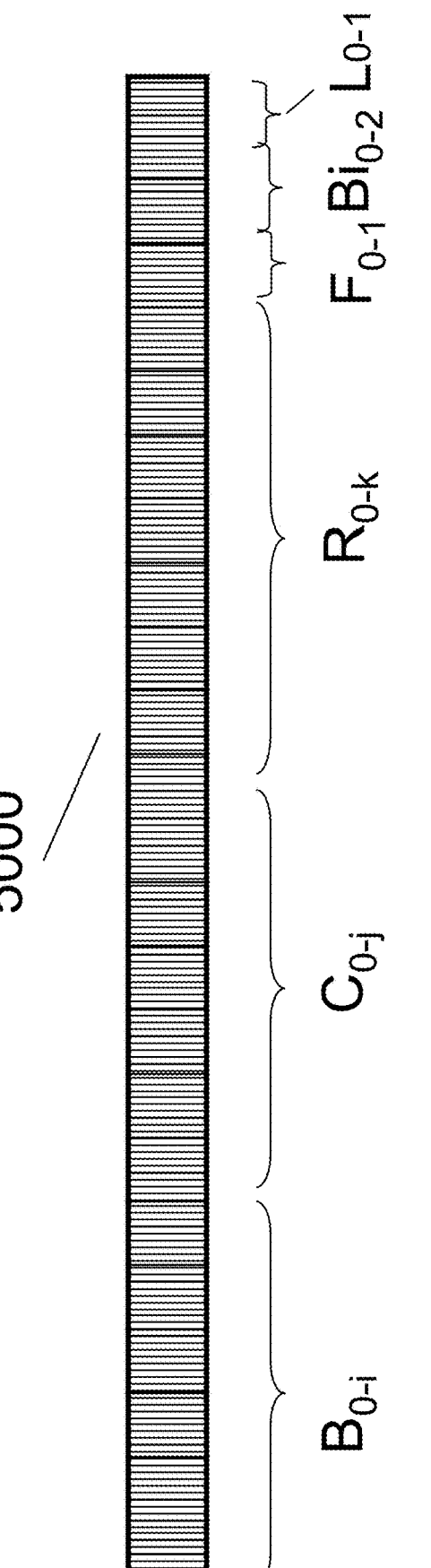
FIG. 50 is an example illustration of a memory addressing format.

An alternative peripheral circuits block diagram would now be presented for the NOR fabric such as is illustrated in FIG. 20G used with 8 bit per facet as is illustrated in FIG. 21. FIG. 50 illustrates an alternative addressing option. The address could include a block address with bits i+1 bits ($B_{0-i}$), Column address with j+1 bits ($C_{0-j}$) which selects the active bit-lines the S/D, Row address with k+1 bits ($R_{0-k}$) which select the active channel, Facet address with 2 bits ($F_{0-1}$) to select one of the 4 facet and accordingly the role of the gates surrounding the selected channel, Bit address with 2 bits ($Bi_{0-2}$) selecting one of the 8 bits within the facet and accordingly the voltage apply to the selected gates, and Level address with 2 bits ($L_{0-1}$) for optional 4 levels of charge within the selected bit. The block addressing is the higher level addressing and all portions of the device that their block is not selected would be in a non active state. Accordingly the following discussion is for an active block.

Figure 51A:
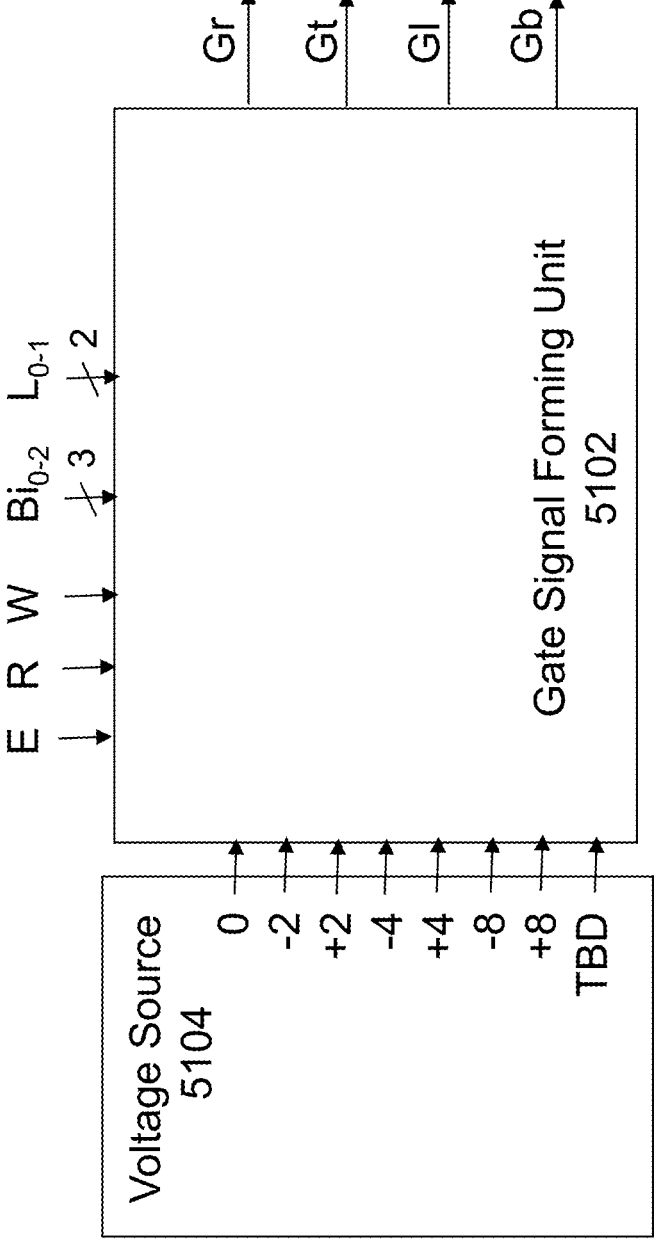
FIGS. 51A-51C are example illustrations of block diagrams of circuit control circuits.

FIG. 51A illustrates the first part of the word-line/gates related peripherals circuits. Voltage source circuits 5104 are the voltage generation circuits, and may include centralized circuits including charge pumps and other power supply type circuits generating the various voltages require for the NOR memory operations including voltages indicated in the table of FIG. 22 and other tables and discussions herein. Gate signal forming circuits 5102 may include signal forming and selectors to generate the four gates signal outputs: Gr for the R-Gate of FIG. 22, Gt for the C-Gate of FIG. 22, Gl for the L-Gate of FIG. 22, and Gb which indicate the bottom gate which for many memory operations could be left floating. These signals are the functional signals as indicated in FIG. 21. These signals would be connected to the selected gate of the selected channel and would be apply based on the selected facet. The formation of these signals would be according to the memory operation if write indicted by W signal or read indicated by R signal or erase is indicated by E signal and also according to the selected bit as indicted by address signals $Bi_{0-2}$, FIG. 21 and the table of FIG. 22 could be used to guide the detail functions of these circuits.

The $L_{0-1}$ address would indicate the level of charge stored or read from the selected bit. Changing store levels could be achieved by additional write voltage levels such as 10 volts, 12 volts etc. or by modulating the writing reading time or combination of these. The Gate Signal Forming circuits 5102 unit could include the corresponding circuits to implement the bit levels.

Figure 51B:
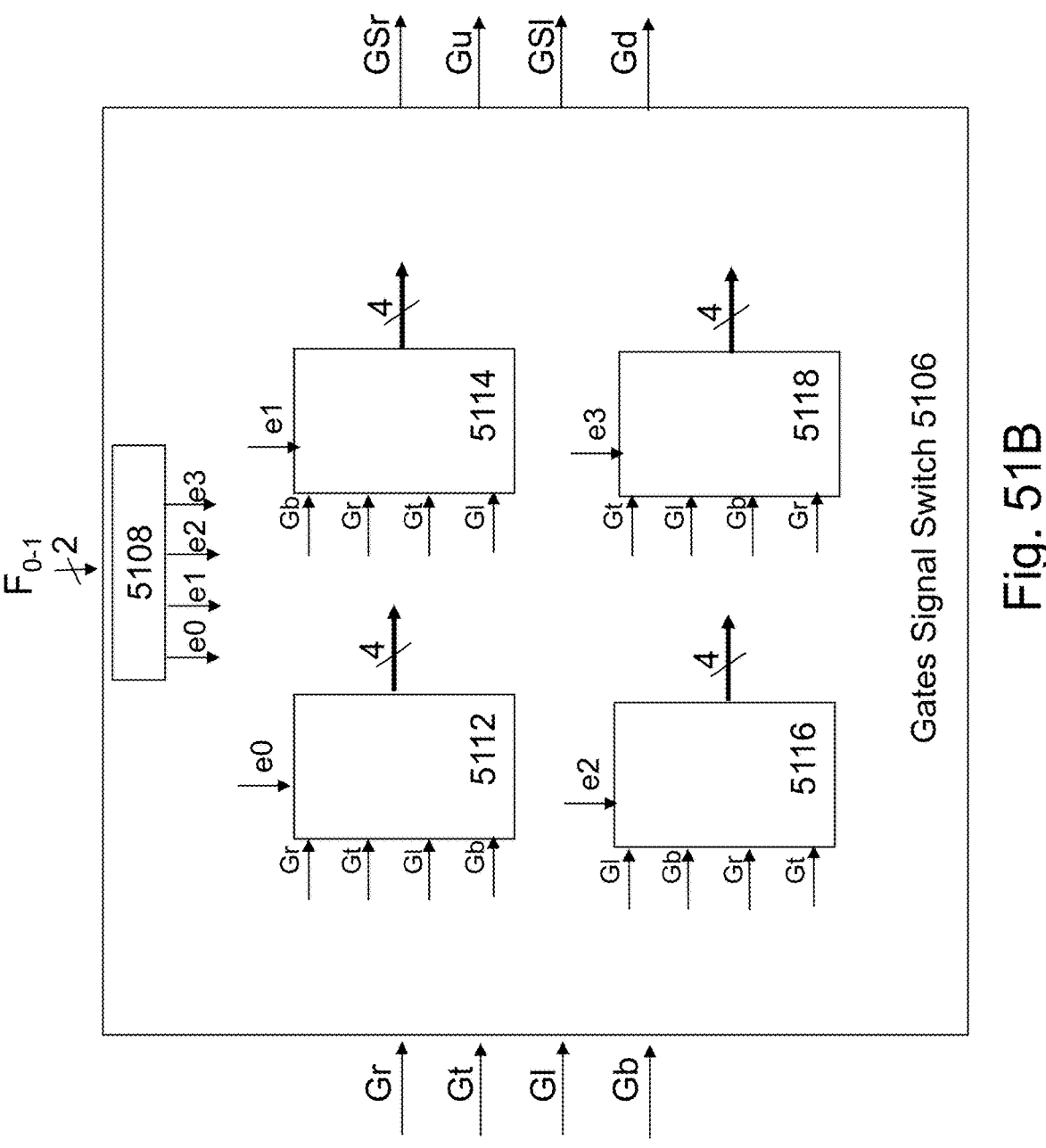

FIG. 51B illustrates the Gate Signal Switch 5106 circuits. Its inputs are the four gate signals (Gr, Gt, Gl, Gb) and the Address bits selecting the facet—$F_{0-1}$. It could include decoder circuit 5108 to generate four enabling signals (e0, e1, e2, e3) of which one is active to enable selecting one of the four signals allocation 5112, 5114, 5116, 5118 to output the 4 gate signals in the proper allocation based on the selected facet to the 4 gate signal outputs: GSr, GU, GSl, Gd.

Figure 51C:
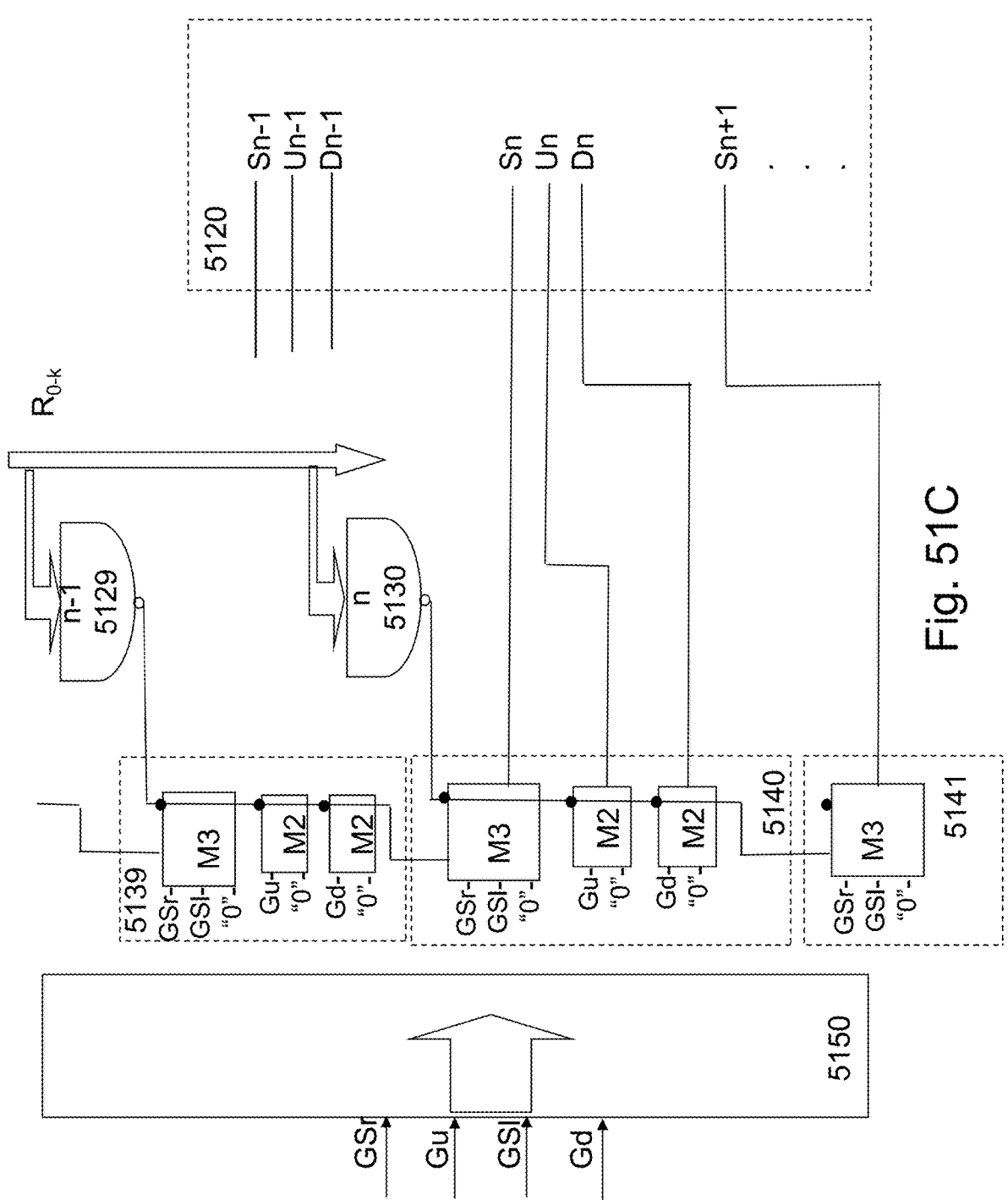

FIG. 51C illustrates the circuits to drive these centralized signals GSr, GU, GSl, Gd, to selected word-lines while all other word-line are disabled. FIG. 20G illustrates a NOR structure with active four facets. Each channel 2050 is controlled by four gates; one on Upper facet 2054, one on the Down facet 2058, one on the Right side 2056, and one on the Left side Side 2052. It should be noted that the side gates are dual function, the Right side gate of Channel 2050—channel 'n', is also the Left side gate of channel 2051—channel 'n+1'. Accordingly, selection of channel 'n' base on the address bits $R_{0-k}$ would select one 'n' Upper gate one 'n' Down gate and two side gates the 'n' Left and the 'n' Right gate which at could also be acting as the 'n+1' Left gate of the 'n+1' channel, as is illustrated in FIG. 51C.

The four centralized signals (GSr, GU, GSl, Gd) may be forming a bus like signal for the word-lines available to be selected for the selected channel gates. Unit 5150 could include the buffers and drive electronics. These are designed according to system considerations such as access time, power and so forth. The Row Address lines $R_{0-k}$ and their complementary signals could be delivered as another bias like signal. For each channel a large fan-in NAND gate could be used with decoding like connection to the Row address so NAND 5130 is activated to "0" only once the Row address is addressing channel 'n' (respectively NAND 5129 is activated to "0" only once the Row address is addressing channel 'n−1'). For each channel there is also a dedicated selector block—for 'n−1' selector block 5139, for 'n' selector block 5140, and for 'n+1' selector block 5141. Each selector block has three selectors, two are one-of-two selectors M2, and one is one-of-three selector M3. These selectors could use a full transmission gate or other switching type circuits.

For the case when channel 'n' is addressed NAND 5130 is activated and accordingly the selector M3 of 5140 would select GSl signal to drive gate lines related to Sn 2052, the first M2 selector of 5140 would select Gu signal to drive gate lines related to Un 2054, the second M2 selector of 5140 would select Gd signal to drive gate lines related to Dn 2058, and selector M3 of 5141 would select GSr signal to drive gate lines related to Sn+1 2056. All non-activated selectors (M2, M3) will output "0", or be left floating in some configuration, which will prevent their respected channel to be affected by or affect the memory operations. Accordingly providing the proper signal to perform the desired operation to the addressed bit within the addressed facet on the addressed channel.

In a similar architecture the peripherals circuit for driving the bit-lines—the S/D lines could be made.

Figure 52A:
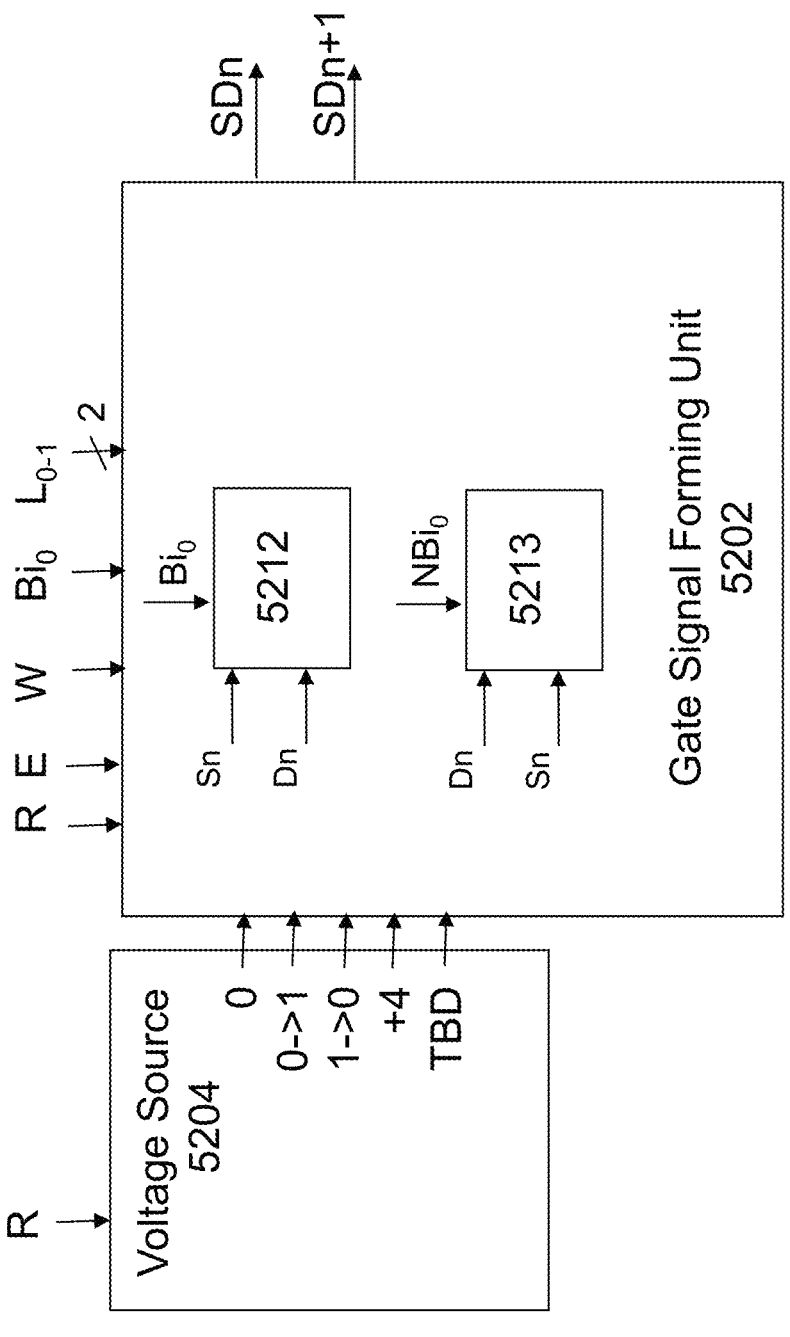
FIGS. 52A-52B are example illustrations of block diagrams of circuits to generate signals.

FIG. 52A illustrates the first part of the bit-lines /S/D lines related peripherals circuits. Circuits 5204 are the voltage generation circuits, those are centralized circuits including charge pumps and other power supply type circuits generating the various voltages require for the NOR memory operations including voltages indicated in the table of FIG. 22 and other tables and discussions herein. For reading bits a pulse to the S/D lines could be used and accordingly the R signal indicating a read function is an input for 5204. Circuits 5202 are signal forming and selectors to generate the two acting bit-line signals outputs: SDn for the S/Dn of FIG. 22, and SDn+1 for S/Dn+1 of FIG. 22. These signals would be connected to the selected S/D lines of the selected Column and accordingly the selected channel. The formation of these signal would be according to the memory operation if write indicted by W signal, R indicated by R signal or Erase indicated by E signal. The lower Bit address $Bi_0$ would affect role of Source and Drain according to the bits location on the respective facet as indicated in FIG. 21. FIG. 21 and the table of FIG. 22 could be used to guide the details of these circuits The $L_{0-1}$ address would indicate the level of charge stored or read from the selected bit, this optional input for the case S/D lines are used for the level modulation.

FIG. 52A also illustrates the swapping between the S/D lines for the role of Source or Drain. While physically these lines are fixed the swapping is done electronically by enabling either buffers 5212 or buffers 5213. $NBi_0$ is the inversion of signal $Bi_0$.

Figure 52B:
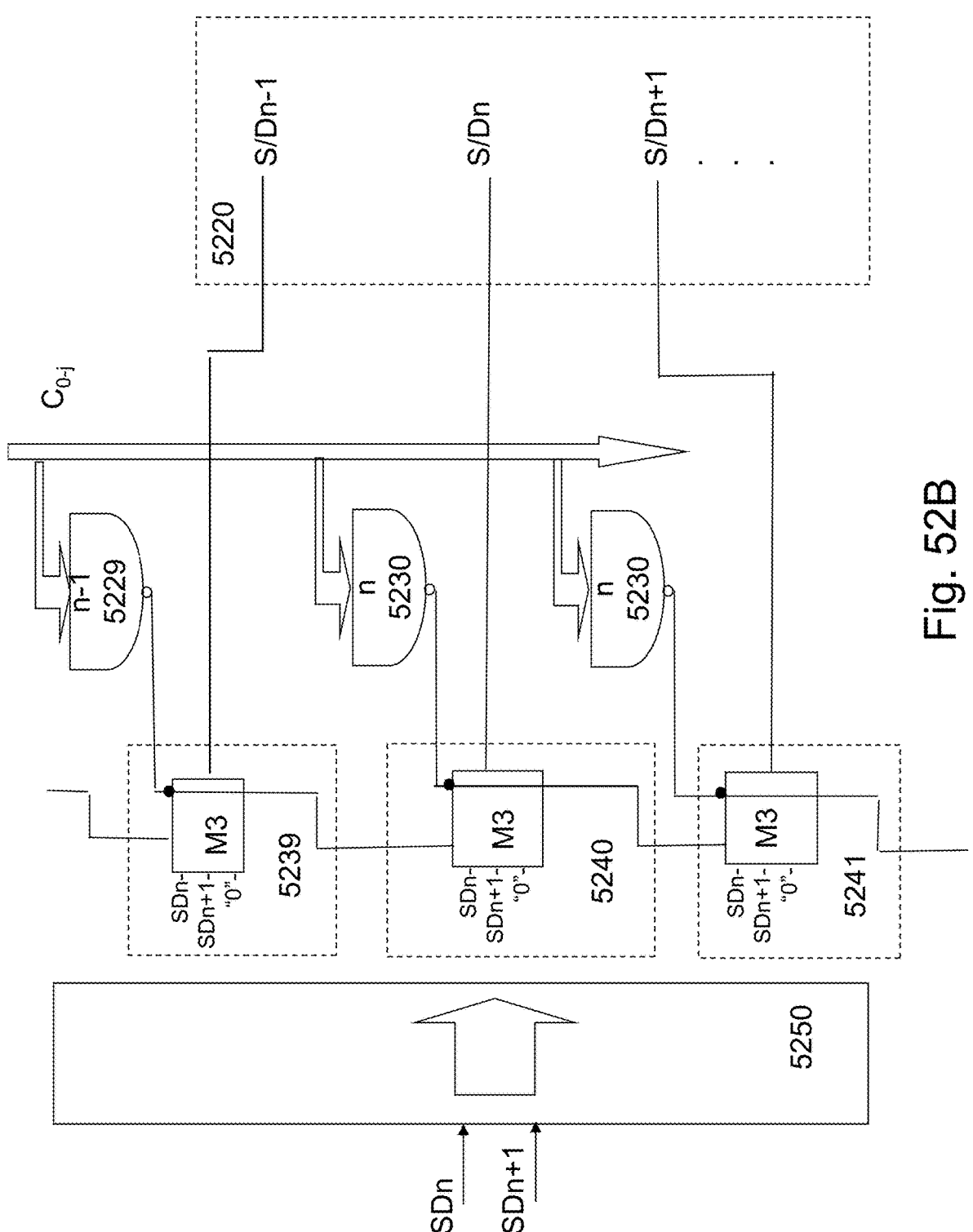

FIG. 52B illustrates the circuits to drive these centralized signals SDn and SDn+1 to selected bit-lines while all other bit-lines are disabled. FIG. 20G illustrates a NOR structure with active four facets. Each channel 2070 is also controlled by the two S/D lines on its sides. The front S/Dn line 2062, and the back S/Dn+1 2064 line. It should be noted that other than the first and the last each S/D line such as 2064 affects two channels: one in front of it 2071 and one in the back of it 2070. Accordingly, selection of Column 'n' base on the address bits $C_{0-j}$ would select two S/D lines which could be marked by S/Dn and S/Dn+1, as is illustrated in FIG. 52B.

The two centralized signals (SDn, SDn+1) are forming a bus like signals for the bit-lines available to be selected for the selected column. Unit 5250 could include the buffers and drive electronics. These are designed according to system considerations such as access time, power and so forth. The Column Address lines $C_{0-j}$ and their complementary signals could be delivered as another bias like signal. For each Column a large fan-in NAND gate could be used with decoding such as connection to the Column address so NAND 5230 is activated to "0" only once the Column address is addressing Column 'n' (respectively NAND 5229 is activated to "0" only once the Column address is addressing Column 'n−1'). For each Column there is also a dedicated selector block—for 'n−1' selector block 5239, for 'n' selector block 5240, and for 'n+1' selector block 5241. Each selector block has one-of-three selectors M3. These selectors could use a full transmission gate or other switching type circuits.

For the case when column 'n' is addressed NAND 5230 may be activated and accordingly the selector M3 of 5240 would select SDn signal to drive word-line to S/Dn at 5220 related to 2062, and selector M3 of 5241 would select SDn+1 signal to drive word line related to S/Dn+1 2064. All non activated selectors (M3) will output "0", or be left floating in some configurations, which will prevent their respective channel to be affected or affect the memory operations. Accordingly providing the proper signal to perform the desired operation to the addressed bit within addressed facet on the addressed channel.

In some configuration the M3 selector could be constructed to select between two active signals or leave the output floating which will render that line in-active.

The units 5104 and/or 5204 could be designed to provide the proper signals as was described herein for the word-line, bit-line operations of the NOR memory including such that were described in respect to FIG. 25 to FIG. 29B. Those signal could be routed to the acting S/D line and acting gate-lines using architectures as presented in respect to FIG. 51A to FIG. 52B.

An additional alternative of 2D memory fabric—Checker board Fabric—which could be used effectively for programmable logic is hereby illustrated in respect to FIG. 53A to FIG. 53F. With this alternative there is no need to use the disconnecting of the S/D line by etching as was described in respect to FIG. 31A-FIG. 31E, as with the Checker board Fabric it could be done electrically.

Figure 53A:
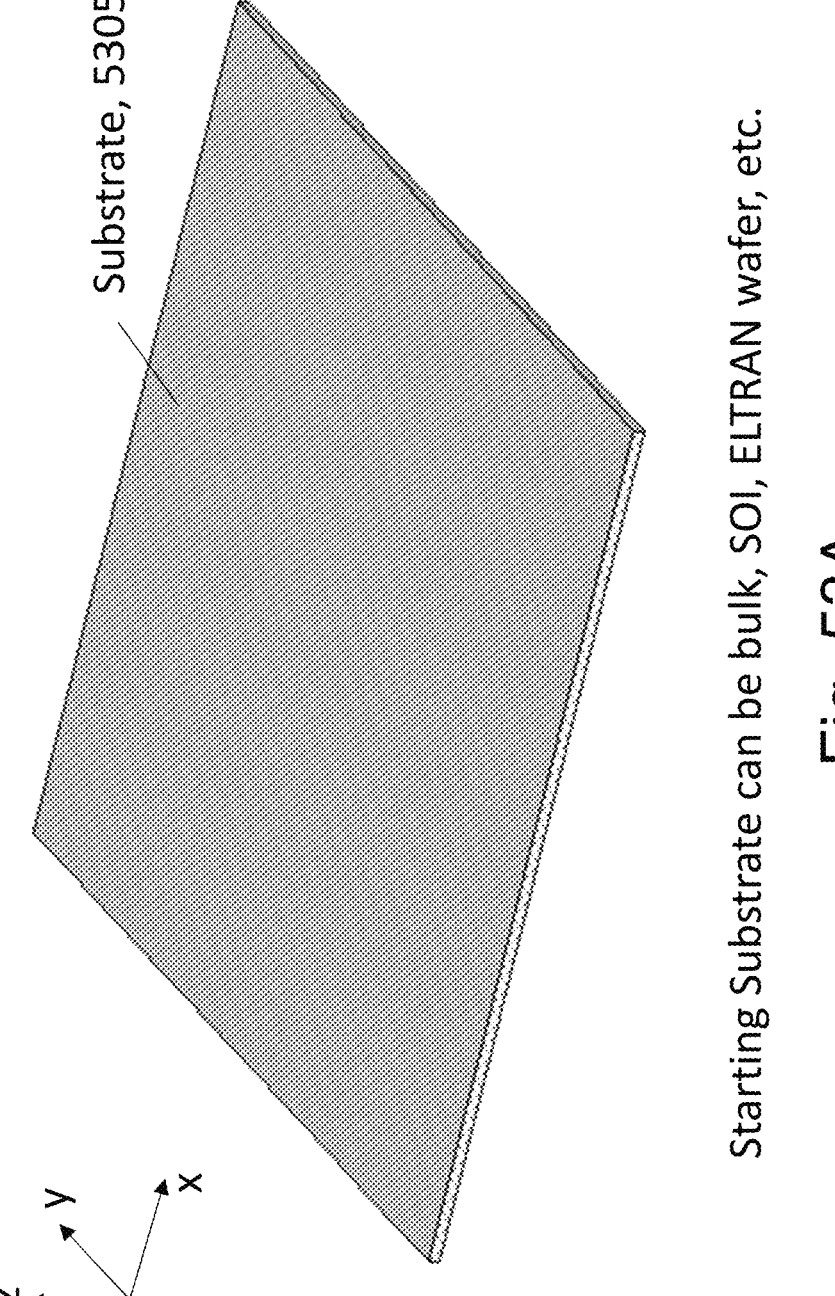
FIGS. 53A-53F are example illustrations of the formation and structure of a Checkerboard Fabric.

FIG. 53A illustrates a starting substrate 5305 which could be a bulk silicon substrate or thin silicon over oxide or over porous or other alternatives, for example, SiGe on silicon.

Figure 53B:
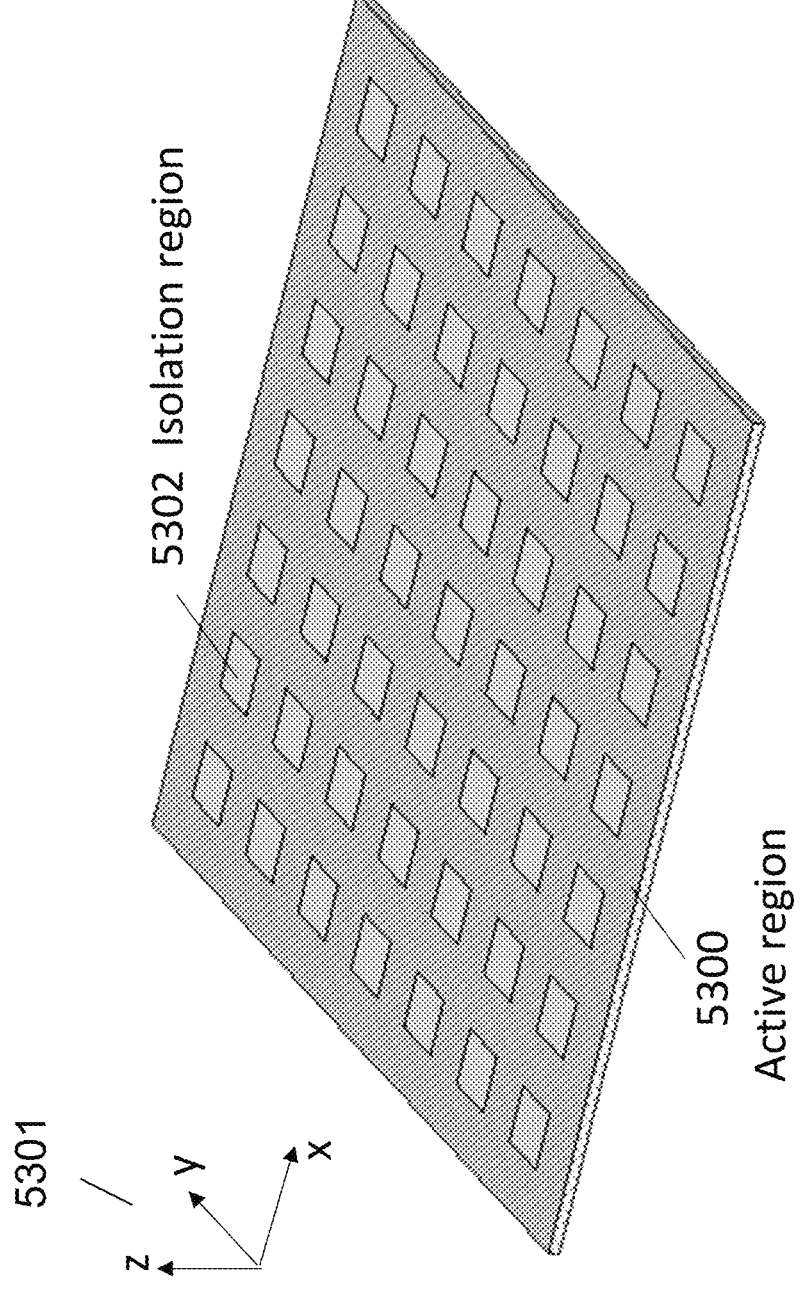

FIG. 53B illustrates starting substrate 5305 processed to form active regions 5300, which could be P type silicon, and after etching a grid or grids of isolation windows and forming isolation oxide, such as STI process, forming isolation regions 5302. For the benefit of the following description we could use directions as indicated by the direction arrows 5301.

Figure 53C:
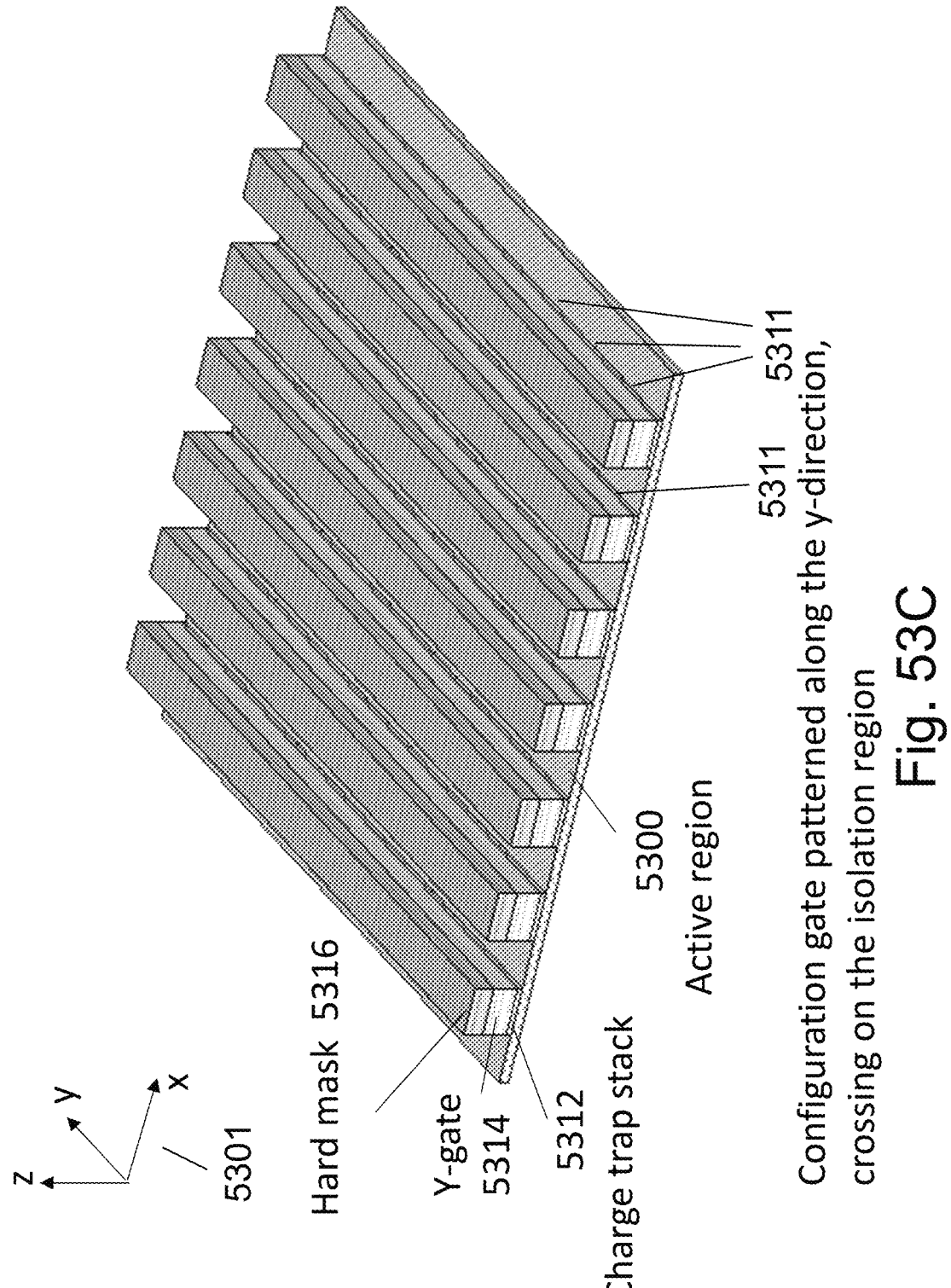

FIG. 53C illustrates the structure after the formation of Y-strips in the Y direction overlaying the grid of isolation windows 5302. These strips include first an O/N/O-Y charge trap stack 5312 covered by Y-gates 5314 and then covered by hard mask 5316 which could have been used to define the Y strips, using directional etching of the deposited layers elsewhere. It should be noted that the Y strips need to be made a bit smaller than the isolation windows 5302 leaving some window edges 5311 at their sides. This is necessary to avoid that the Y-gate 5314 field penetration and disturb to the channel made along future the X-strip 5322.

Figure 53D:
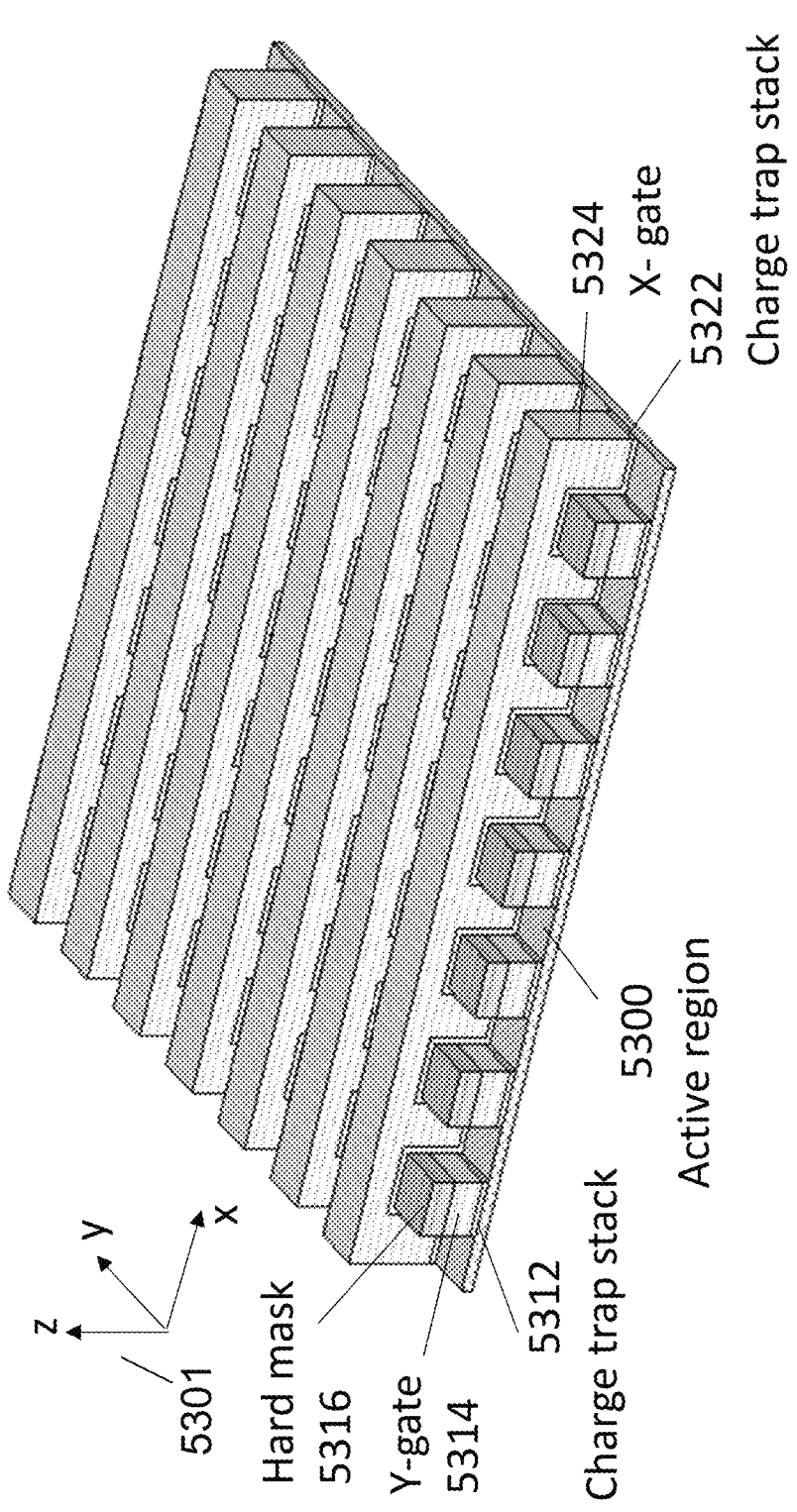

FIG. 53D illustrates the structure after formation of X-strips charge trap stack 5322 and X-gate 5324 in the X direction overlaying the Y-strips charge trap stack 5312, Y-gates 5314, and hard mask 5316 forming a Checker board like channel and gate structure. The X-strips may include second O/N/O-X charge trap stack 5322 covered by X-gate 5324. It should be noted that the X strips should be made a bit smaller than the isolation windows 5302 leaving also some window edges at their sides.

Figure 53E:
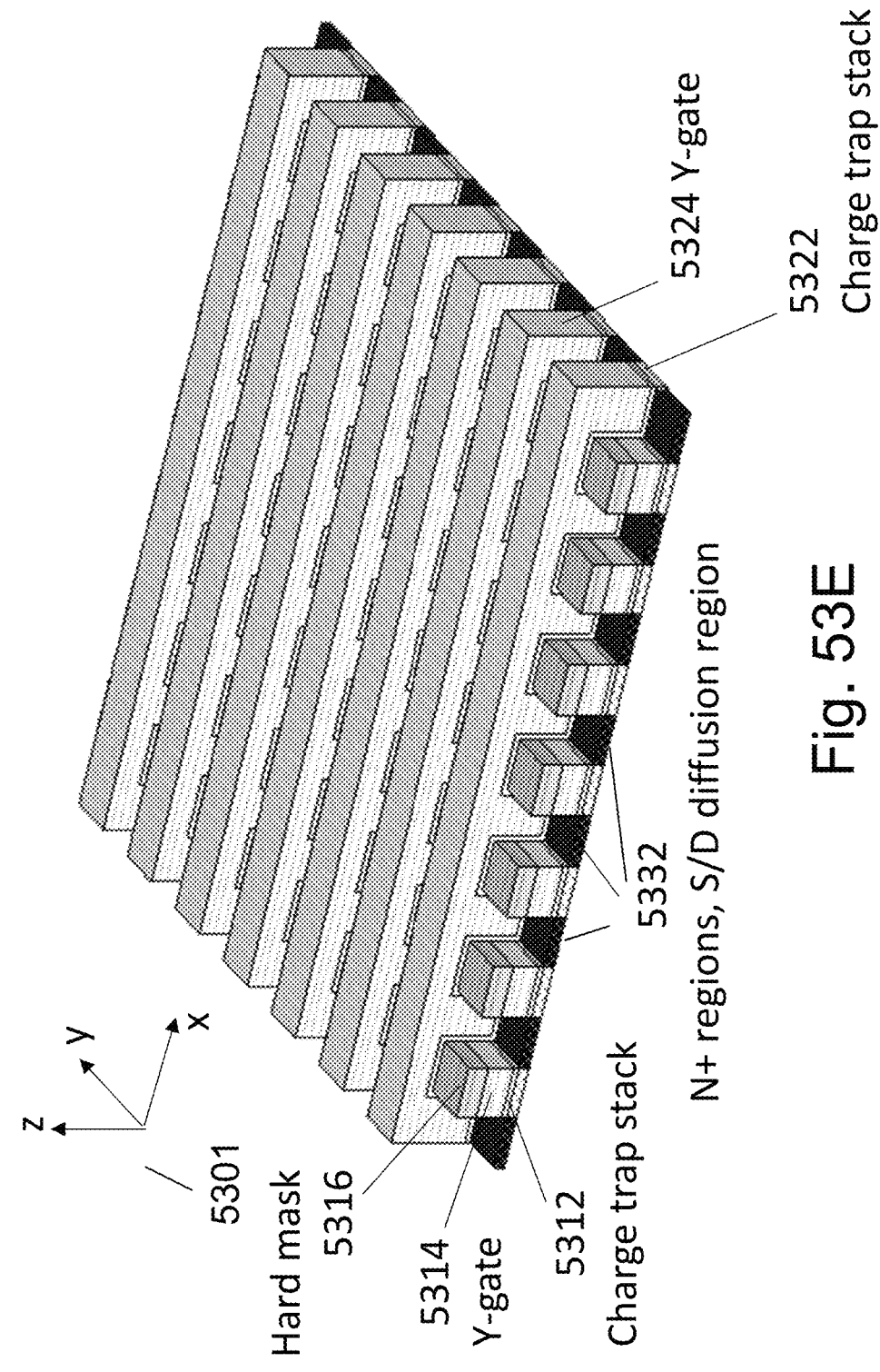

FIG. 53E illustrates the structure after ion implant step to form N+ regions 5332 in all the uncovered regions of the substrate 5300. The N+ regions 5332 may be formed in the intersection regions of the active substrate 5300. These N+ regions may serve as source and drains (S/D) for the respective transistors completing the Checker board Fabric. The fabric could use junction-less transistors if the channel thickness is made thin enough, such as less than 20 nm, for which the substrate could be made from N+ silicon or P+ silicon without the need for the ion implant step for the source and drain (S/D). The substrate could be made thicker but narrow such as the body of a FinFET. The proper modification of the channel side walls could be also be used allowing the fabric to be use as a memory fabric as well. For programmable logic, use of the—Checker board Fabric— the X-gate and the Y-gate could be used to program the respective channel by charging the top surface charge trap layer based on the desired programming choice.

Figure 53F:
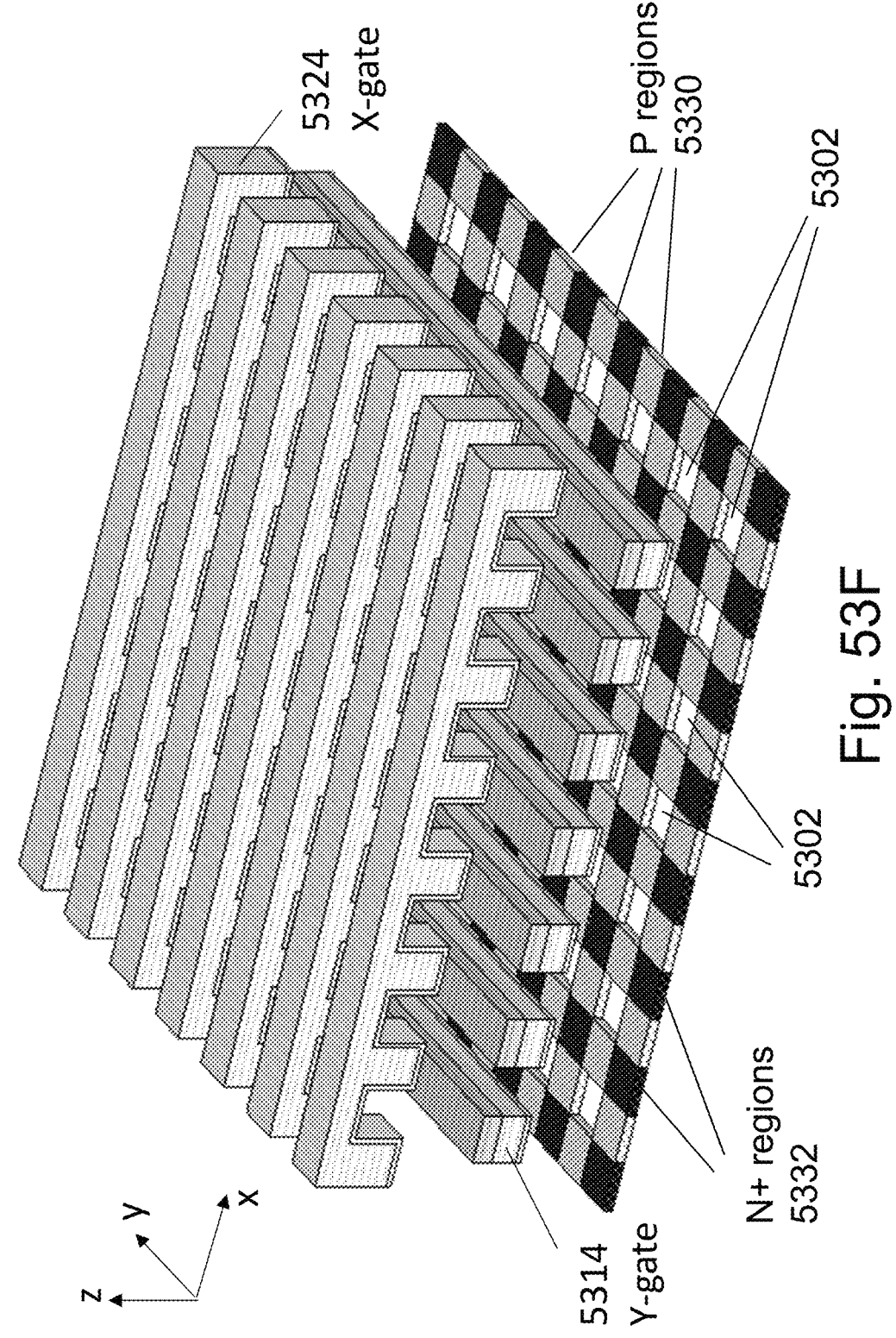

FIG. 53F illustrates the—Checker board Fabric of FIG. 53E by allowing view the functional layer as being virtually lifted up. The base substrate 5300 is now viewed as—like Checker board—with isolation windows 5302, P regions 5330 functioning as transistor channels. And N+ regions 5332 functioning as source drains, S/D, for these transistors. These S/D regions 5332 support programmable transistors in the X direction and programmable transistors in the Y direction. The X-Gate 5324 could be used to program the X direction transistors while the Y-Gate 5314 could be used to program the Y direction transistors. The programming of such—Checker board Fabric—could be done using NAND type programming or NOR type programming as the—Checker board Fabric—is a flexible programming fabric.

Figure 54A:
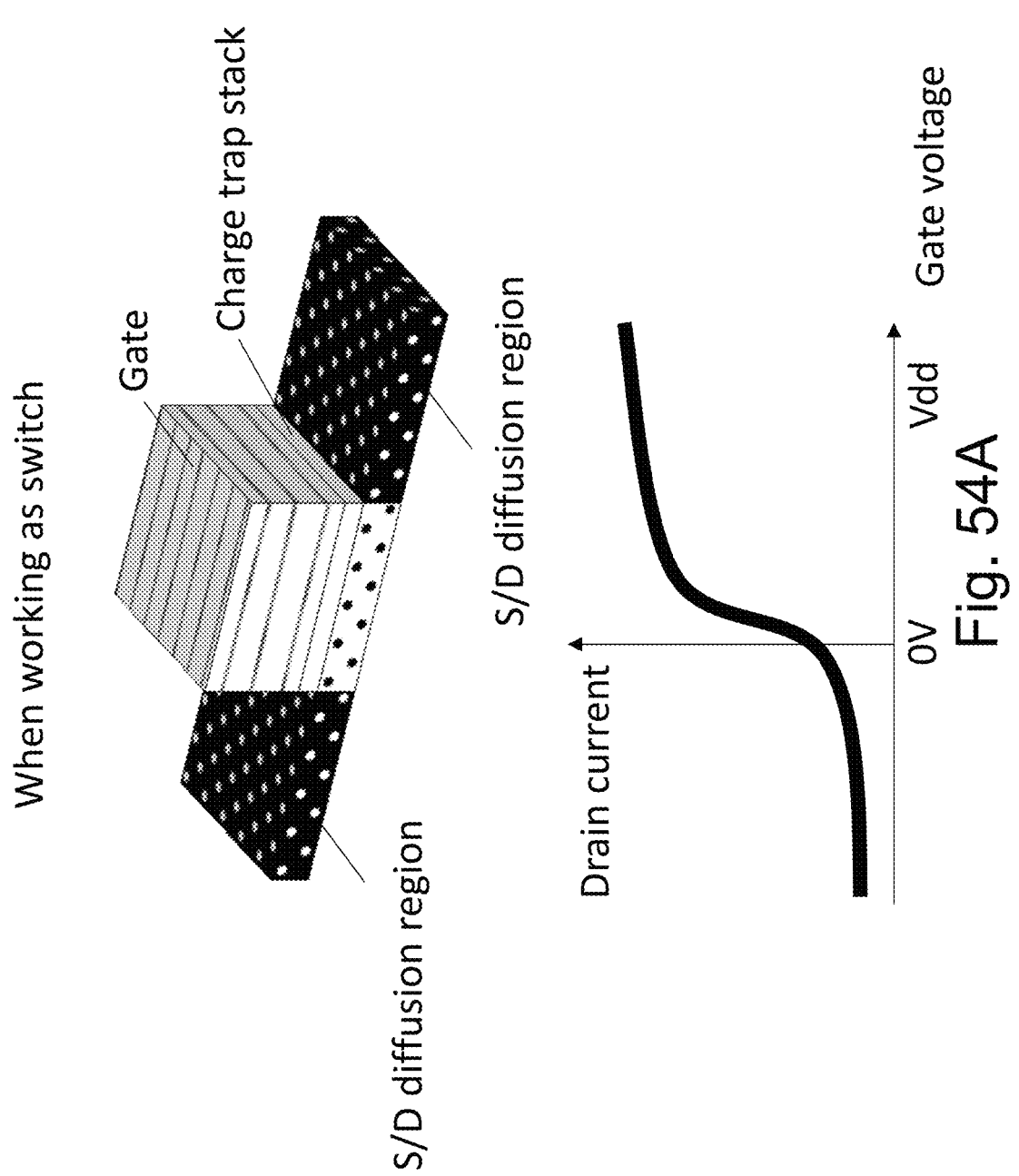
FIGS. 54A-54B are example illustrations of operation of transistors.
Figure 54B:
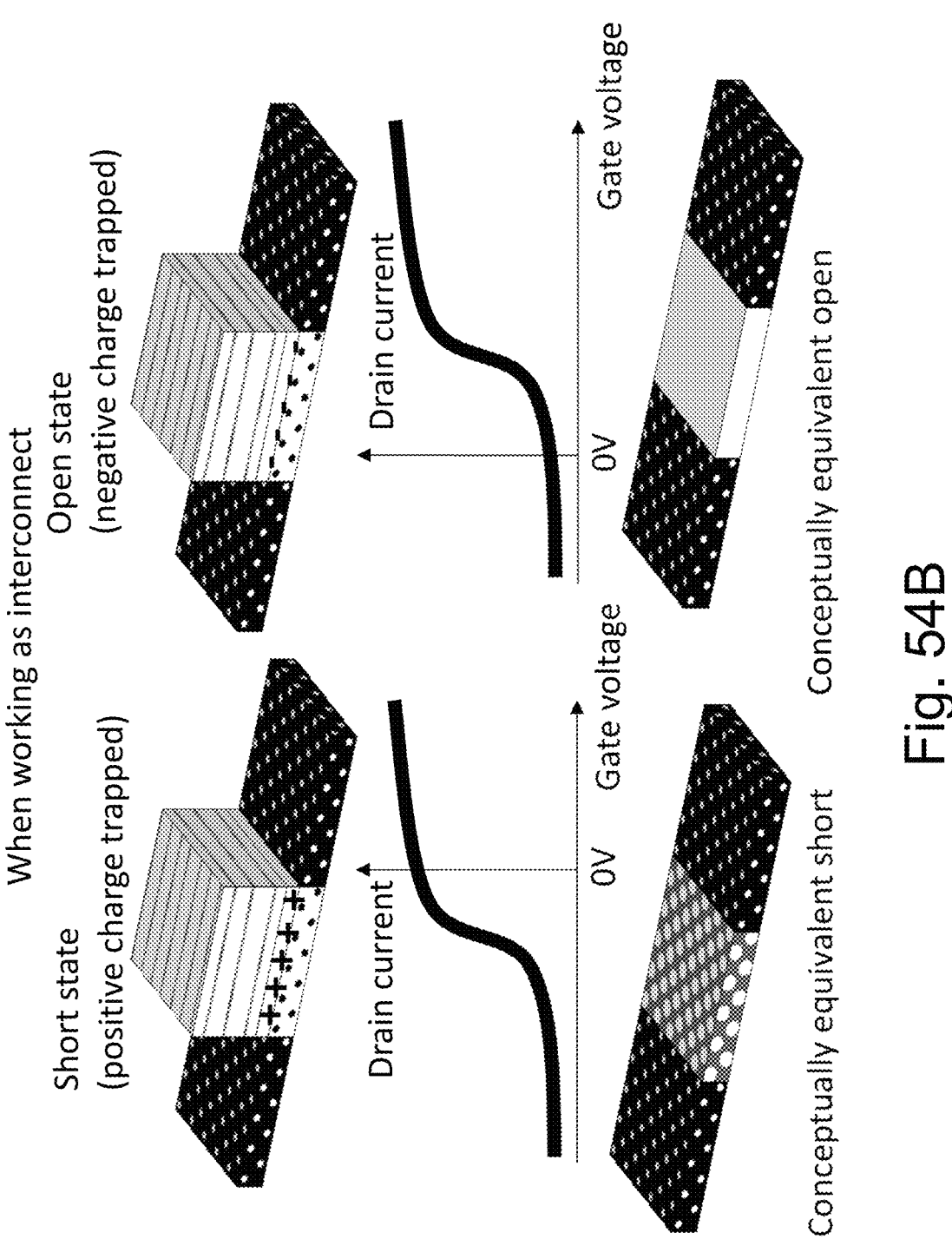

Each of these transistors could be set to one of three modes: Always 'off', function as transistor, always 'on', as was discussed herein before and conceptually illustrated in FIG. 54A-FIG. 54B.

Accordingly the programming option presented herein in respect to drawings: FIG. 32A-FIG. 37E could be applied to the—Checker board Fabric—with one change, instead of FIG. 33A being cut by etch it could be implemented electrically by programming the corresponding Y-transistor to be always off.

The—Checker board Fabric—is a more flexible programmable fabric than the 2D-NOR fabric as it includes the programmable Y-transistors enabling programming in the X direction and in the Y direction.

Figure 55:
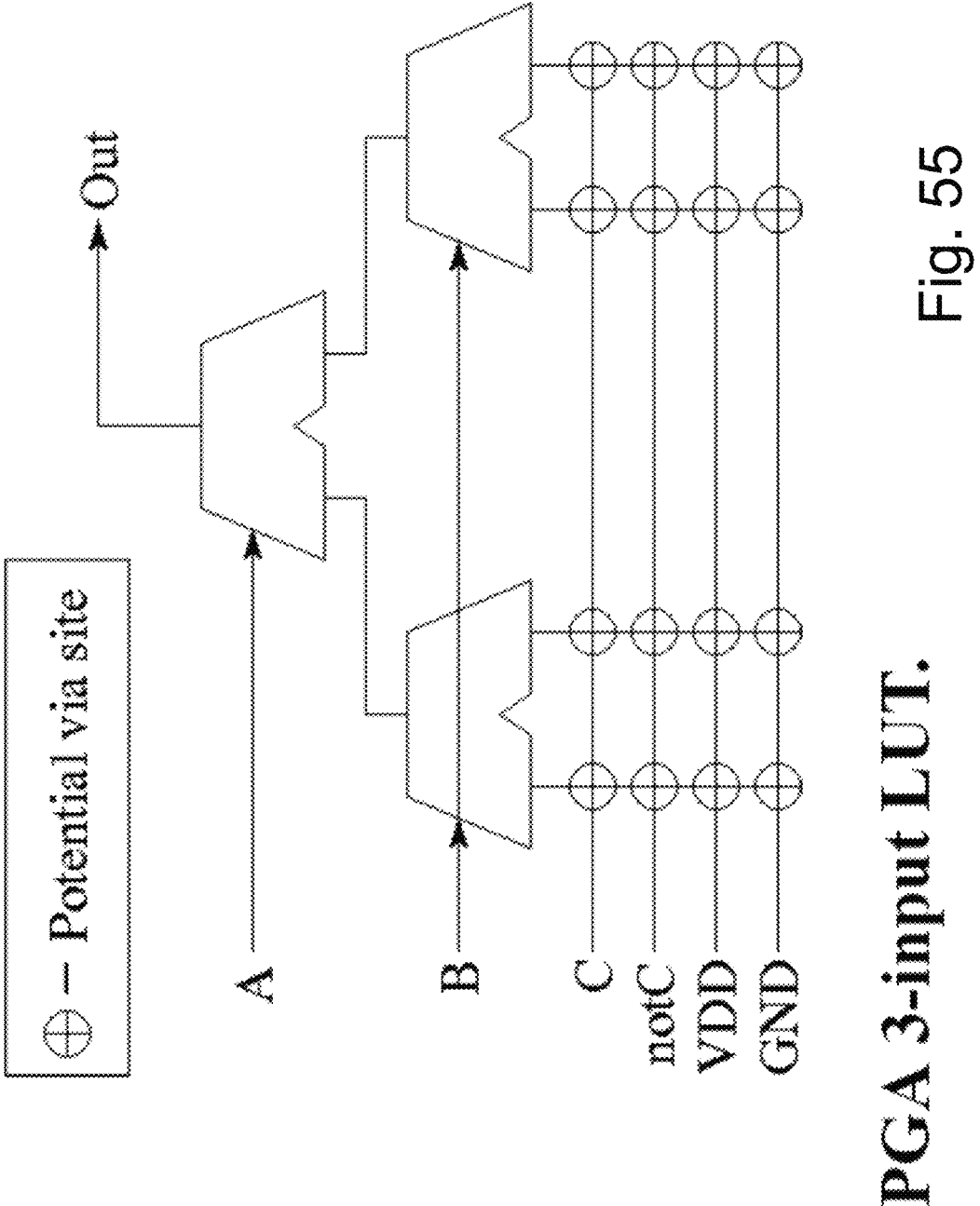
FIG. 55 is an example illustration of an alternative implementation for Look-Up-Table (LUT) utilizing programmable vias.

In a paper by L. Pileggi et al titled: "Exploring Regular Fabrics to Optimize the Performance-Cost Trade-Off" published at DAC 2003, Jun. 2-6, 2003, incorporated herein by reference, an alternative implementation for Look-Up-Table (LUT) utilizing programmable vias is presented—as illustrated in FIG. 55.

Figure 56A:
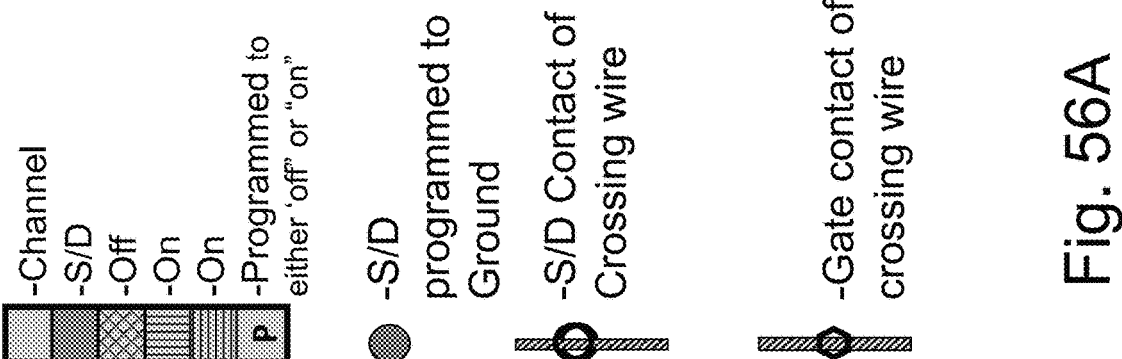
FIGS. 56A-56B are example illustrations of the use of the Checker board Fabric which could result in a LUT4.
Figure 56B:
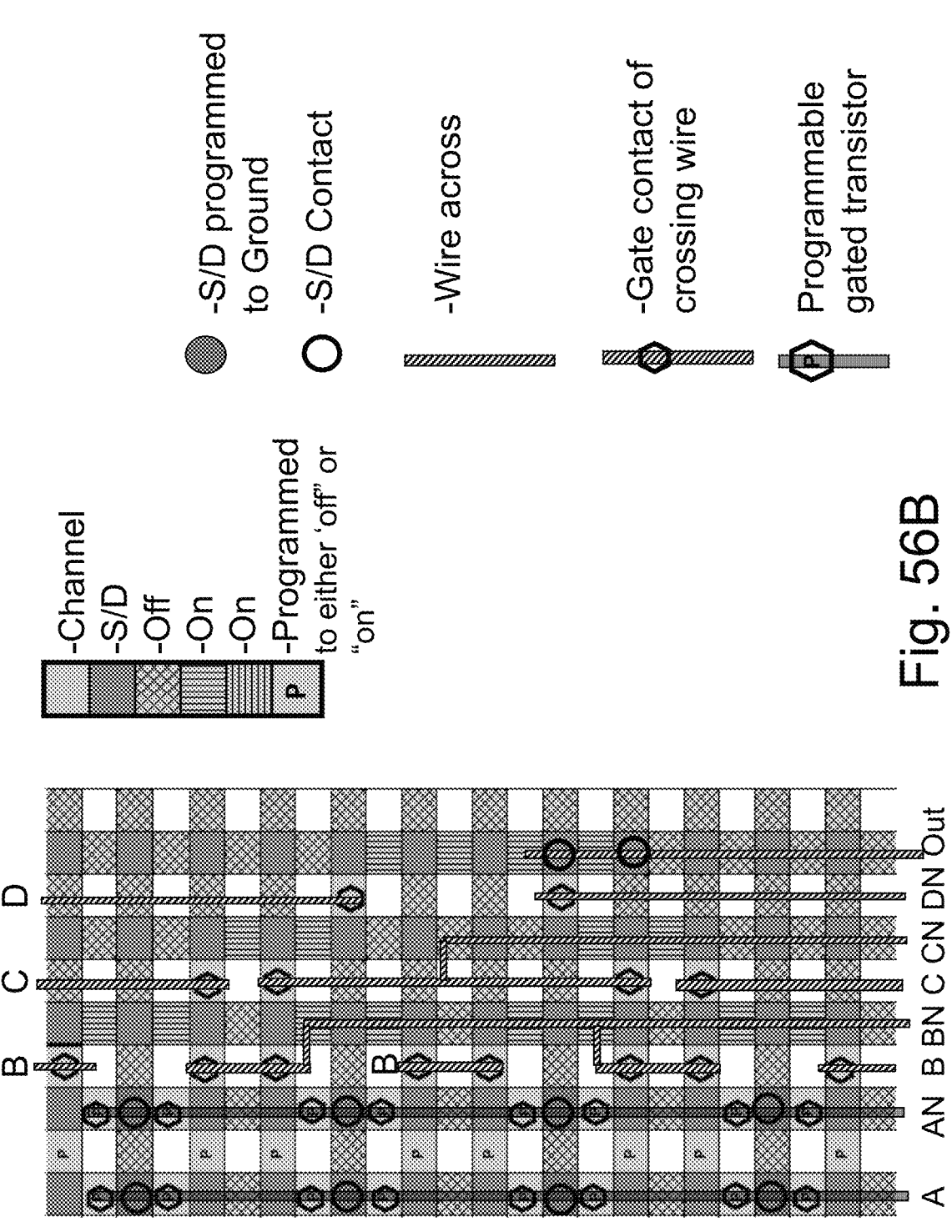

FIG. 56A illustrates the use of such LUT implementation with the Checker board Fabric which could result in a LUT4. FIG. 56B illustrates further compaction of the LUT4 implementation using the Checker board Fabric. These implementations provide significant silicon area reduction vs. the one illustrated in FIG. 35. The right side of FIG. 56A and FIG. 56B provide the symbol map used in the left side illustration of LUT4 implementation over such Checker board Fabric. The programmable fabric of FIG. 53E is flipped by transferring it over a carrier wafer. Once flipped and the backside of the NPN transistor matrix is open to allow adding gate oxide and gates over the P regions as needed and contacting the N+ the S/D regions as needed. Thereby, the front side transistor is used to program/erase (configure) the checker board while the backside transistor is used for the high performance logic functions. In this approach, the silicon substrate is needed to be fully depleted so that the front side charge trapped status affects the backside transistor characteristics. The illustration presents a section of Checker board Fabric in which channels are marked as: always on, always off, or programmable to either state or un-programmed left as acting transistor. The S/D could be connected to a ground (low voltage) or to an input or output signal. Similar to FIG. 35 the LUT4 has 4 input signals (A, B, C, D) and their complement (AN, BN, CN, DN), and one output (Out).

FIG. 56B also utilizes a programmed (P) gated transistor. Such allows the program to leave the transistor controlled by the gate signal or forcefully program the transistor to either always On or Always Off.

These implementation are just an example use of these fabrics for programmable logic, many other programmable circuits could be implemented by the presented fabrics. For example, such as the AND presented in FIGS. 37.

In some applications, such as in an advanced process/device node, the N type LUT circuit illustrated in FIG. 34A and FIG. 34B and the use of the pull-up-inverter signal reconstruction circuit 3401 is less than optimal. Also the domino logic clock base reconstruction circuit 3602 could be limiting. An alternative approach could be used as is illustrated FIG. 57A. It utilizes a half PMOS latch circuit 5714. The half PMOS latch circuit 5714 would have as an inputs, the output L-Out 5722 of the first LUT 5702, which could be connection path to ground—zero signal or floating line—high resistivity, and the output L-OutN 5724 of the first LUT-N 5704, which, too, could be a connection path to ground—zero signal or floating line—high resistivity. The inputs to both LUT 5702 and LUT-N 5704 are the same input signals (A, B, C, D) and their inversion (AN, BN, CN, DN) Input circuit 5712. The two LUTs are programmed to be complementing each other so if L-Out 5722 is low ('0') then L-OutN is high-impedance and the inverse when L-Out 5722 is high-impedance then L-OutN is low ('0'). Accordingly the half PMOS latch circuit 5714 converts these complementing signals to a normal logic signal Output 5726 which would be low ('0' also called Vss) when L-Out 5722 is low and would be high (Vdd) when L-OutN is low ('0').

Figure 57A:
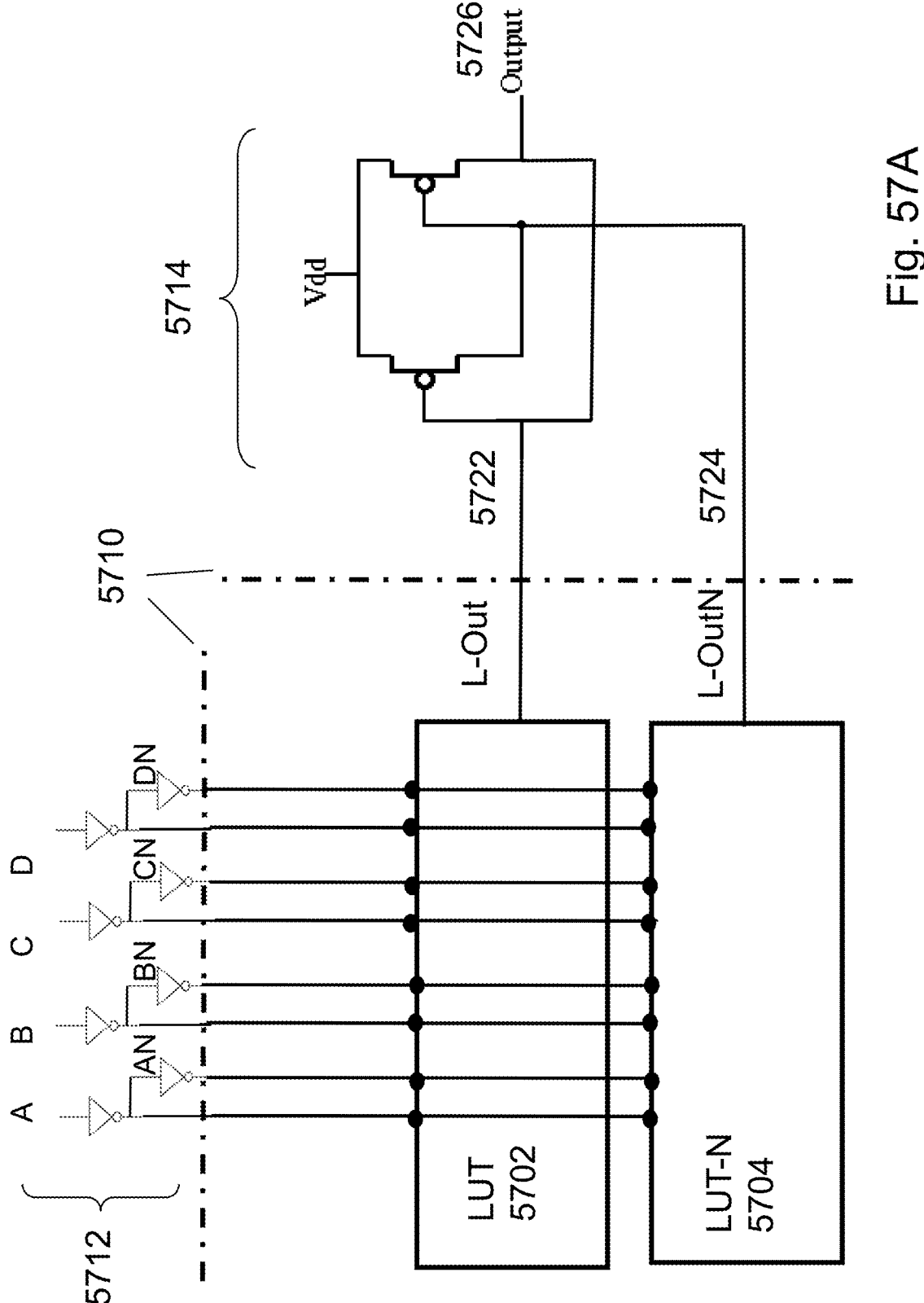
FIGS. 57A-57B are example illustrations of 4 bit Look-Up-Tables and LUT4 with a PMOS half-latch.
Figure 57B:
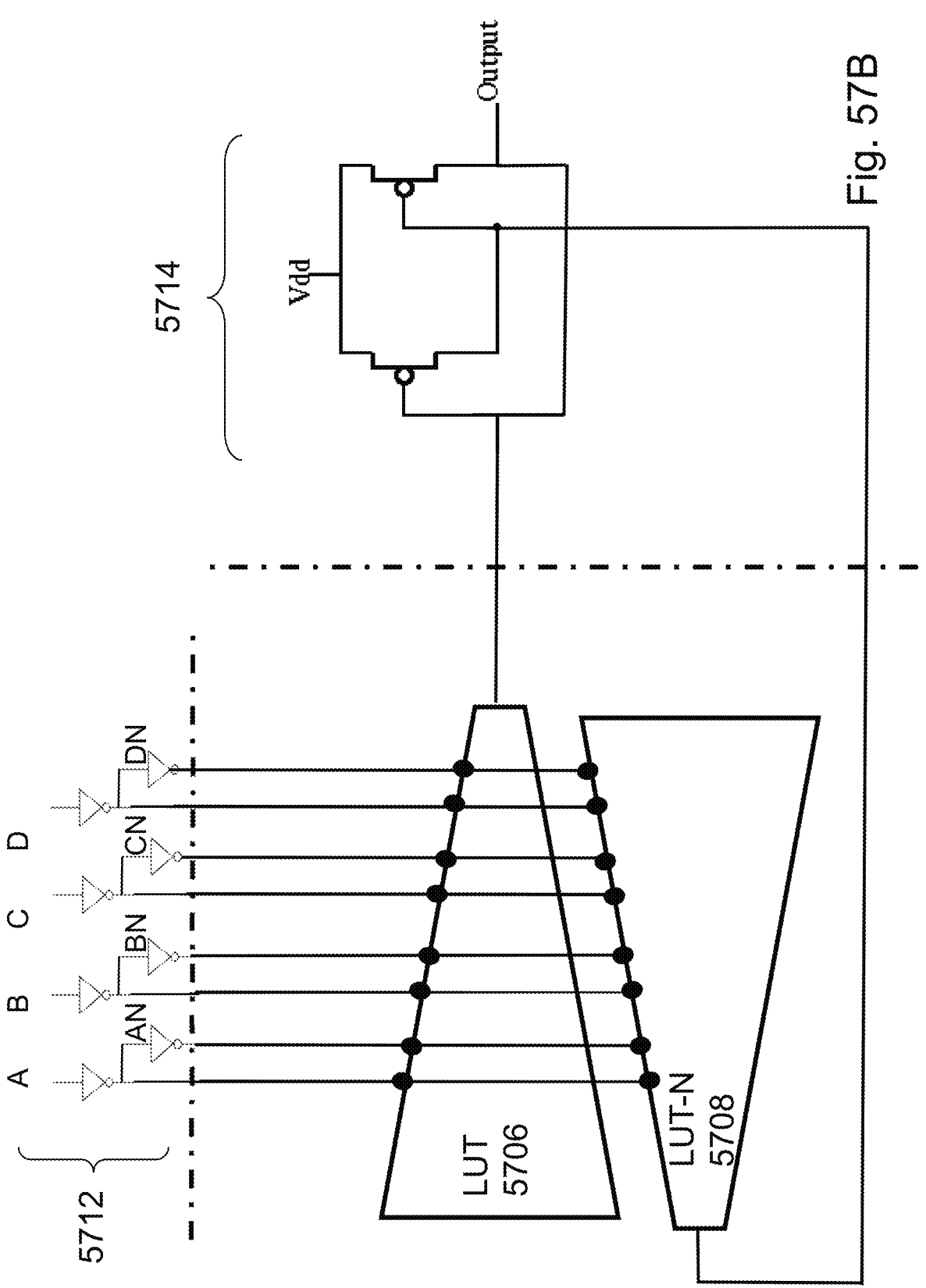

The broken line 5710 indicate the transitions of signals from the programmable logic fabric 4208 (FIG. 56, FIG. 35, . . . ) to the upper layer CMOS fabric 4212 (in respect to FIG. 42B) carrying the CMOS circuits Input circuit 5712 and half PMOS latch circuit 5714. The structure of FIG. 57A illustrates forming a true 0/1 output using LUT of programmable N type transistor fabric. This structure indicates doubling the resource as it uses two LUTs which complement each other. But if the circuit layout would leverage the triangular shape of these LUT circuits then the area penalty could be reduced as illustrated by FIG. 57B, in which the LUT 5708-N is flipped horizontally in respect to LUT 5706 to provide improved circuit density and compaction.

Another type of programmable logic PLA/PLD was presented in respect to FIG. 37A and could be adapted for full signal reconstruction. The following presents such in respect to the programmable Checker board Fabric as is illustrated in FIG. 58A to FIG. 58E.

Figure 58A:
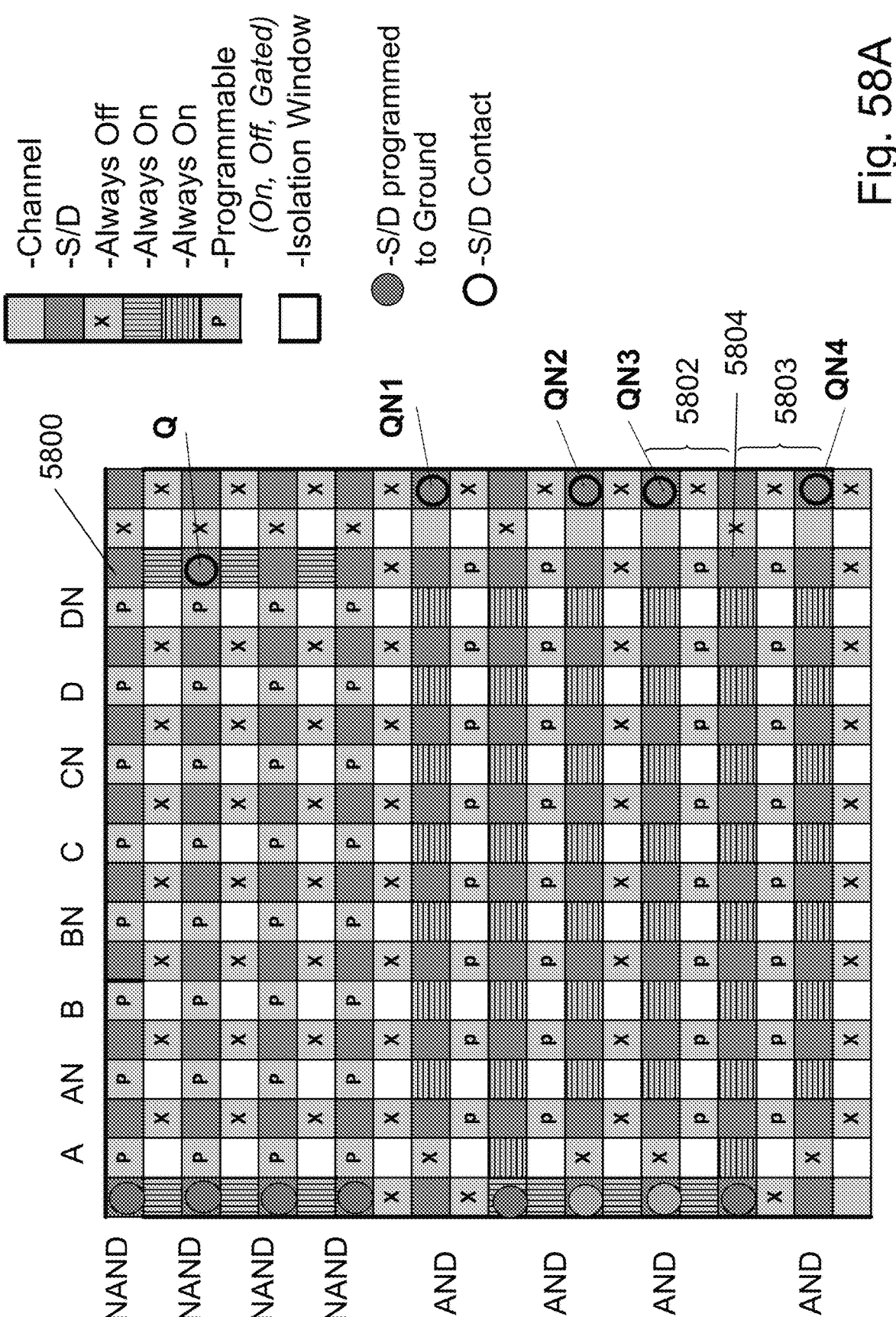
FIGS. 58A-58E are example illustrations of a programmable logic PLA/PLD which could be adapted for full signal reconstruction utilizing the programmable Checker board Fabric.

FIG. 58A illustrates in its upper part a 4 NAND function AND together forming output Q, and its lower part the complementing 4 AND function forming 4 outputs (QN1, QN2, QN3, QN4), which could then OR together by a circuit such as is illustrated in FIG. 58A-3. This example is of a structure design for inputs (A, B, C, D) and with 4 product terms. The right side of these figures presents the symbol map used in the left side illustration. The structure includes at the upper side of the 8 programmable transistors connected serially to form a NAND which would be connected at their end 5800. These NAND structure are then connected together forming an AND logic of these 4 NAND function forming the output Q of the NAND side. Each of the NAND functions could be programmed to include each of the 4 inputs and/or their complements (AN, BN, CN, DN).

The lower part includes 4 programmable AND functions first AND function 5802 and second AND function 5803. For the programmable AND functions a row 5804 may be dedicated to feed the ground/Zero signal to the 8 programmable transistors in parallel forming the AND function. These 4 AND functions could be programmed to complement each of the upper part 4 NAND functions. These AND functions could be connected to the half latch 5844 in an OR forming circuit such as is illustrated in FIG. 58C.

Figure 58B:
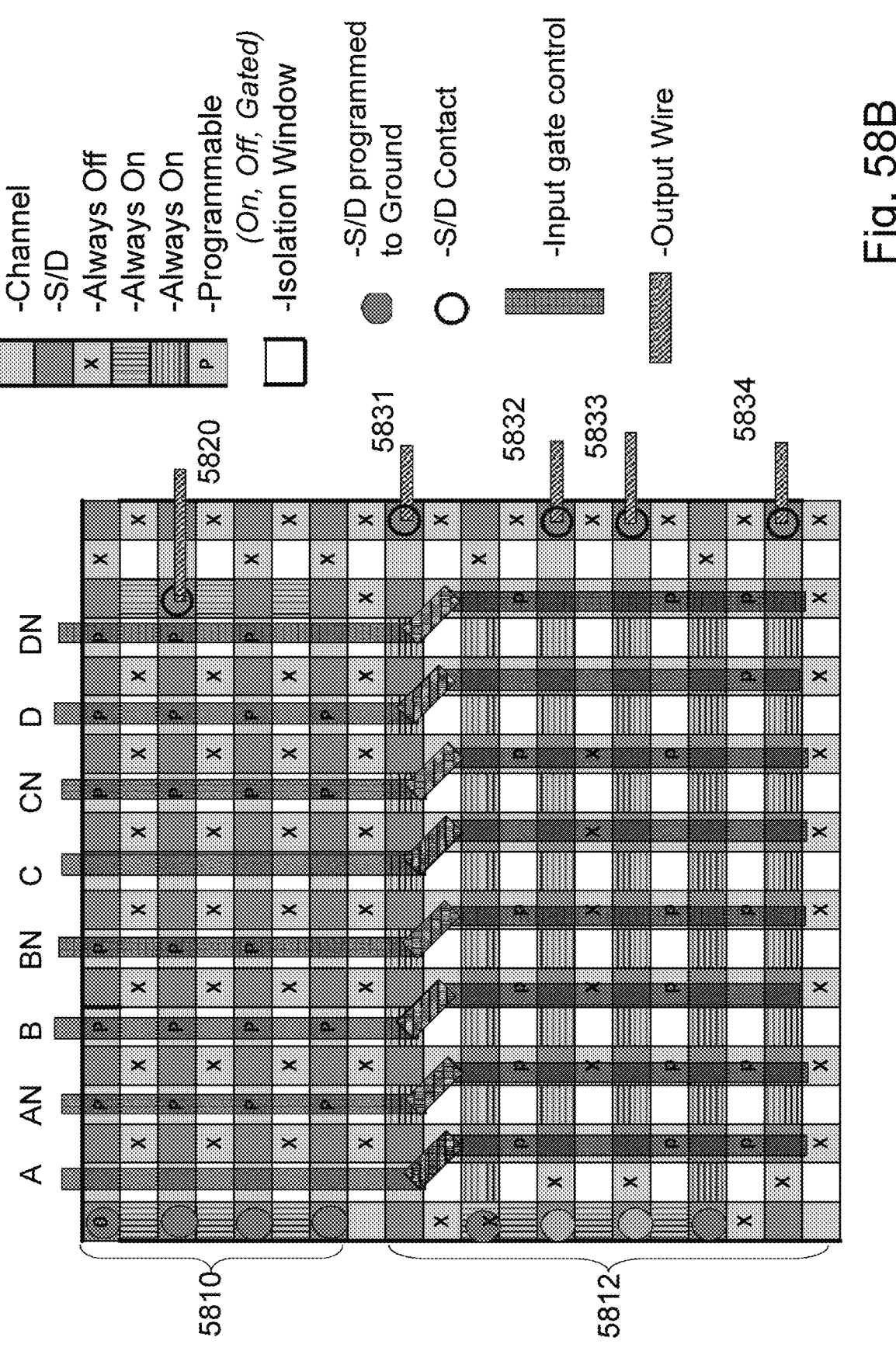
Figure 58C:
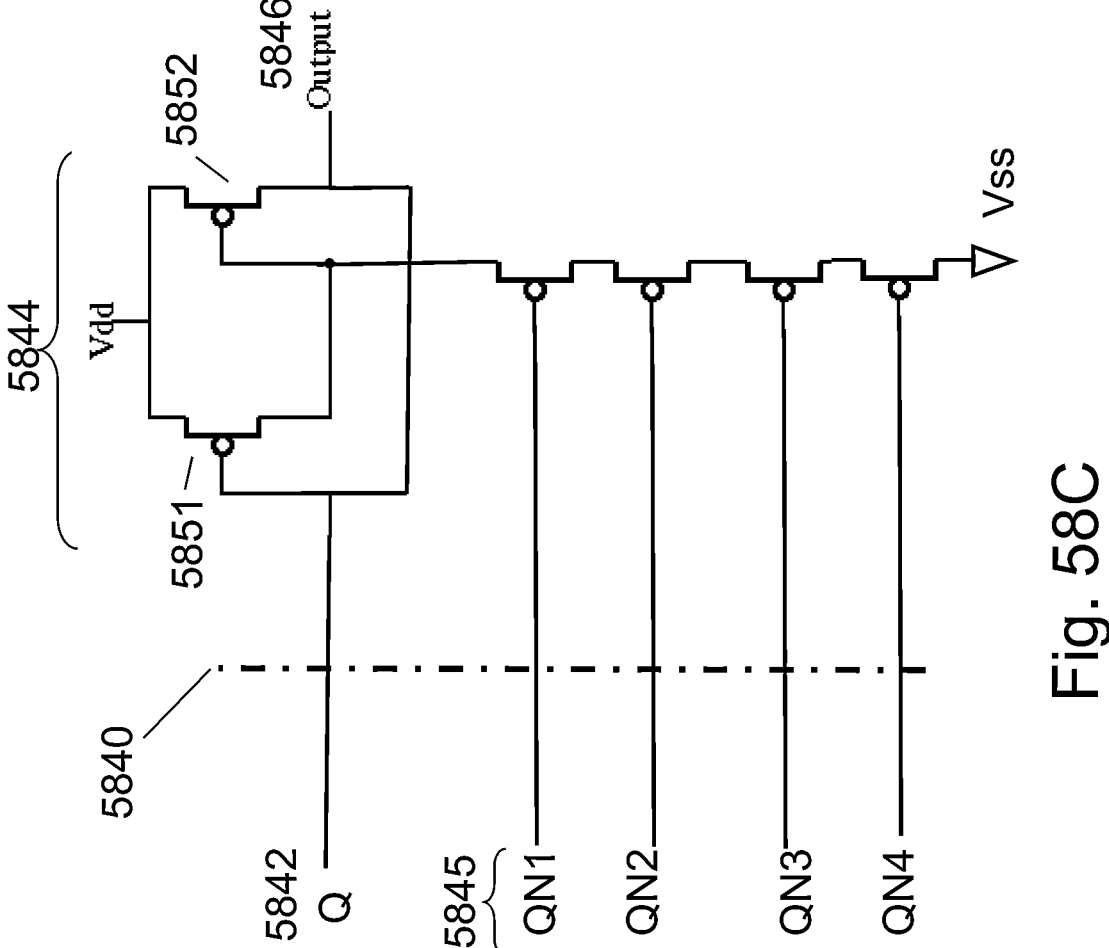

FIG. 58B illustrates the structure after adding the gate control of the inputs (A, AN, B, BN, C, CN, D, DN) so the upper portion 5810 provides the 4 NAND function AND together to the programmable NAND-Out 5820, and lower portion 5812 provides the 4 AND terms forming 4 outputs first output 1 5831, second output 5832, third output 5833, and fourth output 5834. These outputs may then be connected to half latch 5844 as illustrated in FIG. 58C to construct a 0/1 logic output 5846. The broken line 5840 indicate the transition from the Checker Board fabric of the NAND product output Q 5842 and the 4 AND outputs (QN1, QN2, QN3, QN4), 5845. The 4 AND outputs are connected to the gates of 4 serially connected transistors so if they are all 'zero' than first transistor 5852 of the half latch will turn on forcing the half latch to output 5846 a one value. This will occur in the case that the AND side product outputs a high impedance and accordingly the other transistor of the half latch second transistor 5851 would be turned off.

Figure 58D:
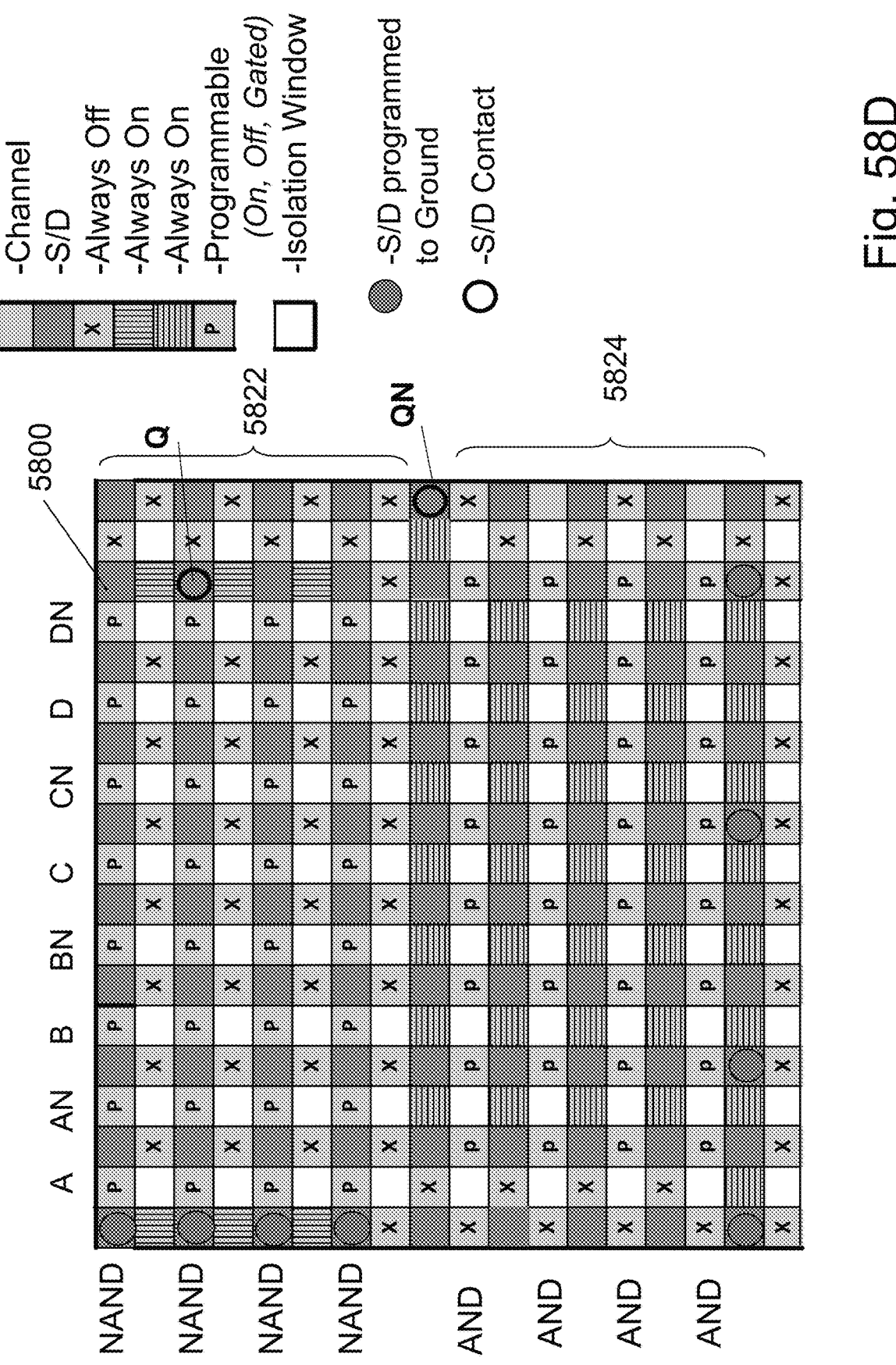
Figure 58E:
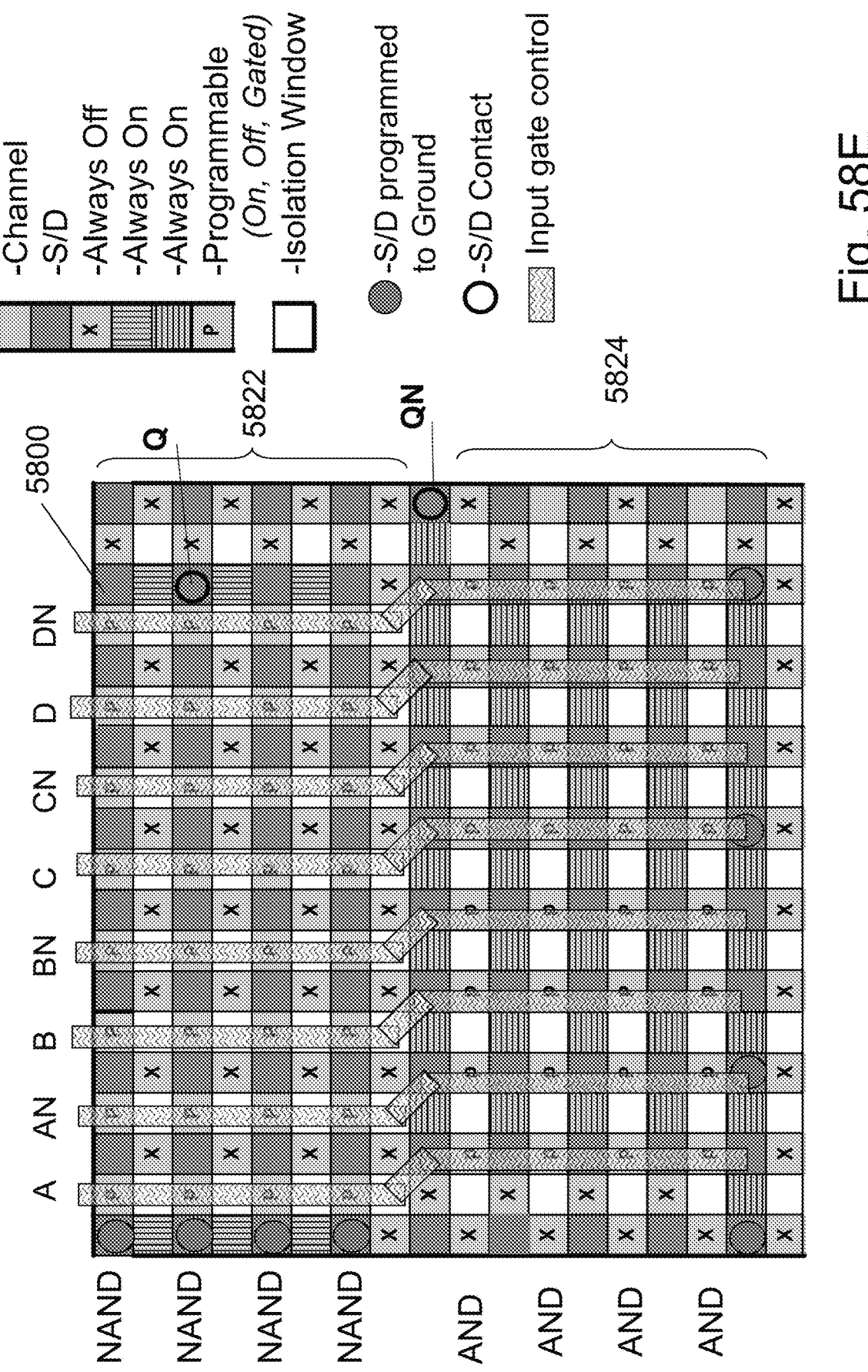

FIG. 58D illustrates an alternative for the AND side of the structure. In this alternative only the first AND has a zero in its inputs. The outputs of the first AND are than fed as inputs to the second AND, and so forth all the way to the fourth NAND. This serial connection is forming the OR function of the 4 AND function as the final output QN would be zero only if the output of each of the 4 ANDs was zero. So the upper part of the 4 NAND wired AND together 5822 will output Q, while the lower part could be programmed to the complement output QN of OR of the 4 AND function. FIG. 58E illustrates adding the gates for gate control to the structure. The two complementing outputs Q and QN could be fed to a half latch circuit for bringing the outputs to full logic level outputs.

Figure 59:
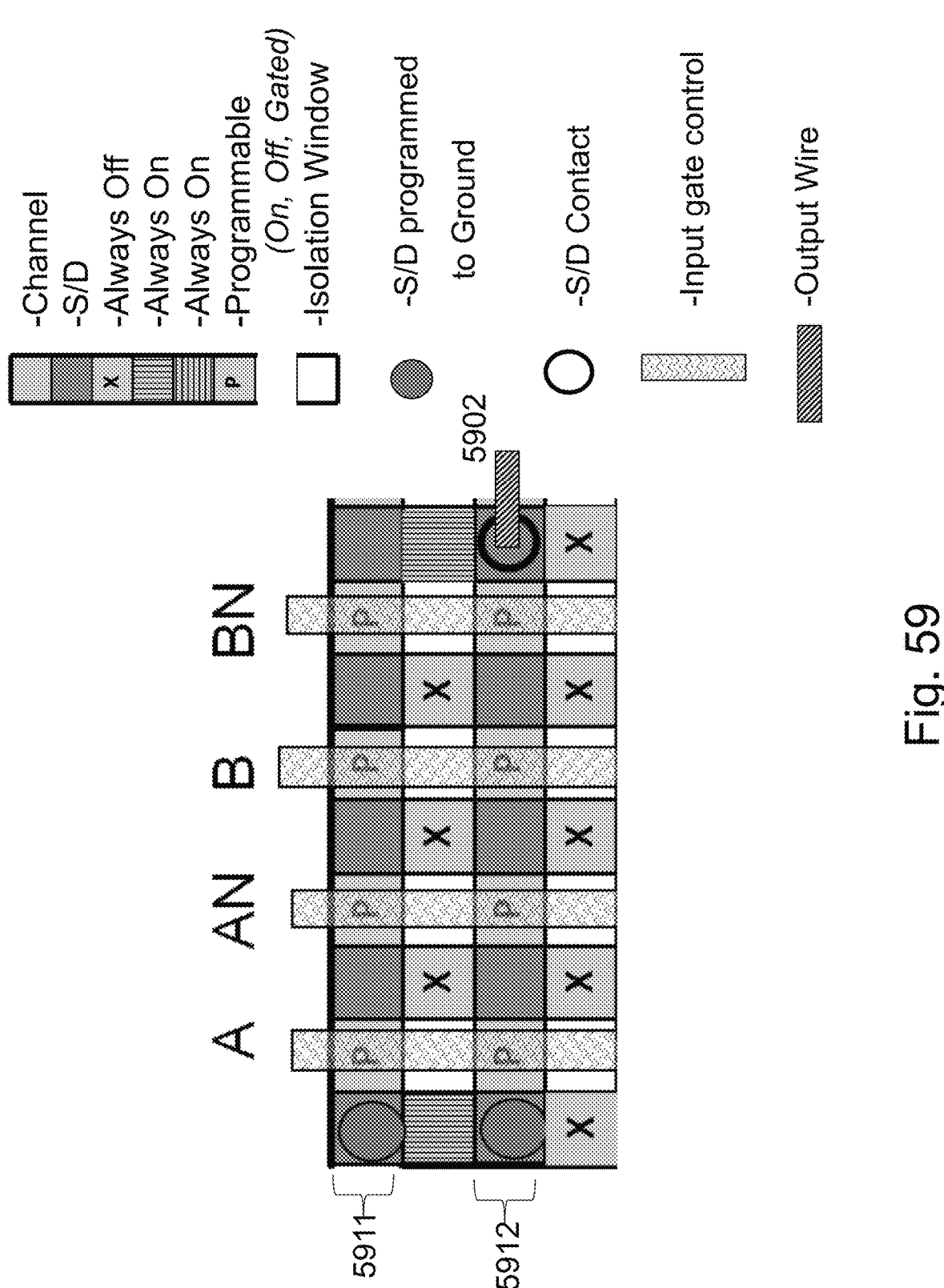
FIG. 59 is an example illustration of a programmable 2 product term of two inputs with output.
Figure 60:
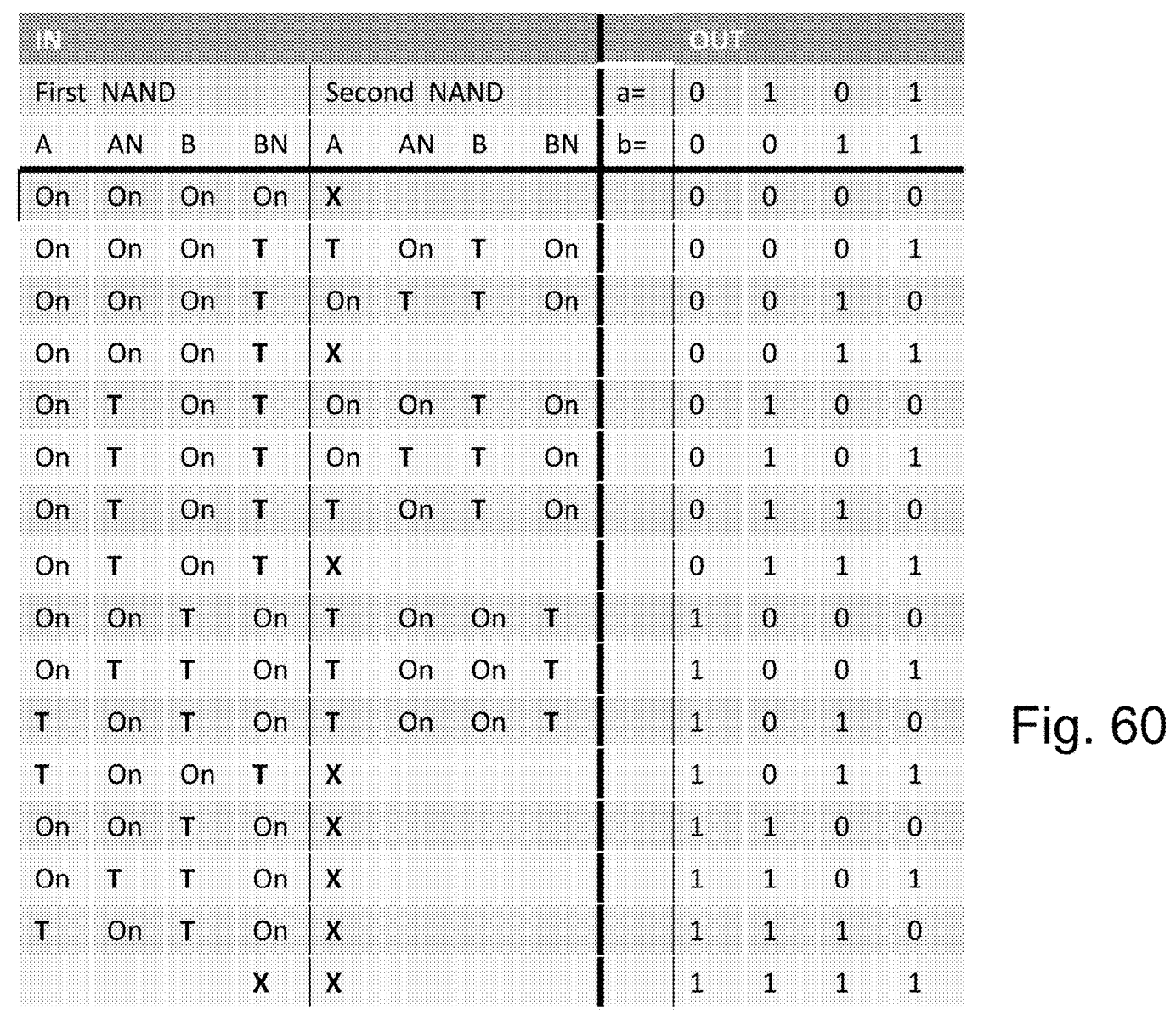

FIG. 59 illustrates a programmable 2 product term of two inputs (A, B) with output 5902. This programmable structure could be programmed to form any two input logic function and accordingly function as a LUT-2. The table in FIG. 60 presents the programming of these two NAND rows to support the LUT-2 functionality. The left side of the table shows the output function according to the two inputs 'a' and 'b' which could be the function inputs (A, B). The table shows '1' for high impedance output 5902, as the high impedance output could be reconstructed to a high logic level—'1' by the following circuit as was discussed herein. The right side represents the programming of the respective transistors of the First NAND row 5911 under the respective gate line and respective transistors of the Second NAND row 5912 under the respective gate line. The table use the following symbol:

On—Always on
X—Always Off
T—Gate control
No symbol—Don't care

The LUT-2 structure could be utilized to construct higher level LUTs such as LUT-3, LUT-4 etc.

If we assume a Checker Board Fabric of equal size rectangular sized $F^2$ each, then the size of the LUT-2 illustrated in FIG. 59 could be about $4 \times (8+1)$ $F^2$. Accordingly using a similar approach as were presented herein a LUT-3 size could be about $2 \times 4 \times [8+1+4]$ $F^2 = 104$ $F^2$, and the size of LUT-4 could be about $2 \times 2 \times 4 \times [8+1+4+4]$ $F^2 = 272$ $F^2$ Using the same measurements the LUT-4 of FIG. 56 could be about $4 \times 6 \times [6+1+4+4+4]$ $F^2 = 456$ $F^2$ For reconstruction the output for full logic signal using the scheme of FIG. 57 it would take two such LUT-4s.

Using aggressive compacting techniques and multilayer connections the decoder portion of these LUTs could be squeezed into smaller area as illustrated in FIG. 56B.

Figure 61:
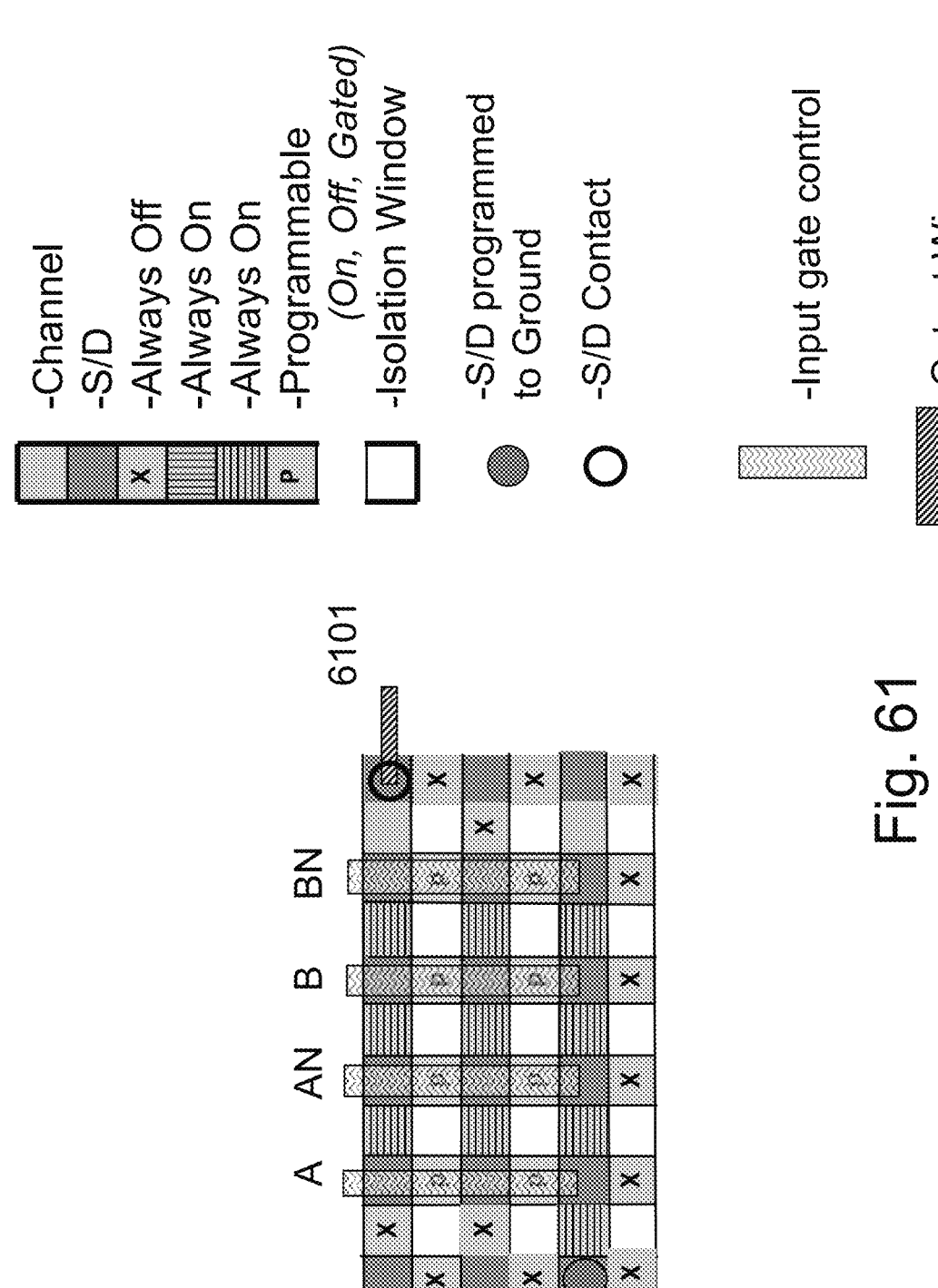
FIG. 61 is an example illustration of the complementary programmable function of the structure in FIG. 59.

FIG. 61 illustrates the complementary programmable function in FIG. 59. The rows are forming NOR functions which if used on the complementary inputs of FIG. 59 would function as AND logic and hence complementing it, as was presented in respect to FIGS. 58D, 58E . . . . Accordingly the structure of FIG. 61 could be programmed as a LUT-2 as well having inputs A, AN, B, BN and output 6101.

Figure 62:
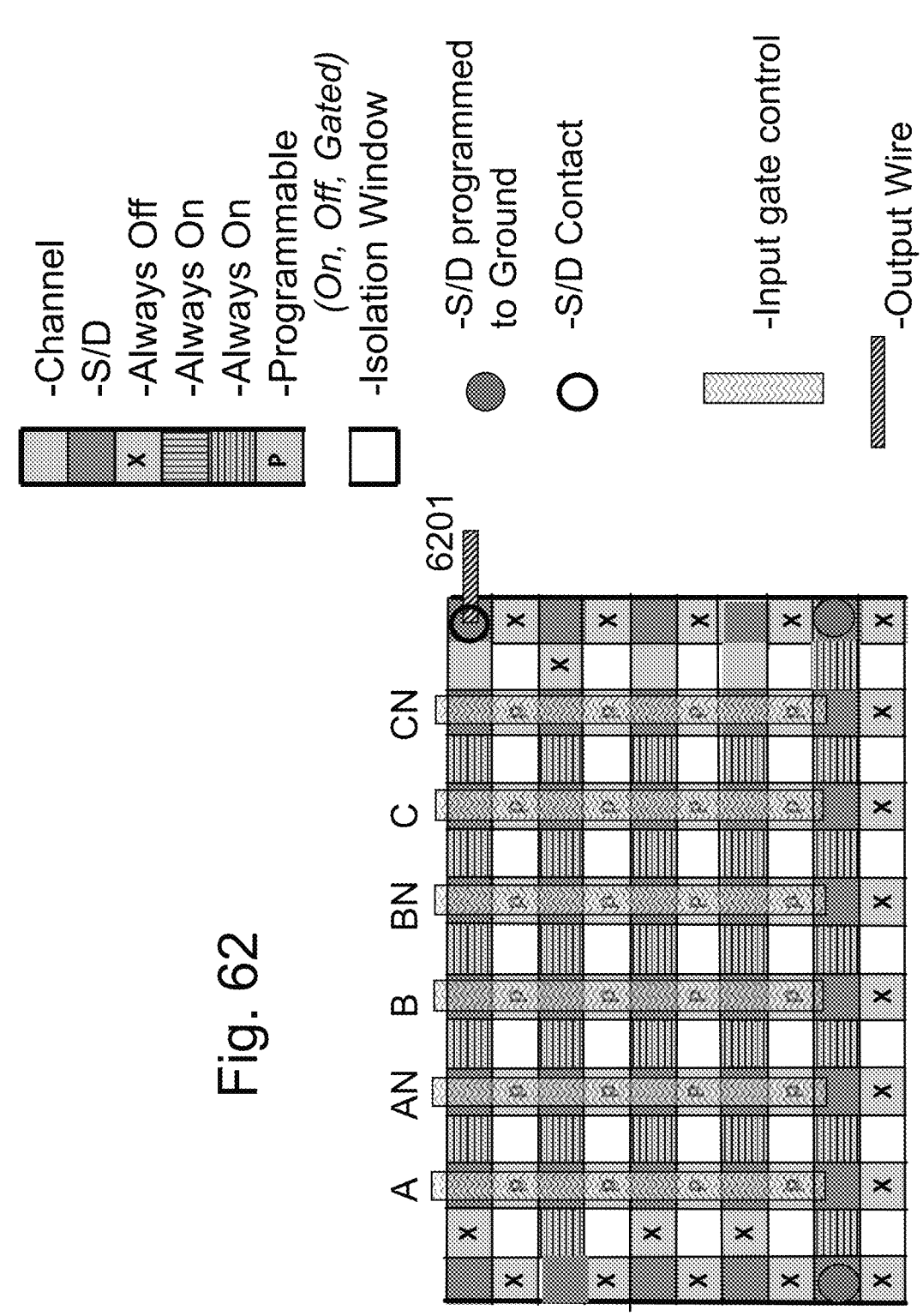
FIG. 62 is an example illustration of a similar function as in FIG. 59 for three inputs and their complement and with 4 NOR terms.

FIG. 62 illustrates a similar function for three inputs and their complement and with 4 NOR terms. The structure of FIG. 62 could be programmed as a LUT-3. And in a similar way the structure could be applied to 4 inputs 5812, as illustrated in FIGS. 58D, 58E. A structure with 4 inputs (and their complement) and with 8 NOR terms (Doubling 5812) could be programmed to function as a LUT-4.

The process flow presented in respect to the 2D NOR fabric—FIGS. 2A-2J utilize self alignment techniques which are well known to reduce cost and increase yield.

Similar ideas could be used for the Checker-Board fabric. These are illustrated in Respect to FIGS. 63A-63F.

Figure 63A:
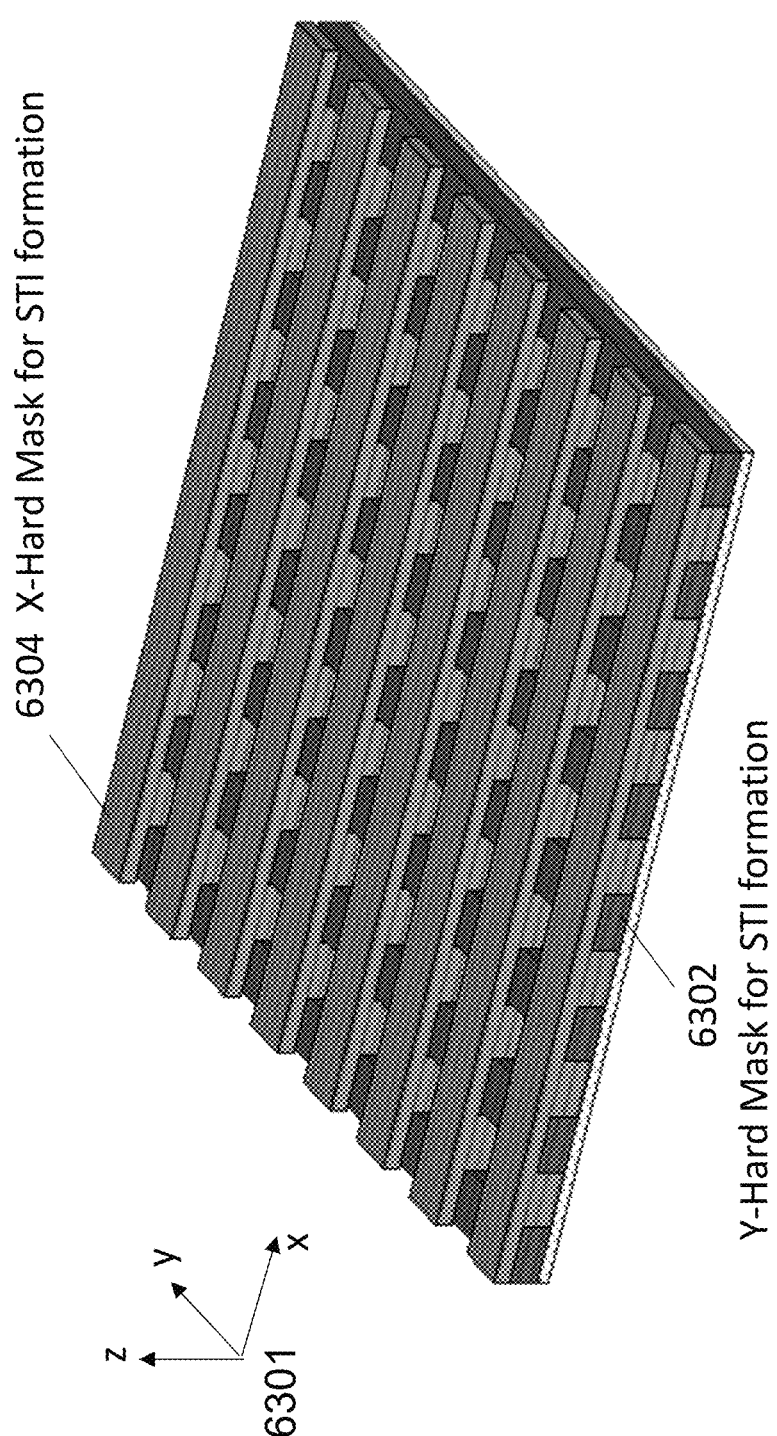
FIGS. 63A-63F are example illustrations of an alternative formation method and structure of a Checkerboard Fabric.

FIG. 63A illustrates the substrate such as in FIG. 53A to form hard mask strips oriented in Y direction 6302, overlaid by hard mask strips in X direction 6304. The directions are indicated by direction arrows 6301. These two hard masks are processed with materials which could allow later removal of the X direction strips 6304 without removing the Y direction strips 6302. These hard masks could shape a Shallow Trench Isolation ("STI") process, forming isolation in the areas/regions unprotected by these strips . . . etching the substrate (may be mono-crystalline silicon) followed by an STI process.

Figure 63B:
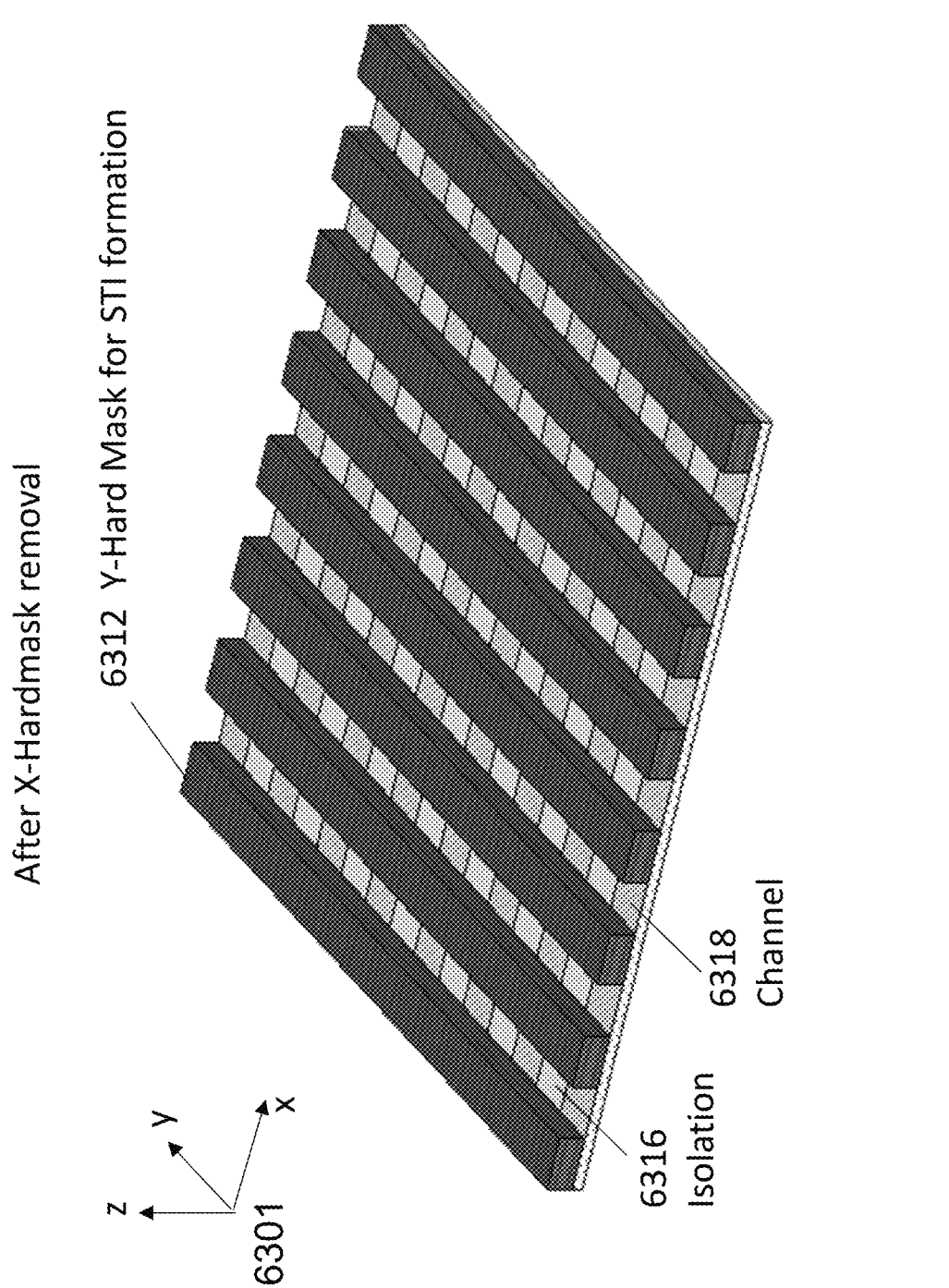

FIG. 63B illustrates the structure after removal of the X direction strips leaving in the Y direction strip 6312. The structure now has the isolation windows 6316, and the regions of the substrate that were protected by the X strips to be functional as the X direction channels 6318.

Figure 63C:
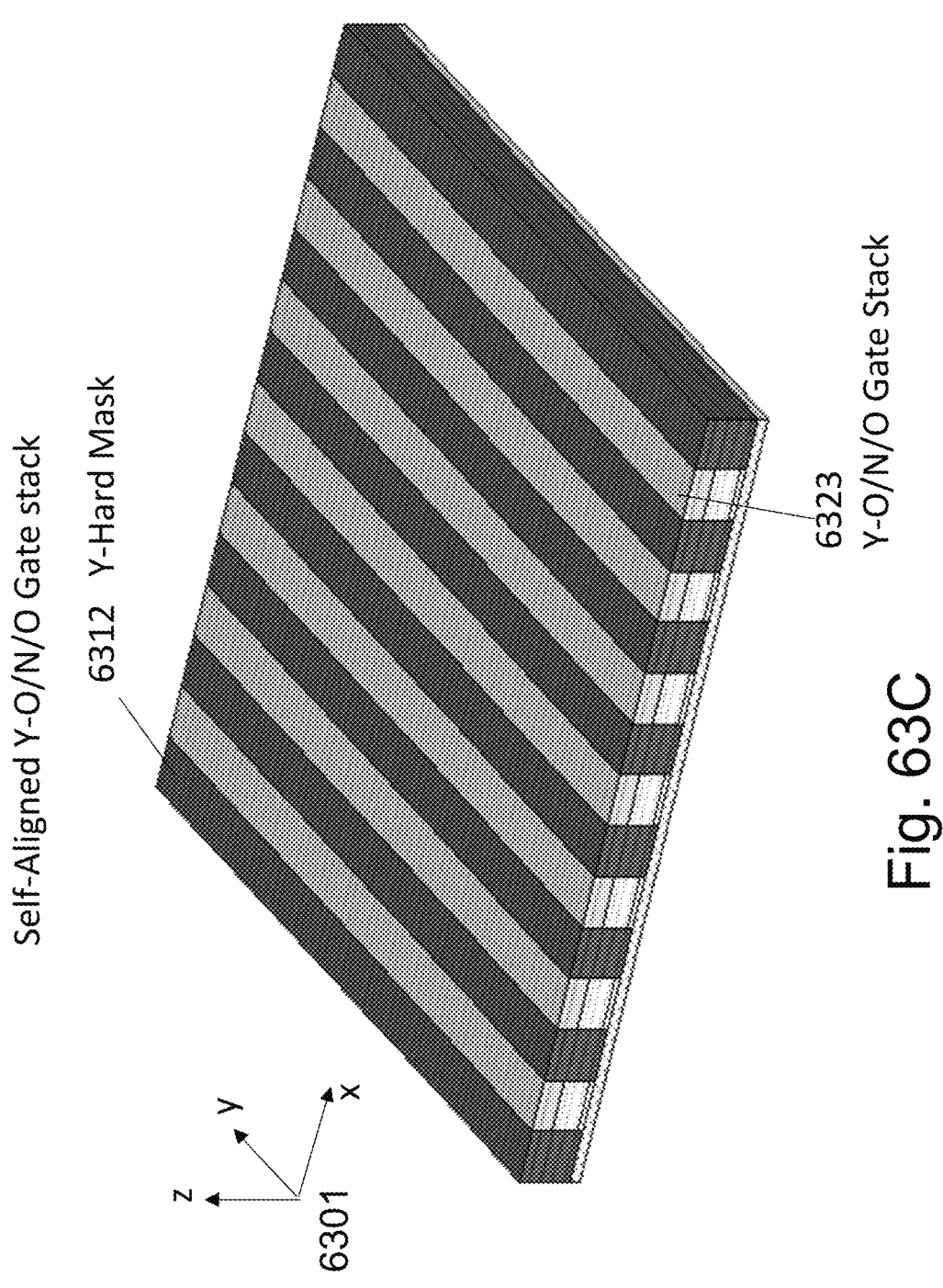

FIG. 63C illustrates the structure after forming the O/N/O and gate stack 6323 in the Y direction in similar process presented in respect to FIG. 2H.

Figure 63D:
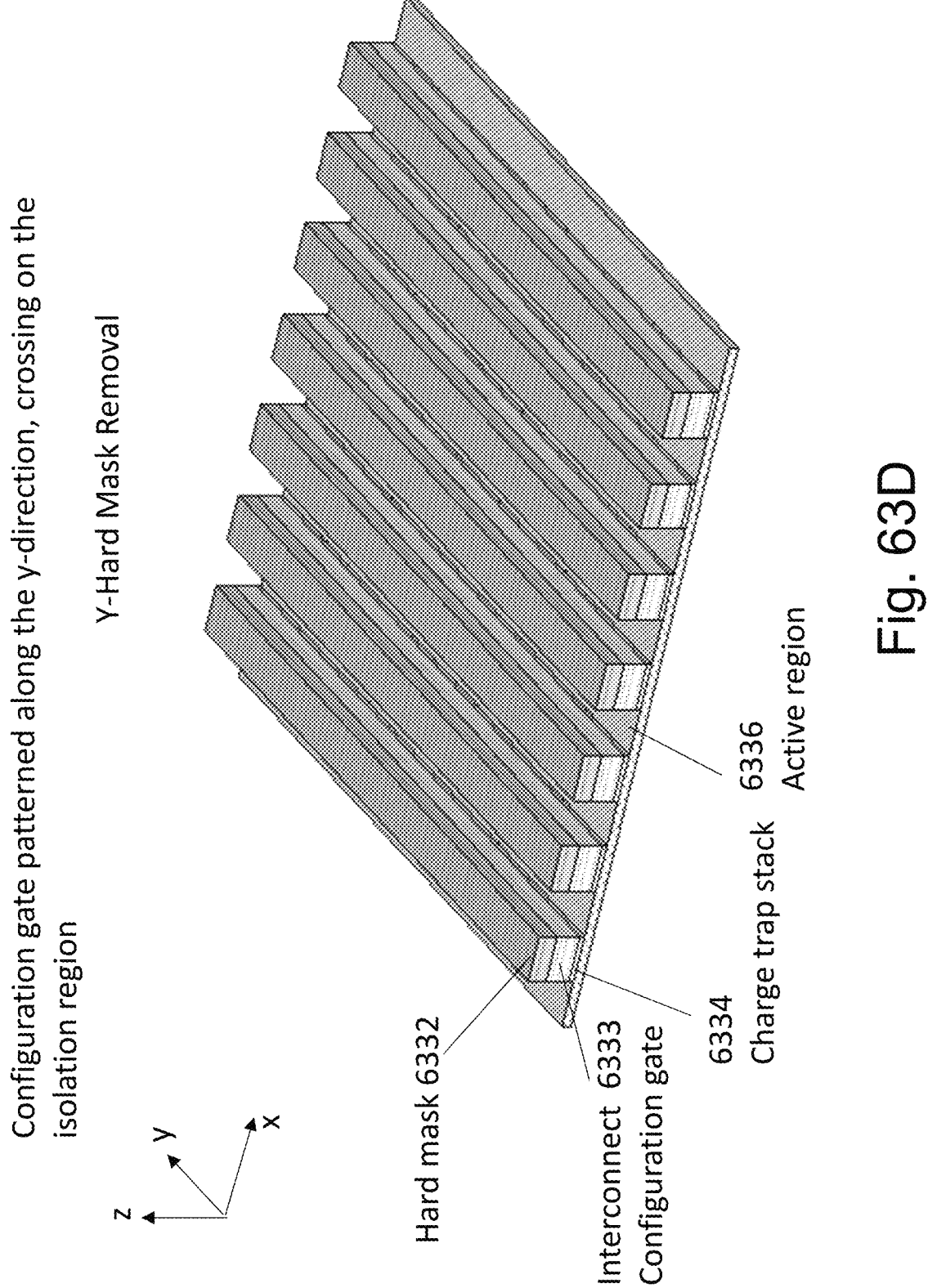

FIG. 63D illustrates the structure after removing the Y direction hard mask strips 6312 and exposing the channels in the Y direction 6336. The formed O/N/O stack 6323 could include charge trap stack 6334, gates 6333 and third hard mask 6332 to protect it from following steps and provide additional isolation.

Figure 63E:
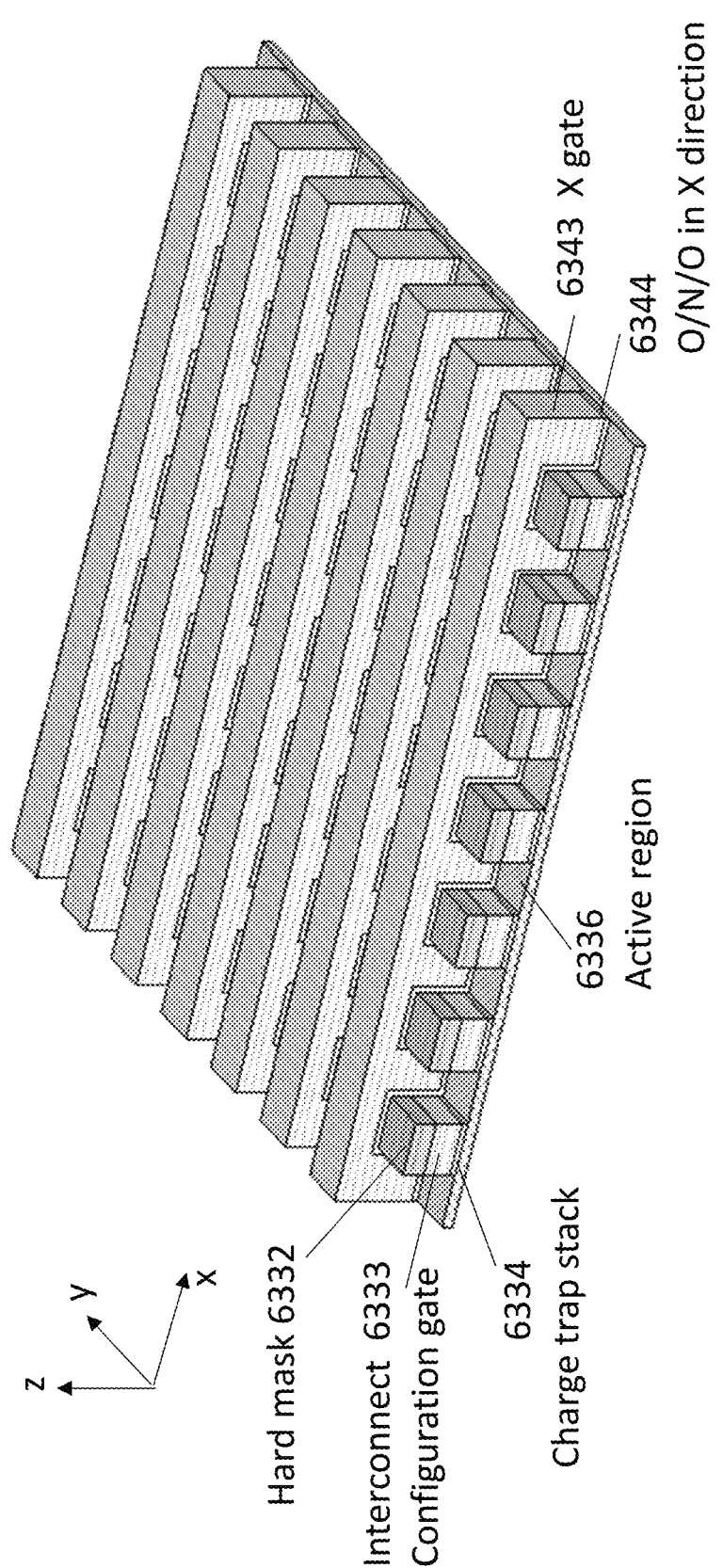

FIG. 63E illustrates the structure after forming the X direction O/N/O 6344 and its corresponding X gates 6343. The process could include ALD and other blanket depositions followed by lithography based patterning.

Figure 63F:
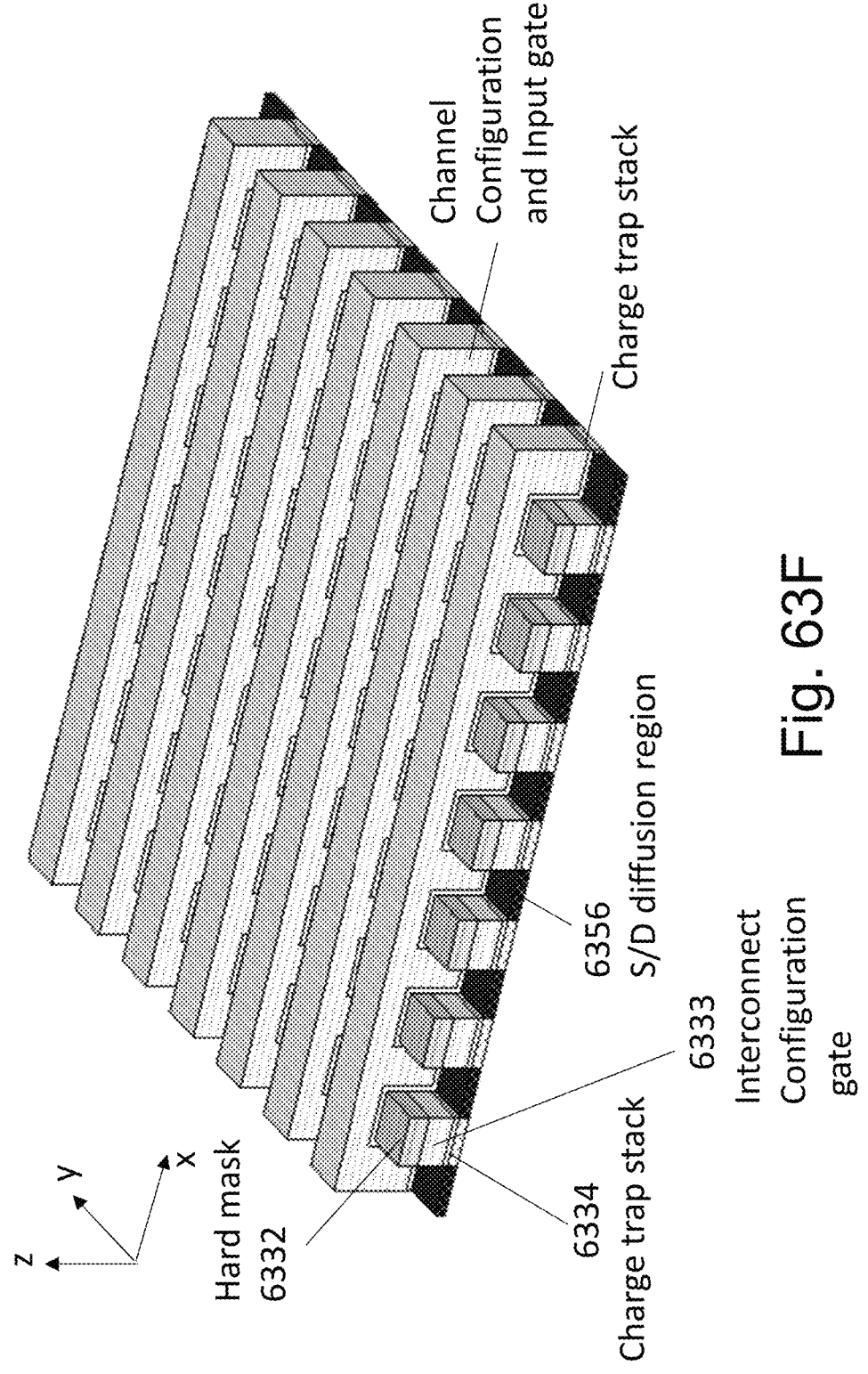

FIG. 63F illustrates the structure after ion implant step or other implant step (such as gas phase or PLAD) to form Source/Drain (S/D) regions 6356 in the now exposed regions of the substrate. The X direction O/N/O 6344 and its corresponding gates 6343 could be made a bit narrow to guarantee that the X channels and the Y channels are isolated by S/D region.

In some alternatives such when the channel thickness is thin, for example less than 20 nm, the device can be a junction-less transistor, then the S/D ion implantation may be modified or skipped.

The sizing of the structure and accordingly of the memory channel could be designed with consideration of access time, operation time memory durability costs and many other engineering, design and economic considerations. The NOR structure provides an interesting attribute as more memory could be added by having a higher number of layers. Processing a higher number of layers is easier, when the dimension of the patterns within the layer is relatively larger. In general the historic trend of the industry has been to make devices smaller and smaller to reduce cost per storage bit and increase memory integration. As size is reduced beyond certain level the bit storage is limited both in how much charge and accordingly how many levels could be stored in one charge trap site, and how many sites could be used on one facet without cross interference between them, also called second-bit effect (SBE). As well, retention time, reliability, and control-lines resistance and capacity (RC) are all negatively impacted. In a NOR structure the individual memory cells could be kept relatively large to achieve the desired attributes of bit capacity on a individual facet both in number of sites and how many levels are stored in each site. This achieves the desired reliability retention and access time while increasing the number of layers to increase memory integration and reduce cost per memory cell. The dimensions of length, width, and height of the memory cell channel could be designed accordingly and those could be relatively similar resulting with cube-like channels or varied to so they are very different. The formation of the O/N/O structure could be modified to enable a charge trap structure that has on its own multiple layers to allow more levels for the multilevel bit storage techniques. Some of these approaches are detailed in papers by: Ye Zhoul, et al titled "Nonvolatile multilevel data storage memory device from controlled ambipolar charge trapping mechanism published at SCIENTIFIC REPORTS|3: 2319|DOI: 10.1038/srep02319; Kyoung-Rok Han et al titled ":Multi-bit/Cell SONOS Flash Memory with Recessed Channel Structure" published at NSTI-Nanotech 2008; by Yan-Xiang Luo et al titled "Coupling of carriers injection and charges distribution in Schottky barrier charge trapping memories using source-side electrons programming" published at Semicond. Sci. Technol. 29 (2014) 115006 (8pp); by Chun-Hsing Shih, titled "Reading Operation and Cell Scalability of Nonvolatile Schottky barrier Multibit Charge-Trapping Memory Cells" at IEEE TRANSACTIONS ON ELECTRON DEVICES, VOL. 59, NO. 6, JUNE 2012, By Zhenjie Tang et al titled "Dependence of memory characteristics on the $(ZrO2)x$ $(SiO2)1-x$ elemental composition" at Semicond. Sci. Technol. 30 (2015) 065010, by Jun Yong Bak Nonvolatile Charge-Trap Memory Transistors With Top-Gate Structure Using In—Ga—Zn—O Active Channel and ZnO Charge-Trap Layer" at IEEE ELECTRON DEVICE LETTERS, VOL. 35, NO. 3, MARCH 2014, and U.S. Pat. No. 8,822,288 all incorporated herein by reference.

Another alternative is to utilize the NOR structure described herein for alternative storage medium such as floating gate, ReRAM, in which the O/N/O structure could be replaced by an ReRAM structure, floating gate based structure and so forth.

The structure of this NOR could be modified by changing the gate stack to construct a 3D-DRAM using the floating body technique. The Floating body of the 3D-DRAM or of the NOR Universal memory could be refreshed using the self-refresh described herein.

As a general note we described herein a memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some silicon control lines, improve speed and reduce variation by strengthening bit-lines and word-line with upper layer parallel running and periodically connected metal lines.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. The material used could be silicon or other alternative materials effective for semiconductor devices. Rather, the scope of the invention includes combinations and sub-combinations of the various features described hereinabove as well as modifications and variations which would occur to such skilled persons upon reading the foregoing description. Thus the invention is to be limited only by any appended claims.

We claim:

1. A 3D semiconductor device, the device comprising:
a first level comprising first single crystal transistors; and
a second level comprising second transistors,
    wherein said first level is overlaid by said second level,
    wherein said first level comprises a transferred layer and a bonded layer,
    wherein said second level is bonded to said first level,
    wherein said bonded second level comprises oxide to oxide bonds,
    wherein said bonded second level comprises metal to metal bonds,
    wherein said first level comprises memory periphery circuits,
    wherein said second level comprises a plurality of memory cells,
    wherein a digital-to-analog converter circuit is at least a part of said periphery circuits,
    wherein said second level comprises at least four memory arrays, and
    wherein each of said at least four memory arrays is independently controlled.

2. The 3D semiconductor device according to claim 1,
wherein said first level comprises circuitry which generates a plurality of pairs of complementing signals,
wherein said plurality of pairs of complementing signals each comprise a signal wire A and a signal wire B.

3. The 3D semiconductor device according to claim 1,
wherein a vertical distance from said first single crystal transistors to said second single crystal transistors is less than eight microns.

4. The 3D semiconductor device according to claim 1,
wherein said first level comprises at least one Look up Table ("LUT") circuit.

5. The 3D semiconductor device according to claim 1, further comprising:
a half-latch circuit.

6. The 3D semiconductor device according to claim 1, further comprising:
first vertical connections and second vertical connections,
    wherein said first vertical connections and said second vertical connections comprise being designed for connecting said first single crystal transistors to said second transistors;
a plurality of processors,
    wherein said plurality of processors comprise a first processor and a second processor,
    wherein said first processor is connected to said first vertical connections, and
    wherein said second processor is connected to said second vertical connections.

7. The 3D semiconductor device according to claim 1,
wherein said memory periphery circuits comprise at least one Look up Table ("LUT") circuit.

8. The 3D semiconductor device according to claim 1,
wherein said first level comprises circuitry which generates a plurality of pairs of complementing signals, and
wherein said plurality of pairs of complementing signals each comprise a signal wire A and a signal wire B.

\* \* \* \* \*